(12) United States Patent
Han et al.

(10) Patent No.: US 12,426,496 B2
(45) Date of Patent: Sep. 23, 2025

(54) ORGANIC ELECTROLUMINESCENCE DEVICE AND ORGANOMETALLIC COMPOUND FOR ORGANIC ELECTROLUMINESCENCE DEVICE

(71) Applicant: Samsung Display Co., Ltd., Yongin-si (KR)

(72) Inventors: Junghoon Han, Seoul (KR); Soo-Byung Ko, Yongin-si (KR); Sungbum Kim, Yongin-si (KR); Sujin Shin, Yongin-si (KR); Eunsoo Ahn, Jinju-si (KR); Jaesung Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 918 days.

(21) Appl. No.: 17/541,130

(22) Filed: Dec. 2, 2021

(65) Prior Publication Data

US 2022/0320447 A1   Oct. 6, 2022

(30) Foreign Application Priority Data

Mar. 25, 2021  (KR) .................. 10-2021-0039166

(51) Int. Cl.
| | |
|---|---|
| C07F 15/00 | (2006.01) |
| C09K 11/06 | (2006.01) |
| H10K 85/30 | (2023.01) |
| H10K 50/11 | (2023.01) |
| H10K 101/10 | (2023.01) |

(52) U.S. Cl.
CPC ....... *H10K 85/346* (2023.02); *C07F 15/0086* (2013.01); *C09K 11/06* (2013.01); *C09K 2211/1044* (2013.01); *C09K 2211/1048* (2013.01); *C09K 2211/185* (2013.01); *H10K 50/11* (2023.02); *H10K 2101/10* (2023.02)

(58) Field of Classification Search
None
See application file for complete search history.

(56) References Cited

U.S. PATENT DOCUMENTS

| | | |
|---|---|---|
| 7,381,479 B2 | 6/2008 | Lamansky et al. |
| 7,393,599 B2 | 7/2008 | Thompson et al. |
| 7,585,573 B2 | 9/2009 | Lee et al. |
| 7,776,458 B2 | 8/2010 | Ragini et al. |
| 8,106,199 B2 | 1/2012 | Jabbour et al. |
| 8,389,725 B2 | 3/2013 | Li et al. |
| 8,669,364 B2 | 3/2014 | Li et al. |
| 8,680,760 B2 | 3/2014 | Cheng et al. |
| 8,816,080 B2 | 8/2014 | Li et al. |
| 8,846,940 B2 | 9/2014 | Li et al. |
| 8,946,417 B2 | 2/2015 | Jian et al. |
| 9,051,344 B2 | 6/2015 | Lin et al. |
| 9,076,974 B2 | 7/2015 | Li et al. |
| 9,203,039 B2 | 12/2015 | Li et al. |
| 9,221,857 B2 | 12/2015 | Li et al. |
| 9,224,963 B2 | 12/2015 | Li et al. |
| 9,238,668 B2 | 1/2016 | Li et al. |
| 9,312,502 B2 | 4/2016 | Li et al. |
| 9,324,957 B2 | 4/2016 | Li et al. |
| 9,382,273 B2 | 7/2016 | Li et al. |
| 9,425,415 B2 | 8/2016 | Li et al. |
| 9,461,254 B2 | 10/2016 | Tsai et al. |
| 9,698,359 B2 | 7/2017 | Li et al. |
| 9,899,614 B2 | 2/2018 | Li et al. |
| 9,972,793 B2 | 5/2018 | Wu et al. |
| 2005/0287394 A1 | 12/2005 | Yang et al. |
| 2008/0018221 A1 | 1/2008 | Egen et al. |
| 2012/0121936 A1 | 5/2012 | Baek et al. |
| 2014/0309428 A1 | 10/2014 | Egen et al. |
| 2019/0214584 A1 | 7/2019 | Chen et al. |
| 2020/0280003 A1 | 9/2020 | Min et al. |

(Continued)

FOREIGN PATENT DOCUMENTS

| | | |
|---|---|---|
| CN | 104370974 A | 2/2015 |
| JP | 2007-45742 A | 2/2007 |
| KR | 10-0730115 B1 | 6/2007 |

(Continued)

*Primary Examiner* — Robert S Loewe
(74) *Attorney, Agent, or Firm* — Womble Bond Dickinson (US) LLP

(57) ABSTRACT

An organic electroluminescence device including a first electrode, a hole transport region disposed on the first electrode, an emission layer disposed on the hole transport region, an electron transport region disposed on the emission layer, and a second electrode disposed on the electron transport region, wherein the emission layer may include an organometallic compound represented by Formula 1 to thereby exhibit a long service life and/or high efficiency:

[Formula 1]

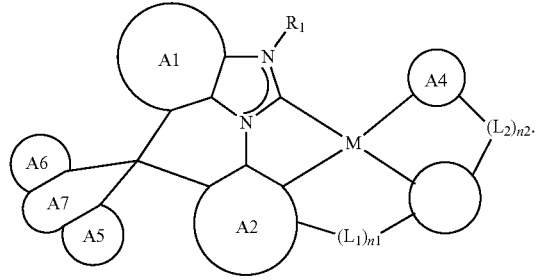

20 Claims, 6 Drawing Sheets

(56) References Cited

U.S. PATENT DOCUMENTS

2020/0295279 A1    9/2020  Lee et al.
2020/0295281 A1*  9/2020  Chen .................. C07F 15/0086

FOREIGN PATENT DOCUMENTS

| KR | 10-2019-0085496 A | 7/2019 |
| KR | 10-2020-0095395 A | 8/2020 |
| KR | 10-2020-0110504 A | 9/2020 |
| WO | WO 2012-121936 A2 | 9/2012 |

* cited by examiner

ORGANIC ELECTROLUMINESCENCE DEVICE AND ORGANOMETALLIC COMPOUND FOR ORGANIC ELECTROLUMINESCENCE DEVICE

CROSS-REFERENCE TO RELATED APPLICATION

This application claims priority to and the benefit of Korean Patent Application No. 10-2021-0039166, filed on Mar. 25, 2021, the entire content of which is hereby incorporated by reference.

BACKGROUND

1. Field

One or more aspects of embodiments of the present disclosure relate to an organic electroluminescence device and an organometallic compound for the organic electroluminescence device.

2. Description of the Related Art

Recently, organic electroluminescence display apparatuses are being developed as image display apparatuses. Unlike liquid crystal display apparatuses and/or the like, an organic electroluminescence display apparatus is a so-called self-luminescent display apparatus, in which holes and electrons injected from a first electrode and a second electrode recombine in an emission layer, and a luminescent material including an organic compound in the emission layer emits light to implement display.

In the application of an organic electroluminescence device to a display, a decrease in driving voltage, and increases in emission efficiency and/or life (e.g., life span) of the organic electroluminescence device are desired, and development of materials for an organic electroluminescence device stably attaining the requirements is continuously desired.

SUMMARY

One or more aspects of embodiments of the present disclosure are directed toward an organic electroluminescence device having excellent or suitable luminous efficiency and/or long service life characteristics.

One or more aspects of embodiments of the present disclosure are directed toward an organic electroluminescence device having high efficiency and/or long service life characteristics by including an organometallic compound in an emission layer.

One or more embodiments of the present disclosure provide an organometallic compound represented by Formula 1:

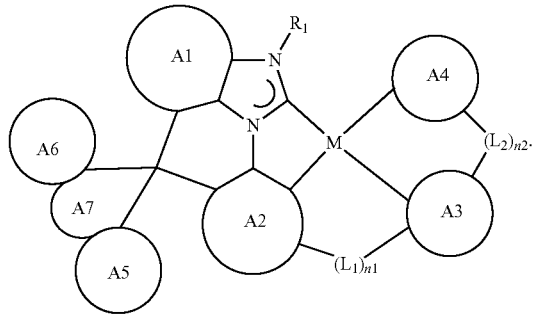

[Formula 1]

In Formula 1, M may be platinum (Pt), palladium (Pd), copper (Cu), silver (Ag), gold (Au), rhodium (Rh), iridium (Ir), ruthenium (Ru), or osmium (Os), ring A1 to ring A7 may each independently be a substituted or unsubstituted hydrocarbon ring having 5 to 60 ring-forming carbon atoms, or a substituted or unsubstituted heterocycle having 1 to 60 ring-forming carbon atoms, $L_1$ and $L_2$ may each independently be a direct linkage, *—O—*', *—S—*', *—C($R_{11}$)($R_{12}$)—*', *—C($R_{13}$)=*', *=C($R_{14}$)—*', *—C($R_{15}$)=C($R_{16}$)—*', *—C(=O)—*', *—C(=S)—*', *—C≡C—*', *—B($R_{17}$)—*', *—N($R_{18}$)—*', *—P($R_{19}$)—*', *—Si($R_{20}$)($R_{21}$)—*', *—P($R_{22}$)($R_{23}$)—*', or *—Ge($R_{24}$)($R_{25}$)—*', $R_{11}$ to $R_{25}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring, $R_1$ may be a hydrogen atom, a deuterium atom, a halogen atom, a substituted or unsubstituted thiol group, a substituted or unsubstituted oxy group, a substituted or unsubstituted boron group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and n1 and n2 may each independently be an integer of 0 to 3.

In an embodiment, ring A1 to ring A7 may each independently be a pentagonal ring, a hexagonal ring, or a heptagonal ring.

In an embodiment, the organometallic compound represented by Formula 1 may be represented by Formula 2:

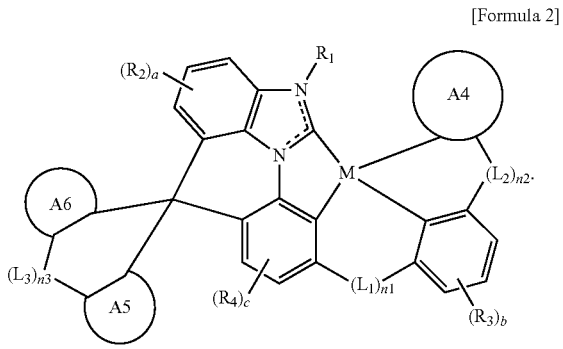

[Formula 2]

In Formula 2, $R_2$ to $R_4$ may each independently be a hydrogen atom, a deuterium atom, a halogen atom, a substituted or unsubstituted thiol group, a substituted or unsubstituted oxy group, a substituted or unsubstituted boron group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a and b may each independently be an integer of 0 to 3, c may be an integer of 0 to 2, $L_3$ may be a direct linkage, *—O—*', *—S—*', *—C($R_{26}$)($R_{27}$)—*', *—C($R_{28}$)=*', *=C($R_{29}$)—*', *—C($R_{30}$)=C($R_{31}$)—*', *—C(=O)—*', *—C(=S)—*', *—C≡C—*', *—B($R_{32}$)—*', *—N($R_{33}$)—*', *—P($R_{34}$)—*', *—Si($R_{35}$)($R_{36}$)—*', *—P($R_{37}$)($R_{38}$)—*', or *—Ge($R_{39}$)($R_{40}$)—*', $R_{26}$ to $R_{40}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring, n3 may be an integer of 0 to 3, and M, ring A4 to ring A6, $R_1$, $L_1$, $L_2$, n1 and n2 may each independently be the same as defined in Formula 1.

In an embodiment, the organometallic compound represented by Formula 2 may be represented by Formula 3:

[Formula 3]

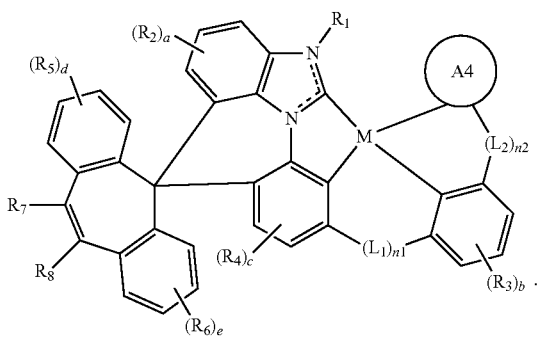

In Formula 3, $R_5$ and $R_6$ may each independently be a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, d and e may each independently be an integer of 0 to 4, and M, ring A4, $R_1$ to $R_4$, a to c, $L_1$ to $L_3$, and n1 to n3 may each independently be the same as defined in Formula 2.

In an embodiment, the organometallic compound represented by Formula 3 may be represented by any one among Formula 4-1 to Formula 4-3:

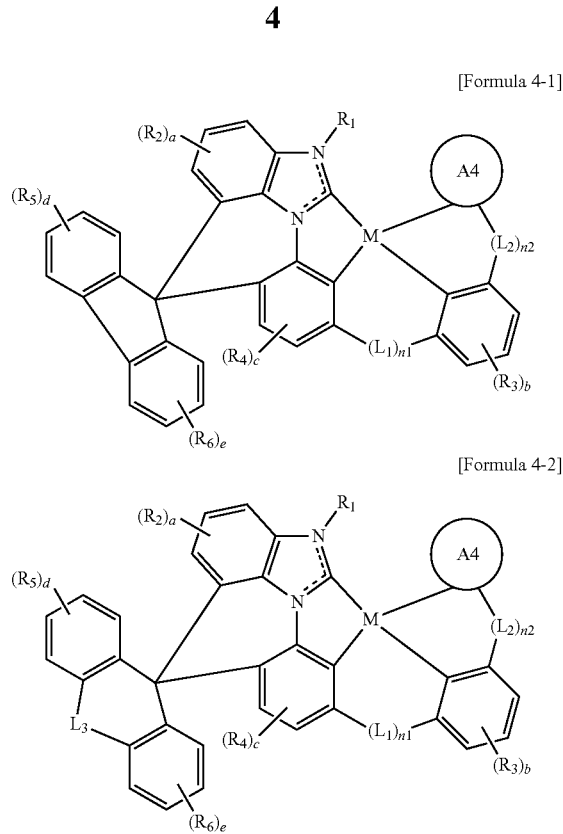

In Formula 4-1 to Formula 4-3, $L_3$ may be *—O—*, *—S—*, *—C($R_{26}$)($R_{27}$)—*', or N($R_{33}$)—*', $R_{26}$, $R_{27}$, and $R_{33}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring, $R_7$ and $R_8$ may each independently be a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and M, ring A4, $R_1$ to $R_6$, a to e, $L_1$ and $L_2$, and n1 and n2 may each independently be the same as defined in Formula 3.

In an embodiment, the organometallic compound represented by Formula 3 may be represented by Formula 5:

[Formula 5]

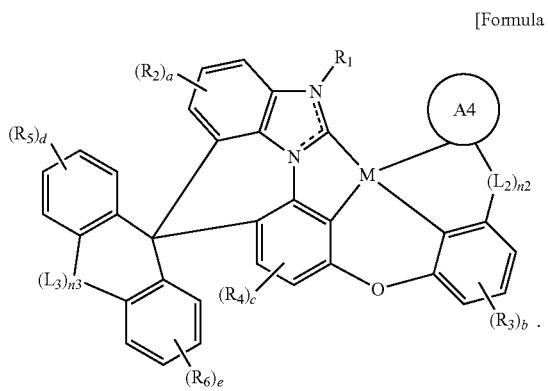

In Formula 5, M, ring A4, R1 to R6, a to e, L$_2$, L$_3$, and n2 and n3 may each independently be the same as defined in Formula 3.

In an embodiment, the organometallic compound represented by Formula 3 may be represented by Formula 6-1 or Formula 6-2:

[Formula 6-1]

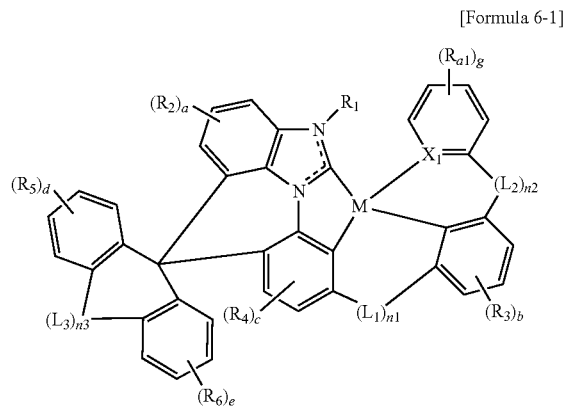

[Formula 6-2]

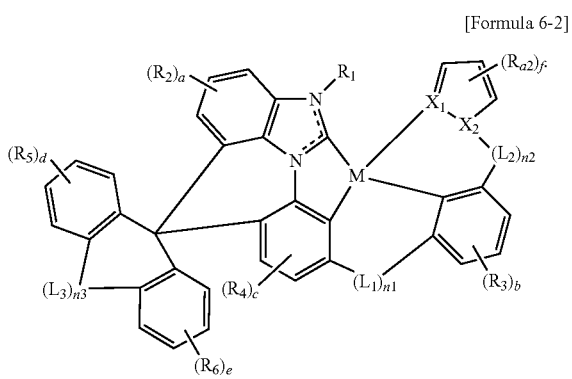

In Formula 6-1 and Formula 6-2, $X_1$ may be N or C, $X_2$ may be N or $CR_{a3}$, $R_{a1}$ to $R_{a3}$ may each independently be a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring, g may be an integer of 0 to 4, f may be an integer of 0 to 3, and M, $R_1$ to $R_6$, a to e, $L_1$ to $L_3$, and n1, n2, and n3 may each independently be the same as defined in Formula 3.

In an embodiment, the organometallic compound represented by Formula 6-1 may be represented by Formula 7-1 or Formula 7-2:

[Formula 7-1]

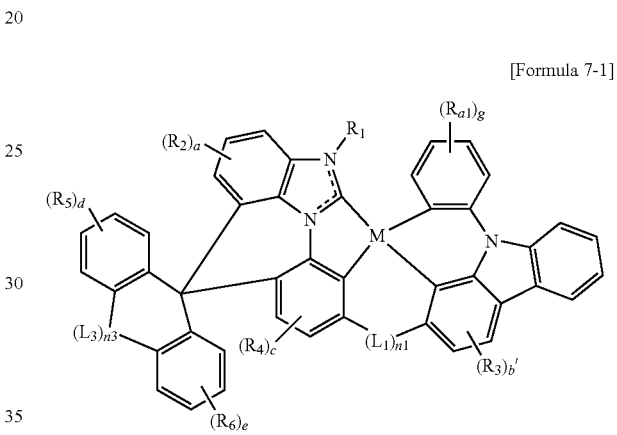

[Formula 7-2]

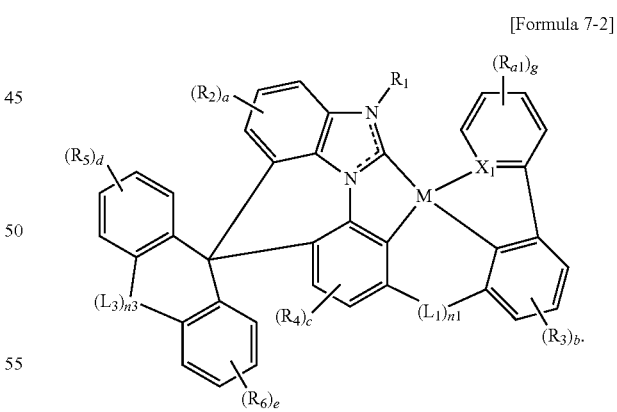

In Formula 7-1 and Formula 7-2, b' may be an integer of 0 to 2, and $X_1$, M, $R_1$ to $R_6$, $R_{a1}$, a to e, g, $L_1$, $L_3$, n1 and n3 may each independently be the same as defined in Formula 6-1.

In an embodiment, the organometallic compound represented by Formula 6-1 may be represented by Formula 8-1 or Formula 8-2:

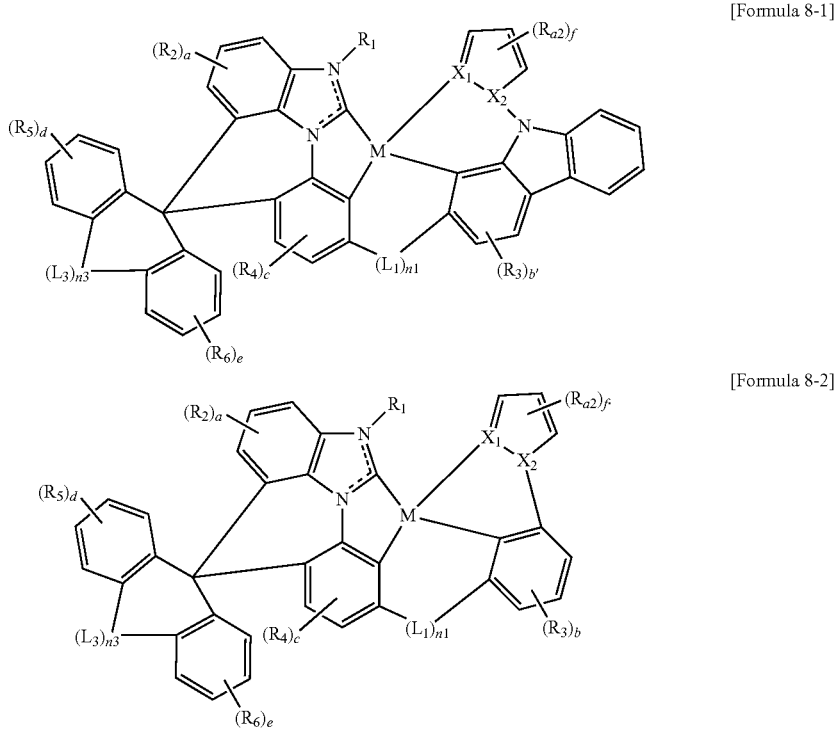

[Formula 8-1]

[Formula 8-2]

In Formula 8-1 and Formula 8-2, b' may be an integer of 0 to 2, and $X_1$, $X_2$, M, $R_1$ to $R_6$, $R_{a2}$, a to e, $L_1$, $L_3$, n1 and n3 may each independently be the same as defined in Formula 6-2.

The organometallic compound according to an embodiment may be to emit phosphorescence.

In an embodiment, the organometallic compound represented by Formula 1 may be at least one selected from among the compounds represented in Compound Group 1.

One or more embodiments of the present disclosure provide an organic electroluminescence device including: a first electrode; a hole transport region provided on the first electrode; an emission layer provided on the hole transport region; an electron transport region provided on the emission layer; and a second electrode provided on the electron transport region, wherein the emission layer includes the organometallic compound according to an embodiment.

The emission layer may be to emit phosphorescence.

In an embodiment, the emission layer may include a host and a dopant, and the dopant may be or include the organometallic compound represented by Formula 1.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
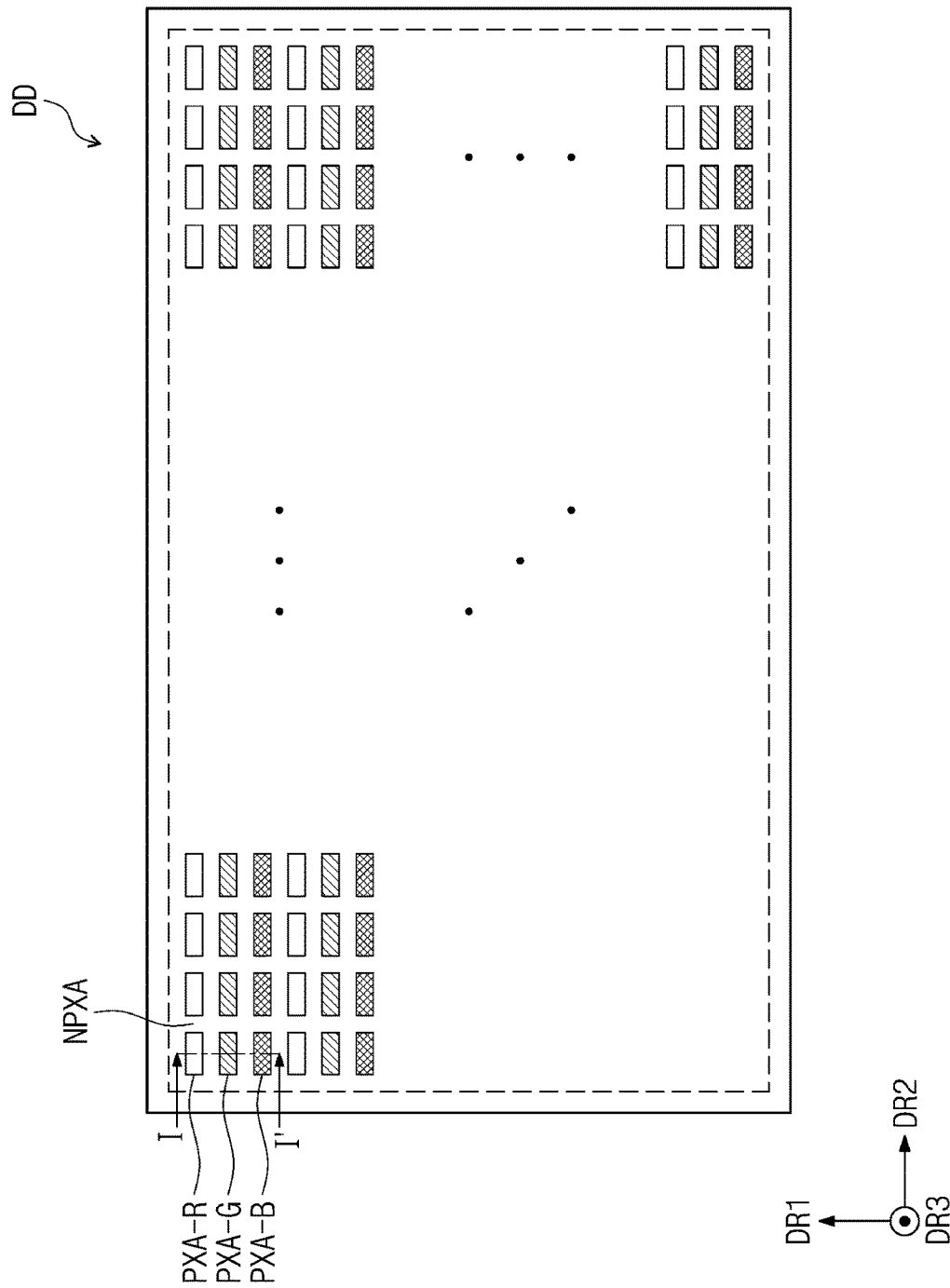
FIG. 1 is a plan view illustrating a display apparatus according to an embodiment of the present disclosure.

The present disclosure may be modified in many alternate forms, and thus selected embodiments will be shown in the drawings and described in more detail. It should be understood, however, that the present disclosure is not limited to the particular forms disclosed, but rather, is intended to cover all modifications, equivalents, and alternatives falling within the spirit and scope of the present disclosure.

When referring to the drawings, like reference numbers denote like elements throughout, and duplicative descriptions thereof may not be provided. In the accompanying drawings, the dimensions and sizes of each structure may be exaggerated for clarity. It will be understood that, although the terms "first," "second," etc. may be utilized herein to describe various elements, these elements should not be limited by these terms. These terms are only used to distinguish one element from another. For example, a first element may be alternatively referred to as a second element, and, similarly, the second element may be alternatively referred to as the first element, without departing from the scope of the present disclosure. Singular forms such as "a," "an," and "the" are intended to include the plural forms unless the context clearly indicates otherwise.

In the present application, it will be understood that the terms "comprise," "include," "have," etc., specify the presence of a feature, a fixed number, a step, an operation, an element, a component, or a combination thereof as disclosed in the specification, but do not exclude the possibility of presence or addition of one or more other features, fixed numbers, steps, operations, elements, components, or combinations thereof.

As used herein, the terms "use," "using," and "used" may be considered synonymous with the terms "utilize," "utilizing," and "utilized," respectively. As used herein, expressions such as "at least one of," "one of," and "selected from," when preceding a list of elements, modify the entire list of elements and do not modify the individual elements of the list. As used herein, the term "and/or" includes any and all combinations of one or more of the associated listed items. Further, the use of "may" when describing embodiments of the present disclosure refers to "one or more embodiments of the present disclosure".

In the present application, when a part such as a layer, a film, a region, or a plate is referred to as being "on" or "above" another part, it can be directly on the other part, or an intervening part may also be present. When a part such as a layer, a film, a region, or a plate is referred to as being "under" or "below" another part, it can be directly under the other part, or an intervening part may also be present. In contrast, when an element is referred to as being e.g., "directly on," or "directly under" another element, no intervening parts are present. It will be understood that when a part is referred to as being "on" another part, it can be disposed on the other part, or disposed under the other part as well (e.g., positional relationships are understood to be relative, such that a rotated and/or translated view of an overall structure will be understood to be equivalent to the original structure, unless specified otherwise).

In the specification, the term "substituted or unsubstituted" may refer to a state of being unsubstituted, or substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In some embodiments, each of the above substituents may be further substituted or unsubstituted. For example, a biphenyl group may be interpreted as a named aryl group, or as a phenyl group substituted with a phenyl group.

In the specification, the phrase "bonded to an adjacent group to form a ring" may indicate that one (e.g., the specified position or group) is bonded to an adjacent group to form a substituted or unsubstituted hydrocarbon ring, or a substituted or unsubstituted heterocycle. The term "hydrocarbon ring" includes an aliphatic hydrocarbon ring and an aromatic hydrocarbon ring. The term "heterocycle" includes an aliphatic heterocycle and an aromatic heterocycle. The hydrocarbon ring and the heterocycle may each independently be monocyclic or polycyclic. In some embodiments, the ring formed when groups are bonded to each other may be connected to another ring to form a spiro structure.

In the specification, the term "adjacent group" may refer to a substituent on the same atom or point, a substituent on an atom that is directly connected to the base atom or point, or a substituent sterically positioned (e.g., within intramolecular bonding distance) to the corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. Two methyl groups in 4,5-dimethylphenanthrene may be interpreted as "adjacent groups" to each other.

In the specification, examples of the halogen atom may include a fluorine atom, a chlorine atom, a bromine atom, and/or an iodine atom.

In the specification, the alkyl group may be a linear, branched or cyclic alkyl. The number of carbons in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments of the present disclosure are not limited thereto.

The term "hydrocarbon ring group" herein refers to any functional group or substituent derived from an aliphatic hydrocarbon ring. The hydrocarbon ring group may be a saturated hydrocarbon ring group having 5 to 20 ring-forming carbon atoms.

The term "aryl group" herein refers to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments of the present disclosure are not limited thereto.

In the specification, the fluorenyl group may be substituted, and two substituents may be bonded to each other to form a spiro structure. Examples of cases where the fluorenyl group is substituted are as follows. However, embodiments of the present disclosure are not limited thereto.

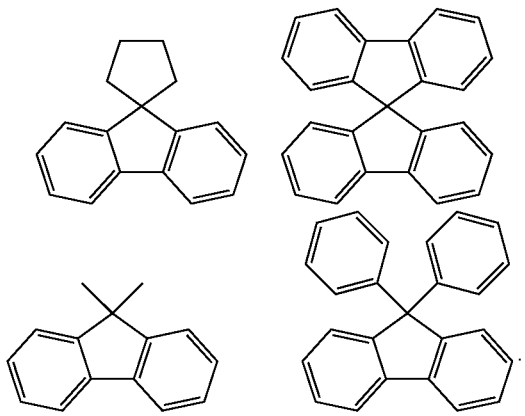

The term "heterocyclic group" herein refers to any functional group or substituent derived from a ring including at least one of boron (B), oxygen (O), nitrogen (N), phosphorus (P), silicon (Si), or selenium (Se) as a heteroatom. The term "heterocyclic group" includes an aliphatic heterocyclic group and an aromatic heterocyclic group. The aromatic heterocyclic group may be a heteroaryl group. The aliphatic heterocycle and the aromatic heterocycle may each independently be monocyclic or polycyclic.

In the specification, the heterocyclic group may include at least one of B, O, N, P, Si or S as a heteroatom. When the heterocyclic group includes two or more heteroatoms, the two or more heteroatoms may be the same as or different from each other. The heterocyclic group may be a monocyclic heterocyclic group or a polycyclic heterocyclic group, and in some embodiments may include a heteroaryl group. The number of ring-forming carbon atoms in the heterocyclic group may be 2 to 30, 2 to 20, or 2 to 10.

In the specification, the aliphatic heterocyclic group may include one or more among B, O, N, P, Si, and S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but embodiments of the present disclosure are not limited thereto.

The heteroaryl group herein may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments of the present disclosure are not limited thereto.

In the specification, the above description of the aryl group may also be applied to an arylene group, except that the arylene group is a divalent group. The above description of the heteroaryl group may be applied to a heteroarylene group except that the heteroarylene group is a divalent group.

In the specification, the term "silyl group" includes an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments of the present disclosure are not limited thereto.

In the specification, the number of carbon atoms in the amino group is not specifically limited, but may be 1 to 30. The amino group may include an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., but are not limited thereto.

The term "thio group" herein may include an alkylthio group and an arylthio group. The term "thio group" may refer to a sulfur atom bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, and/or a naphthylthio group, but embodiments of the present disclosure are not limited thereto.

In the specification, the alkenyl group may be linear or branched. The number of carbon atoms in the alkynyl group is not specifically limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the specification, the number of carbon atoms in an amine group is not specifically limited, but may be 1 to 30. The term "amine group" may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but embodiments of the present disclosure are not limited thereto.

In the specification, examples of the alkyl group included in an alkylthio group, an alkylsulfoxy group, an alkylaryl group, an alkylamino group, an alkyl boron group, an alkyl silyl group, and an alkyl amine group may each independently be the same as the examples of the (independent) alkyl group described above.

In the specification, examples of the aryl group included in an aryloxy group, an arylthio group, an arylsulfoxy group, an arylamino group, an arylboron group, an arylsilyl group, and/or an arylamine group may each independently be the same as the examples of the (independent) aryl group described above.

The term "direct linkage" herein may refer to a single bond.

In the specification, "-*" and "  " refer to a position to be connected (e.g., to another Formula).

Hereinafter, embodiments of the present disclosure will be described with reference to the accompanying drawings.

Figure 2:
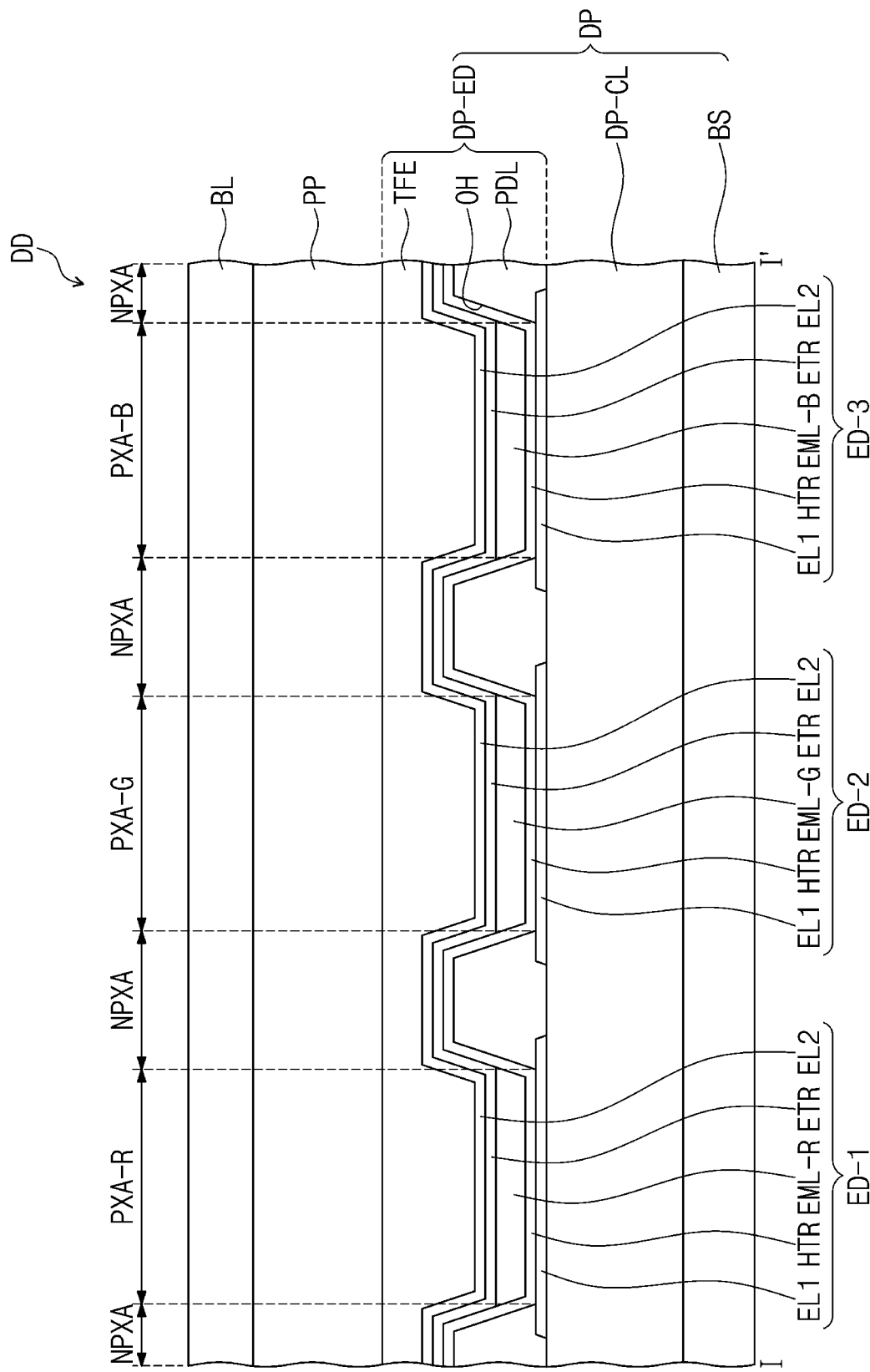
FIG. 2 is a cross-sectional view illustrating a display apparatus according to an embodiment of the present disclosure.

FIG. 1 is a plan view illustrating an embodiment of a display apparatus DD. FIG. 2 is a cross-sectional view of the display apparatus DD of the embodiment. FIG. 2 is a cross-sectional view illustrating a part taken along line I-I' of FIG. 1.

The display apparatus DD may include a display panel DP and an optical layer PP disposed on the display panel DP. The display panel DP includes organic electroluminescence devices ED-1, ED-2, and ED-3. The display apparatus DD may include a plurality of organic electroluminescence devices ED-1, ED-2, and ED-3. The optical layer PP may be disposed on the display panel DP and control reflected external light in the display panel DP. The optical layer PP may include, for example, a polarization layer and/or a color filter layer. In some embodiments, the optical layer PP may not be provided in the display apparatus DD of an embodiment.

A base substrate BL may be disposed on the optical layer PP. The base substrate BL may provide a base surface on which the optical layer PP is disposed. The base substrate BL may be a glass substrate, a metal substrate, a plastic substrate, etc. However, embodiments of the present disclosure are not limited thereto, and the base substrate BL may be an inorganic layer, an organic layer, or a composite material layer. In some embodiments, the base substrate BL may not be provided.

The display apparatus DD according to an embodiment may further include a filling layer. The filling layer may be disposed between a display device layer DP-ED and the base substrate BL. The filling layer may be an organic material layer. The filling layer may include at least one of an acrylic-based resin, a silicone-based resin, or an epoxy-based resin.

The display panel DP may include a base layer BS, a circuit layer DP-CL provided on the base layer BS, and a display device layer DP-ED. The display device layer DP-ED may include a pixel defining film PDL, the organic electroluminescence devices ED-1, ED-2, and ED-3 disposed between portions of the pixel defining film PDL, and an encapsulation layer TFE disposed on the organic electroluminescence devices ED-1, ED-2, and ED-3.

The base layer BS may be a member that provides a base surface on which the display device layer DP-ED is disposed. The base layer BS may be a glass substrate, a metal substrate, a plastic substrate, etc. However, embodiments of the present disclosure are not limited thereto, and the base layer BS may be an inorganic layer, an organic layer, or a composite material layer.

In an embodiment, the circuit layer DP-CL is disposed on the base layer BS, and the circuit layer DP-CL may include a plurality of transistors. Each of the transistors may include a control electrode, an input electrode, and an output electrode. For example, the circuit layer DP-CL may include a switching transistor and a driving transistor in order to drive the organic electroluminescence devices ED-1, ED-2, and ED-3 of the display device layer DP-ED.

Each of the organic electroluminescence devices ED-1, ED-2, and ED-3 may have a structure of an organic electroluminescence device ED of an embodiment according to FIGS. 3 to 6, which will be described later. Each of the organic electroluminescence devices ED-1, ED-2 and ED-3 may include a first electrode EL1, a hole transport region HTR, emission layers EML-R, EML-G and EML-B, respectively, an electron transport region ETR, and a second electrode EL2.

FIG. 2 illustrates an embodiment in which the emission layers EML-R, EML-G, and EML-B of the organic electroluminescence devices ED-1, ED-2, and ED-3 are disposed in openings OH defined in the pixel defining film PDL, and the hole transport region HTR, the electron transport region ETR, and the second electrode EL2 are provided as common layers in the entire organic electroluminescence devices ED-1, ED-2, and ED-3. However, embodiments of the present disclosure are not limited thereto, and in some embodiments, the hole transport region HTR and the electron transport region ETR in an embodiment may be provided by being patterned inside the opening hole OH defined in the pixel defining film PDL. For example, the hole transport region HTR, the emission layers EML-R, EML-G, and EML-B, and the electron transport region ETR of the organic electroluminescence devices ED-1, ED-2, and ED-3 in an embodiment may be provided by being patterned in an inkjet printing method.

The encapsulation layer TFE may cover the organic electroluminescence devices ED-1, ED-2 and ED-3. The encapsulation layer TFE may seal the display device layer DP-ED. The encapsulation layer TFE may be a thin film encapsulation layer. The encapsulation layer TFE may be formed by laminating one layer or a plurality of layers. The encapsulation layer TFE includes at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film protects the display device layer DP-ED from moisture/oxygen, and the encapsulation-organic film protects the display device layer DP-ED from foreign substances (such as dust particles). The encapsulation-inorganic film may include silicon nitride, silicon oxynitride, silicon oxide, titanium oxide, aluminum oxide, and/or the like, but embodiments of the present disclosure are not particularly limited thereto. The encapsulation-organic film may include an acrylic-based compound, an epoxy-based compound, and/or the like. The encapsulation-organic film may include a photopolymerizable organic material, but embodiments of the present disclosure are not particularly limited thereto.

The encapsulation layer TFE may be disposed on the second electrode EL2 and may be disposed filling the opening hole OH.

Referring to FIGS. 1 and 2, the display apparatus DD may include a non-light emitting region NPXA and light emitting regions PXA-R, PXA-G and PXA-B. The light emitting regions PXA-R, PXA-G and PXA-B may be regions to emit light generated from the organic electroluminescence devices ED-1, ED-2 and ED-3, respectively. The light emitting regions PXA-R, PXA-G, and PXA-B may be spaced apart from each other in a plane.

Each of the light emitting regions PXA-R, PXA-G, and PXA-B may be a region divided by the pixel defining film PDL. The non-light emitting regions NPXA may be regions between the adjacent light emitting regions PXA-R, PXA-G, and PXA-B, which correspond to portions of the pixel defining film PDL. Each of the light emitting regions PXA-R, PXA-G, and PXA-B may correspond to a pixel. The pixel defining film PDL may separate the organic electroluminescence devices ED-1, ED-2 and ED-3. The emission layers EML-R, EML-G and EML-B of the organic electroluminescence devices ED-1, ED-2 and ED-3 may be disposed in openings OH defined by (e.g., within) the pixel defining film PDL and may be separated from each other.

The light emitting regions PXA-R, PXA-G and PXA-B may be divided into a plurality of groups according to the color of light generated from the organic electroluminescence devices ED-1, ED-2 and ED-3. In the display apparatus DD of an embodiment shown in FIGS. 1 and 2, three light emitting regions PXA-R, PXA-G, and PXA-B to emit red light, green light, and blue light, respectively, are illustrated as an example. For example, the display apparatus DD of an embodiment may include the red light emitting region PXA-R, the green light emitting region PXA-G, and the blue light emitting region PXA-B, which are separated from one another.

In the display apparatus DD according to an embodiment, the plurality of organic electroluminescence devices ED-1, ED-2 and ED-3 may be to emit light (e.g., light beams) having wavelengths different from one another. For example, in an embodiment, the display apparatus DD may include a first organic electroluminescence device ED-1 to emit red light, a second organic electroluminescence device ED-2 to emit green light, and a third organic electroluminescence device ED-3 to emit blue light. For example, the red light emitting region PXA-R, the green light emitting region PXA-G, and the blue light emitting region PXA-B of the display apparatus DD may correspond to the first organic electroluminescence device ED-1, the second organic electroluminescence device ED-2, and the third organic electroluminescence device ED-3, respectively.

However, embodiments of the present disclosure are not limited thereto, and the first to third organic electroluminescence devices ED-1, ED-2, and ED-3 may be to emit light beams in substantially the same wavelength range, or at least one organic electroluminescence device may be to emit a light beam in a wavelength range different from the others. For example, the first to third organic electroluminescence devices ED-1, ED-2, and ED-3 may all be to emit blue light.

The light emitting regions PXA-R, PXA-G, and PXA-B in the display apparatus DD according to an embodiment may be arranged in a stripe form or pattern. Referring to FIG. 1, the plurality of red light emitting regions PXA-R may be arranged with each other along a second directional axis DR2, the plurality of green light emitting regions PXA-G may be arranged with each other along the second directional axis DR2, and the plurality of blue light emitting regions PXA-B each may be arranged with each other along the second directional axis DR2. The red light emitting region PXA-R, the green light emitting region PXA-G, and the blue light emitting region PXA-B may be alternatingly arranged with each other in this order along a first directional axis DR1.

FIGS. 1 and 2 illustrate embodiments in which all the light emitting regions PXA-R, PXA-G, and PXA-B have similar areas, but embodiments of the present disclosure are not limited thereto, and the light emitting regions PXA-R, PXA-G, and PXA-B may have different areas from each other according to a wavelength range of the emitted light. In this case, the areas of the light emitting regions PXA-R, PXA-G, and PXA-B may be areas when viewed in a plane defined by the first directional axis DR1 and the second directional axis DR2.

The arrangement form or pattern of the light emitting regions PXA-R, PXA-G, and PXA-B is not limited to that illustrated in FIG. 1, and the order in which the red light emitting region PXA-R, the green light emitting region PXA-G, and the blue light emitting region PXA-B are arranged may be variously combined and provided according to the desired characteristics and/or display quality of the display apparatus DD. For example, the arrangement form of the light emitting regions PXA-R, PXA-G, and PXA-B may be a PENTILE© arrangement form or a diamond arrangement form. (PENTILE© is a registered trademark of Samsung Display Co., Ltd.)

In some embodiments, the areas of the light emitting regions PXA-R, PXA-G, and PXA-B may be different from each other. For example, in an embodiment, the area of the green light emitting region PXA-G may be smaller than that of the blue light emitting region PXA-B, but embodiments of the present disclosure are not limited thereto.

Hereinafter, FIGS. 3 to 6 are cross-sectional views schematically illustrating organic electroluminescence devices according to embodiments. Each of the organic electroluminescence devices ED according to embodiments may include a first electrode EL1, a hole transport region HTR, an emission layer EML, an electron transport region ETR, and a second electrode EL2, which are sequentially stacked.

Figure 3:
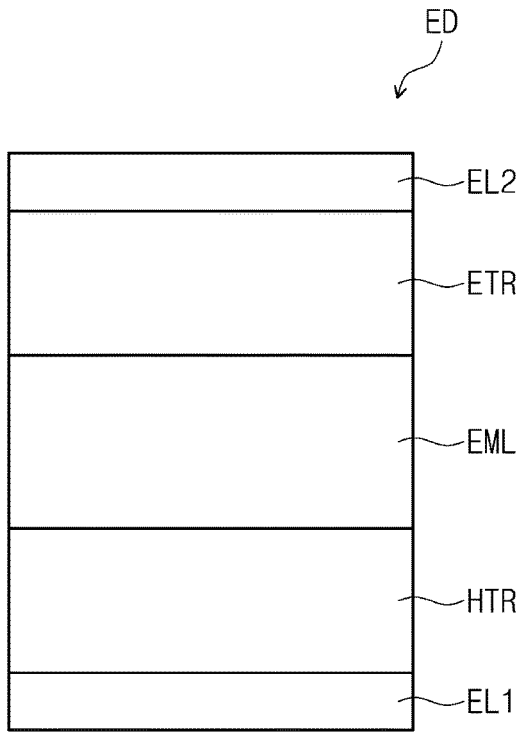
FIG. 3 is a cross-sectional view schematically illustrating an organic electroluminescence device according to an embodiment of the present disclosure.
Figure 4:
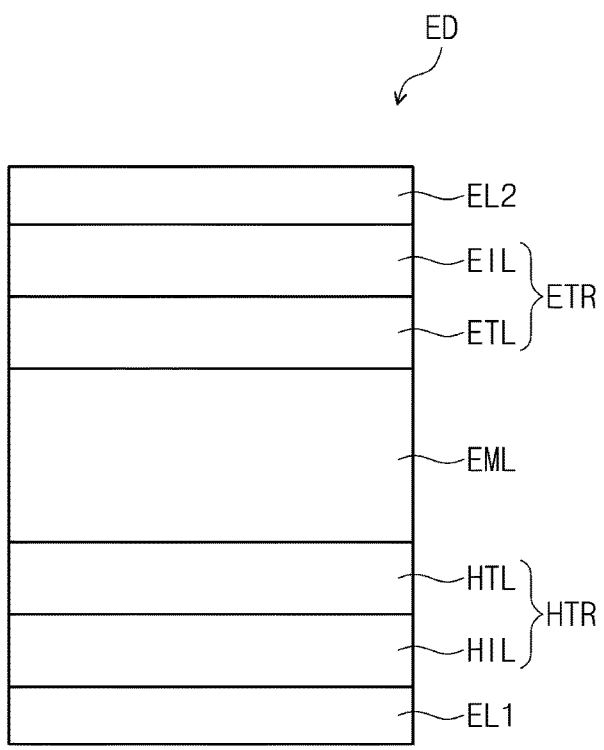
FIG. 4 is a cross-sectional view schematically illustrating an organic electroluminescence device according to an embodiment of the present disclosure.
Figure 5:
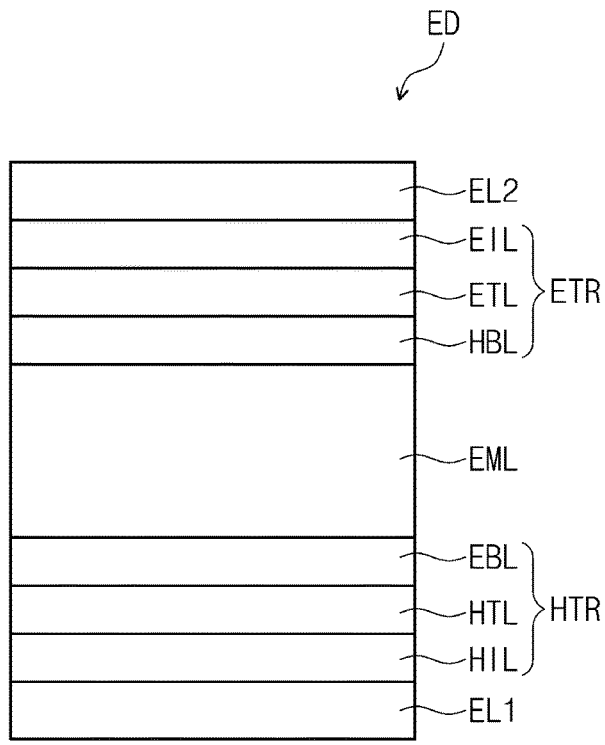
FIG. 5 is a cross-sectional view schematically illustrating an organic electroluminescence device according to an embodiment of the present disclosure.
Figure 6:
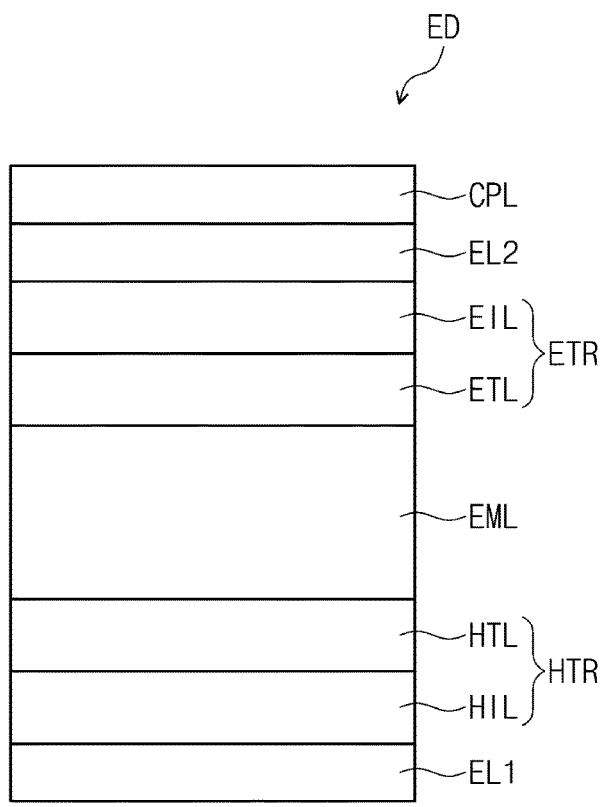
FIG. 6 is a cross-sectional view schematically illustrating an organic electroluminescence device according to an embodiment of the present disclosure.

Compared to FIG. 3, FIG. 4 illustrates a cross-sectional view of an organic electroluminescence device ED of an embodiment, in which a hole transport region HTR includes a hole injection layer HIL and a hole transport layer HTL, and an electron transport region ETR includes an electron injection layer EIL and an electron transport layer ETL. Compared to FIG. 3, FIG. 5 illustrates a cross-sectional view of an organic electroluminescence device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 4, FIG. 6 illustrates a cross-sectional view of an organic electroluminescence device ED of an embodiment including a capping layer CPL disposed on a second electrode EL2.

The first electrode EL1 has conductivity (e.g., is a conductor). The first electrode EL1 may be formed of a metal material, a metal alloy, and/or a conductive compound. The first electrode EL1 may be an anode or a cathode. However, embodiments of the present disclosure are not limited thereto. In some embodiments, the first electrode EL1 may be a pixel electrode. The first electrode EL1 may be a transmissive electrode, a transflective electrode, or a reflective electrode. When the first electrode EL1 is a transmissive electrode, the first electrode EL1 may be formed utilizing a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), tungsten (W), a compound of any thereof, or a mixture of any thereof (e.g., a mixture of Ag and Mg). In some embodiments, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments of the present disclosure are not limited thereto. In some embodiments, the first electrode EL1 may include the above-described metal materials, combinations of at least of the above-described metal materials, oxides of the above-described metal materials, and/or the like. The thickness of the first electrode EL1 may be about 700 Å to about 10,000 Å. For example, the thickness of the first electrode EL1 may be about 1,000 Å to about 3,000 Å.

The hole transport region HTR is provided on the first electrode EL1. The hole transport region HTR may include at least one of a hole injection layer HIL, a hole transport layer HTL, a buffer layer or an emission-auxiliary layer, or an electron blocking layer EBL. The thickness of the hole transport region HTR may be, for example, about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, or may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/ buffer layer, or a hole injection layer HIL/hole transport layer HTL/electron blocking layer EBL are stacked in order from the first electrode EL1, but embodiments of the present disclosure are not limited thereto.

The hole transport region HTR may be formed utilizing one or more suitable methods (such as a vacuum deposition method, a spin coating method, a cast method, a Langmuir-Blodgett (LB) method, an inkjet printing method, a laser printing method, and/or a laser induced thermal imaging (LITI) method).

The hole transport region HTR may include a compound represented by Formula H-1:

[Formula H-1]

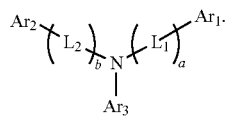

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. a and b may each independently be an integer of 0 to 10. In some embodiments, when a or b is an integer of 2 or greater, the plurality of $L_1$'s and $L_2$'s may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In some embodiments, in Formula H-1, $Ar_3$ may be a substituted or unsubstituted aryl group having 6 to 30 ring-forming carbon atoms.

The compound represented by Formula H-1 above may be a monoamine compound (e.g., may have only one amine atom or group). In some embodiments, the compound represented by Formula H-1 above may be a diamine compound (e.g., having two amine atom or groups) in which at least one among $Ar_1$ to $Ar_3$ includes an amine group as a substituent. In some embodiments, the compound represented by Formula H-1 above may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one among the compounds of Compound Group H. However, the compounds listed in Compound Group H are examples, and the compounds represented by Formula H-1 are not limited to those represented by Compound Group H:

[Compound Group H]

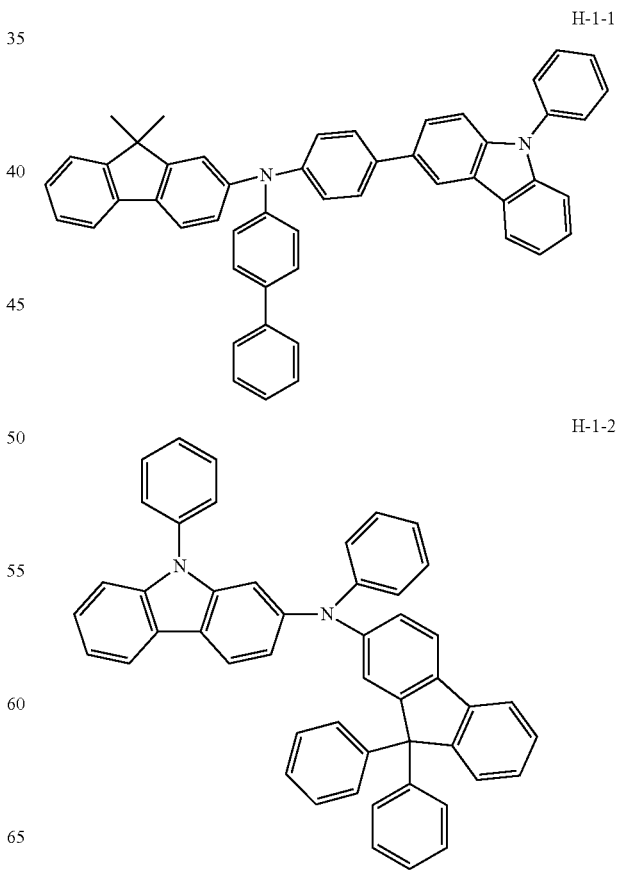

-continued
H-1-3
H-1-4
H-1-5
H-1-6
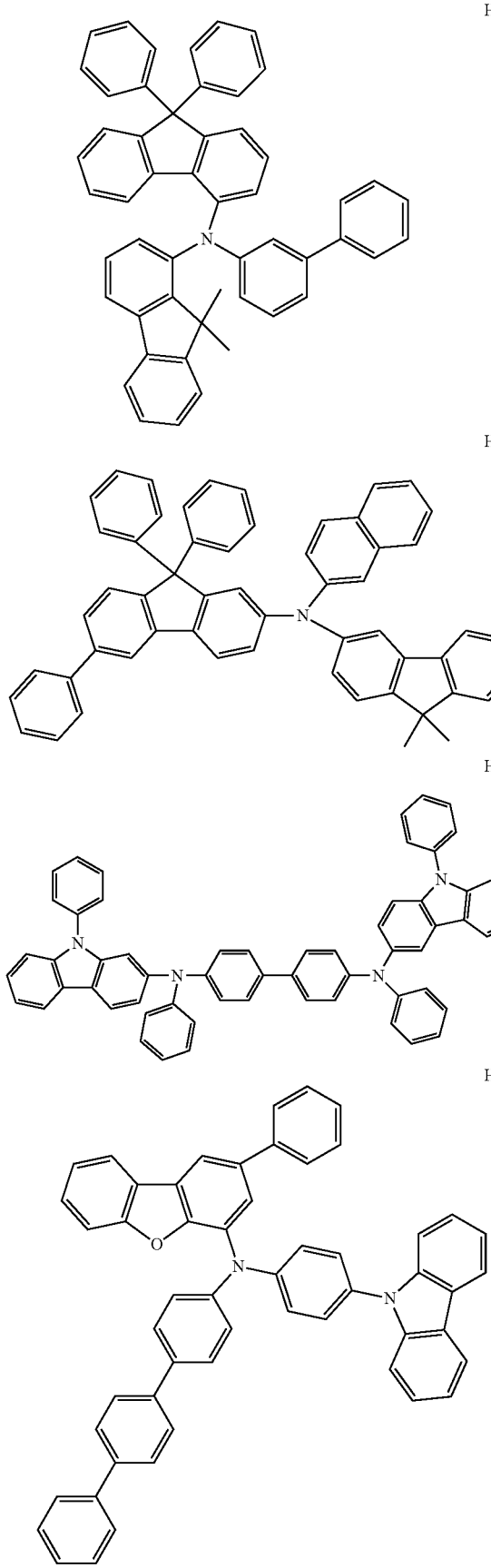
-continued
H-1-7
H-1-8
H-1-9
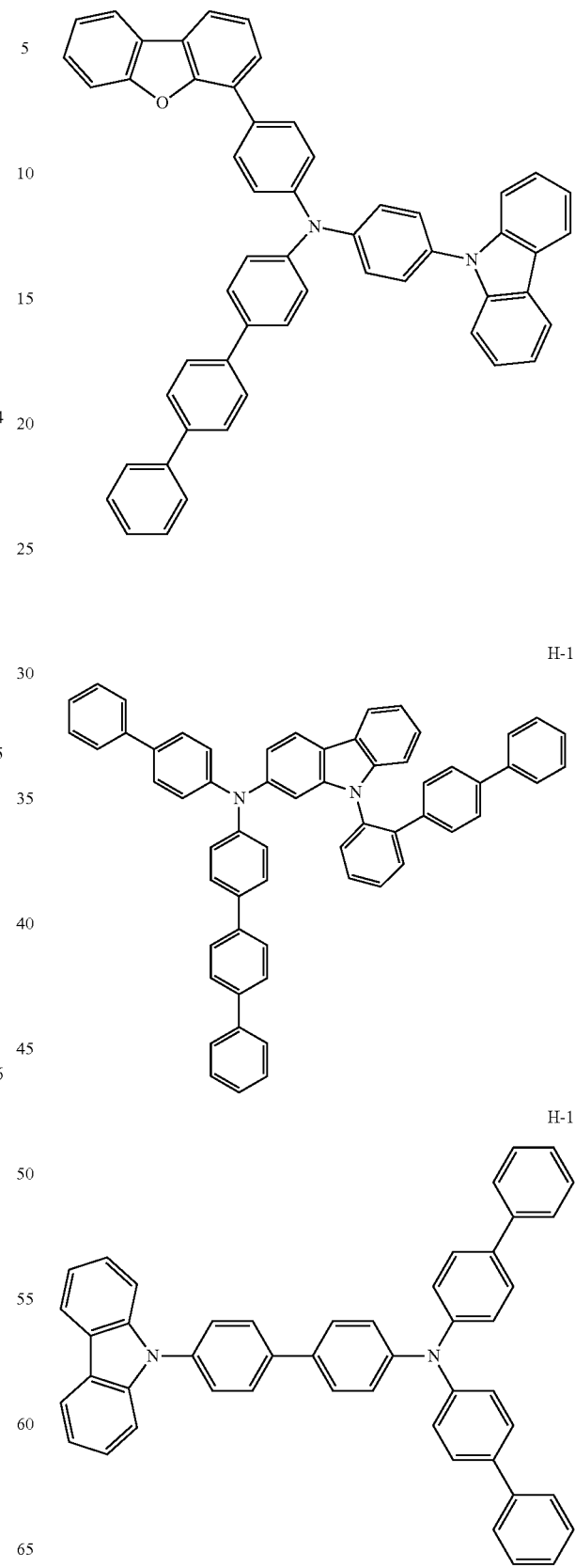

H-1-10
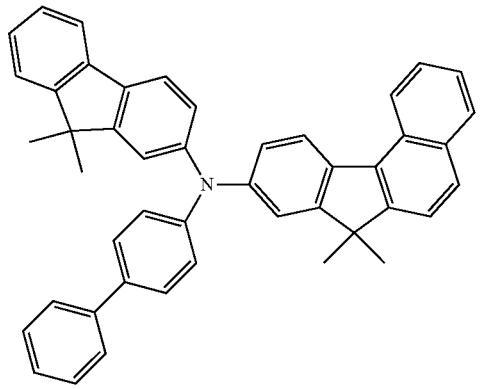
H-1-11
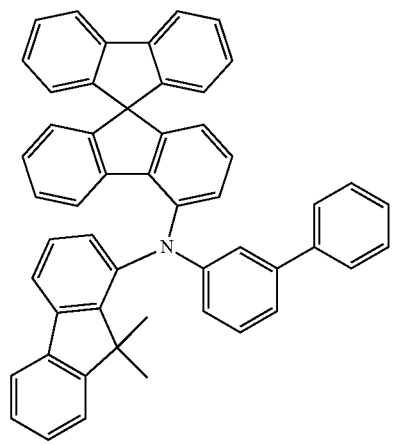
H-1-12
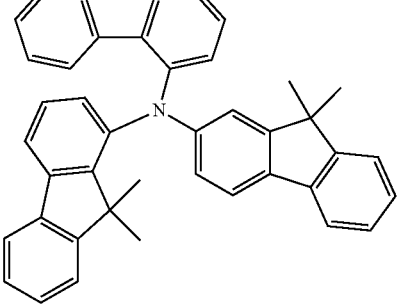
H-1-13
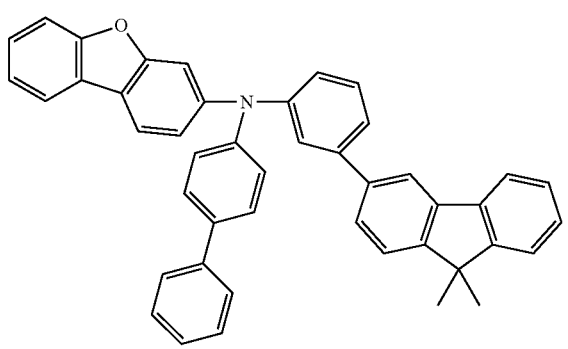
H-1-14
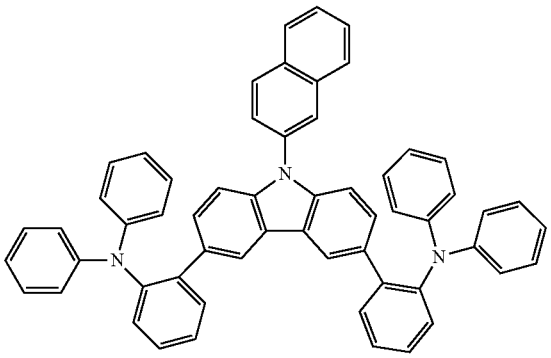
H-1-15
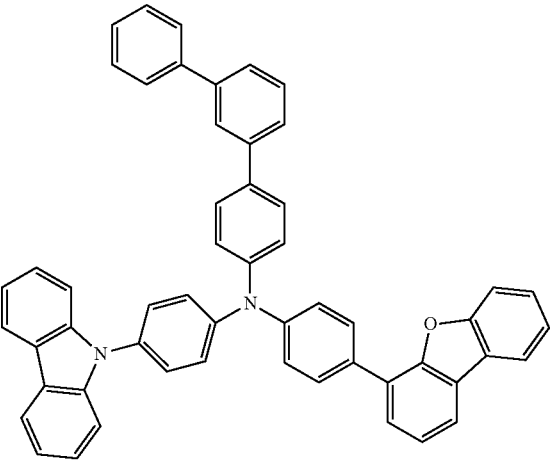
H-1-16
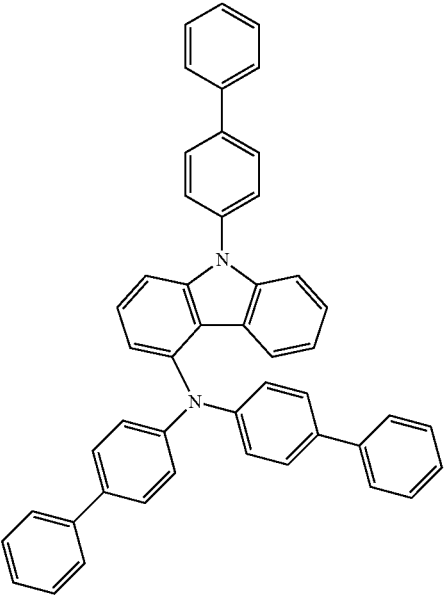

H-1-17

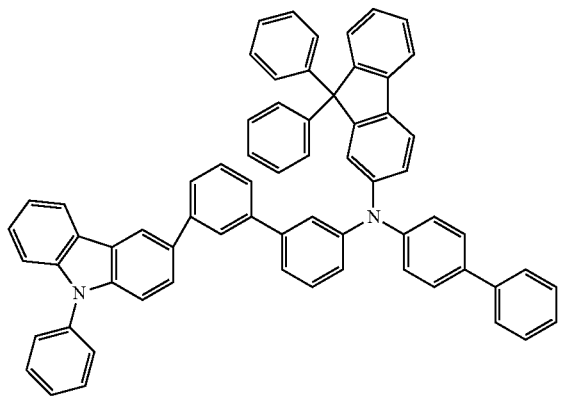

H-1-18

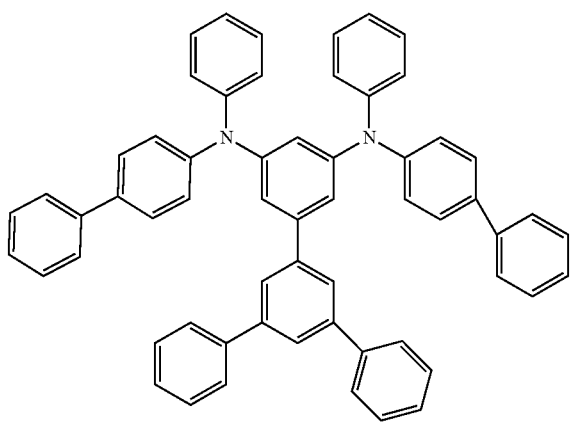

H-1-19

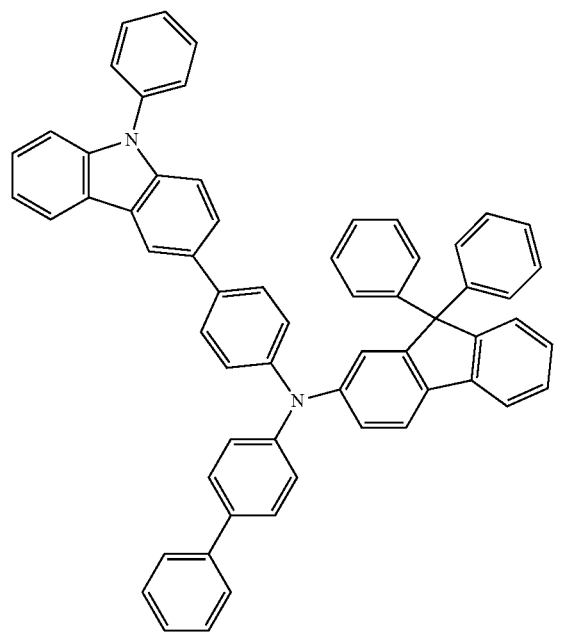

H-1-20

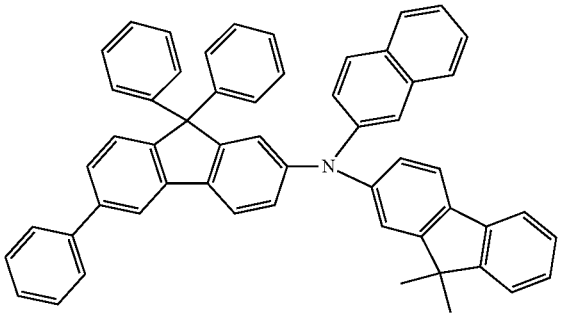

The hole transport region HTR may include a phthalocyanine compound (such as copper phthalocyanine); $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4''-[tris(3-methylphenyl)phenylamino]triphenylamine (m-MTDATA), 4,4'4''-tris(N,N-diphenylamino)triphenylamine (TDATA), 4,4',4''-tris[N(2-naphthyl)-N-phenylamino]-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(naphthalen-1-yl)-N,N'-diphenyl-benzidine (NPB), triphenylamine-containing polyether ketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may include carbazole derivatives (such as N-phenyl carbazole and/or polyvinyl carbazole), fluorene derivatives, N,N'-bis(3-methylphenyl)-N,N'-diphenyl-[1,1-biphenyl]-4,4'-diamine (TPD), triphenylamine derivatives (such as 4,4',4''-tris(N-carbazolyl)triphenylamine (TCTA)), N,N'-di(naphthalen-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

In some embodiments, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compound of the hole transport region in at least one of a hole injection layer HIL, a hole transport layer HTL, or an electron blocking layer EBL.

The thickness of the hole transport region HTR may be about 100 Å to about 10,000 Å, for example, about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 30 Å to about 1,000 Å. For example, when the hole transport region HTR includes the electron blocking layer EBL, the electron blocking layer EBL may have a thickness of about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without a substantial increase in a driving voltage.

The hole transport region HTR may further include a charge generating material to increase conductivity in addition to the above-described materials. The charge generating material may be dispersed substantially uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but embodiments of the present disclosure are not limited thereto. For example, the p-dopant may include metal halides (such as CuI and/or RbI), quinone derivatives (such as tetracyanoquinodimethane (TCNQ) and/or 2,3,5,6-tetrafluoro-7,7'8,8-tetracyanoquinodimethane (F4-TCNQ)), metal oxides (such as tungsten oxide and/or molybdenum oxide), dipyrazino[2,3-f:2',3'-h]quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but embodiments of the present disclosure are not limited thereto.

As described above, the hole transport region HTR may further include at least one of the buffer layer or the electron blocking layer EBL in addition to the hole injection layer HIL and the hole transport layer HTL. The buffer layer may compensate for a resonance distance of the wavelength of light emitted from the emission layer EML, and may thus increase light emission efficiency. Materials that may be included in the hole transport region HTR may also be included in the buffer layer. The electron blocking layer EBL may prevent or reduce electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

The emission layer EML in the organic electroluminescence device ED of an embodiment may include an organometallic compound of an embodiment which will be described below.

An organometallic compound according to an embodiment may be represented by Formula 1:

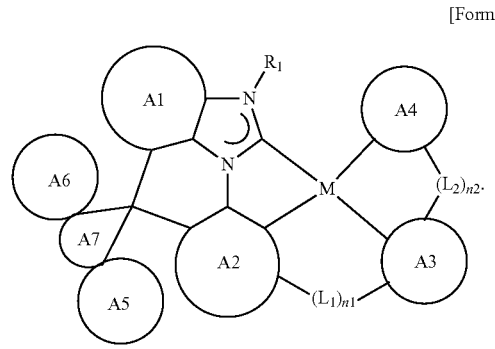

[Formula 1]

In Formula 1, M may be platinum (Pt), lead (Pd), copper (Cu), silver (Ag), gold (Au), rhodium (Rh), iridium (Ir), ruthenium (Ru), or osmium (Os).

In Formula 1, ring A1 to ring A7 may each independently be a substituted or unsubstituted hydrocarbon ring having 5 to 60 ring-forming carbon atoms, or a substituted or unsubstituted heterocycle having 1 to 60 ring-forming carbon atoms.

In Formula 1, $L_1$ and $L_2$ may each independently be a direct linkage, *—S—*', *—C($R_{11}$)($R_{12}$)—*', *—C($R_{13}$)=*', *=C($R_{14}$)—*', *—C($R_{15}$)=C($R_{16}$)—*', *—C(=O)—*', *—C(=S)—*', *—C≡C—*', *—B($R_{17}$)—*', *—N($R_{18}$)—*', *—P($R_{19}$)—*', *—Si($R_{20}$)($R_{21}$)—*', *—P($R_{22}$)($R_{23}$)—*', or *—Ge($R_{24}$)($R_{25}$)—*'. In $L_1$ and $L_2$, -* and -*' refer to positions connected to any one among ring A2 to ring A4.

In Formula 1, $R_{11}$ to $R_{25}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula 1, $R_1$ may be a hydrogen atom, a deuterium atom, a halogen atom, a substituted or unsubstituted thiol group, a substituted or unsubstituted oxy group, a substituted or unsubstituted boron group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 1, n1 and n2 may each independently be an integer of 0 to 3. In some embodiments, when n1 is 2 or more, a plurality of $L_1$'s may each independently be the same as or different from each other, and when n2 is 2 or more, a plurality of $L_2$'s may each independently be the same as or different from each other.

In an embodiment, M may be iridium (Ir) or platinum (Pt).

In an embodiment, ring A1 to ring A7 in Formula 1 may each independently be a pentagonal (e.g., five-membered) ring, a hexagonal (e.g., six-membered) ring, or a heptagonal (e.g., seven-membered) ring.

In some embodiments, the organometallic compound represented by Formula 1 may be represented by Formula 2:

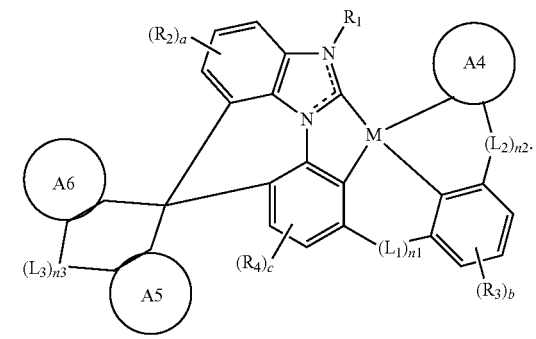

[Formula 2]

In Formula 2, $R_2$ to $R_4$ may each independently be a hydrogen atom, a deuterium atom, a halogen atom, a substituted or unsubstituted thiol group, a substituted or unsubstituted oxy group, a substituted or unsubstituted boron group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 2, a and b may each independently be an integer of 0 to 5, and when a is an integer of 2 or more, a plurality of $R_2$'s may each independently be the same as or different from each other, and when b is an integer of 2 or more, a plurality of $R_3$'s may be the same as or different from each other.

In Formula 2, c may be an integer of 0 to 2. In some embodiments, when c is 2 or more, a plurality of $R_4$'s may be the same as or different from each other.

In Formula 2, $L_3$ may be a direct linkage, *—O—*', *—S—*', *—C($R_{26}$)($R_{27}$)—*', *—C($R_{28}$)=*', *=C($R_{29}$)—*', *—C($R_{30}$)=C($R_{31}$)—*', *—C(=O)—*', *—C(=S)—*', *—C≡C—*', *—B($R_{32}$)—*', *—N($R_{33}$)—*', *—P($R_{34}$)—*', *—Si($R_{35}$)($R_{36}$)—*', *—P($R_{37}$)($R_{38}$)—*', or *—Ge($R_{39}$)($R_{40}$)—*'. In $L_3$, -* and -*' refer to positions connected to any one of ring A5 or ring A6.

In Formula 2, $R_{26}$ to $R_{40}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula 2, n3 may be an integer of 0 to 3, when n3 is 2 or more, a plurality of $L_3$'s may be the same as or different from each other.

In Formula 2, M, ring A4 to ring A6, $R_1$, $L_1$, $L_2$, n1 and n2 may each independently be the same as defined in Formula 1.

In an embodiment, the organometallic compound represented by Formula 2 may be represented by Formula 3:

[Formula 3]

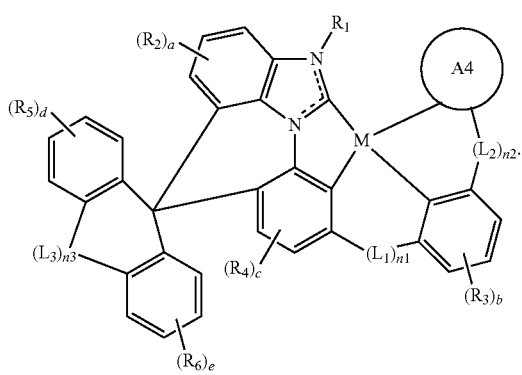

In Formula 3, $R_5$ and $R_6$ may each independently be a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 3, d and e may each independently be an integer of 0 to 4. In some embodiments, when d is 2 or more, a plurality of $R_5$'s may be the same as or different from each other, and when e is 2 or more, a plurality of $R_6$'s may be the same as or different from each other.

In Formula 3, M, ring A4, $R_1$ to $R_4$, a to c, $L_1$ to $L_3$, and n1 to n3 may each independently be the same as defined in Formula 2.

In an embodiment, the organometallic compound represented by Formula 3 may be represented by any one among Formula 4-1 to Formula 4-3:

[Formula 4-1]

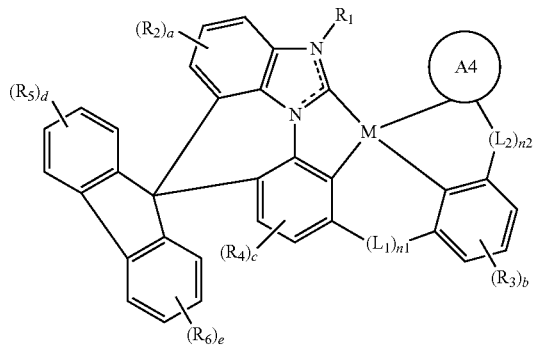

[Formula 4-2]

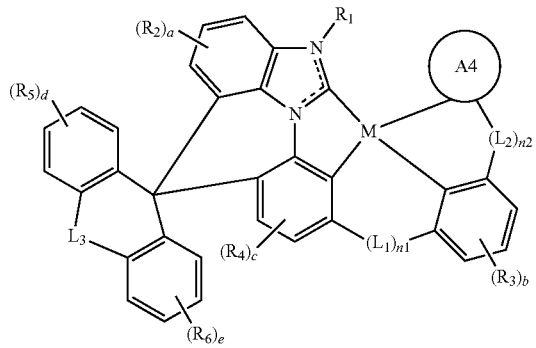

[Formula 4-3]

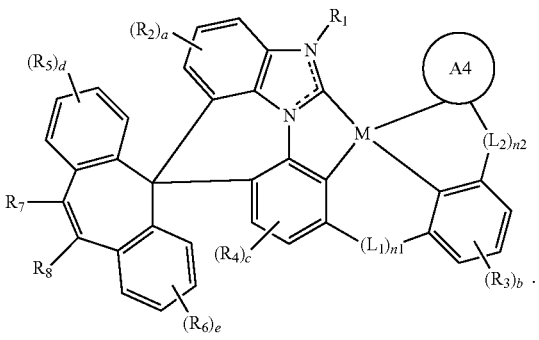

In Formula 4-2, $L_3$ may be *—O—*, *—S—*, *—C($R_{26}$)($R_{27}$)—*', or N($R_{33}$)—*'. In $L_3$, -* and -*' refer to positions connected to a benzene ring, and $R_{26}$, $R_{27}$, and $R_{33}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula 4-3, $R_7$ and $R_8$ may each independently be a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 4-1 to Formula 4-3, M, ring A4, $R_1$ to $R_6$, a to e, $L_1$ and $L_2$, n1 and n2 may each independently be the same as defined in Formula 3.

In an embodiment, the organometallic compound represented by Formula 3

[Formula 5]

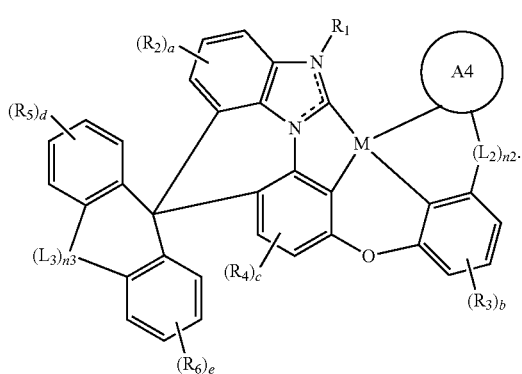

In Formula 5, M, ring A4, $R_1$ to $R_6$, b to e, $L_2$, $L_3$, n2 and n3 may each independently be the same as defined in Formula 3.

In an embodiment, the organometallic compound represented by Formula 3 may be represented by Formula 6-1 or Formula 6-2:

[Formula 6-1]

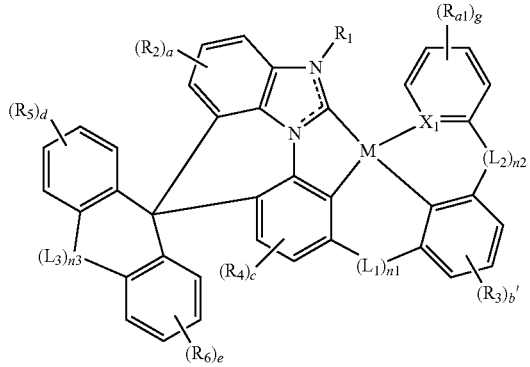

[Formula 6-2]

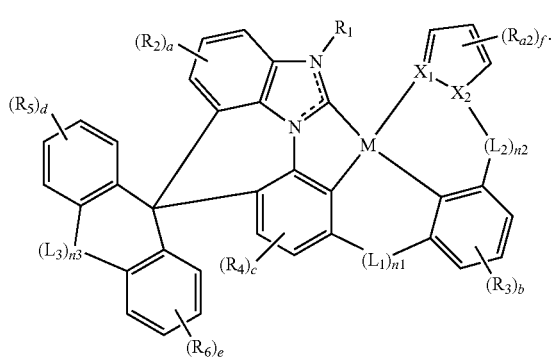

In Formula 6-1 and Formula 6-2, $X_1$ may be N or C, and $X_2$ may be N or $CR_{a3}$.

In Formula 6-1 and Formula 6-2, $R_{a1}$ to $R_{a3}$ may each independently be a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula 6-1 and Formula 6-2, g may be an integer of 0 to 4, and when g is 2 or more, a plurality of Rai's may be the same as or different from each other.

In Formula 6-1 and Formula 6-2, f may be an integer of 0 to 3, and when f is 2 or more, a plurality of $R_{a2}$'s may be the same as or different from each other.

In Formula 6-1 and Formula 6-2, M, $R_1$ to $R_6$, a to e, $L_1$ to $L_3$, n1, n2, and n3 may each independently be the same as defined in Formula 3.

In an embodiment, the organometallic compound represented by Formula 6-1 may be represented by Formula 7-1 or Formula 7-2:

[Formula 7-1]

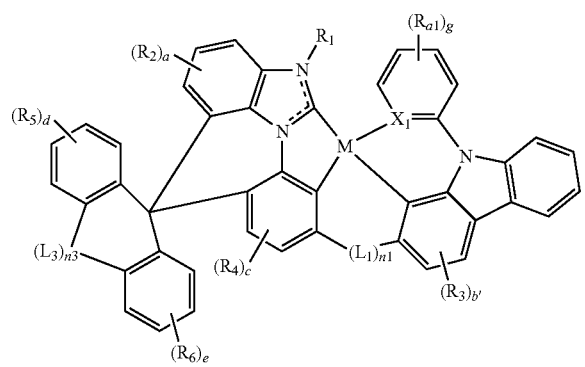

[Formula 7-2]

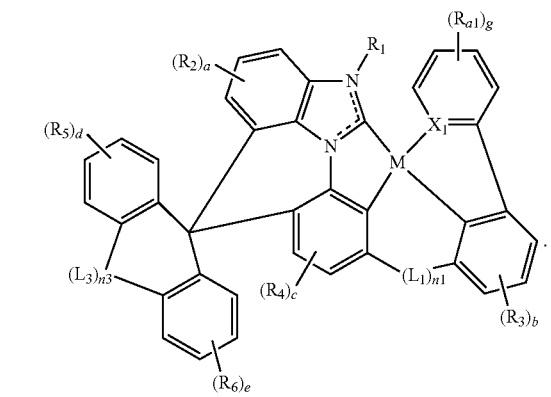

In Formula 7-1, b' may be an integer of 0 to 2, and when b' is 2 or more, a plurality of $R_3$'s may be the same as or different from each other.

In Formula 7-1 and Formula 7-2, $X_1$, M, $R_1$ to $R_6$, $R_{a1}$, a to e, g, $L_1$, $L_3$, n1 and n3 may be the same as defined in Formula 6-1.

In an embodiment, the organometallic compound represented by Formula 6-2 may be represented by Formula 8-1 or Formula 8-2:

[Formula 8-1]

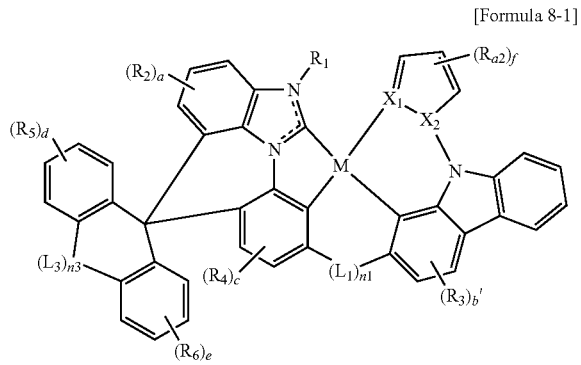

[Formula 8-2]

In Formula 8-1, b' may be an integer of 0 to 2, and when b' is 2 or more, a plurality of $R_3$'s may be the same as or different from each other.

In Formula 8-1 and Formula 8-2, $X_1$, $X_2$, M, $R_1$ to $R_6$, $R_{a2}$, a to f, $L_1$, $L_3$, n1 and n3 may each independently be the same as defined in Formula 6-2.

The organometallic compound of an embodiment may be represented by any one among the compounds represented by Compound Group 1. For example, the emission layer EML may include at least one from among the compounds represented by Compound Group 1:

[Compound Group 1]

1

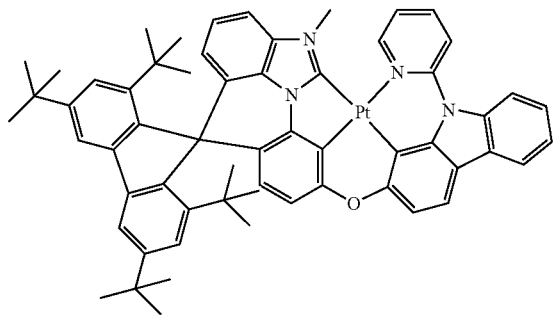

2

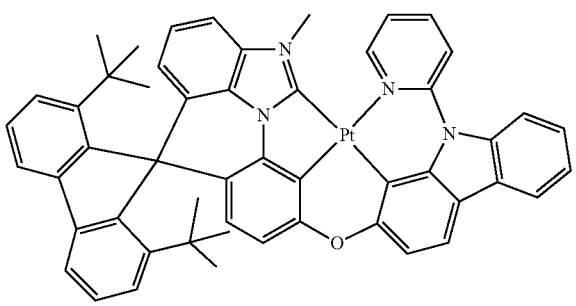

3

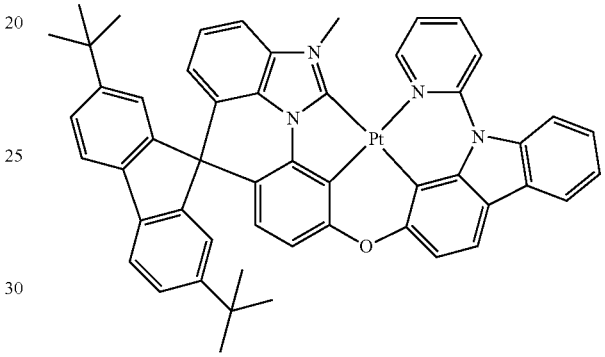

4

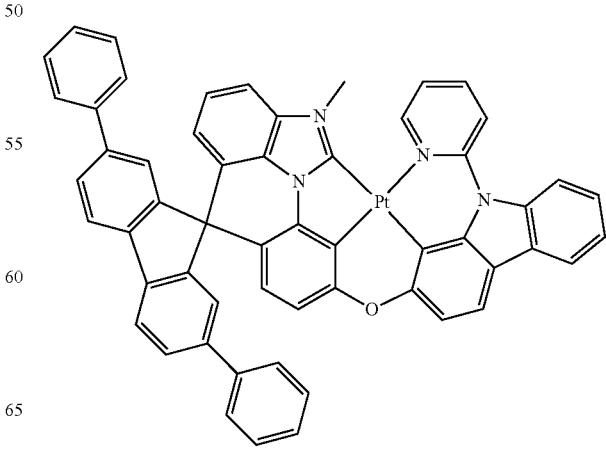

5

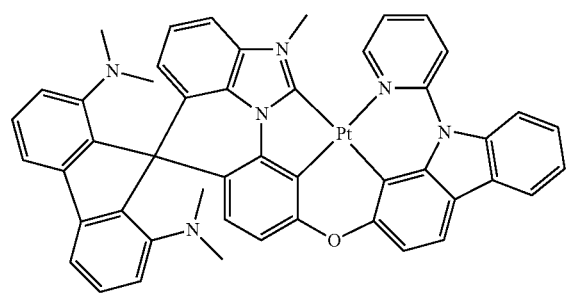
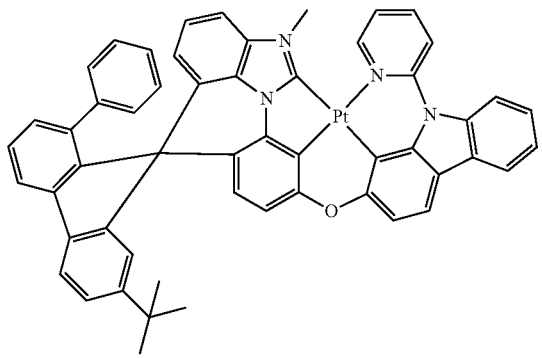
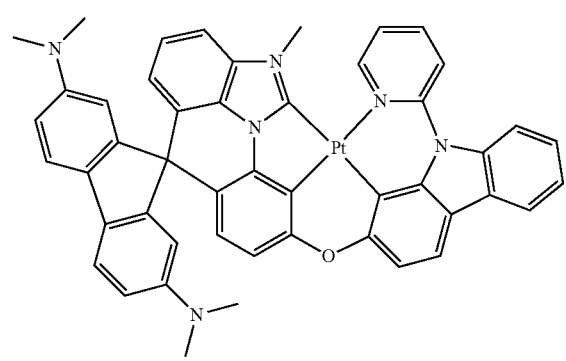
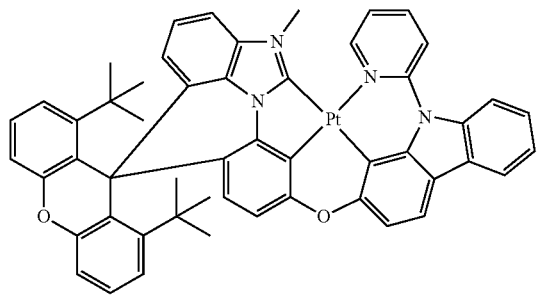
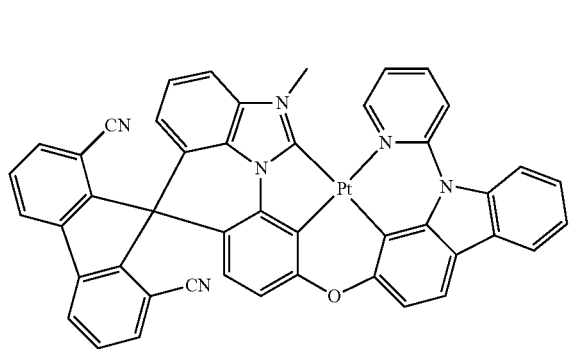
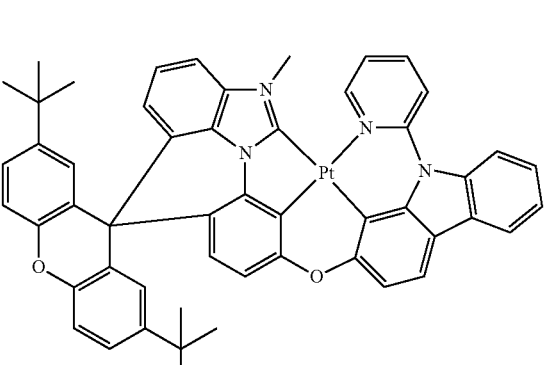
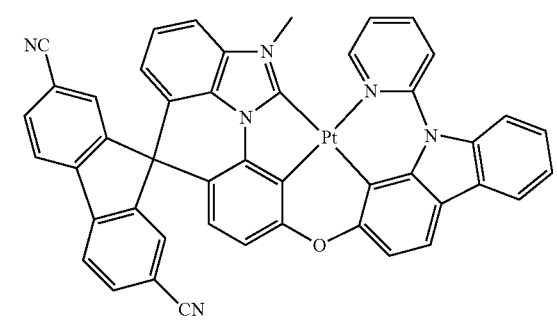
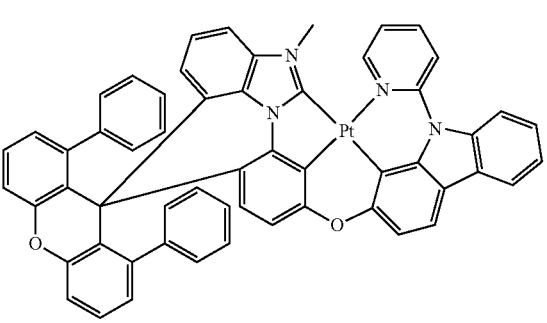

14
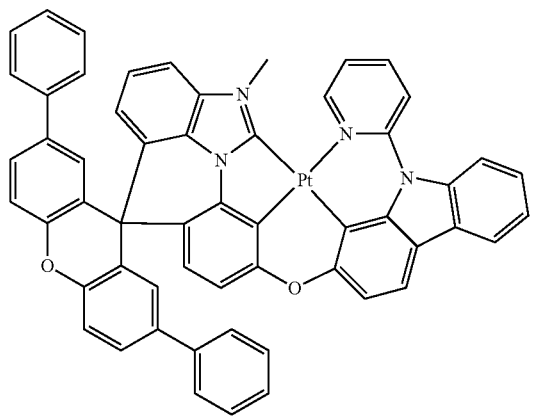
15
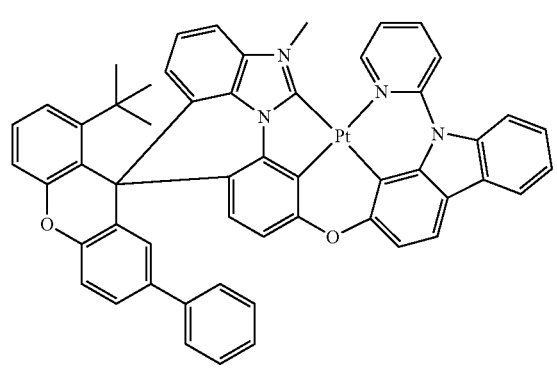
16
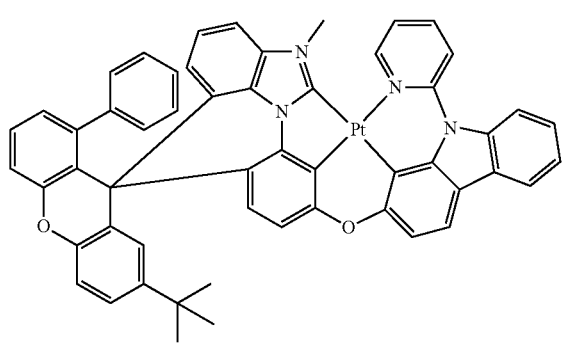
17
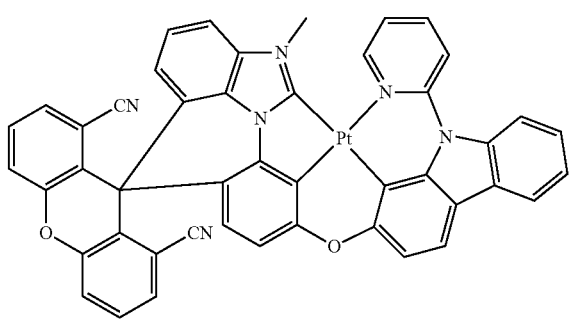
18
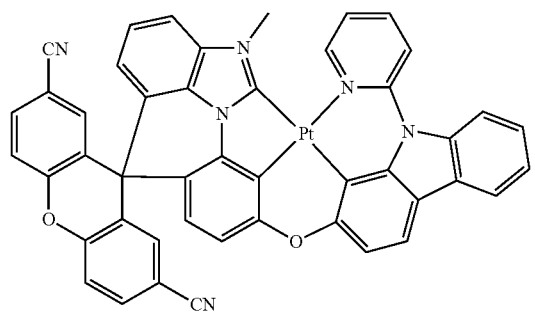
19
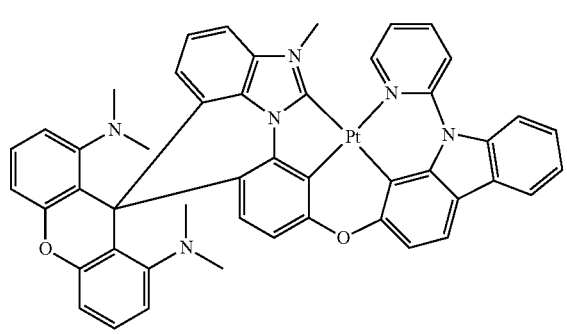
20
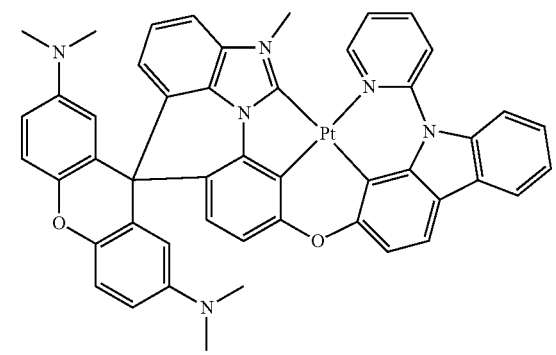
21
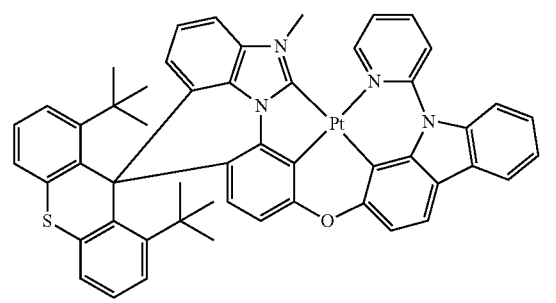

-continued
22
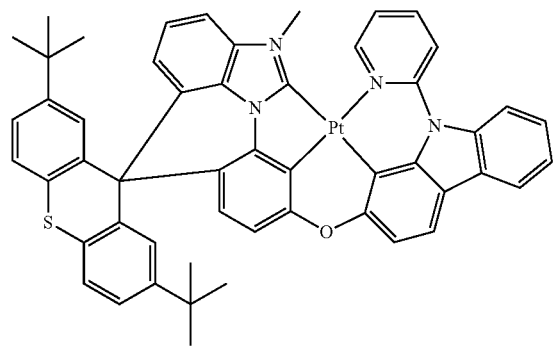
23
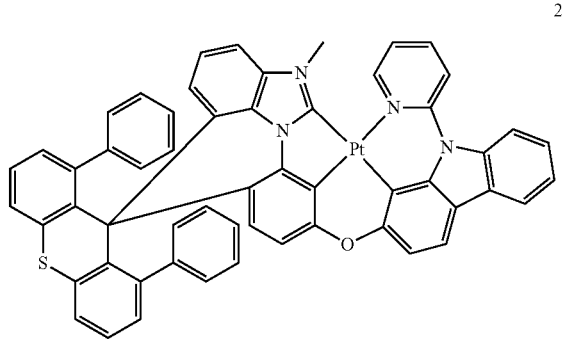
24
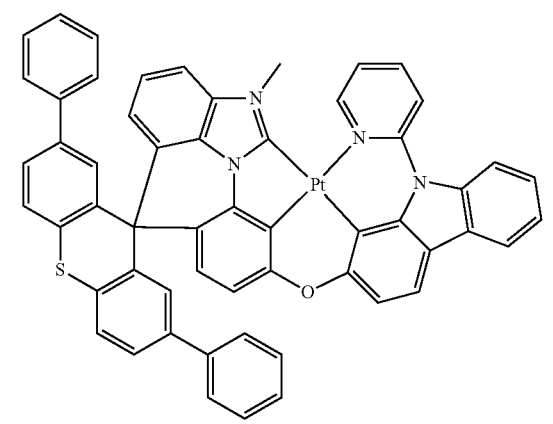
25
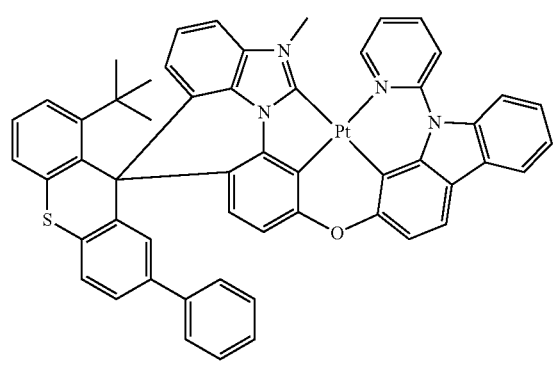
-continued
26
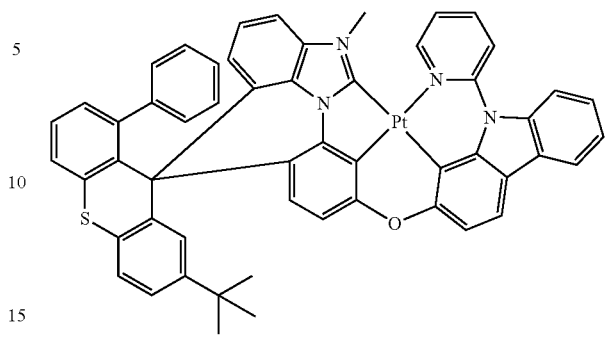
27
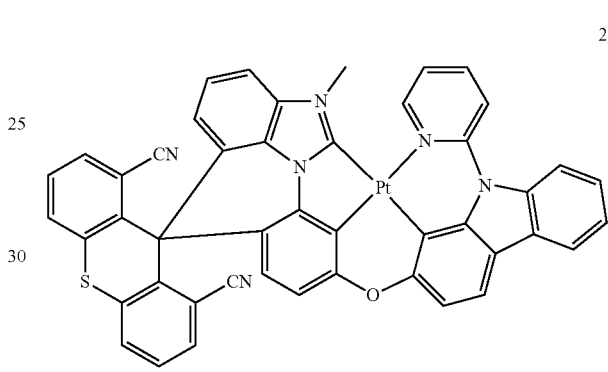
28
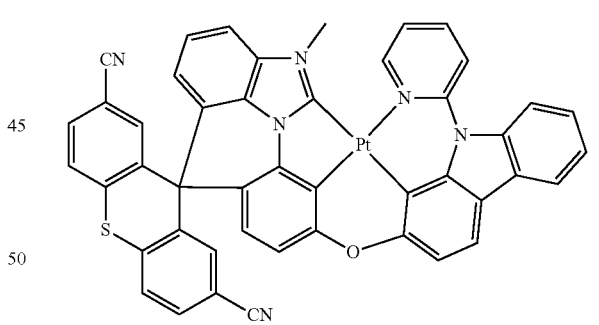
29
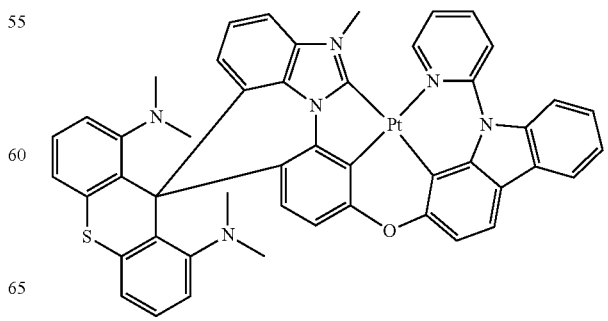

30
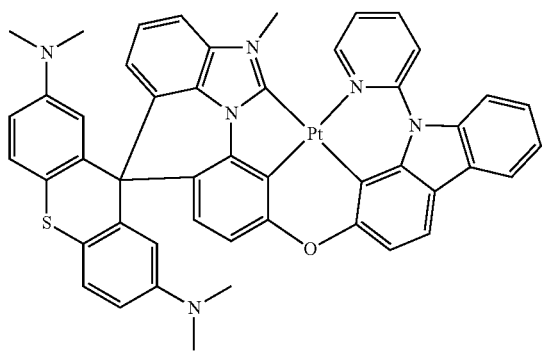
34
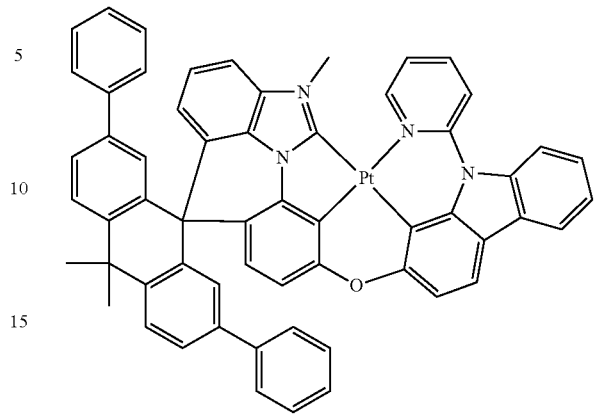
31
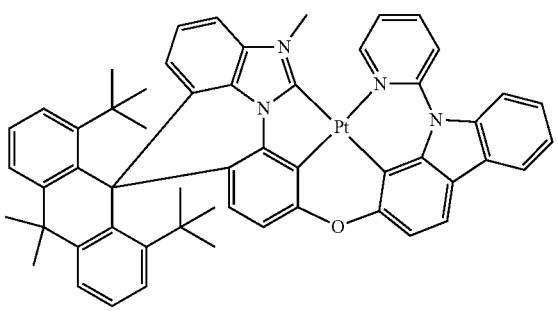
35
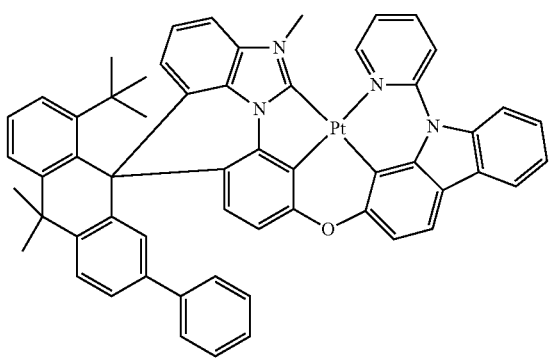
32
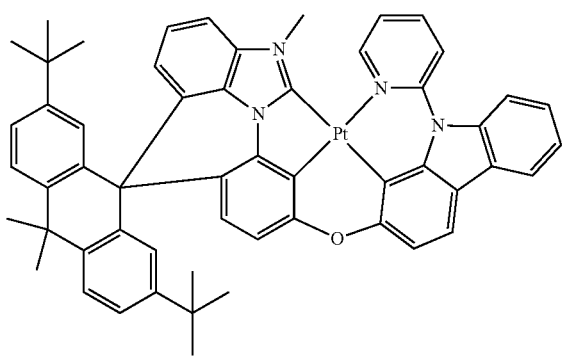
36
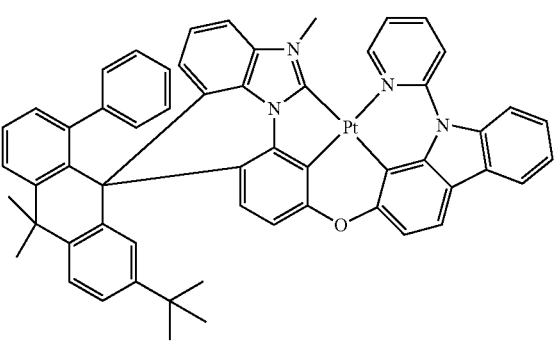
33
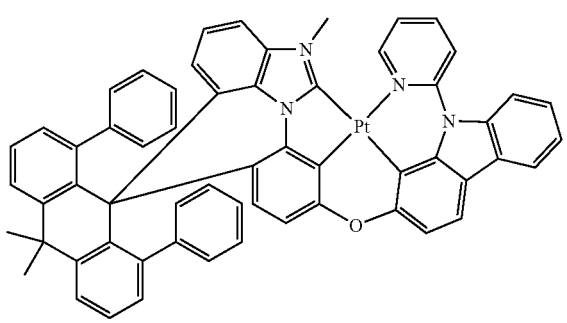
37
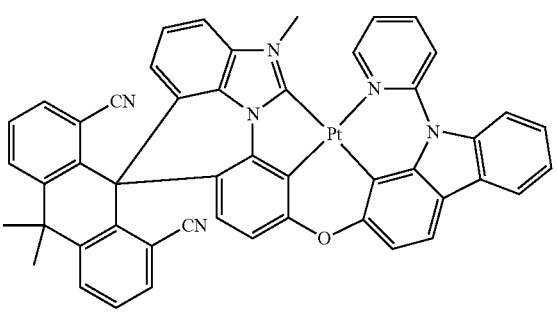

38
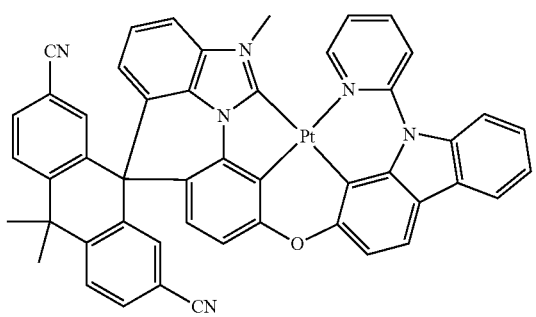
42
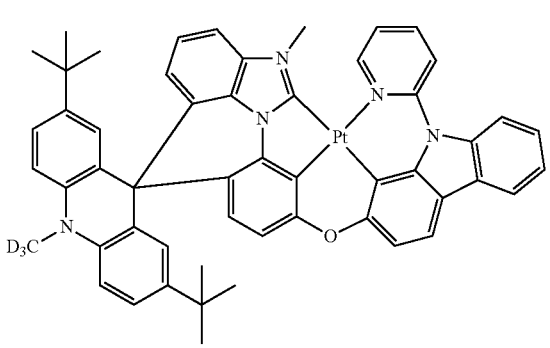
39
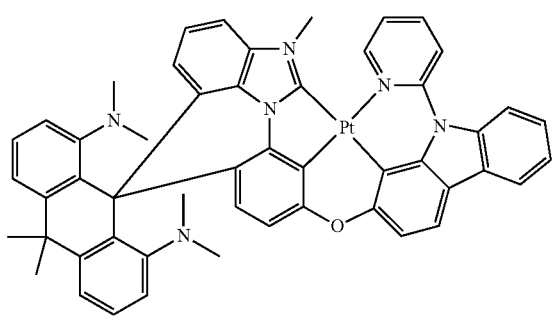
43
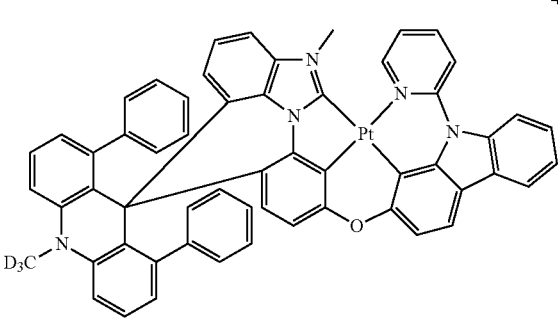
40
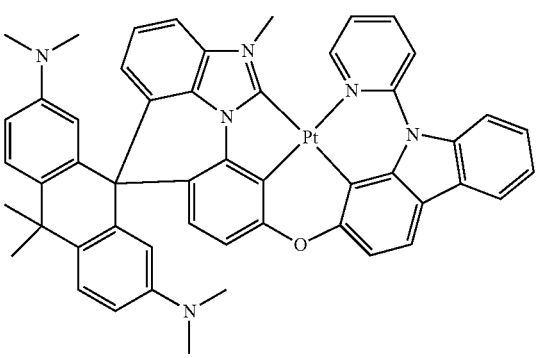
44
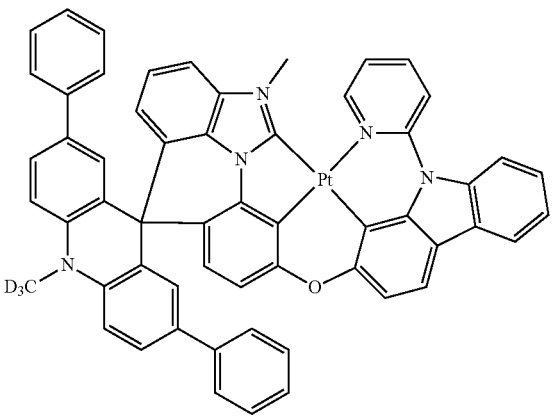
41
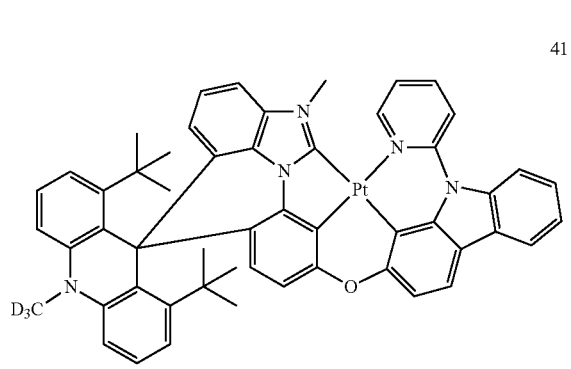
45
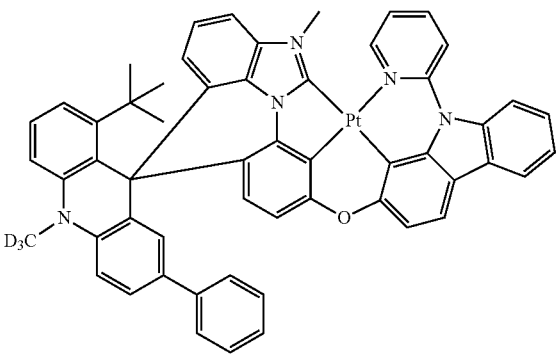

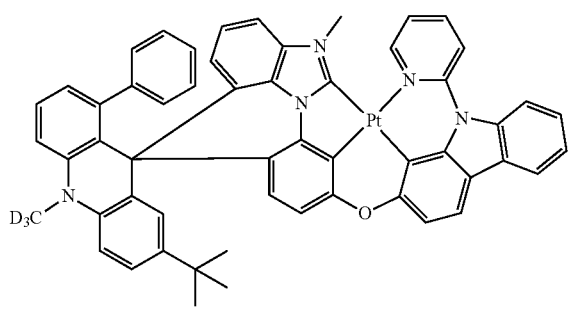
46
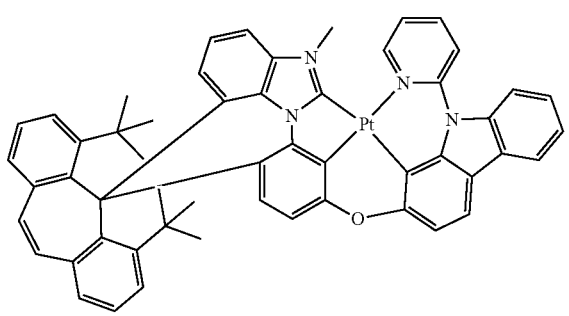
51
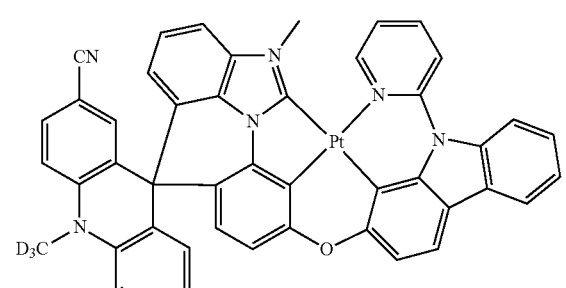
47
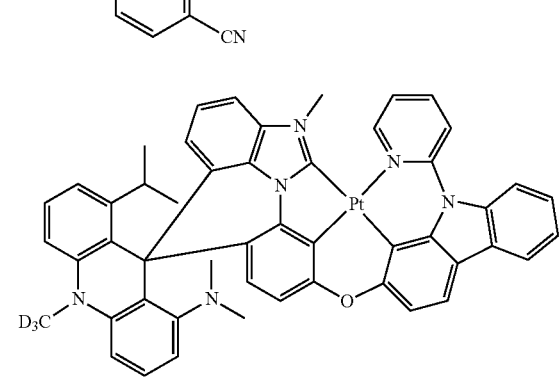
48
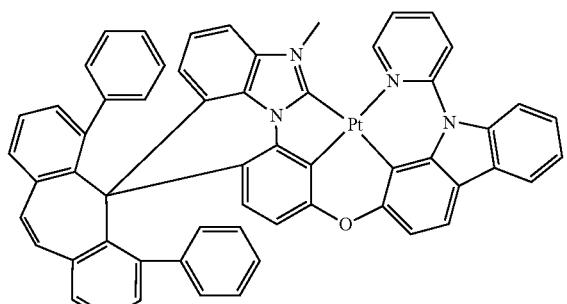
52
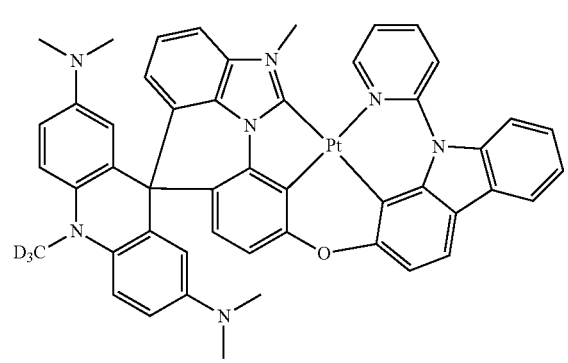
49
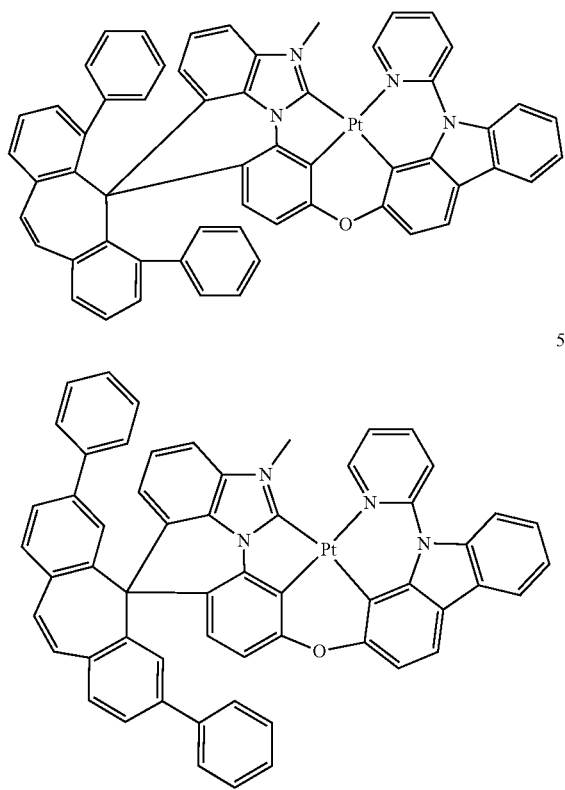
53
50
54

55
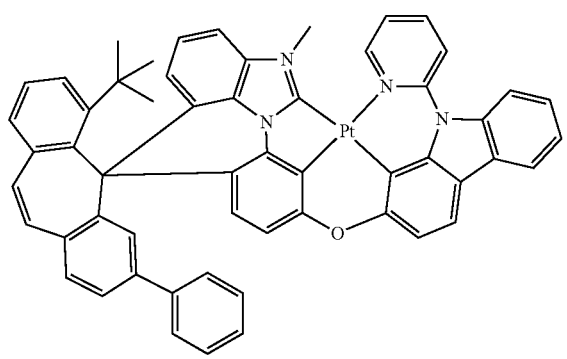
56
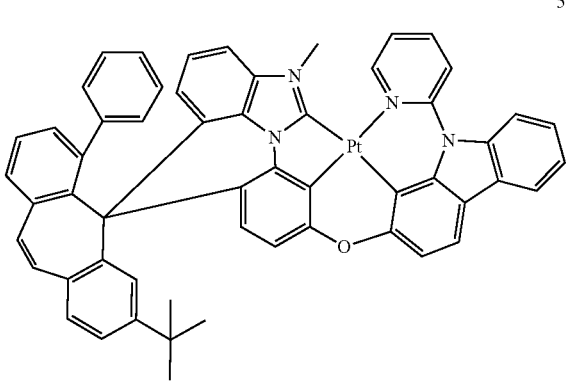
57
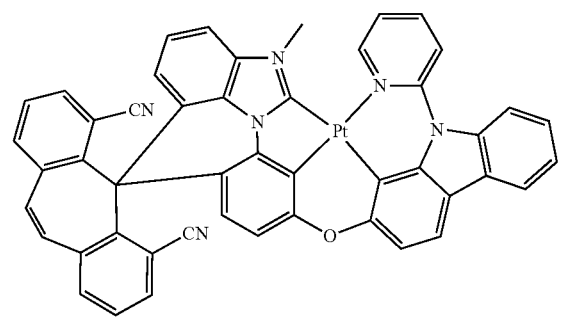
58
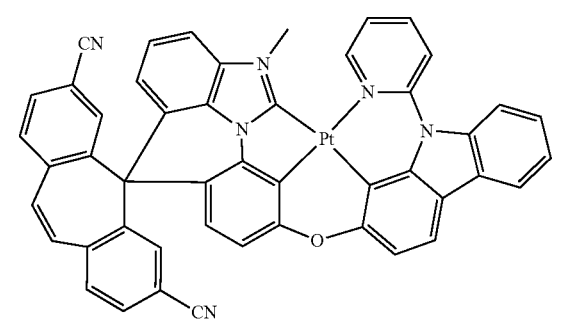
59
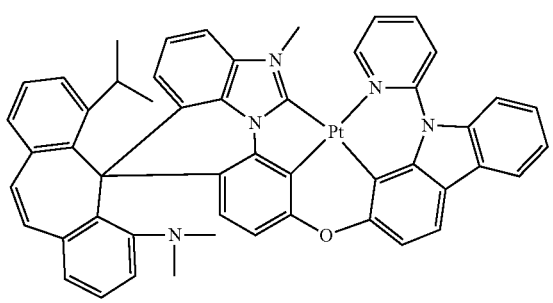
60
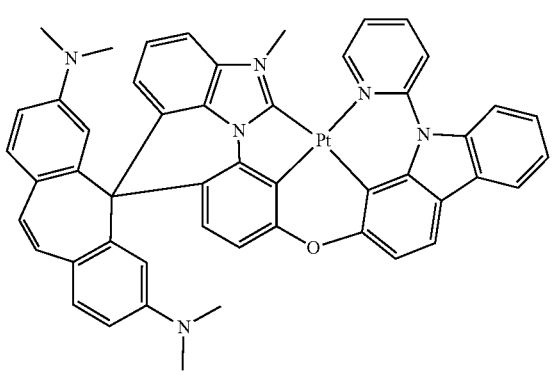
61
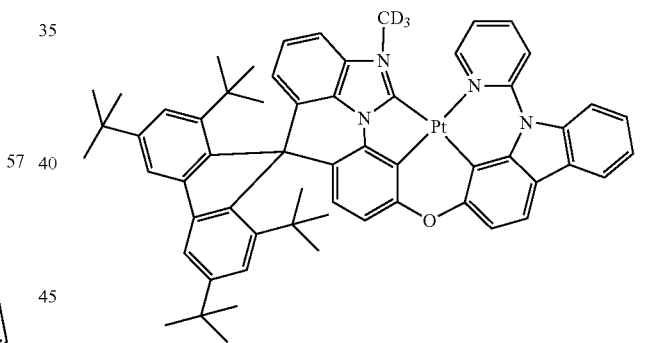
62
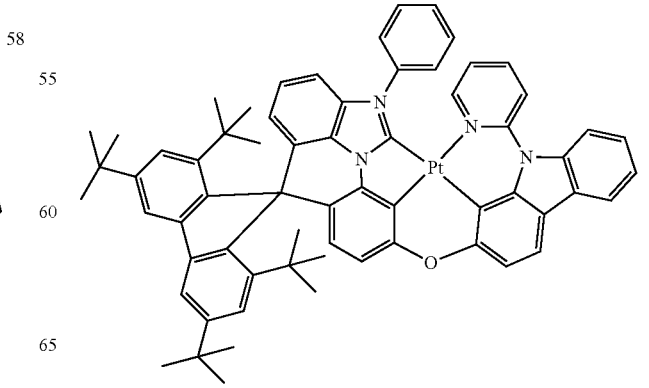

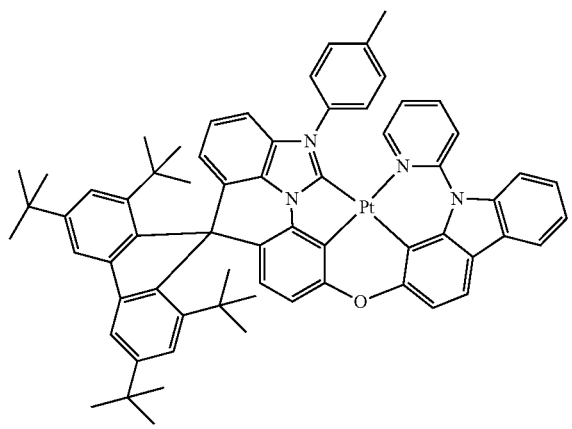
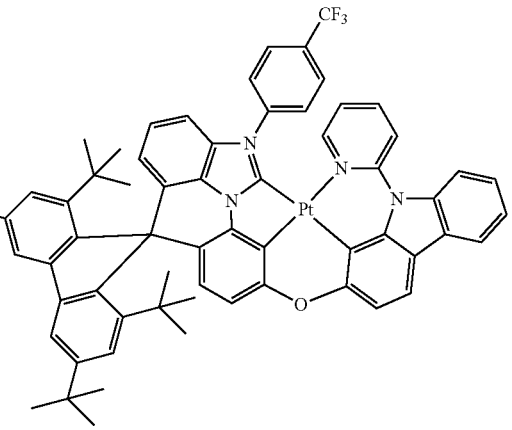
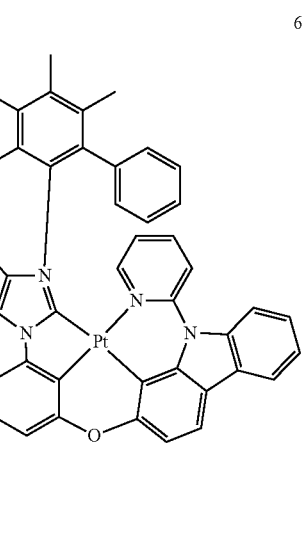

69
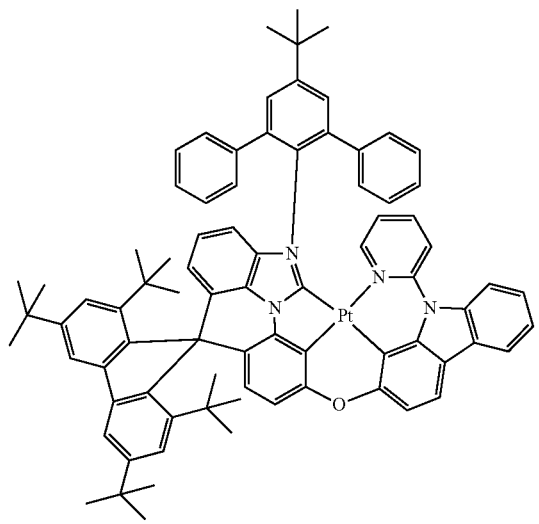
70
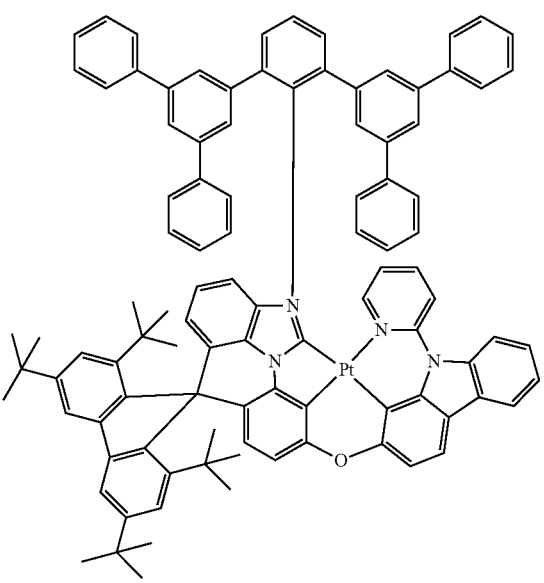
71
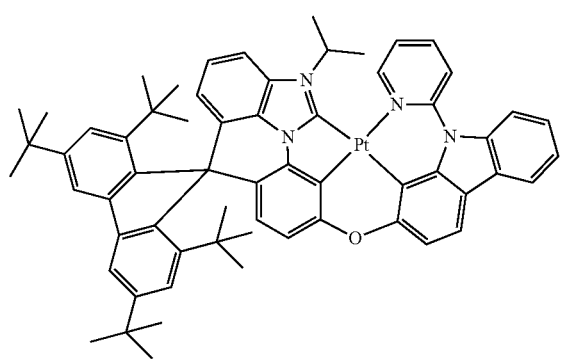
72
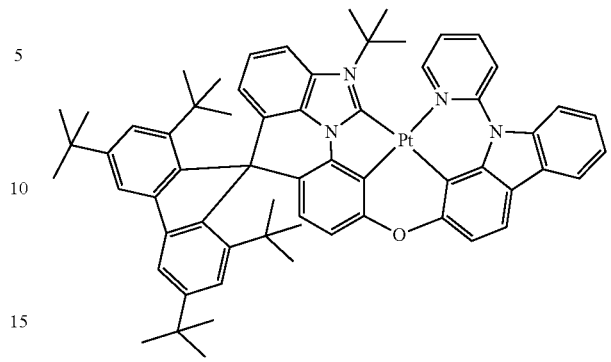
73
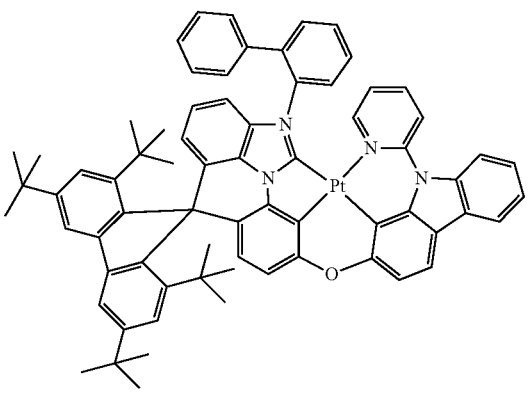
74
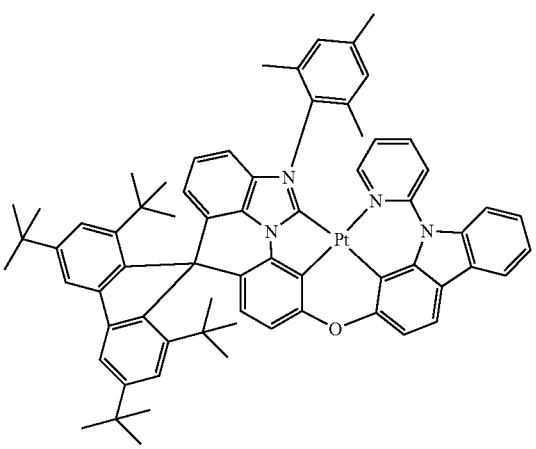
75
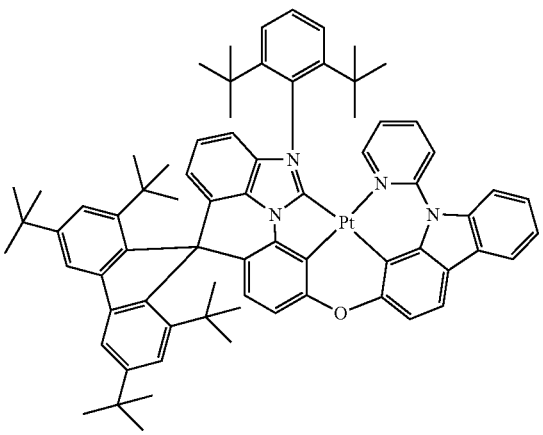

76
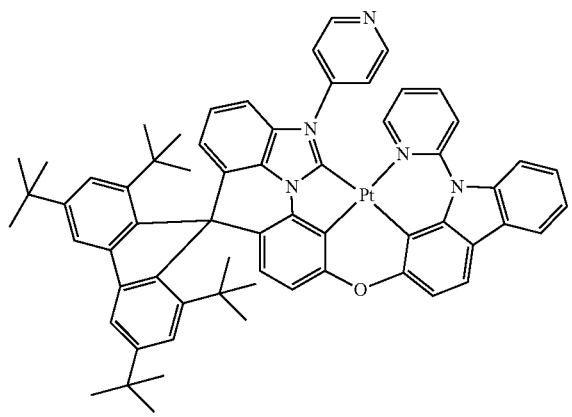
77
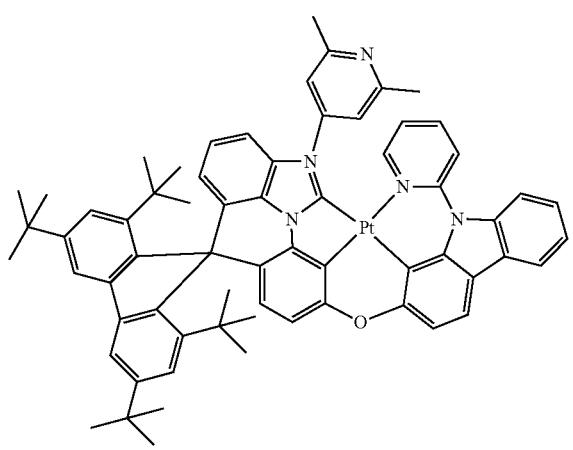
78
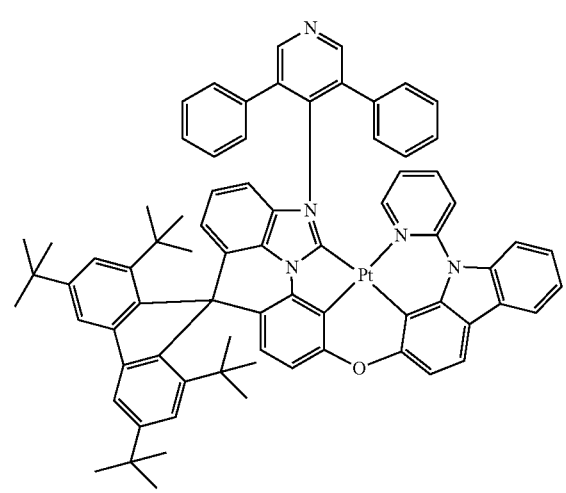
79
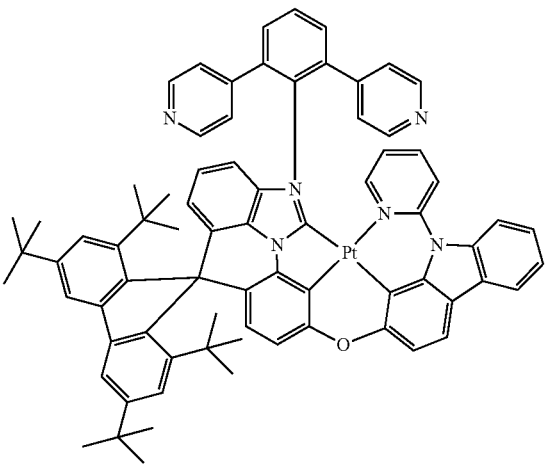
80
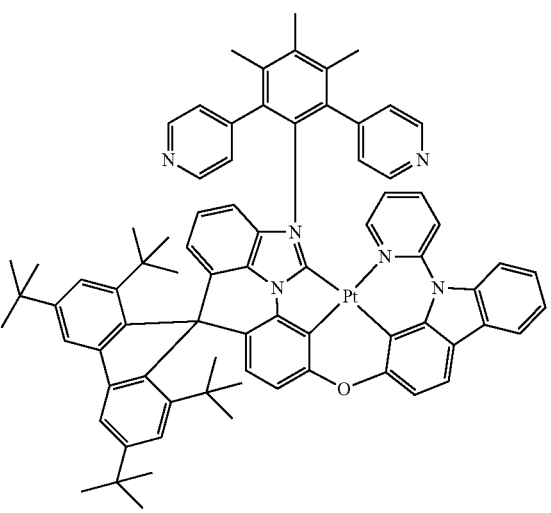
81
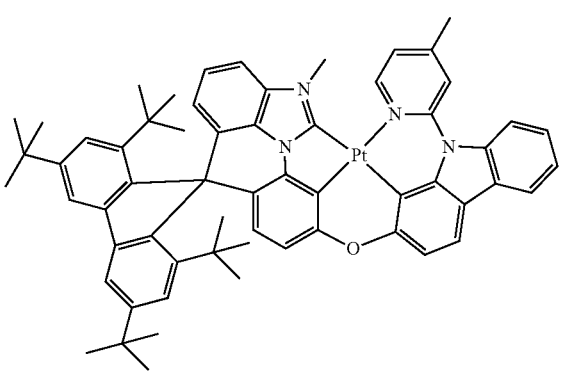

82
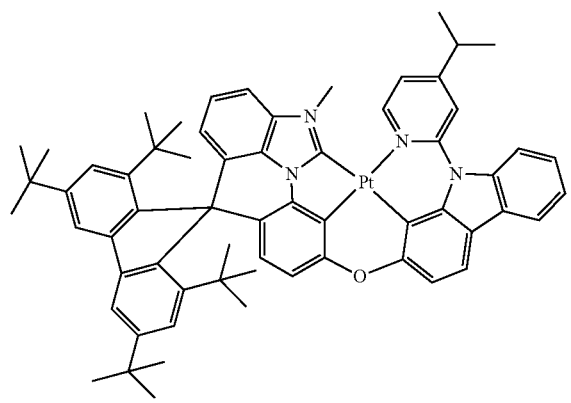
83
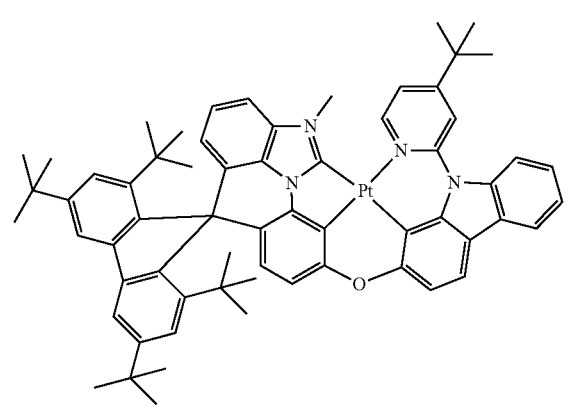
84
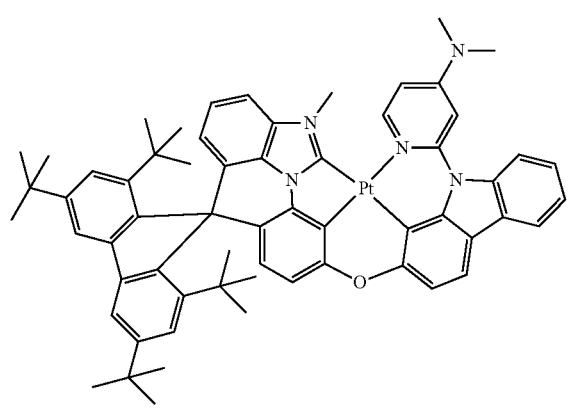
85
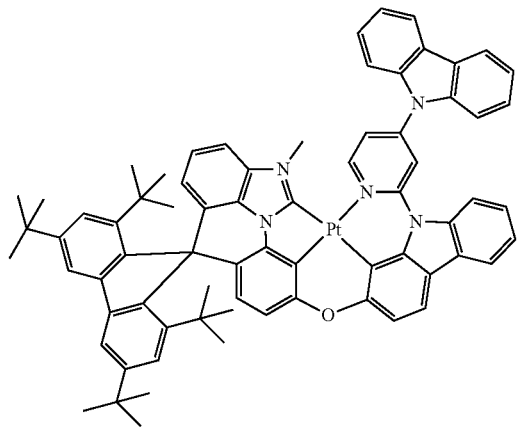
86
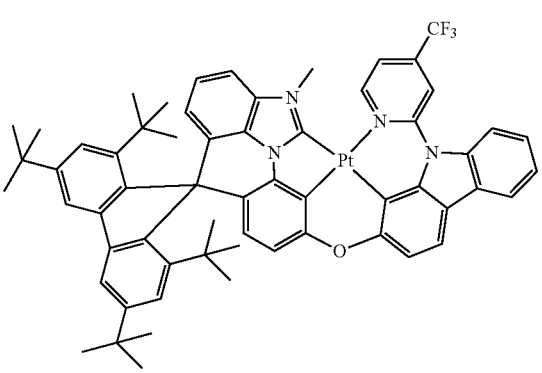
87
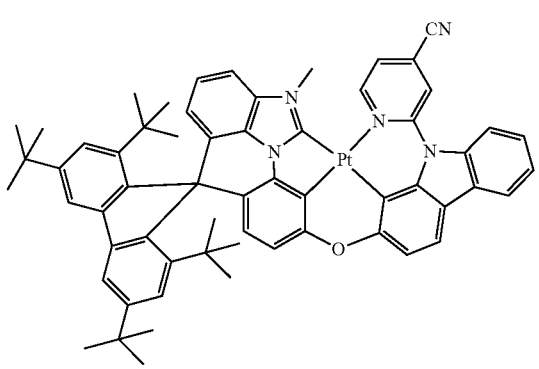
88
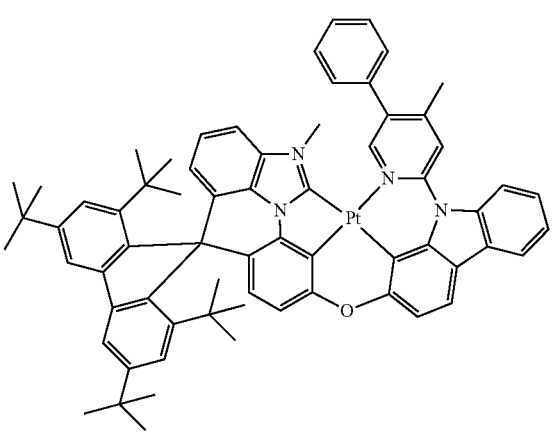

89
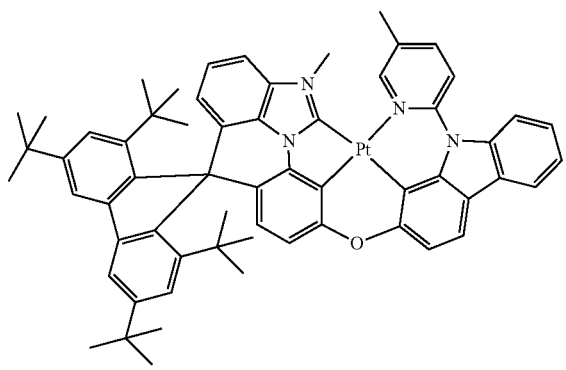
90
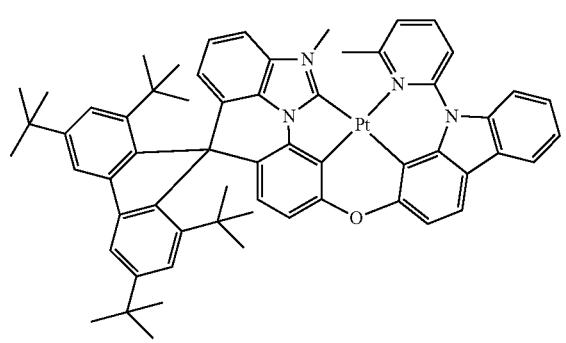
91
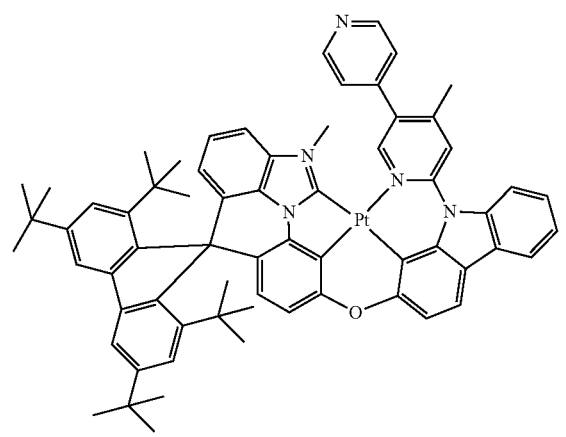
92
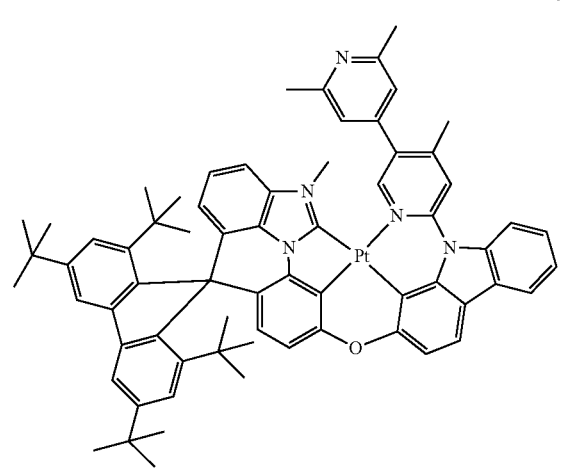
93
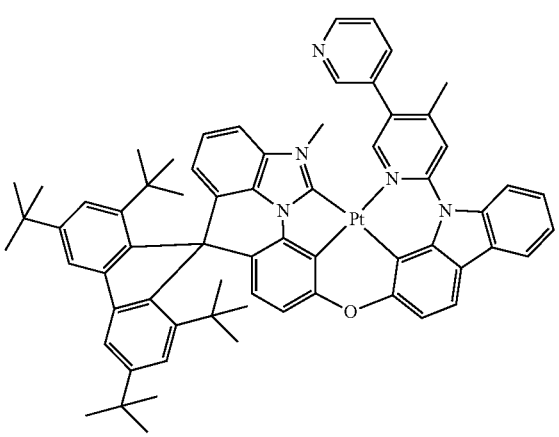
94
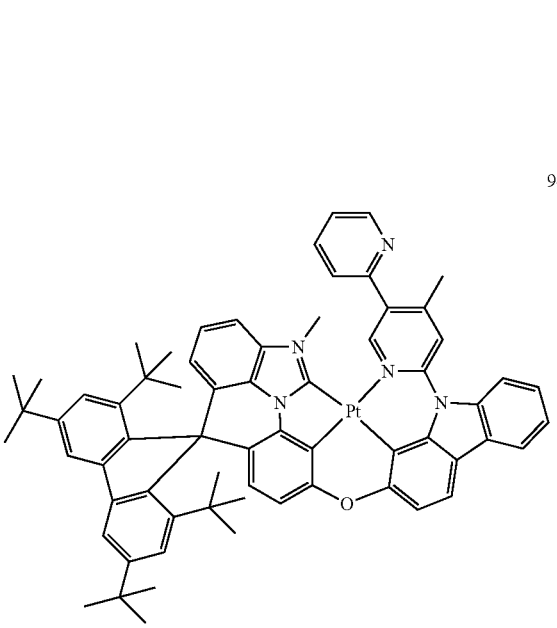
95
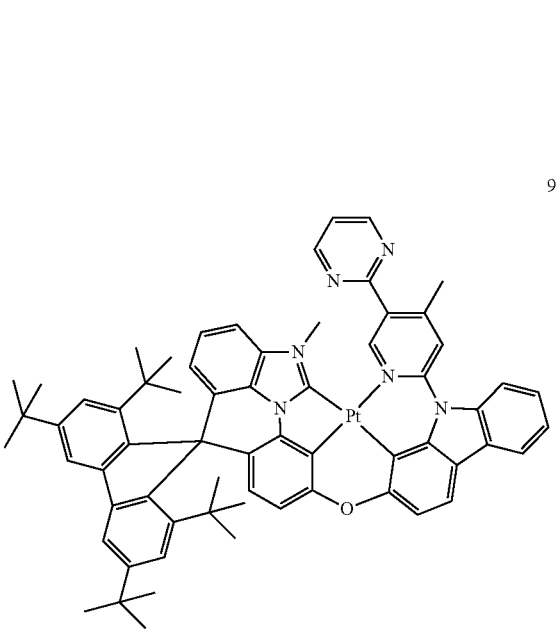

96
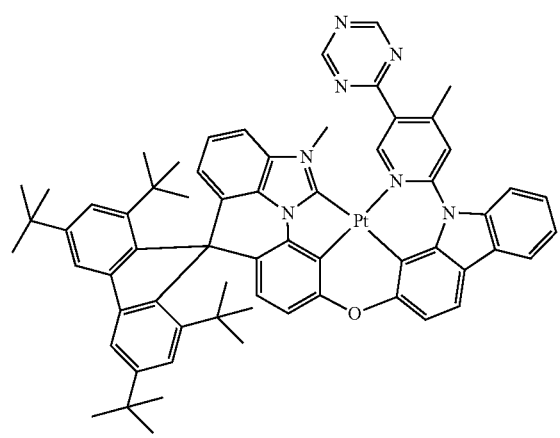
97
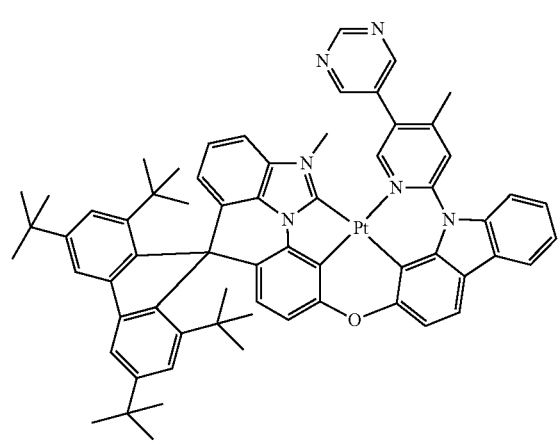
98
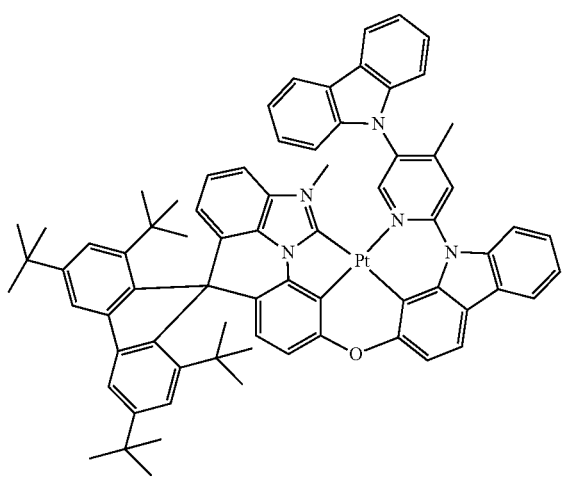
99
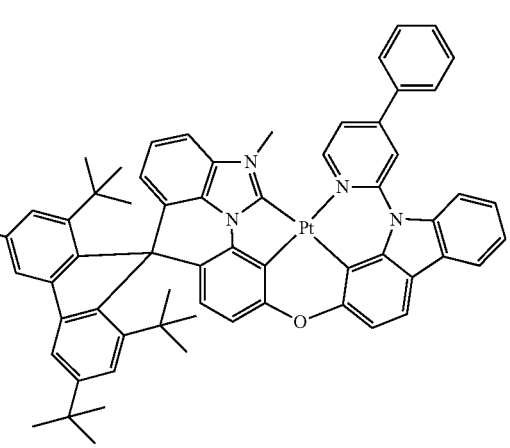
100
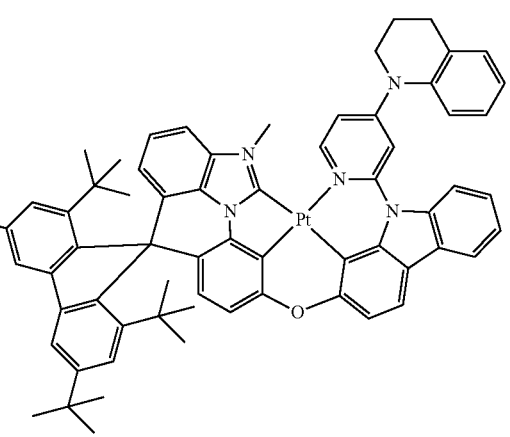
101
102
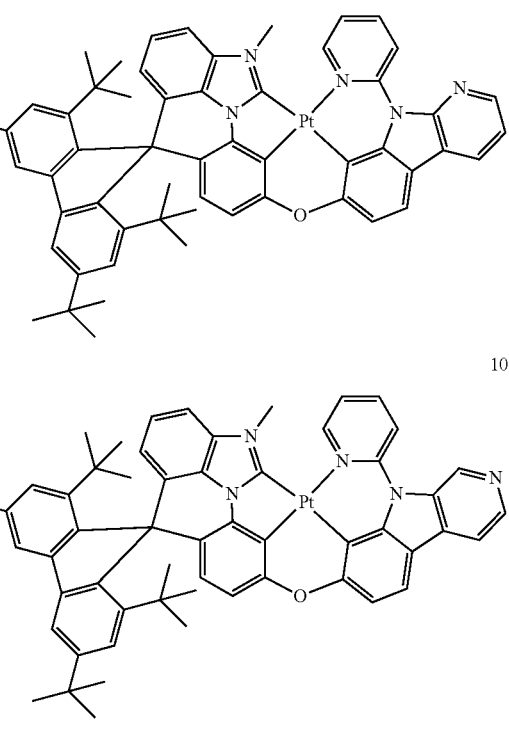

103
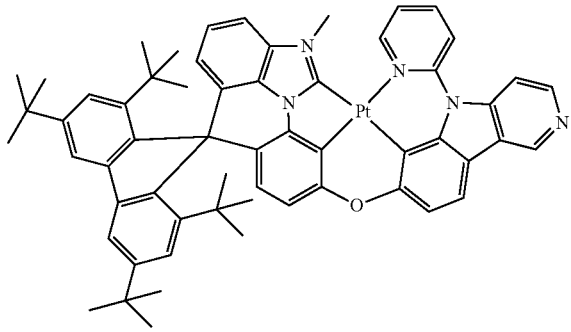
104
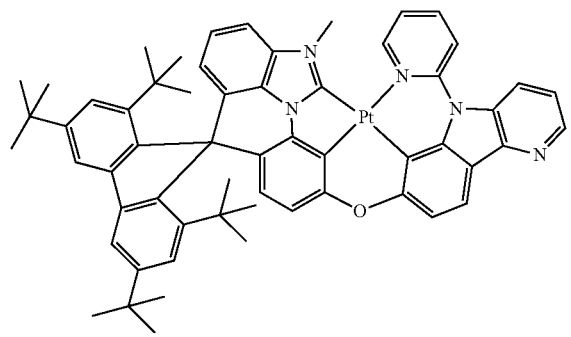
105
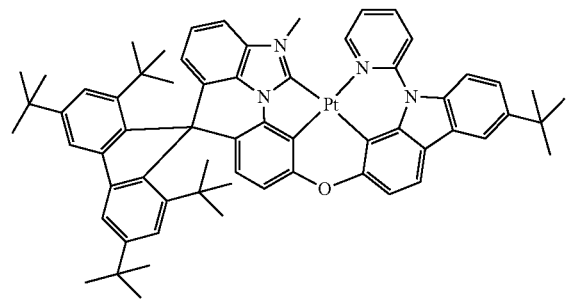
106
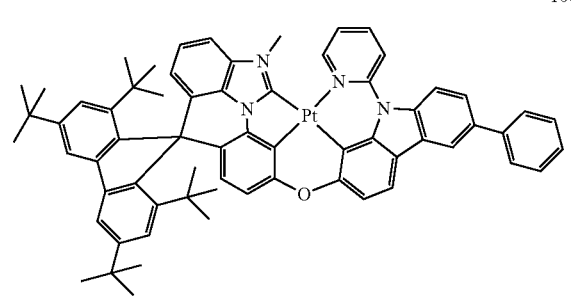
107
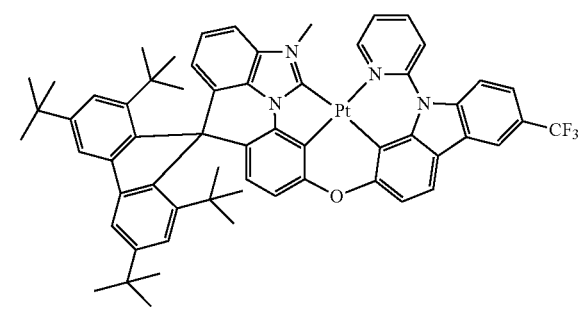
108
109
110
111
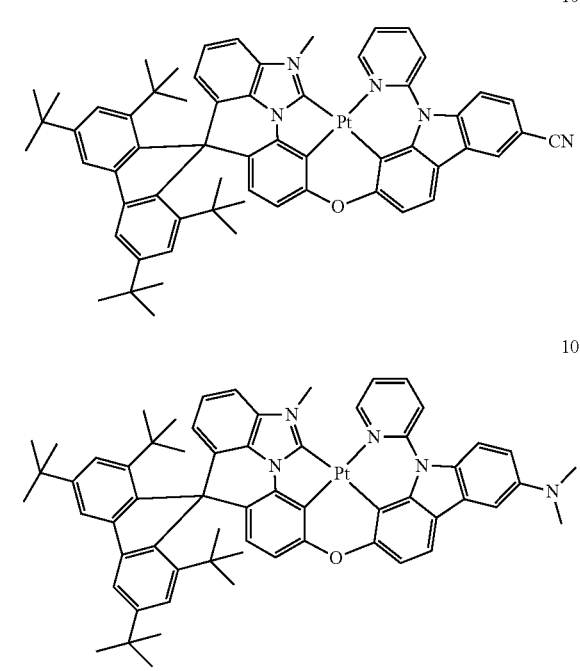
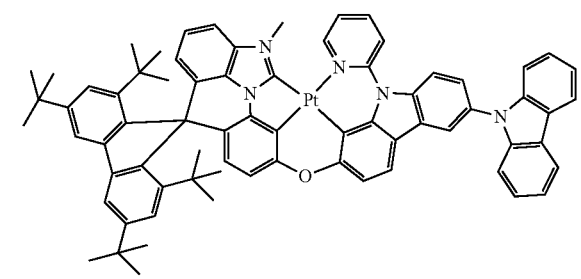
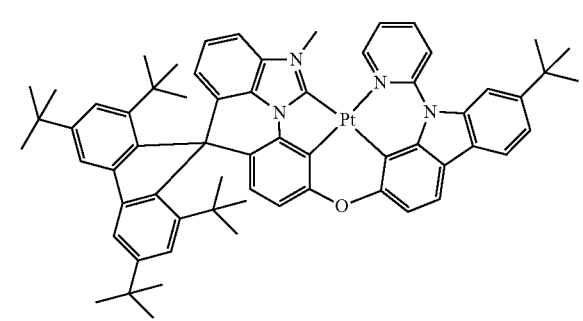

112
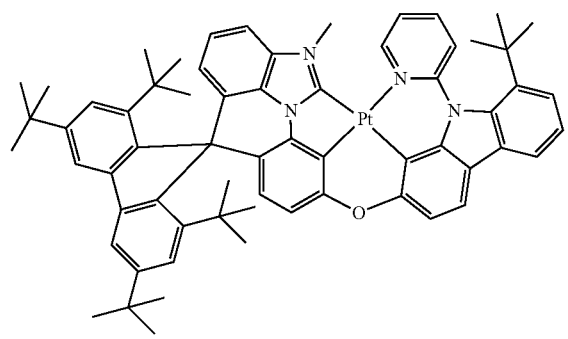
113
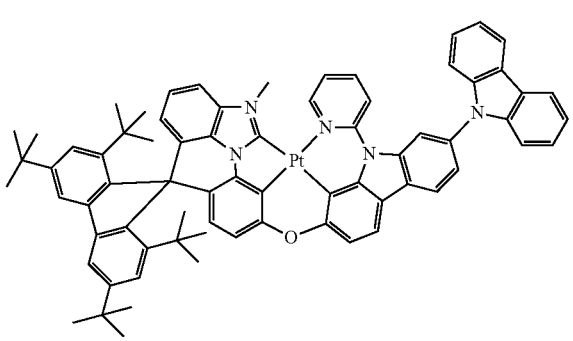
114
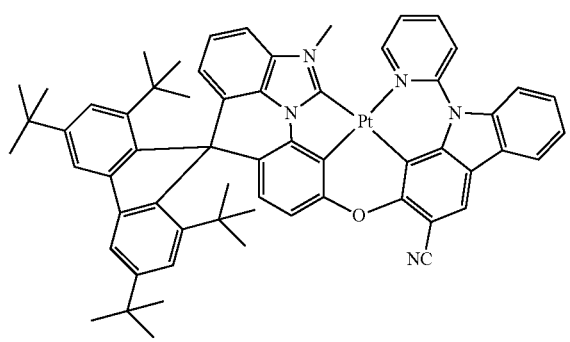
115
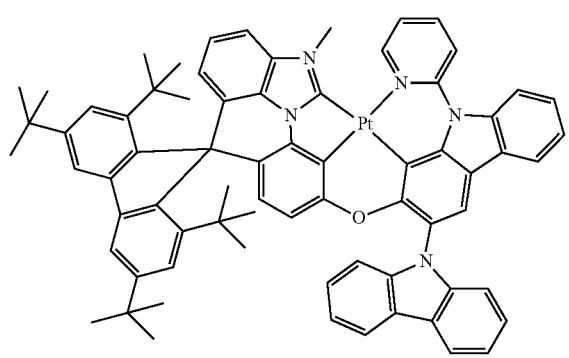
116
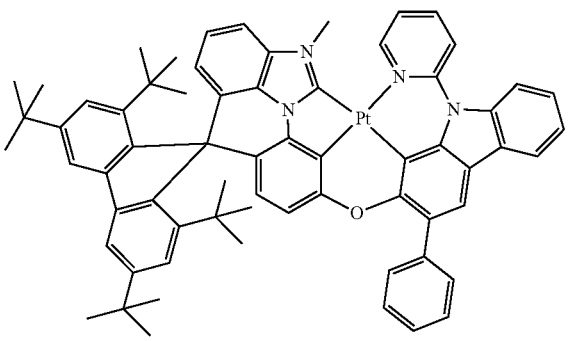
117
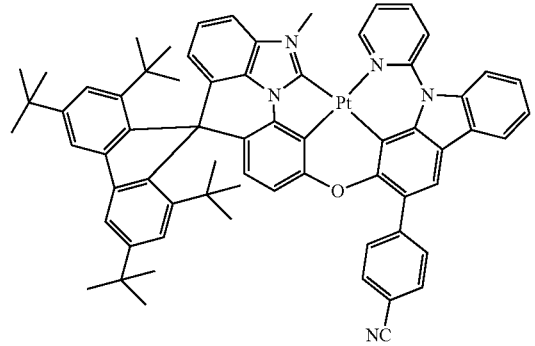
118
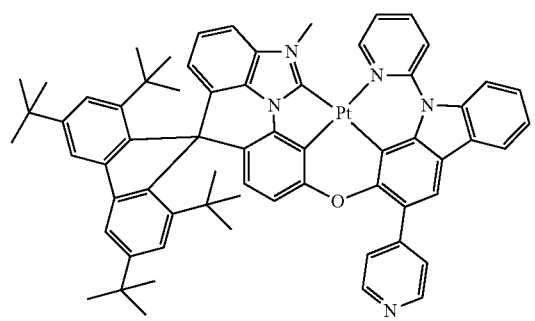
119

63
-continued
120
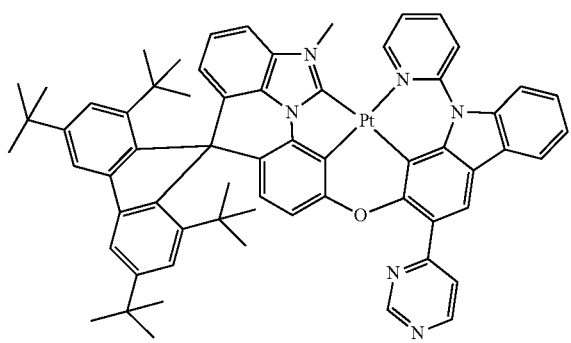
121
124
-continued
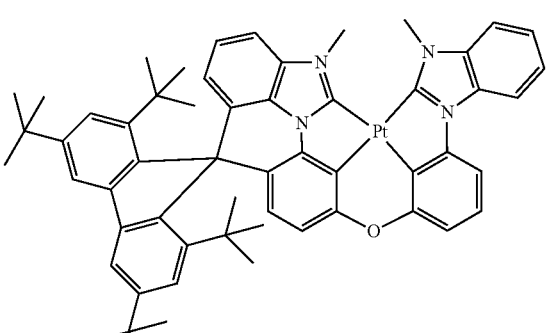
122
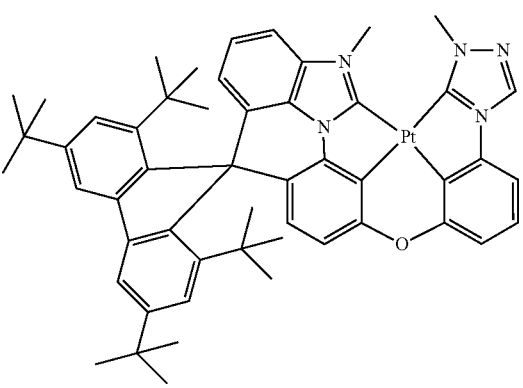
125
123
126
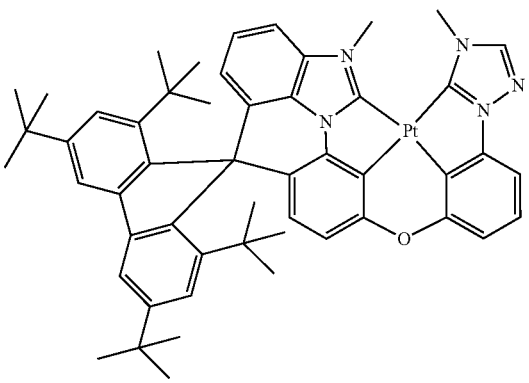
127
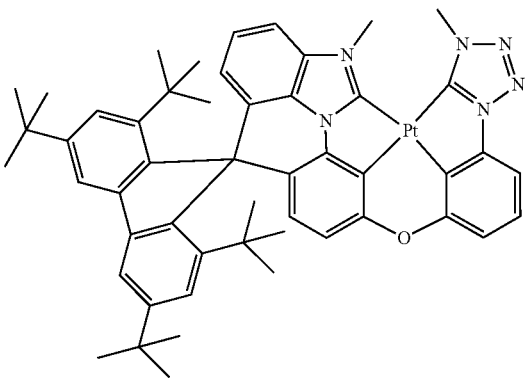

128
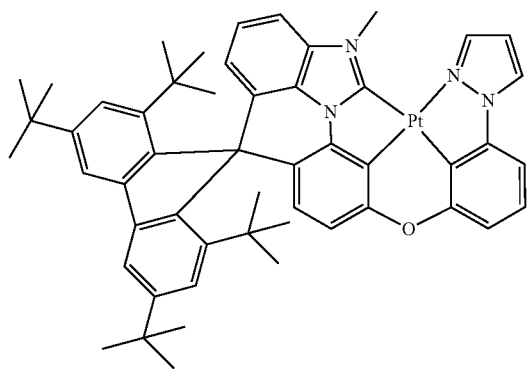
129
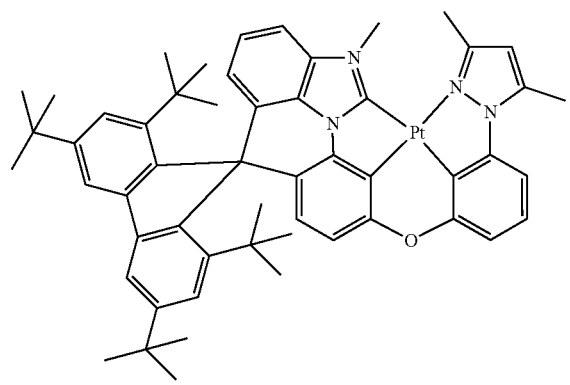
130
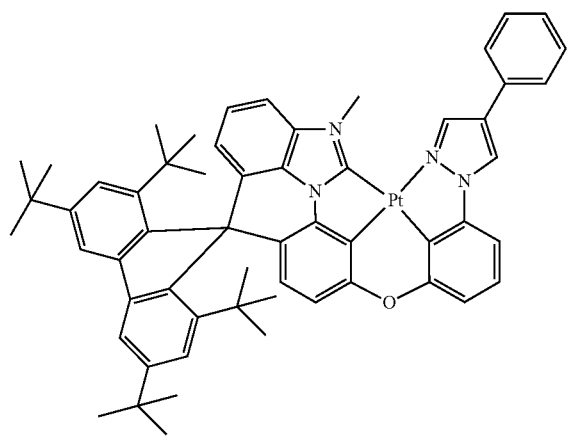
131
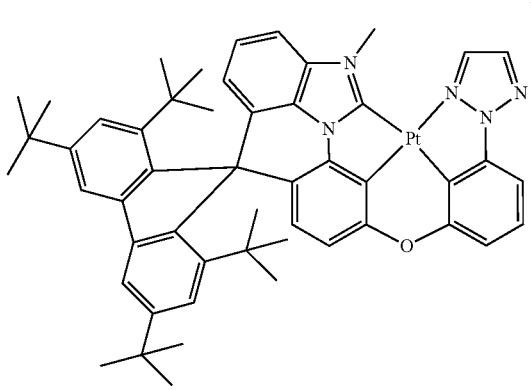
132
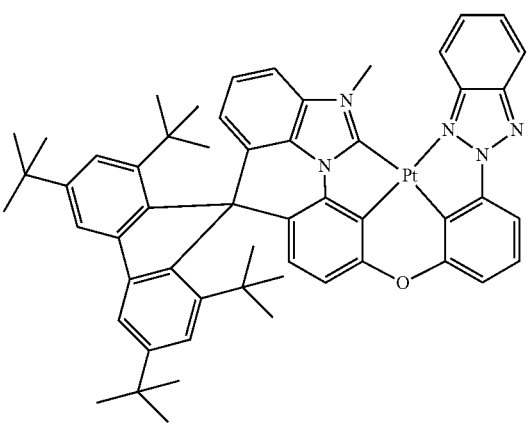
133
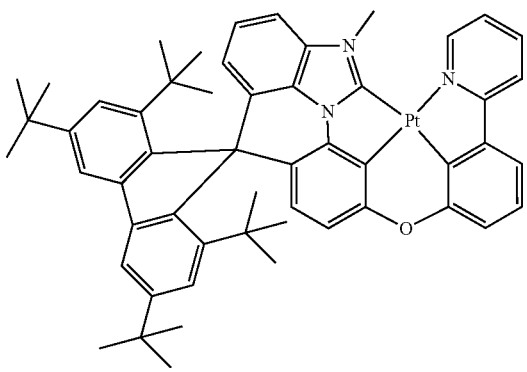
134
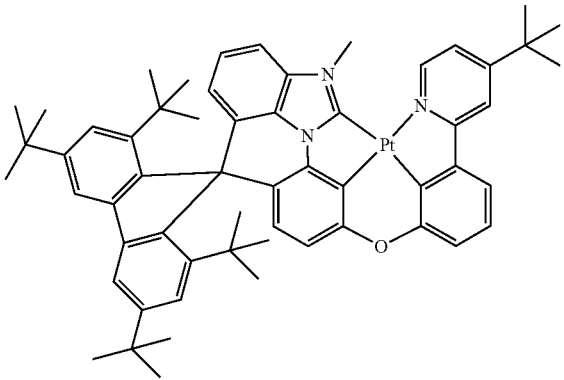
135

136
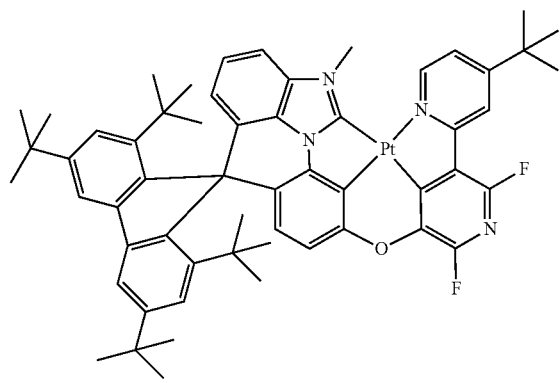
137
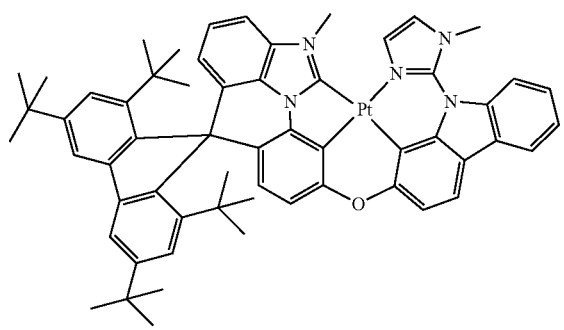
138
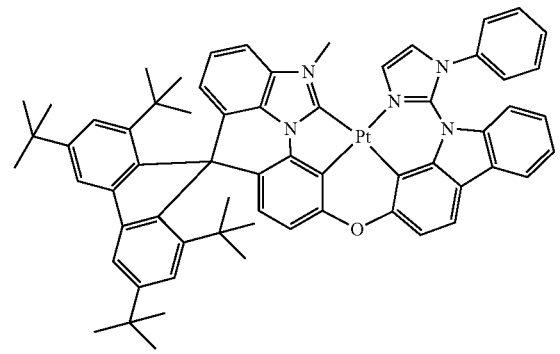
139
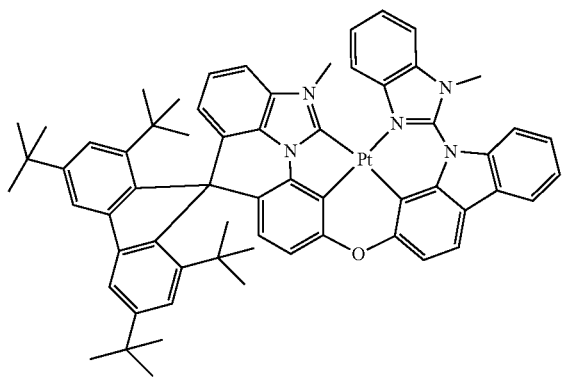
140
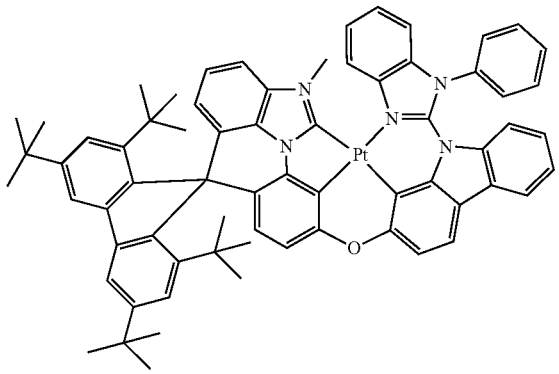
141
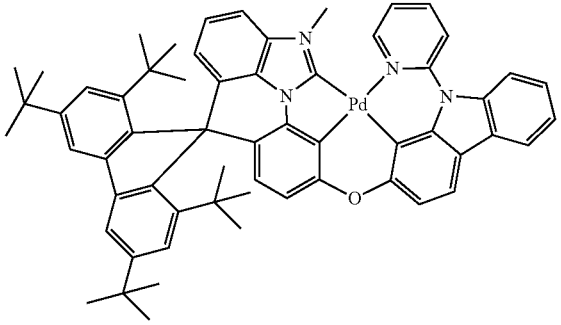
142
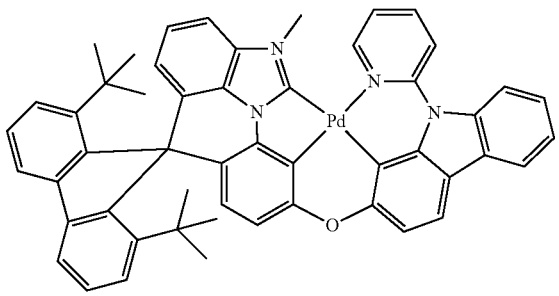
143
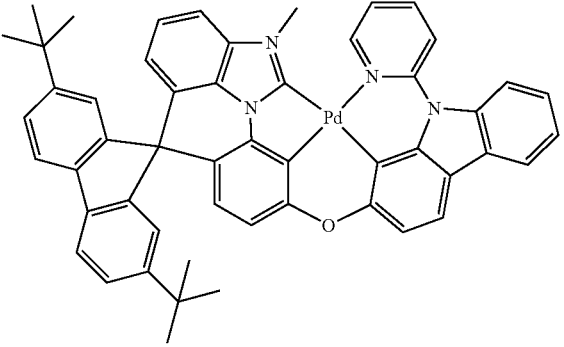

-continued

144

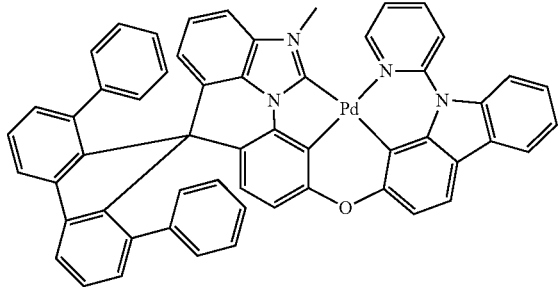

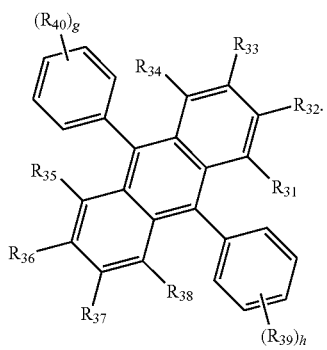

[Formula E-1]

145

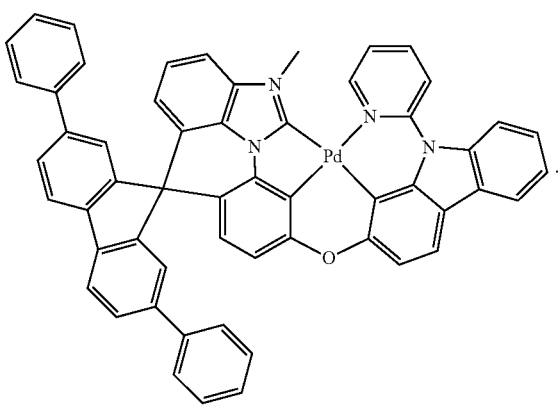

In the organic electroluminescence device ED of embodiments illustrated in FIGS. 3 to 6, the emission layer EML may include a host and a dopant, and the emission layer EML may include the organometallic compound represented by Formula 1 (e.g., as a dopant).

In an embodiment, the emission layer EML may be to emit phosphorescence. For example, the organometallic compound represented by Formula 1 according to an embodiment may be a phosphorescence dopant.

In some embodiments, the emission layer EML may further include a host material in addition to the organometallic compound of an embodiment as described above. The emission layer EML in the organic electroluminescence device 10 of an embodiment may include any suitable material in the art, as a host material. In the organic electroluminescence device ED of an embodiment, the emission layer EML may include anthracene derivatives, pyrene derivatives, fluoranthene derivatives, chrysene derivatives, dihydrobenzanthracene derivatives, and/or triphenylene derivatives. For example, the emission layer EML may include anthracene derivatives and/or pyrene derivatives.

In an embodiment, the emission layer EML may include a compound represented by Formula E-1. The compound represented by Formula E-1 may be utilized as a fluorescence host material:

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. For example, $R_{31}$ to $R_{40}$ may be bonded to an adjacent group to form a saturated hydrocarbon ring or an unsaturated hydrocarbon ring, a saturated heterocycle, or an unsaturated heterocycle.

In Formula E-1, g and h may each independently be an integer of 0 to 5.

Formula E-1 may be represented by any one among Compound E1 to Compound E19:

E1

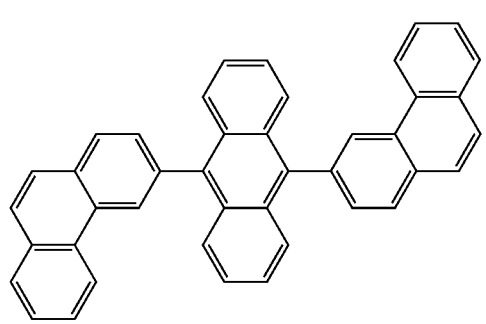

E2

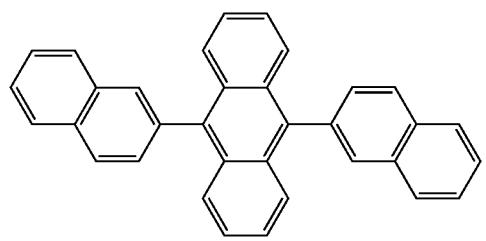

-continued
E3
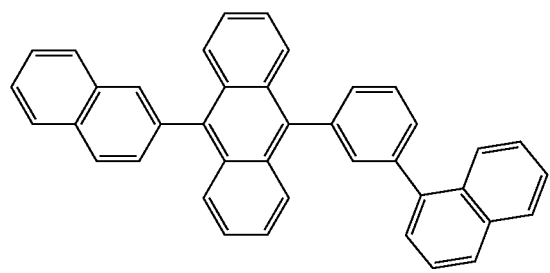
E4
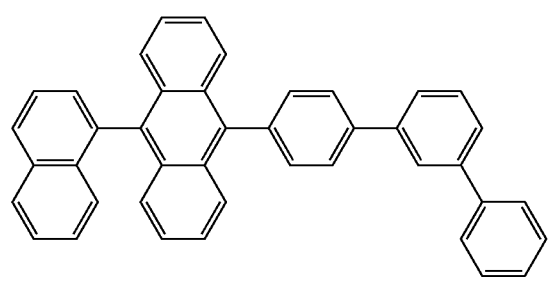
E5
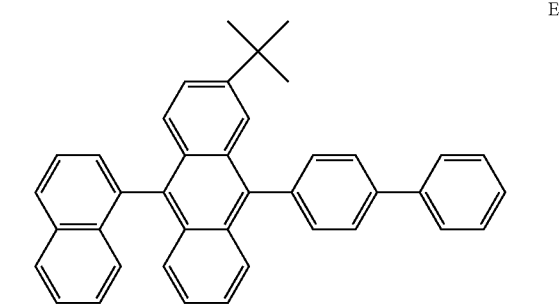
E6
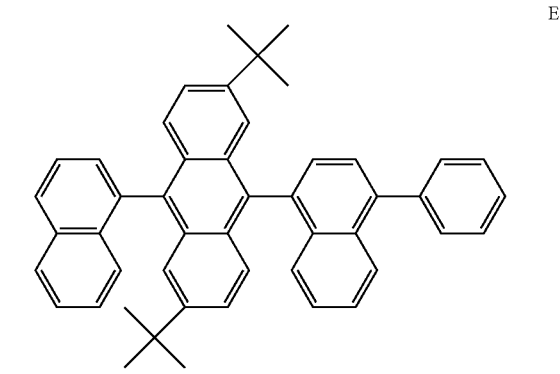
E7
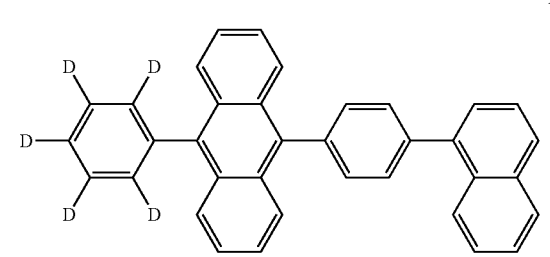
-continued
E8
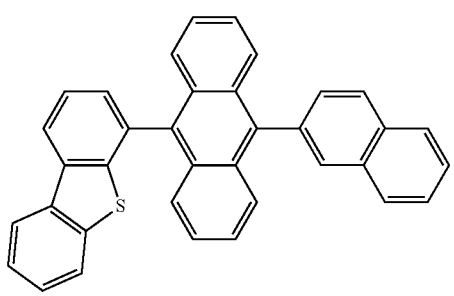
E9
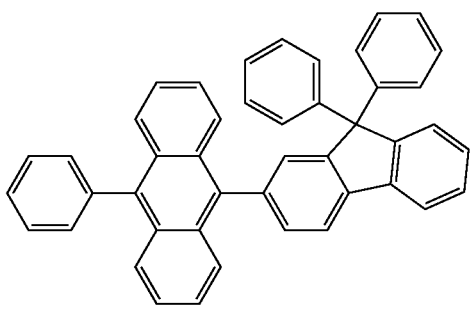
E10
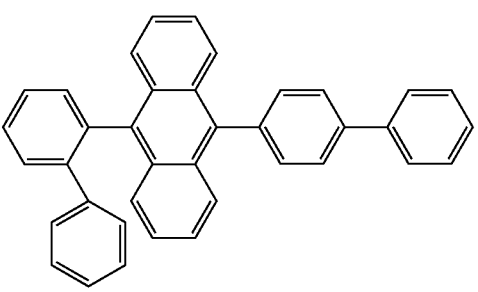
E11
E12
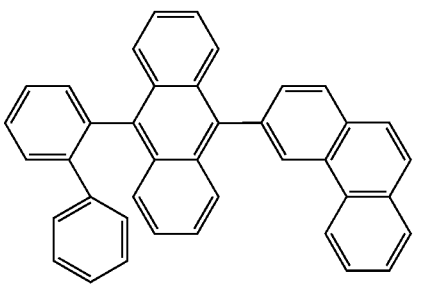

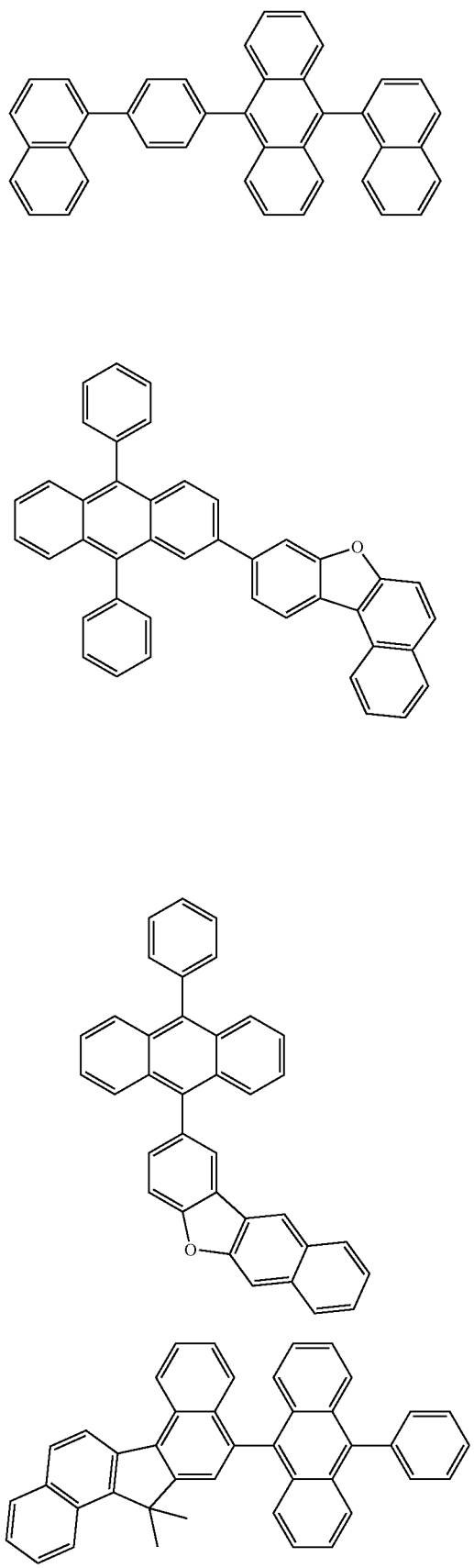
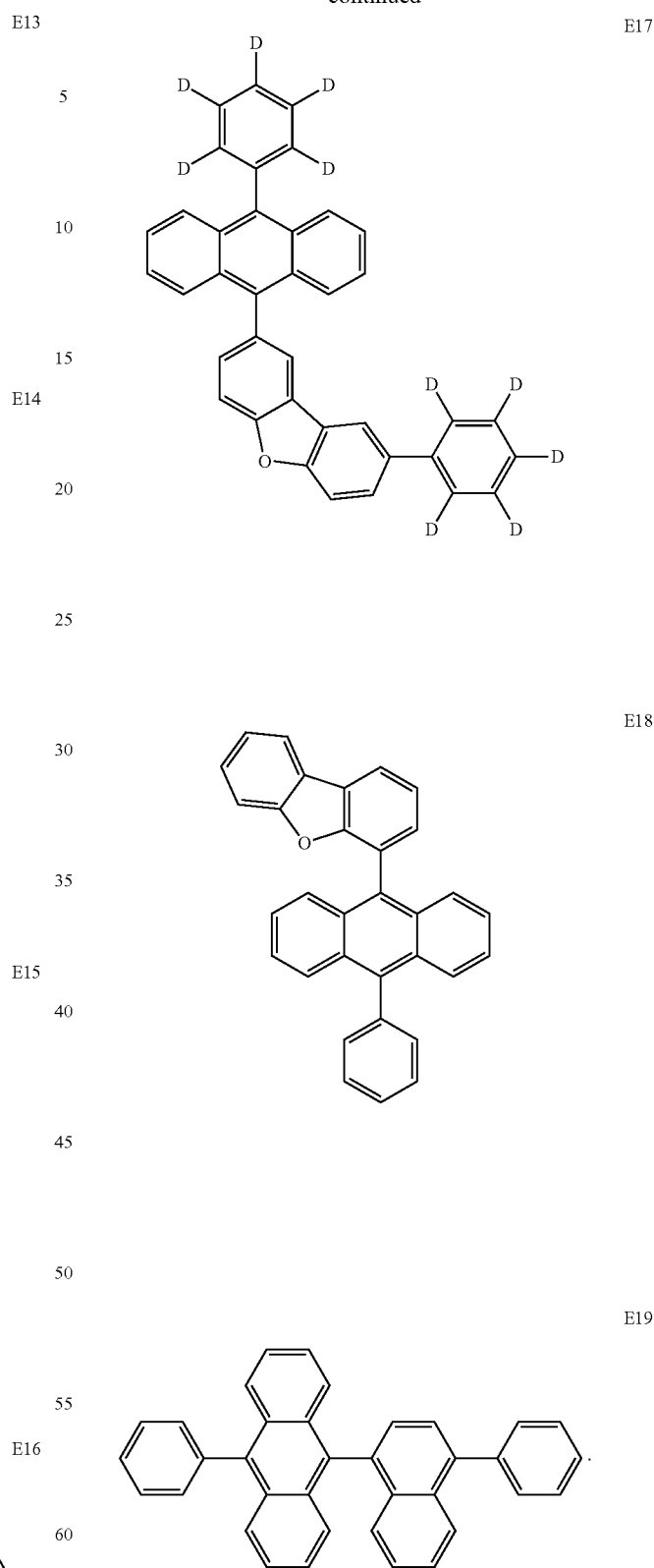
In an embodiment, the emission layer EML may include a compound represented by Formula E-2a or Formula E-2b. The compound represented by Formula E-2a or Formula E-2b may be utilized as a phosphorescence host material.

[Formula E-2a]

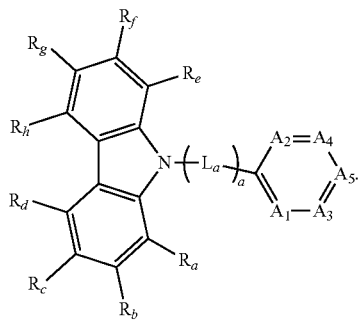

[Compound Group E-2]

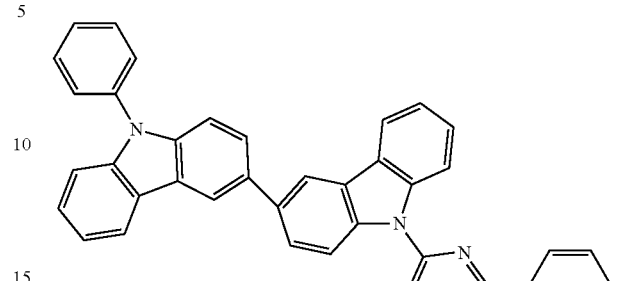

E-2-1

In Formula E-2a, a may be an integer of 0 to 10, La may be a direct linkage, a substituted or unsubstituted arylene group having 6 to 30 ring-forming carbon atoms, or a substituted or unsubstituted heteroarylene group having 2 to 30 ring-forming carbon atoms. When a is an integer of 2 or more, a plurality of La's may each independently be a substituted or unsubstituted arylene group having 6 to 30 ring-forming carbon atoms, or a substituted or unsubstituted heteroarylene group having 2 to 30 ring-forming carbon atoms.

In Formula E-2a, Ai to A5 may each independently be N or $CR_i$. Ra to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. $R_a$ to $R_i$ may be bonded to an adjacent group to form a hydrocarbon ring or a heterocycle containing N, O, S, etc. as a ring-forming atom.

In some embodiments, in Formula E-2a, two or three selected from Ai to A5 may be N, and the rest may be $CR_i$.

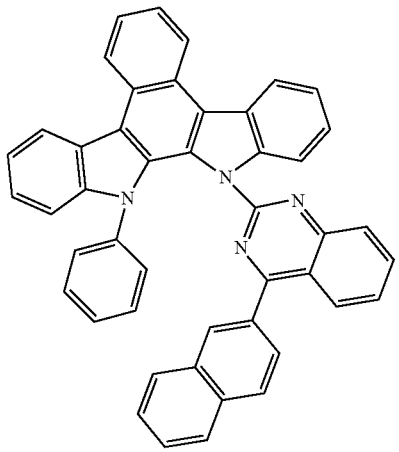

E-2-2

[Formula E-2b]

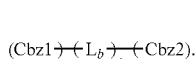

In Formula E-2b, Cbz1 and Cbz2 may each independently be an unsubstituted carbazole group, or a carbazole group substituted with an aryl group having 6 to 30 ring-forming carbon atoms. $L_b$ is a direct linkage, a substituted or unsubstituted arylene group having 6 to 30 ring-forming carbon atoms, or a substituted or unsubstituted heteroarylene group having 2 to 30 ring-forming carbon atoms. b may be an integer of 0 to 10, and when b is an integer of 2 or more, a plurality of $L_b$'s may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one among the compounds of Compound Group E-2. However, the compounds listed in Compound Group E-2 are examples, and the compound represented by Formula E-2a or Formula E-2b is not limited to those represented by Compound Group E-2.

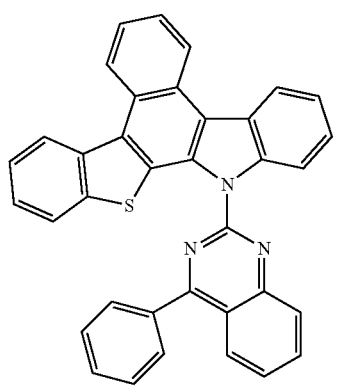

E-2-3

-continued
E-2-4
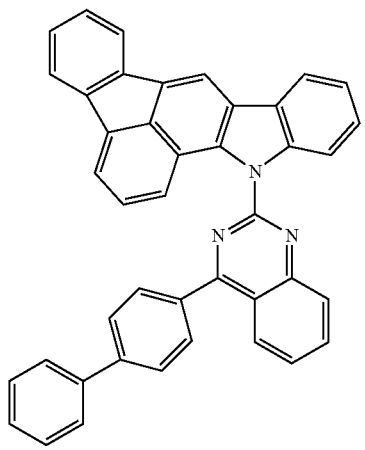
E-2-5
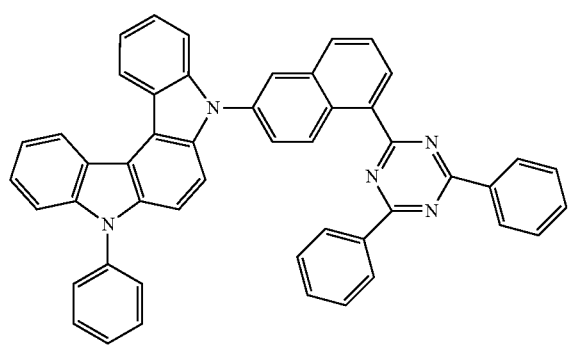
E-2-6
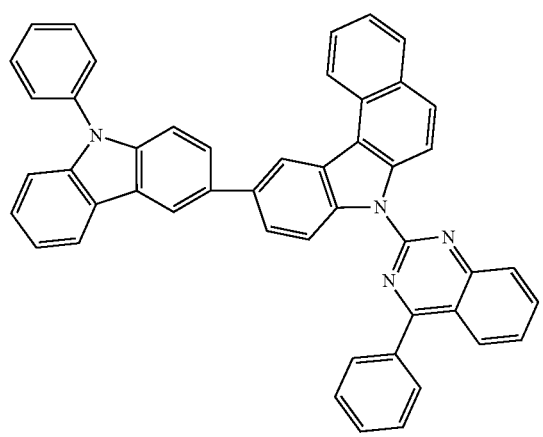
E-2-7
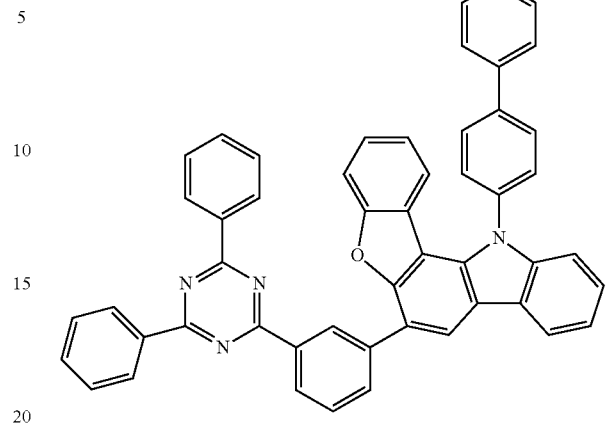
E-2-8
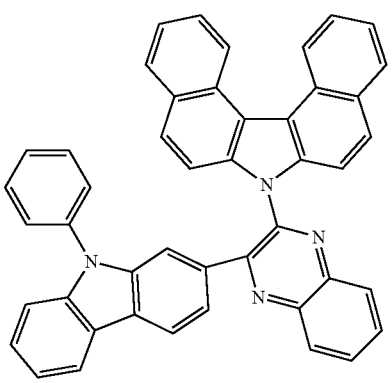
E-2-9
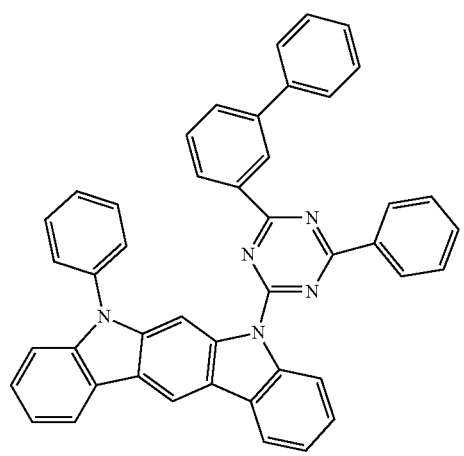

-continued
E-2-10
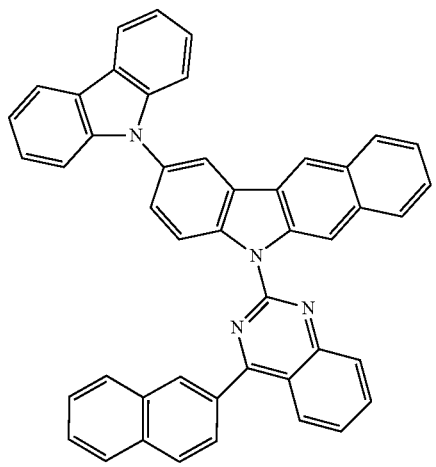
E-2-11
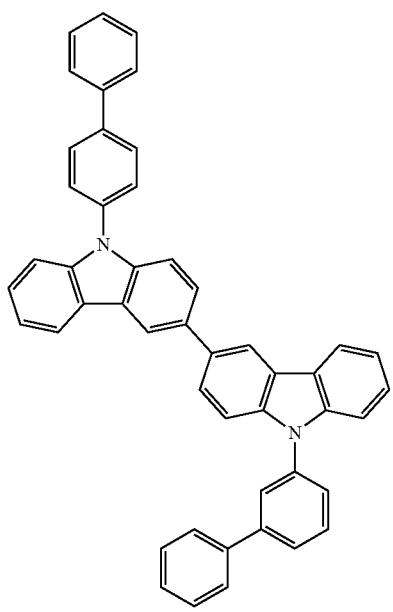
E-2-12
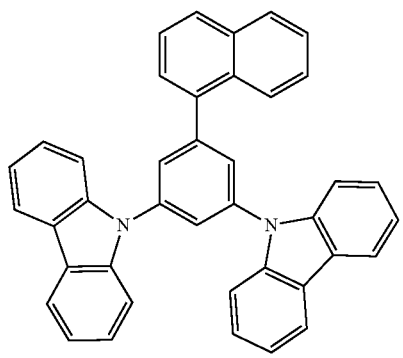
E-2-13
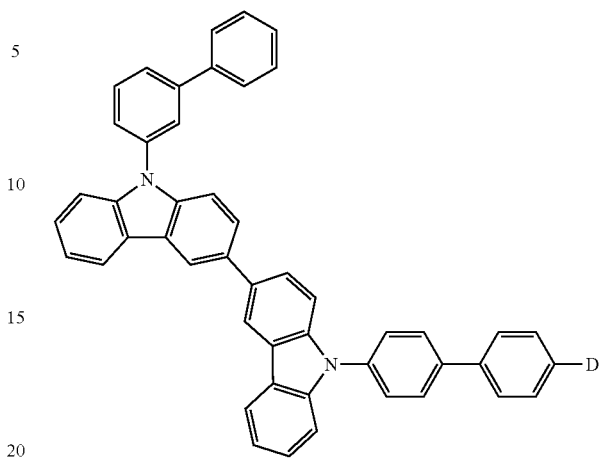
E-2-14
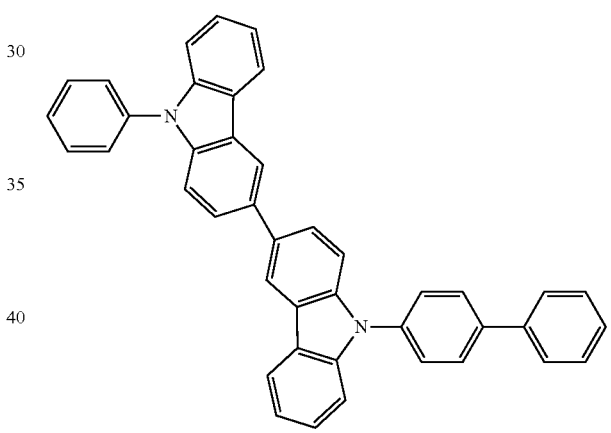
E-2-15
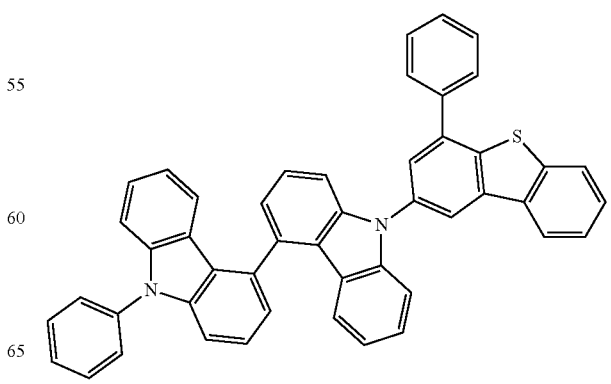

-continued
E-2-16
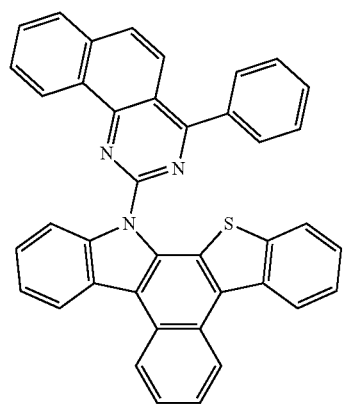
E-2-17
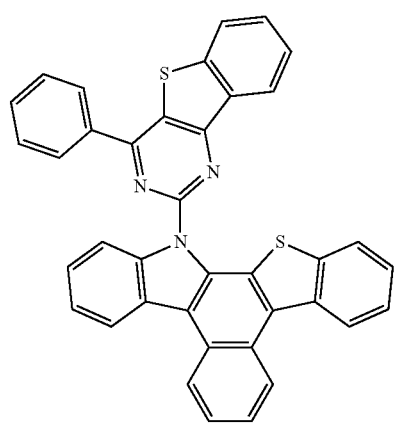
E-2-18
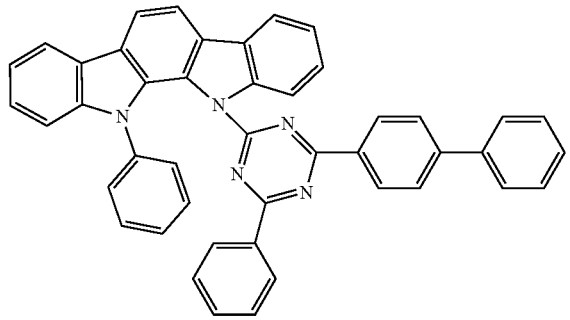
E-2-19
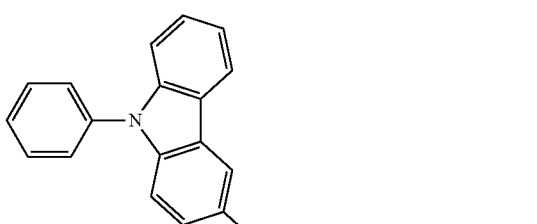
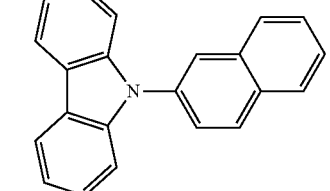
-continued
E-2-20
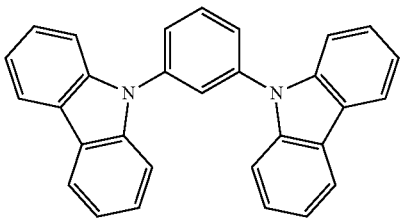
E-2-21
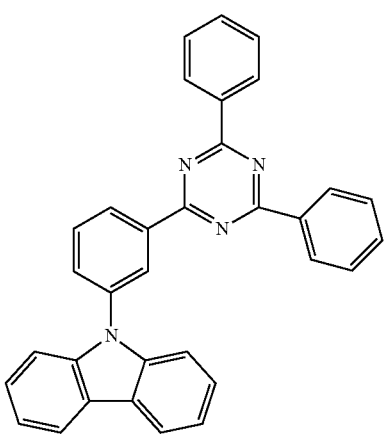
E-2-22
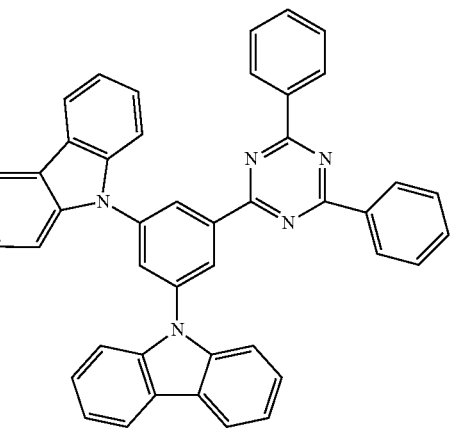
E-2-23
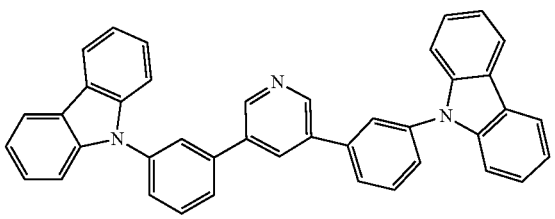

E-2-24

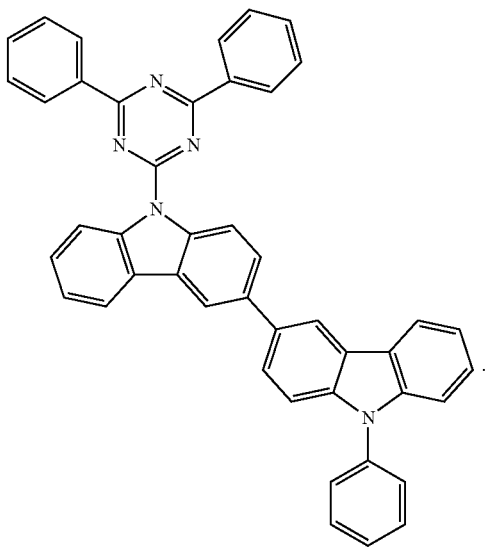

The emission layer EML may further include a any suitable material in the art as a host material. For example, the emission layer EML may include, as a host material, at least one of bis[2-(diphenylphosphino)phenyl]ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, embodiments of the present disclosure are not limited thereto, and for example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be utilized as a host material.

The emission layer EML may include a compound represented by Formula M-a or Formula M-b. The compound represented by Formula M-a or Formula M-b may be utilized as a phosphorescence dopant material.

[Formula M-a]

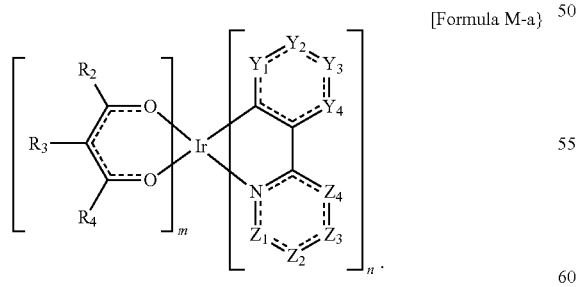

In Formula M-a, $Y_1$ to $Y_4$ and $Z_1$ to $Z_4$ may each independently be $CR_1$ or N, $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In Formula M-a, m may be 0 or 1, and n may be 2 or 3. In Formula M-a, when m is 0, n is 3, and when m is 1, n is 2.

The compound represented by Formula M-a may be utilized as a phosphorescence dopant.

The compound represented by Formula M-a may be represented by any one among Compound M-a1 to Compound M-a25. However, Compounds M-a1 to M-a25 are examples, and the compound represented by Formula M-a is not limited to those represented by Compounds M-a1 to M-a25.

M-a1

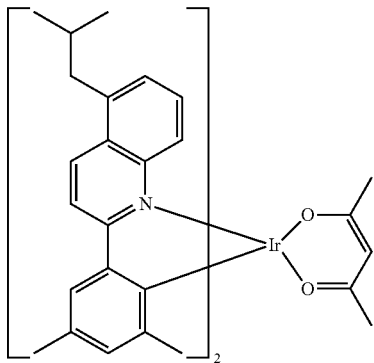

M-a2

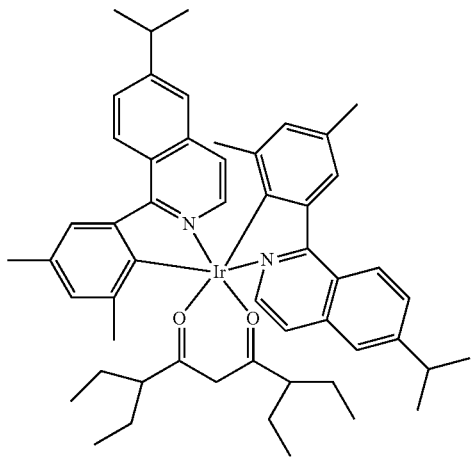

M-a3

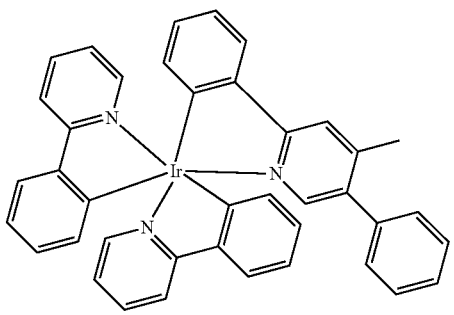

-continued
M-a4
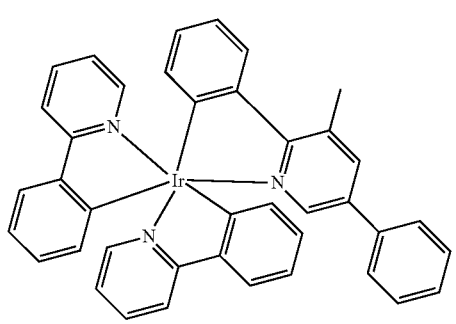
M-a9
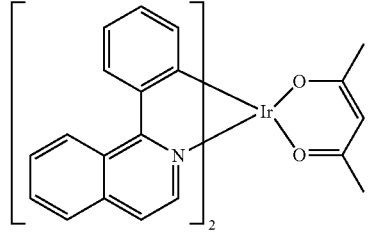
M-a5
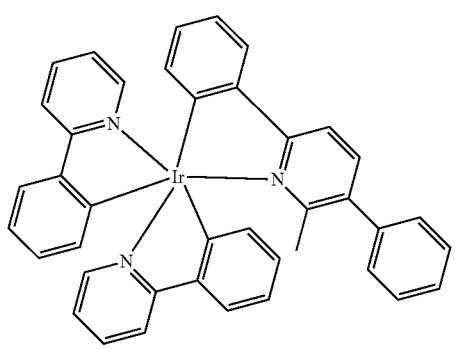
M-a10
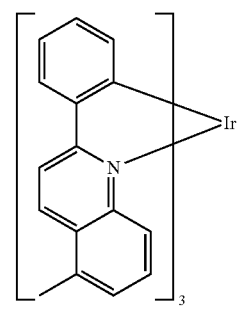
M-a6
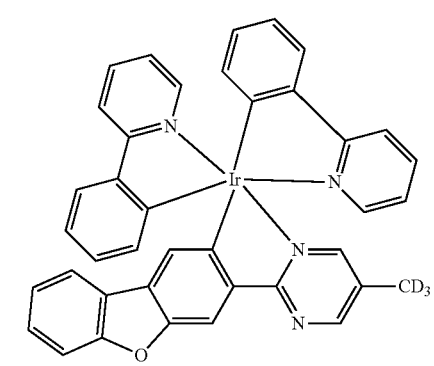
M-a11
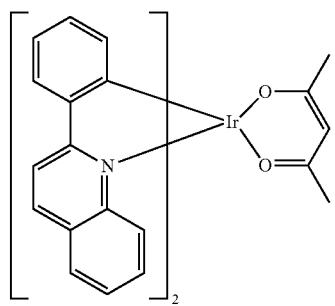
M-a7
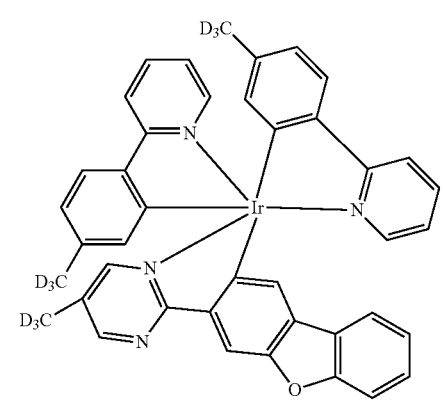
M-a12
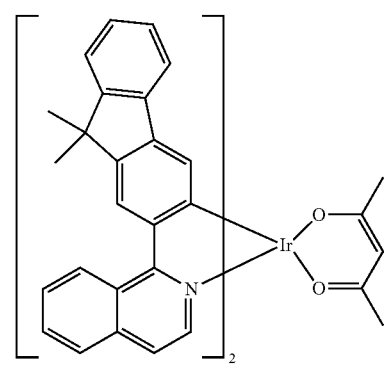
M-a8
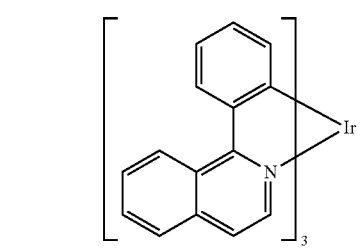
M-a13
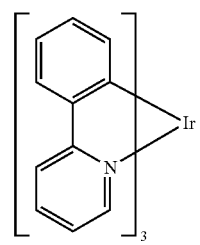

M-a14
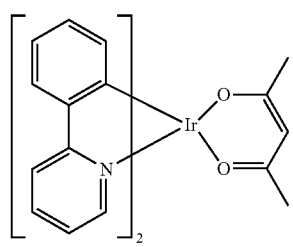
M-a15
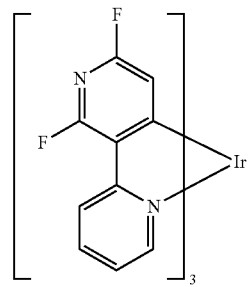
M-a16
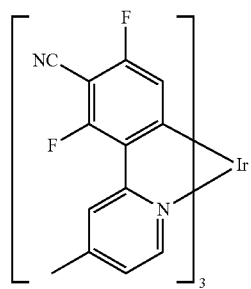
M-a17
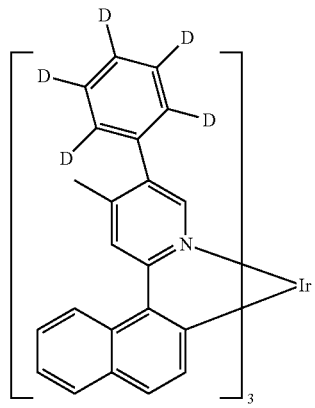
M-a18
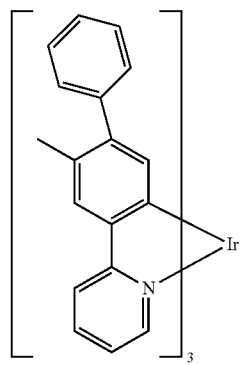
M-a19
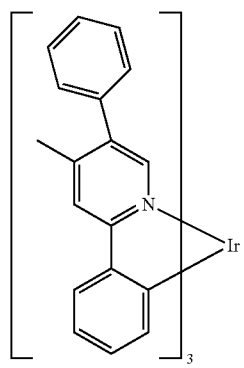
M-a20
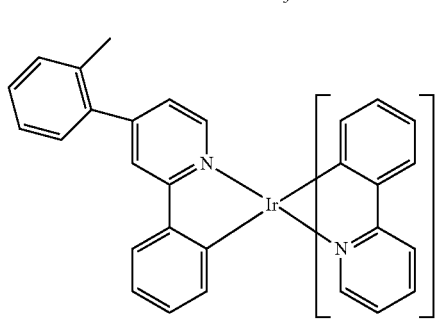
M-a21
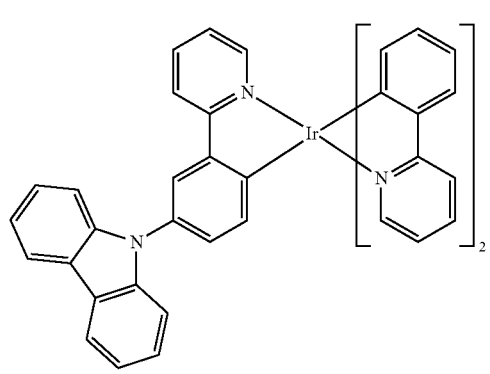
M-a22
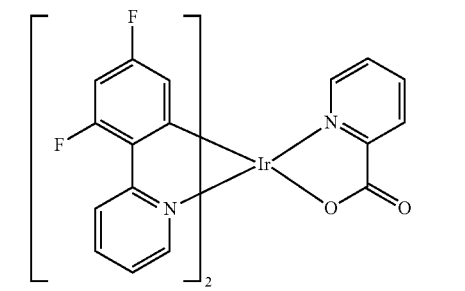
M-a23
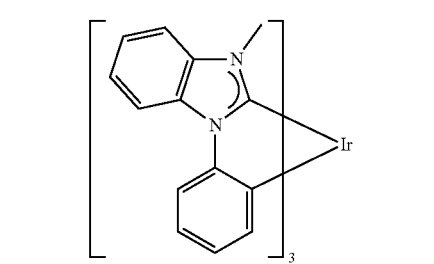

-continued

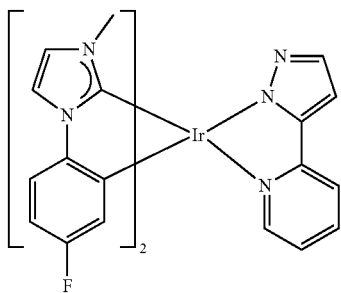
M-a24

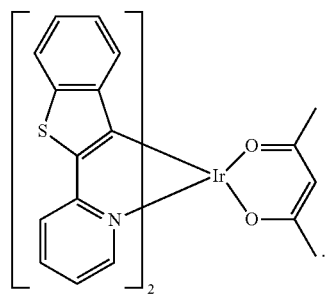
M-a25

Compound M-a1 and Compound M-a2 may be utilized as a red dopant material, and Compound M-a3 and Compound M-a4 may be utilized as a green dopant material.

[Formula M-b]

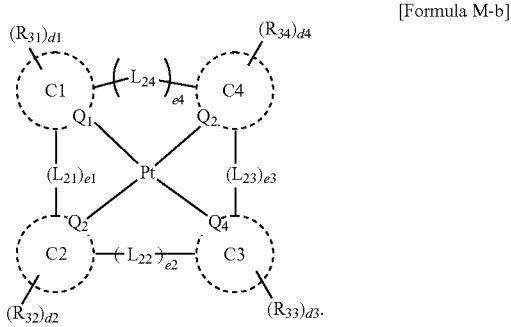

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage,

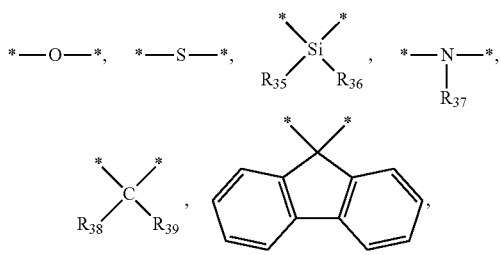

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring, and d1 to d4 may each independently be an integer of 0 to 4.

The compound represented by Formula M-b may be utilized as a blue phosphorescence dopant or a green phosphorescence dopant.

The compound represented by Formula M-b may be represented by any one among the compounds below. However, the compounds below are examples, and the compound represented by Formula M-b is not limited to those represented by the compounds below.

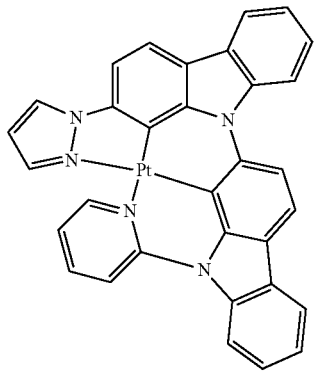
M-b-1

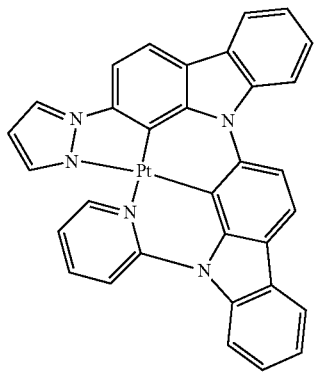
M-b-2

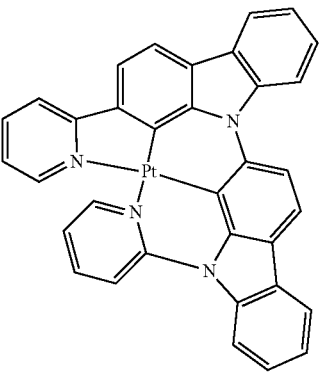
M-b-3

-continued
M-b-4
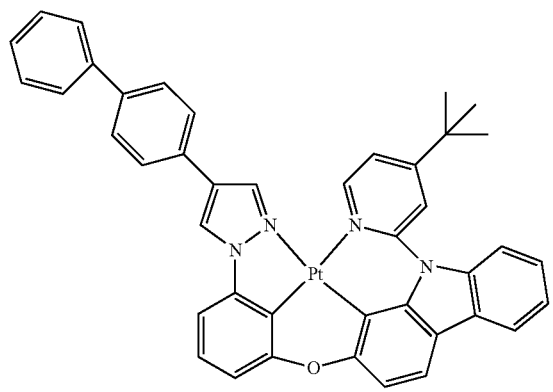
M-b-5
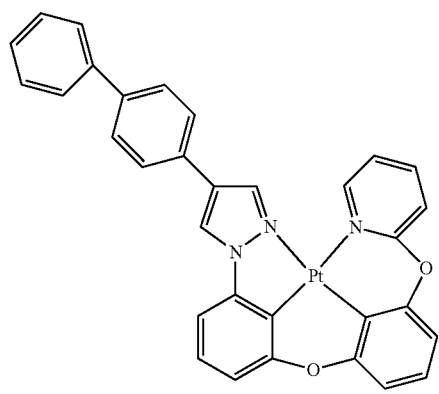
M-b-6
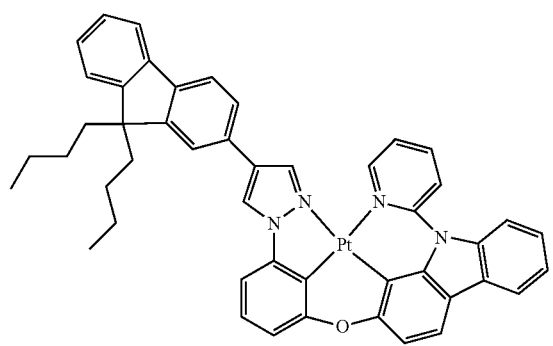
M-b-7
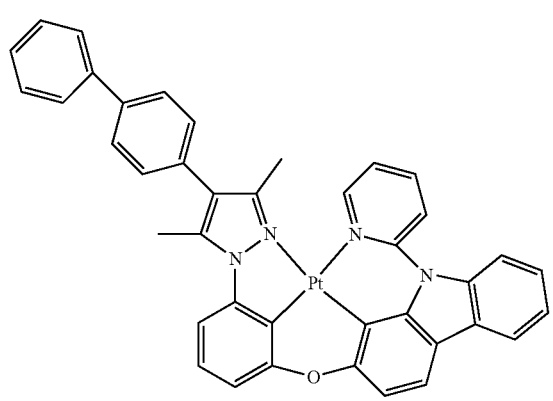
-continued
M-b-8
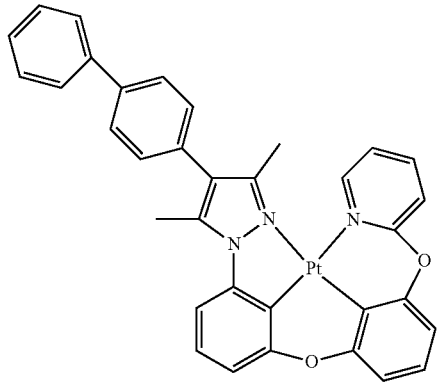
M-b-9
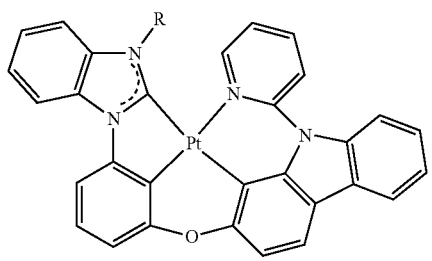
M-b-10
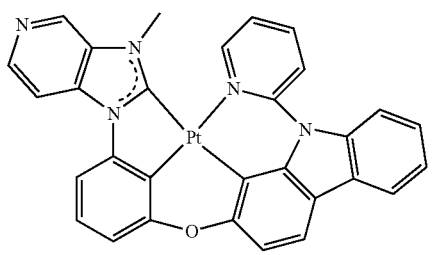
M-b-11
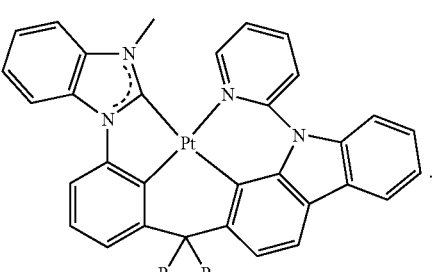
M-b-12

In the compounds represented by Formula M-b-10 and M-b-12, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one among Formula F-a to Formula F-c. The compound represented by Formula F-a or Formula F-c may be utilized as a fluorescence dopant material.

[Formula F-a]

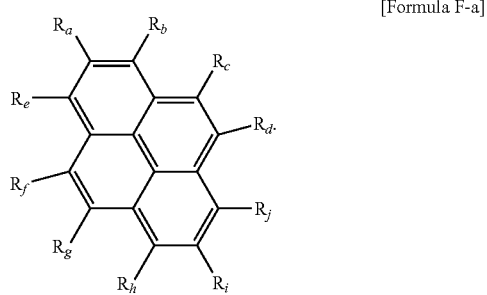

In Formula F-a, two selected from among $R_a$ to $R_j$ may each independently be substituted with *—$NAr_1Ar_2$. The others among $R_a$ to $R_j$, which are not substituted with *—$NAr_1Ar_2$, may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

[Formula F-b]

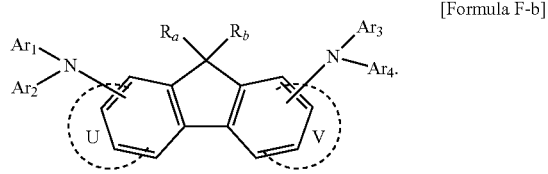

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula F-b, U and V may each independently be 0 or 1. When Formula F-b, U refers to the number of rings bonded to the position of U, and V refers to the number of rings bonded to the position of V. For example, when U or V is 1, a ring described as U or V forms a condensed ring, and when U or V is 0, a ring described as U or V is not present. For example, when U is 0 and V is 1, or when U is 1 and V is 0, the condensed ring having a fluorene core of Formula F-b may be a four-ring cyclic compound. In some embodiments, when both U and V are 0 (e.g., simultaneously), the condensed ring of Formula F-b may be a three-ring cyclic compound. Also, when both U and V are 1 (e.g., simultaneously), the condensed ring having a fluorene core of Formula F-b may be a five-ring cyclic compound.

In Formula F-b, when U or V is 1, U or V may be a substituted or unsubstituted hydrocarbon ring having 5 to 30 ring-forming carbon atoms, or a substituted or unsubstituted heterocycle having 2 to 30 ring-forming carbon atoms.

[Formula F-c]

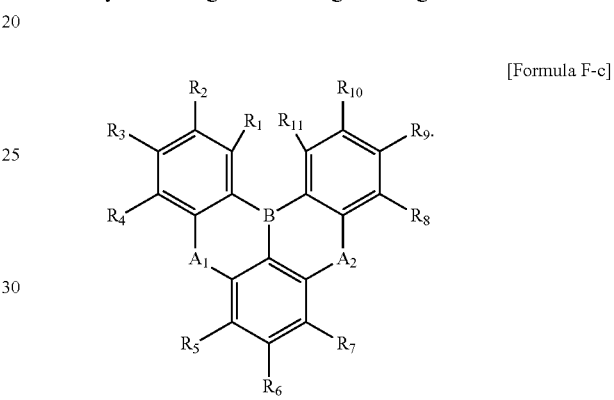

In Formula F-c, $A_1$ and $A_2$ may each independently be O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula F-c, $A_1$ and $A_2$ may each independently be bonded to substituents of an adjacent ring to form a condensed ring. For example, when Ai is $NR_m$, $A_1$ may be bonded to $R_4$ or $R_5$ to form a ring. When A2 is $NR_m$, $A_2$ may be bonded to $R_7$ or $R_8$ to form a ring.

In an embodiment, the emission layer EML may include, as a suitable dopant material, styryl derivatives (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino) styryl)naphthalen-2-yl)vinyl)phenyl)-N-phenylbenzenamine (N-BDAVBi)), 4,4'-bis[2-(4-(N,N-diphenylamino) phenyl)vinyl]biphenyl(DPAVBi), perylene and/or derivatives thereof (e.g., 2,5,8,11-tetra-t-butylperylene (TBP)), pyrene and/or derivatives thereof (e.g., 1,1-dipyrene, 1,4-dipyrenylbenzene, 1,4-bis(N,N-diphenylamino)pyrene), etc.

The emission layer EML may include any suitable phosphorescence dopant material. For example, a metal complex including iridium (Ir), platinum (Pt), osmium (Os), gold (Au), titanium (Ti), zirconium (Zr), hafnium (Hf), europium (Eu), terbium (Tb), or thulium (Tm) may be utilized as a phosphorescence dopant. For example, iridium(III) bis(4,6-difluorophenylpyridinato-N,C2') (Flrpic), bis(2,4-difluorophenylpyridinato)-tetrakis(1-pyrazolyl)borate iridium(III) (Fir6), or platinum octaethyl porphyrin (PtOEP) may be utilized as a phosphorescence dopant. However, embodiments of the present disclosure are not limited thereto.

The emission layer EML may include a quantum dot material. The core of the quantum dot may be selected from a Group II-VI compound, a Group III-VI compound, a Group I-III-IV compound, a Group III-V compound, a Group III-II-V compound, a Group IV-VI compound, a Group IV element, a Group IV compound, and combinations thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and mixtures thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The Group III-VI compound may include a binary compound (such as $In_2S_3$ and/or $In_2Se_3$), a ternary compound (such as $InGaS_3$ and/or $InGaSe_3$), or any combination thereof.

The Group I-III-VI compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and mixtures thereof, and a quaternary compound (such as $AgInGaS_2$ and/or $CuInGaS_2$).

The Group III-V compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The Group IV element may be selected from the group consisting of Si, Ge, and mixtures thereof. The Group IV compound may be a binary compound selected from the group consisting of SiC, SiGe, and mixtures thereof.

In this case, a binary compound, a ternary compound, or a quaternary compound may be present in particles in a substantially uniform concentration distribution, or may be present in substantially the same particle in a partially different concentration distribution. In some embodiments, the quantum dot may have a core/shell structure in which one quantum dot surrounds another quantum dot. In a core/shell structure, the interface of the shell may have a concentration gradient in which the concentration of an element present in the shell becomes lower towards the core.

In some embodiments, a quantum dot may have the above-described core-shell structure including a core containing nanocrystals and a shell around (e.g., surrounding) the core. The shell of the quantum dot may serve as a protection layer to prevent or reduce the chemical deformation of the core so as to maintain semiconductor properties, and/or as a charging layer to impart electrophoretic properties to the quantum dot. The shell may be a single layer or a multilayer. An example shell of the quantum dot may include a metal or non-metal oxide, a semiconductor compound, or any combination thereof.

For example, the metal or non-metal oxide may be a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO), or a ternary compound (such as $MgAl_2O_4$, $CoFe_2O_4$, $NiFe_2O_4$, and/or $CoMn_2O_4$), but embodiments of the present disclosure are not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

The quantum dot may have a full width of half maximum (FWHM) of a light emission wavelength spectrum of about 45 nm or less, about 40 nm or less, or about 30 nm or less, and color purity and/or color reproducibility may be improved in the above range. In some embodiments, light emitted through such a quantum dot may be emitted in all directions, and thus a wide viewing angle may be improved.

The form of the quantum dot is not particularly limited but may have any suitable form in the art, and for example may have the form of spherical, pyramidal, multi-arm, and/or cubic nanoparticles, nanotubes, nanowires, nanofibers, nanoplate particles, etc.

The quantum dot may control or select the color of emitted light according to the particle size thereof, and accordingly, the quantum dot may have one or more suitable emission colors (such as blue, red, and/or green).

In each organic electroluminescence device ED of the embodiments illustrated in FIGS. 3 to 6, the electron transport region ETR is provided on the emission layer EML. The electron transport region ETR may include at least one of the hole blocking layer HBL, the electron transport layer ETL, or the electron injection layer EIL, but embodiments of the present disclosure are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, or may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, a hole blocking layer HBL/electron transport layer ETL/electron injection layer EIL are stacked in order from the emission layer EML, but embodiments of the present disclosure are not limited thereto. The electron transport region ETR may have a thickness, for example, of about 1,000 Å to about 1,500 Å.

The electron transport region ETR may be formed by utilizing one or more suitable methods (such as a vacuum deposition method, a spin coating method, a cast method, a Langmuir-Blodgett (LB) method, an inkjet printing method, a laser printing method, a laser induced thermal imaging (LITI) method, etc.)

The electron transport region ETR may include a compound represented by Formula ET-1:

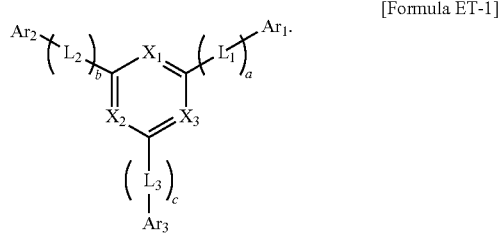

[Formula ET-1]

In Formula ET-1, at least one among $X_1$ to $X_3$ may be N, and the rest may be $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer of 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a to c are an integer of 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments of the present disclosure are not limited thereto, and the electron transport region ETR may include, for example, diphenyl [4-(triphenylsilyl)phenyl]phosphine oxide (TSPO1), tris(8-hydroxyquinolinato)aluminum (Alq₃), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzimidazol-1-yl) phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq₂), 9,10-di(naphthalene-2-yl)anthracene (ADN), 1,3-bis[3,5-di(pyridin-3-yl)phenyl]benzene (BmPyPhB), or a mixture thereof.

The electron transport region ETR may include at least one among Compound ET1 to Compound ET36:

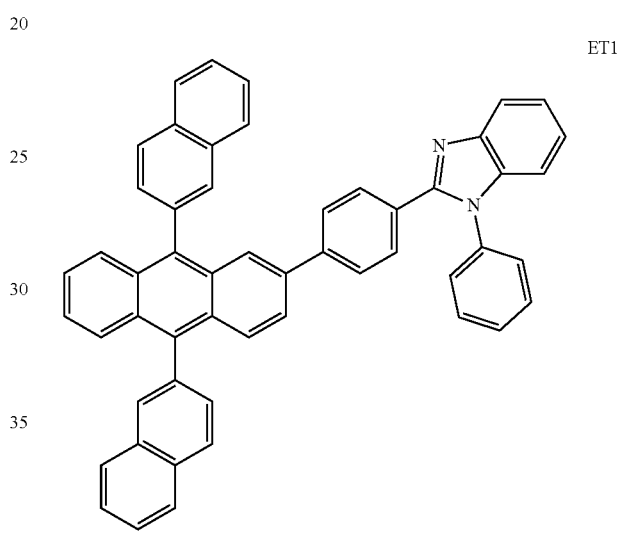

ET1

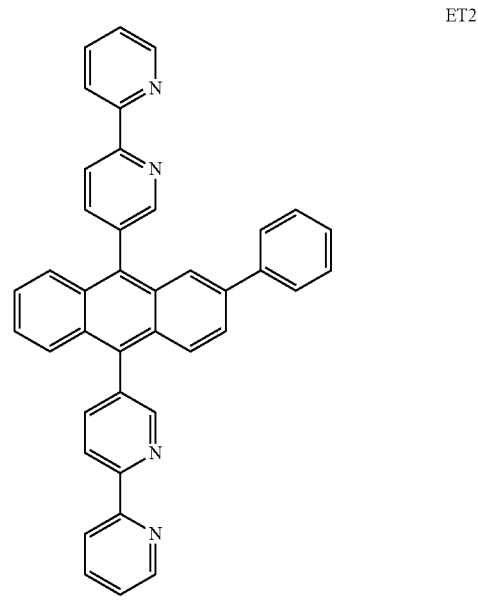

ET2

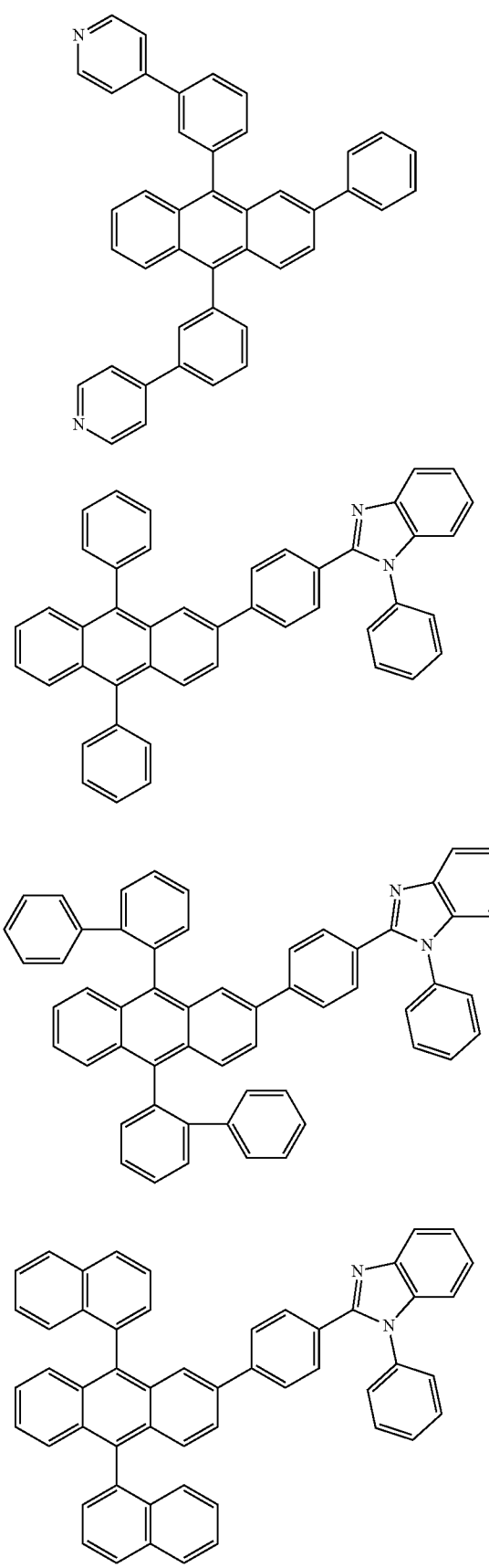
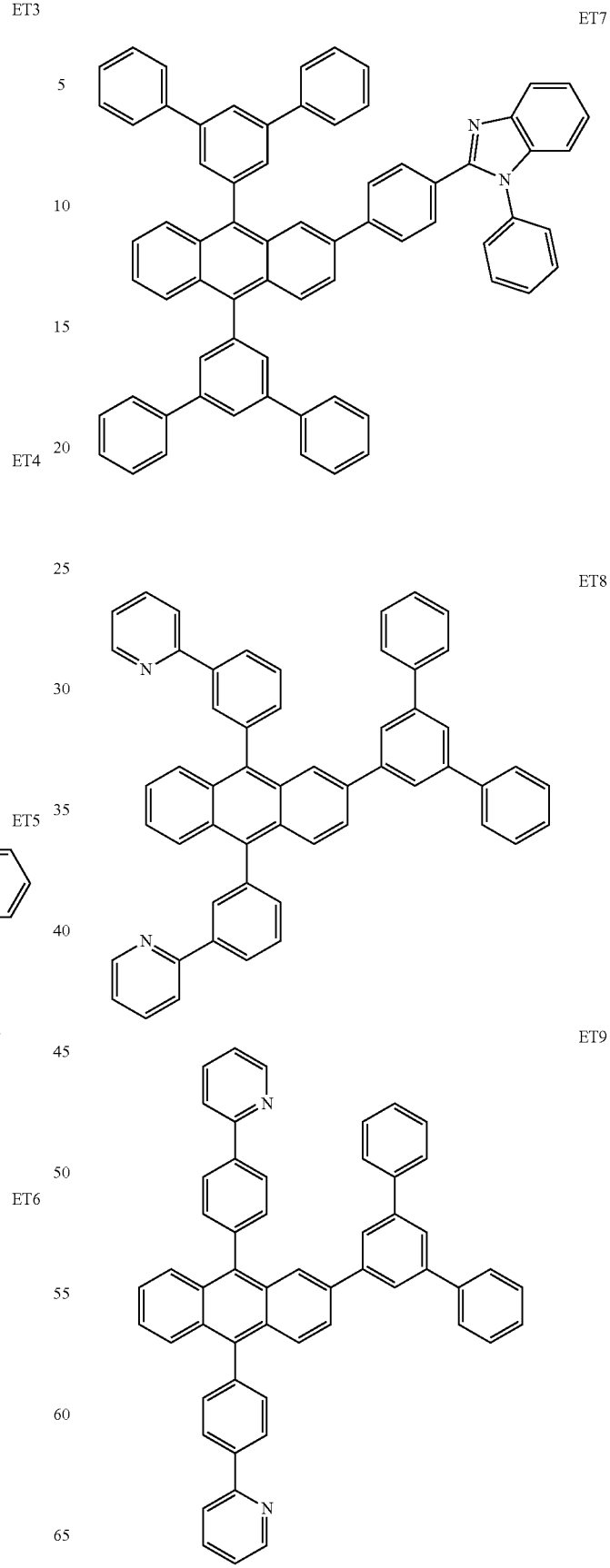

ET10
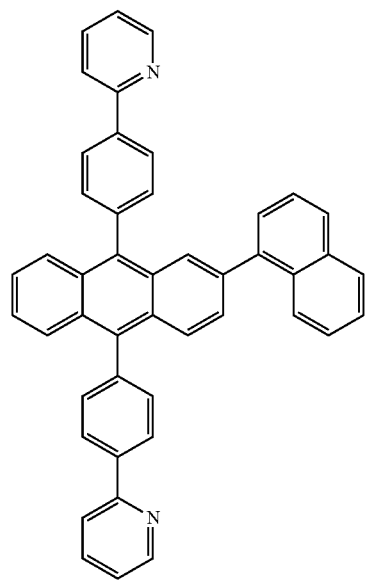
ET11
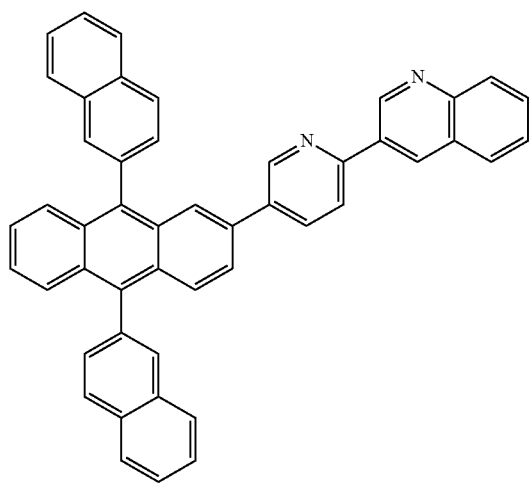
ET12
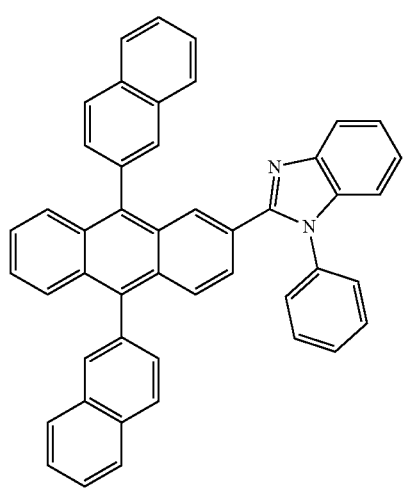
ET13
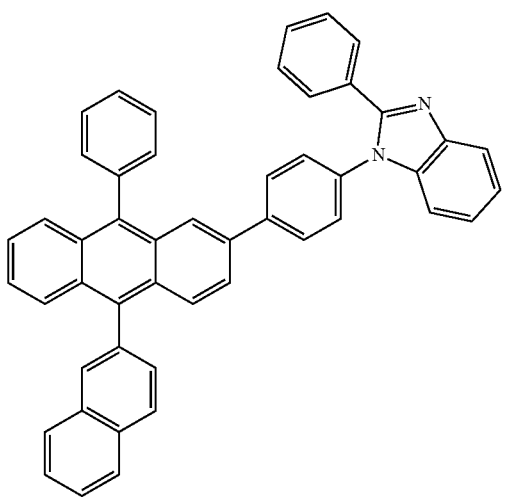
ET14
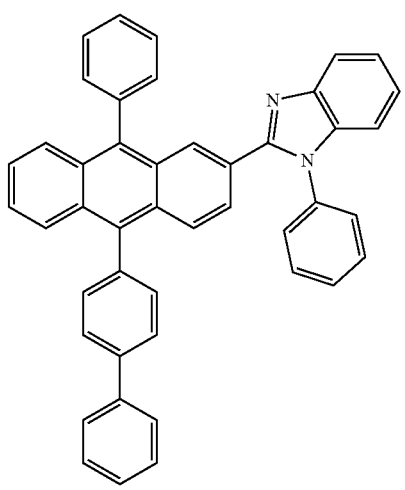
ET15
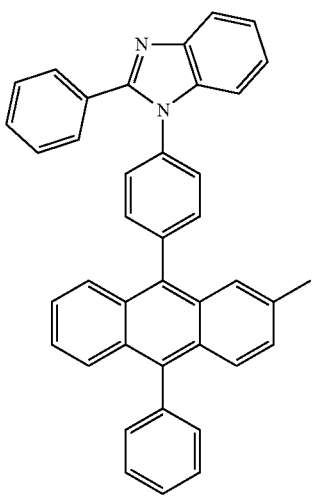

ET16
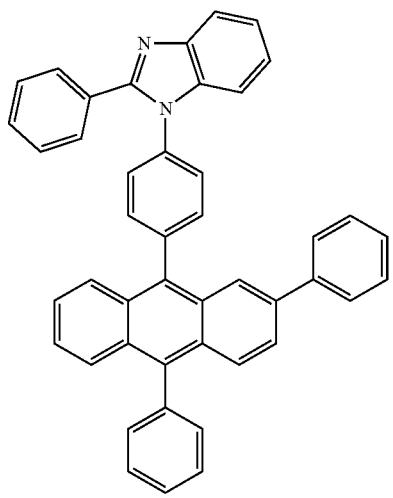
ET17
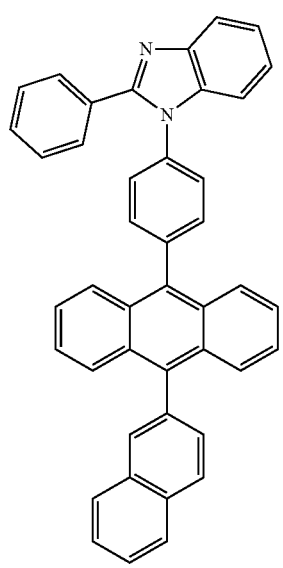
ET18
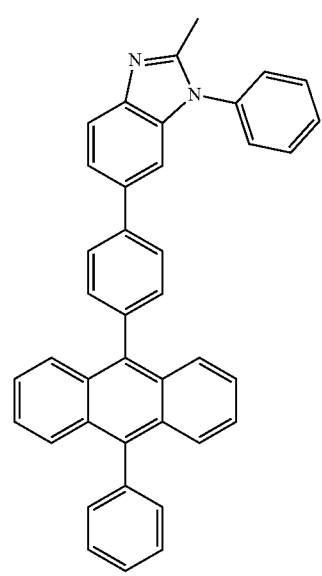
ET19
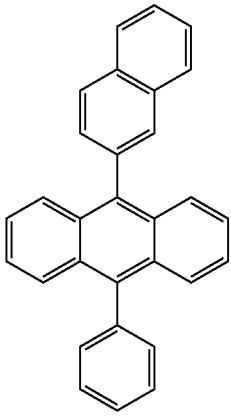
ET20
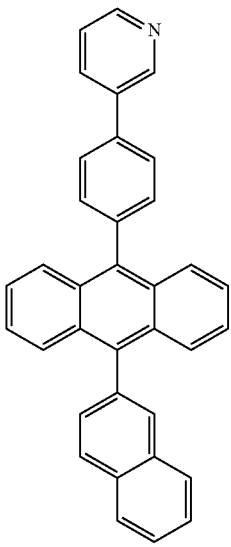
ET21
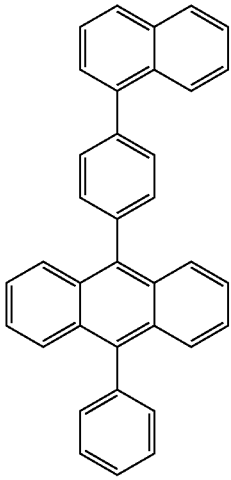

ET22
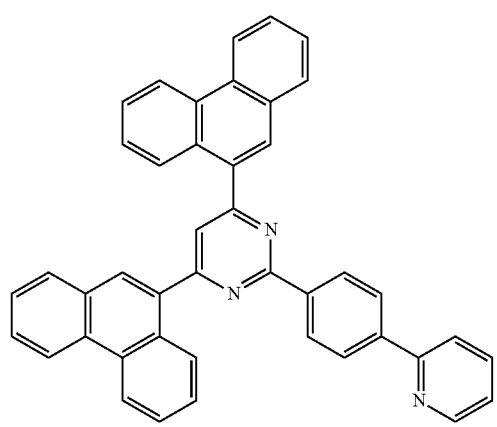
ET25
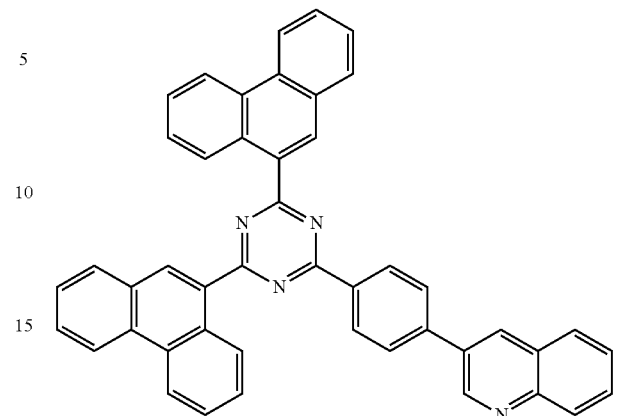
ET23
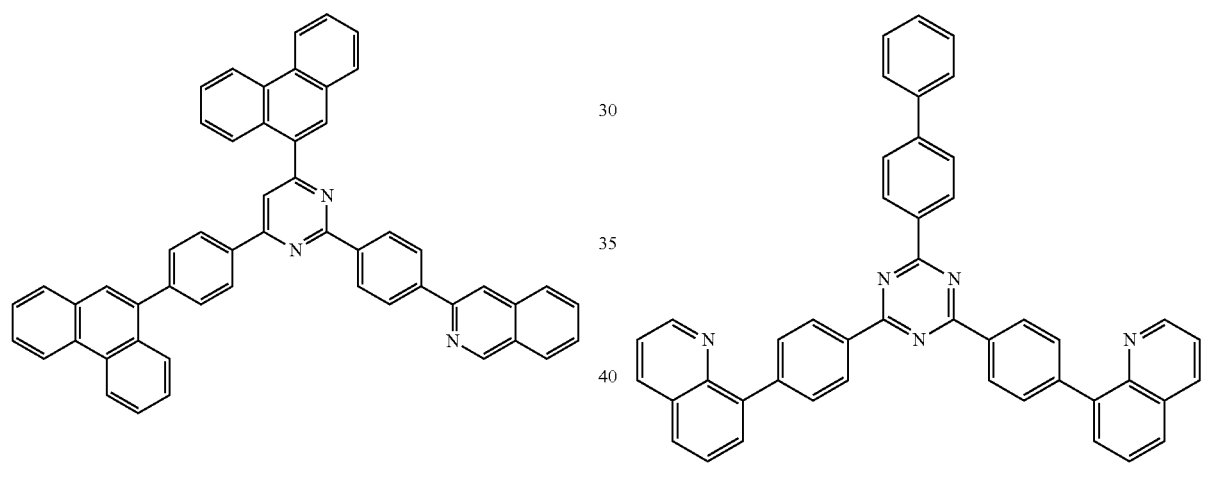
ET26
ET24
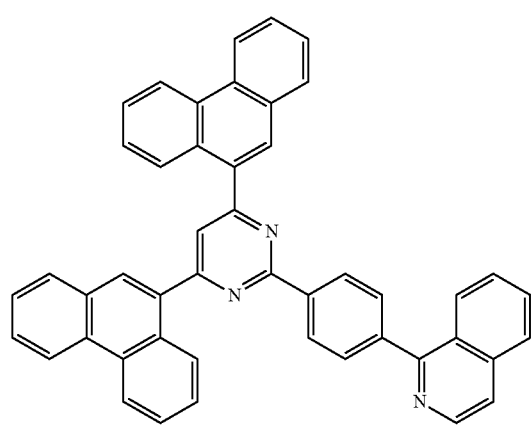
ET27
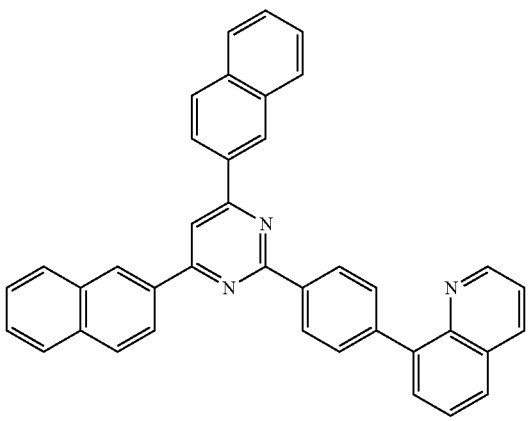

ET28
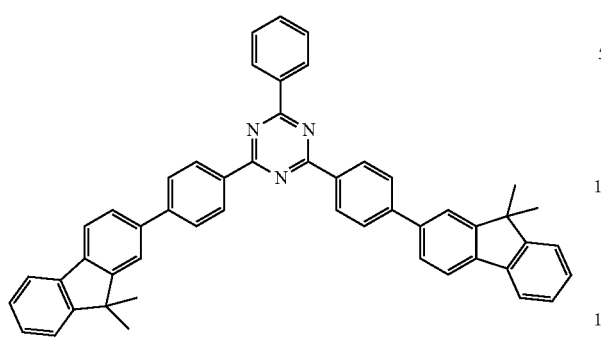
ET29
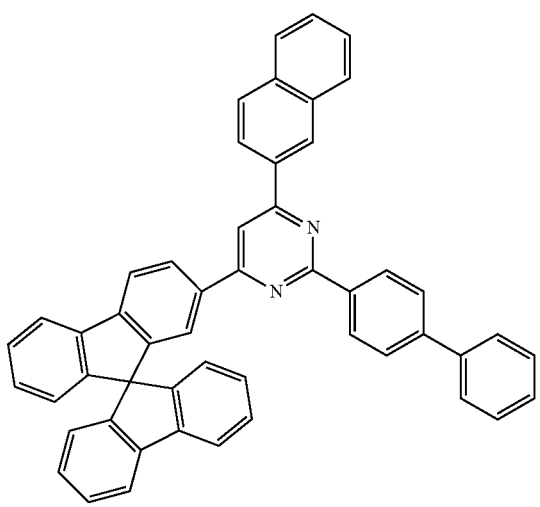
ET30
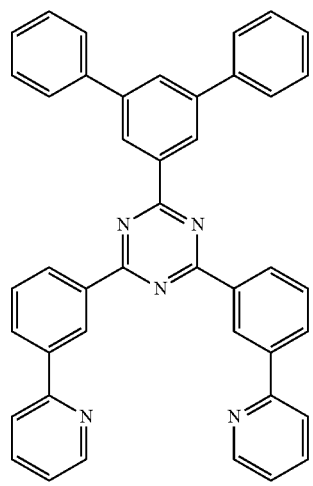
ET31
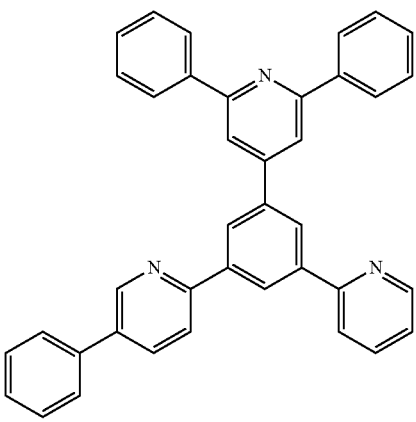
ET32
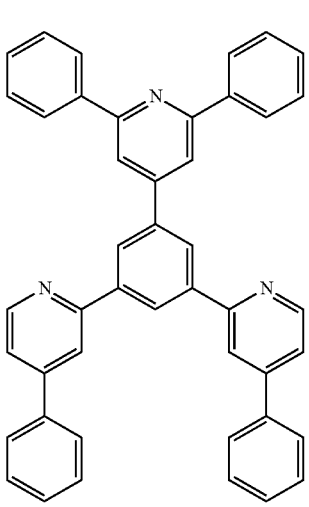
ET33
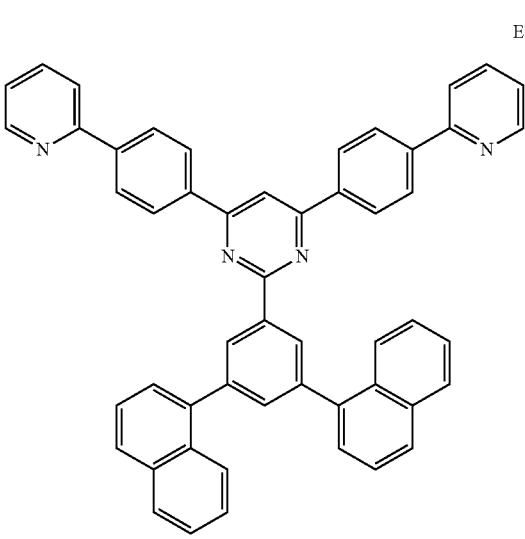

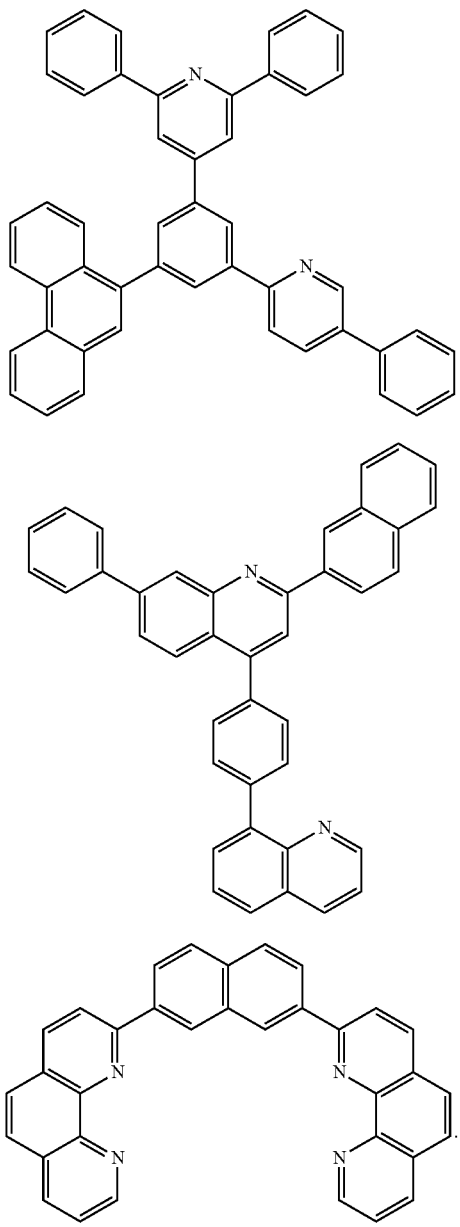

In some embodiments, the electron transport regions ETR may include a metal halide (such as LiF, NaCl, CsF, RbCl, RbI, CuI, and/or KI), a lanthanide metal (such as Yb), or a co-deposited material of the metal halide and the lanthanide metal. For example, the electron transport region ETR may include KI:Yb, RbI: Yb, etc. as a co-deposited material. In some embodiments, the electron transport region ETR may be formed utilizing a metal oxide (such as $Li_2O$ and/or BaO), or 8-hydroxyl-lithium quinolate (LiQ), etc., but embodiments of the present disclosure are not limited thereto. The electron transport region ETR may also be formed of a mixture material of an electron transport material and an insulating organometallic salt. The organometallic salt may be a material having an energy band gap of about 4 eV or more. For example, the organometallic salt may include, for example, metal acetates, metal benzoates, metal acetoacetates, metal acetylacetonates, and/or metal stearates.

The electron transport region ETR may further include at least one of 2,9-dimethyl-4,7-diphenyl-1,10-phenanthroline (BCP), or 4,7-diphenyl-1,10-phenanthroline (Bphen) in addition to the above-described materials, but embodiments of the present disclosure are not limited thereto.

The electron transport region ETR may include the above-described compounds of the hole transport region in at least one of the electron injection layer EIL, the electron transport layer ETL, or the hole blocking layer HBL.

When the electron transport region ETR includes the electron transport layer ETL, the electron transport layer ETL may have a thickness of about 100 Å to about 1,000 Å, for example, about 150 Å to about 500 Å. When the thickness of the electron transport layer ETL satisfies the aforementioned range, satisfactory electron transport characteristics may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. When the thickness of the electron injection layer EIL satisfies the above-described range, satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or mixture thereof (e.g., AgMg, AgYb, or MgAg). In some embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

In some embodiments, the second electrode EL2 may be connected with an auxiliary electrode. When the second electrode EL2 is connected with the auxiliary electrode, the resistance of the second electrode EL2 may decrease.

In some embodiments, a capping layer CPL may be further disposed on the second electrode EL2 of the organic electroluminescence device ED according to an embodiment. The capping layer CPL may include a multilayer or a single layer.

In an embodiment, the capping layer CPL may be an organic layer or an inorganic layer. For example, when the capping layer CPL includes an inorganic material, the inorganic material may include an alkaline metal compound (such as LiF), an alkaline earth metal compound (such as MgF$_2$, SiON, SiN$_x$, and/or SiO$_y$), etc.

For example, when the capping layer CPL includes an organic material, the organic material may include α-NPD, NPB, TPD, m-MTDATA, Alq$_3$, CuPc, N4,N4,N4',N4'-tetra(biphenyl-4-yl)biphenyl-4,4'-diamine (TPD15), 4,4',4''-tris(carbazol-9-yl)triphenylamine (TCTA), etc., or an epoxy resin, or acrylate (such as methacrylate). However, embodiments of the present disclosure are not limited thereto, and the capping layer CPL may include at least one among Compounds P1 to P5:

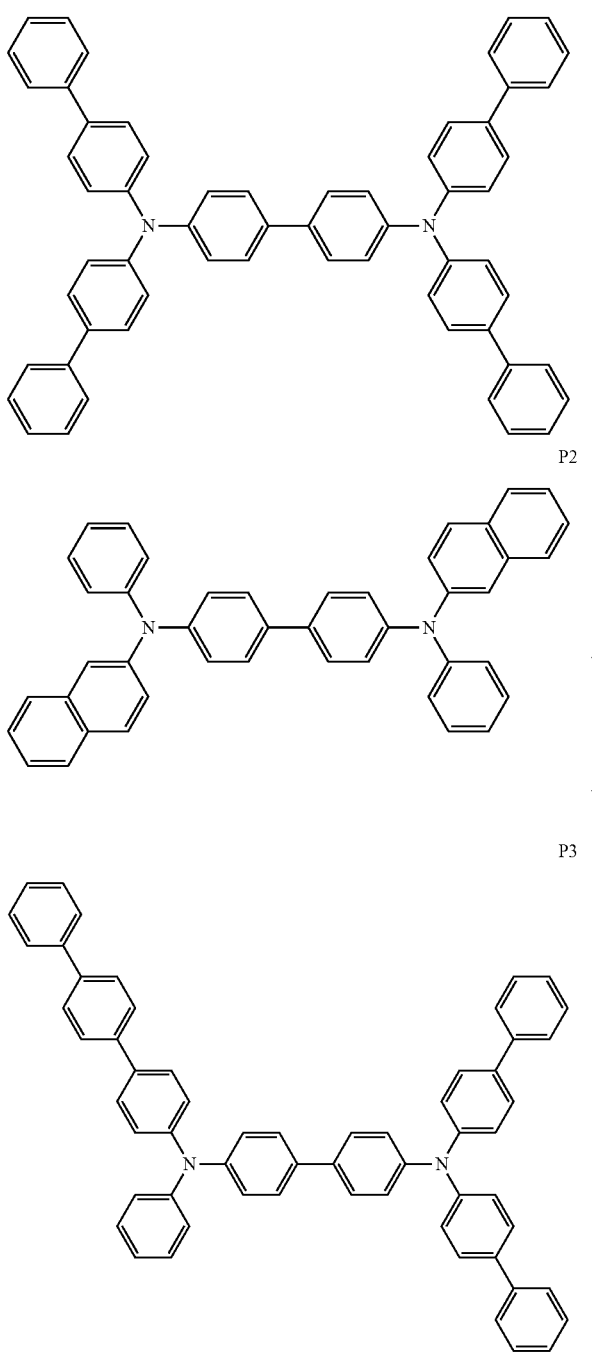

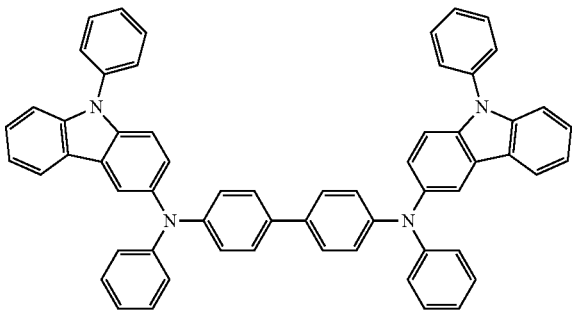

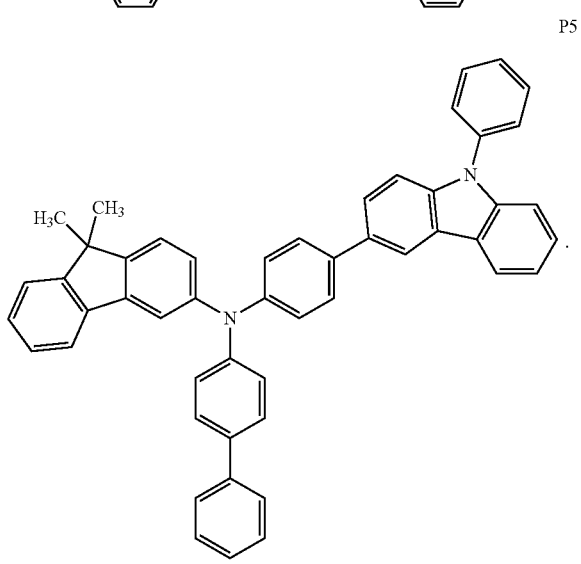

In some embodiments, the refractive index of the capping layer CPL may be about 1.6 or more. For example, the refractive index of the capping layer CPL may be about 1.6 or more with respect to light in a wavelength range of about 550 nm to about 660 nm.

Figure 7:
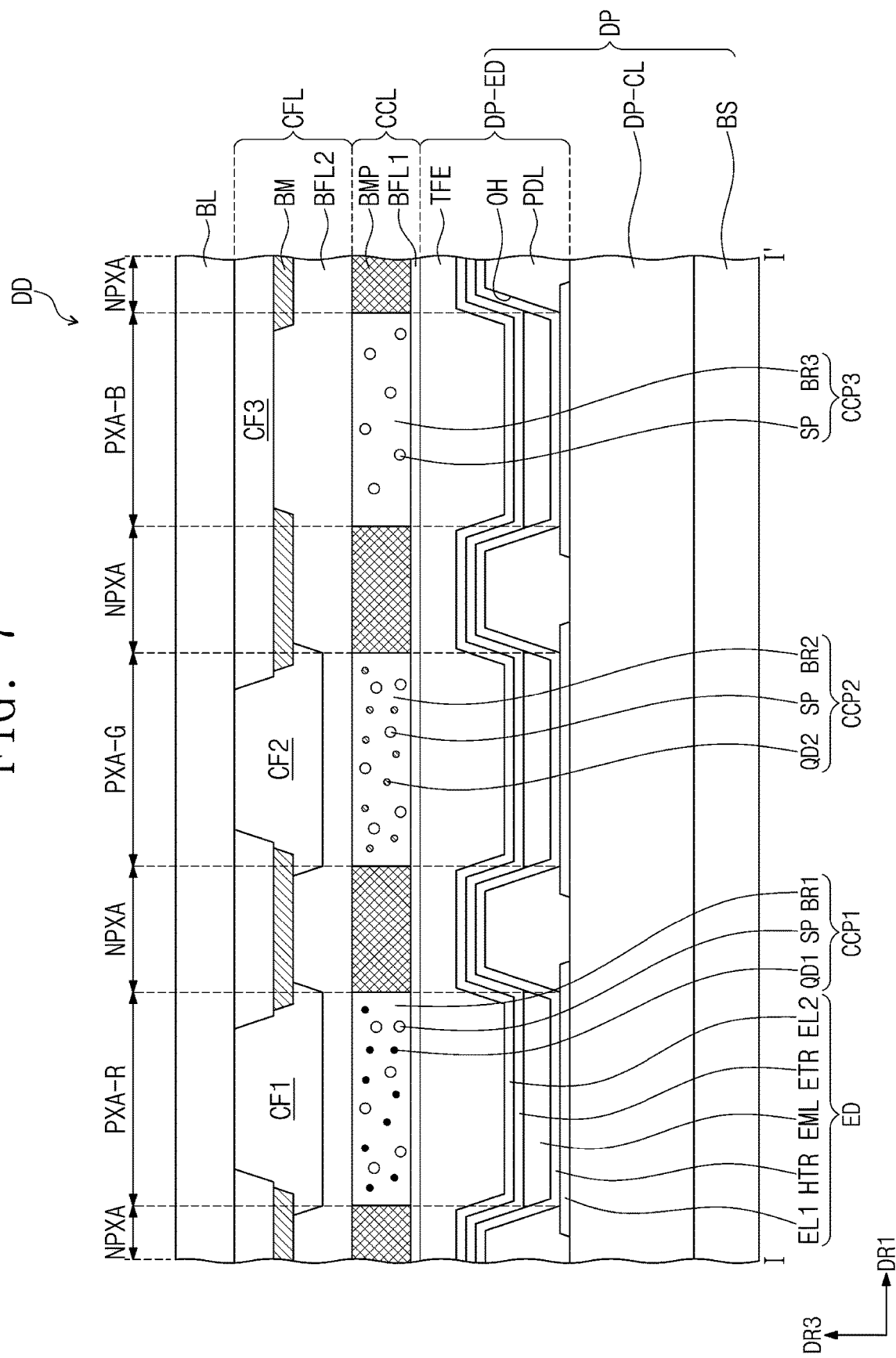
FIG. 7 is a cross-sectional view illustrating a display apparatus according to an embodiment of the present disclosure.
Figure 8:
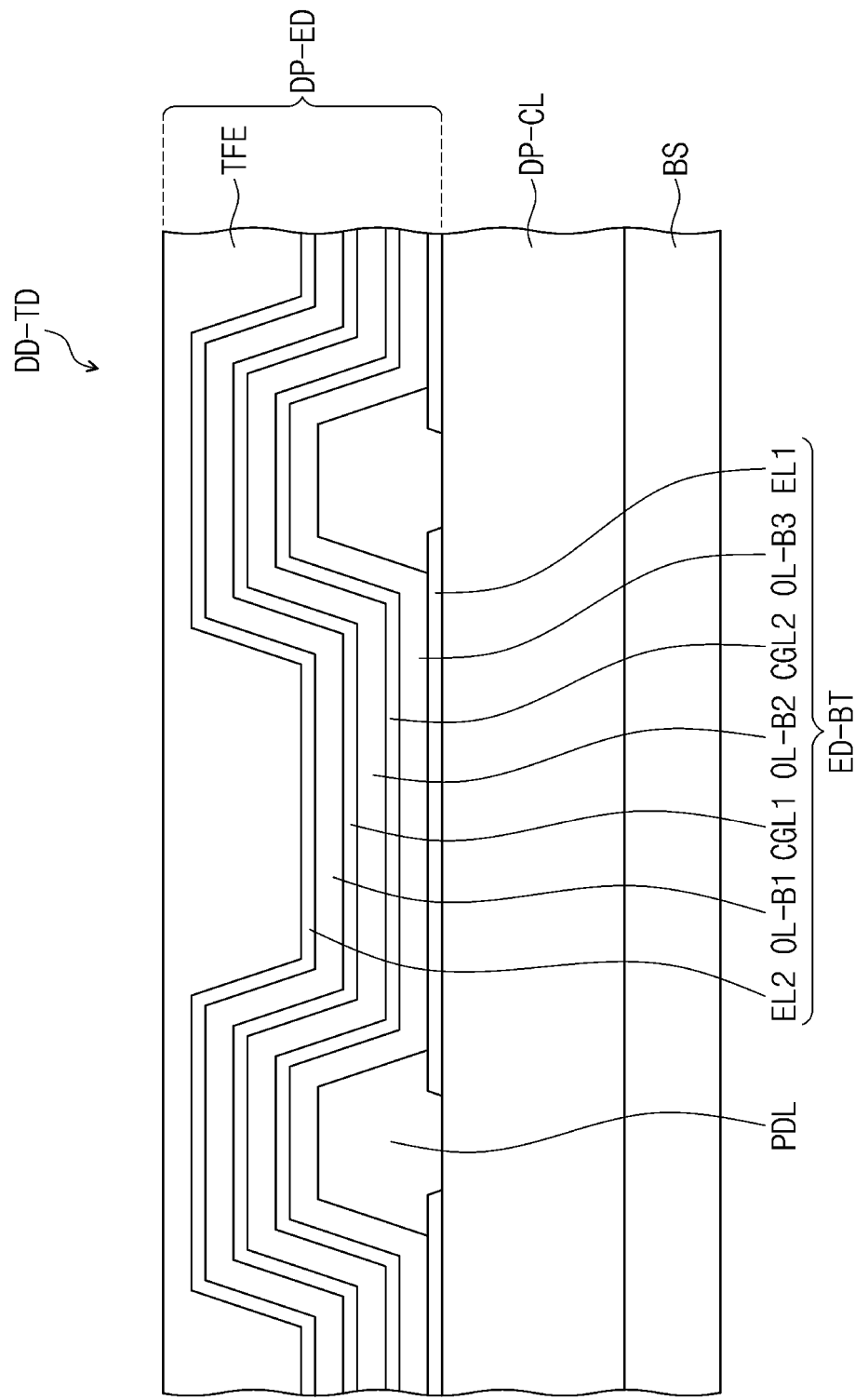
FIG. 8 is a cross-sectional view illustrating a display apparatus according to an embodiment of the present disclosure.

FIGS. 7 and 8 each are a cross-sectional view of a display apparatus according to an embodiment. Hereinafter, in describing the display apparatuses of embodiments with reference to FIGS. 7 and 8, the duplicated features which have been described in FIGS. 1 to 6 are not described again, but their differences will be mainly described.

Referring to FIG. 7, the display apparatus DD according to an embodiment may include a display panel DP including a display device layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include an organic electroluminescence device ED.

The organic electroluminescence device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In some embodiments, the structures of the organic electroluminescence devices of FIGS. 3 to 6 as described above may be equally applied to the structure of the organic electroluminescence device ED shown in FIG. 7.

Referring to FIG. 7, the emission layer EML may be disposed in an opening OH defined in a pixel defining film PDL. For example, the emission layer EML which is divided by the pixel defining film PDL and provided to correspond to each of the light emitting regions PXA-R, PXA-G, and PXA-B may be to emit light in substantially the same wavelength range. In the display apparatus DD of an embodiment, the emission layer EML may be to emit blue light. In some embodiments, the emission layer EML may be provided as a common layer to all of the light emitting regions PXA-R, PXA-G, and PXA-B.

The light control layer CCL may be disposed on the display panel DP. The light control layer CCL may include a light conversion body. The light conversion body may be or include a quantum dot, a phosphor, and/or the like. The light conversion body may be to emit light by converting the wavelength of an incident light. For example, the light control layer CCL may be a layer containing a quantum dot or a layer containing a phosphor.

The light control layer CCL may include a plurality of light control parts CCP1, CCP2 and CCP3. The light control parts CCP1, CCP2, and CCP3 may be spaced apart from one another.

Referring to FIG. 7, divided patterns BMP may be disposed between the light control parts CCP1, CCP2 and CCP3, which are spaced apart from each other, but embodiments of the present disclosure are not limited thereto. FIG. 7 illustrates that the divided patterns BMP do not overlap the light control parts CCP1, CCP2 and CCP3, but at least a portion of the edges of the light control parts CCP1, CCP2 and CCP3 may overlap the divided patterns BMP.

The light control layer CCL may include a first light control unit CCP1 containing a first quantum dot QD1 to convert first color light provided from the organic electroluminescence device ED into second color light, a second light control unit CCP2 containing a second quantum dot QD2 to convert the first color light into third color light, and a third light control unit CCP3 to transmit the first color light.

In an embodiment, the first light control part CCP1 may be to provide red light that is the second color light, and the second light control part CCP2 may be to provide green light that is the third color light. The third light control unit CCP3 may be to provide blue light by transmitting the blue light that is the first color light provided in the organic electroluminescence device ED. For example, the first quantum dot QD1 may be a red quantum dot, and the second quantum dot QD2 may be a green quantum dot. The same as described above may be applied with respect to the quantum dots QD1 and QD2.

In some embodiments, the light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include any quantum dot but may include the scatterer SP.

The scatterer SP may be or include inorganic particles. For example, the scatterer SP may include at least one of $TiO_2$, $ZnO$, $Al_2O_3$, $SiO_2$, or hollow silica. The scatterer SP may include any one of $TiO_2$, $ZnO$, $Al_2O_3$, $SiO_2$, or hollow silica, or may be a mixture of at least two materials selected from among $TiO_2$, $ZnO$, $Al_2O_3$, $SiO_2$, and hollow silica.

The first light control part CCP1, the second light control part CCP2, and the third light control part CCP3 may respectively include base resins BR1, BR2, and BR3, in which the quantum dots QD1 and QD2 and the scatterer SP are dispersed. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 are media in which the quantum dots QD1 and QD2 and the scatterer SP are dispersed, and may be formed of various suitable resin compositions, each of which may be generally referred to as a binder. For example, the base resins BR1, BR2, and BR3 may each independently be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may serve to prevent or reduce the penetration of moisture and/or oxygen (hereinafter, referred to as 'moisture/oxygen'). The barrier layer BFL1 may be disposed on the light control parts CCP1, CCP2, and CCP3 to block or reduce exposure of the light control parts CCP1, CCP2 and CCP3 to moisture/oxygen. In some embodiments, the barrier layer BFL1 may cover the light control parts CCP1, CCP2, and CCP3. In some embodiments, the barrier layer BFL2 may be provided between the light control parts CCP1, CCP2, and CCP3 and the color filter layer CFL.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. In some embodiments, the barrier layers BFL1 and BFL2 may further include an organic film. The barrier layers BFL1 and BFL2 may be formed of a single layer or a plurality of layers.

In the display apparatus DD of an embodiment, the color filter layer CFL may be disposed on the light control layer CCL. For example, the color filter layer CFL may be directly disposed on the light control layer CCL. In this case, the barrier layer BFL2 may not be provided.

The color filter layer CFL may include a light shielding unit BM and filters CF-B, CF-G, and CF-R. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 may each independently include a polymeric photosensitive resin and/or a pigment and/or dye. The first filter CF1 may include a red pigment and/or dye, the second filter CF2 may include a green pigment and/or dye, and the third filter CF3 may include a blue pigment and/or dye. Embodiments of the present disclosure are not limited thereto, and the third filter CF3 may not include (e.g., may exclude) a pigment or dye. The third filter CF3 may include a polymeric photosensitive resin and may not include (e.g., may exclude) a pigment and/or dye. The third filter CF3 may be transparent. The third filter CF3 may be formed of a transparent photosensitive resin.

Furthermore, in an embodiment, the first filter CF1 and the second filter CF2 may be a yellow filter. In some embodiments, the first filter CF1 and the second filter CF2 may not be separated and may be provided as one filter.

The light shielding unit BM may be a black matrix. The light shielding unit BM may include an organic light shielding material and/or an inorganic light shielding material, each containing a black pigment and/or dye. The light shielding unit BM may prevent or reduce light leakage, and may separate boundaries between the adjacent filters CF1, CF2, and CF3. In some embodiments, in an embodiment, the light shielding unit BM may be formed of a blue filter.

The first to third filters CF1, CF2, and CF3 may be disposed to correspond to the red light emitting region PXA-R, the green light emitting region PXA-G, and the blue light emitting region PXA-B, respectively.

A base substrate BL may be disposed on the color filter layer CFL. The base substrate BL may be a member which provides a base surface in which the color filter layer CFL, the light control layer CCL, and/or the like are disposed. The base substrate BL may be a glass substrate, a metal substrate, a plastic substrate, etc. However, embodiments of the present disclosure are not limited thereto, and the base substrate BL may be an inorganic layer, an organic layer, or a composite material layer. In some embodiments, the base substrate BL may not be provided.

FIG. 8 is a cross-sectional view illustrating a part of a display apparatus according to an embodiment. FIG. 8 illustrates a cross-sectional view of a part corresponding to the display panel DP of FIG. 7. In the display apparatus DD-TD of an embodiment, the organic electroluminescence device ED-BT may include a plurality of light emitting structures OL-B1, OL-B2, and OL-B3. The organic electroluminescence device ED-BT may include a first electrode EL1 and a second electrode EL2, which face each other, and the plurality of light emitting structures OL-B1, OL-B2, and OL-B3 sequentially stacked in the thickness direction between the first electrode EL1 and the second electrode EL2. The light emitting structures OL-B1, OL-B2, and OL-B3 may each independently include an emission layer EML (FIG. 7) and a hole transport region HTR and an electron transport region ETR disposed with the emission layer EML (FIG. 7) therebetween.

For example, the organic electroluminescence device ED-BT included in the display apparatus DD-TD of an embodiment may be an organic electroluminescence device having a tandem structure and including a plurality of emission layers.

In an embodiment illustrated in FIG. 8, all light beams to be respectively emitted from the light emitting structures OL-B1, OL-B2, and OL-B3 may be blue light. However, embodiments of the present disclosure are not limited thereto, and the light beams to be respectively emitted from the light emitting structures OL-B1, OL-B2, and OL-B3 may have wavelength ranges different from each other. For example, the organic electroluminescence device ED-BT including the plurality of light emitting structures OL-B1, OL-B2, and OL-B3 which may be to emit light beams having wavelength ranges different from each other in order to emit white light.

A charge generation layer CGL may be disposed between the neighboring light emitting structures OL-B1, OL-B2, and OL-B3. The charge generation layer CGL may include a p-type charge generation layer and/or an n-type charge generation layer.

Hereinafter, the present disclosure will be described in more detail through Examples and Comparative Examples. The examples are only illustrations for assisting the understanding of the present disclosure, and the scope of the present disclosure is not limited thereto.

SYNTHETIC EXAMPLES

An organometallic compound according to an embodiment of the present disclosure may be synthesized, for example, as follows. However, synthetic methods of the organometallic compound according to an embodiment of the present disclosure are not limited thereto.

1. Synthesis of Example Compound 1

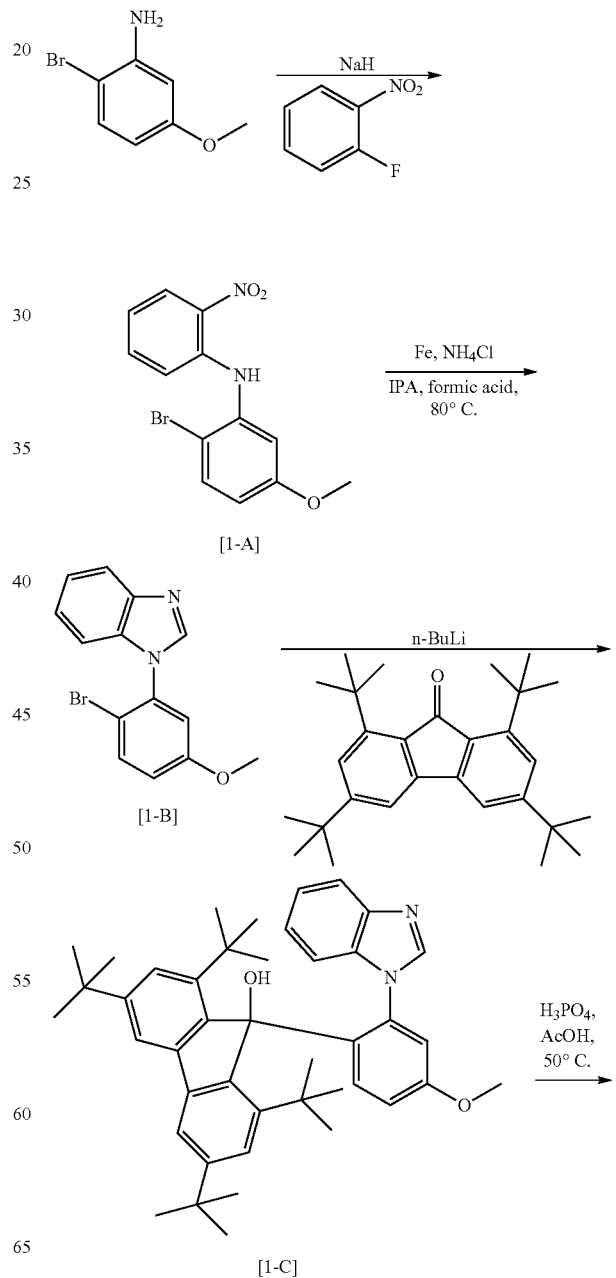

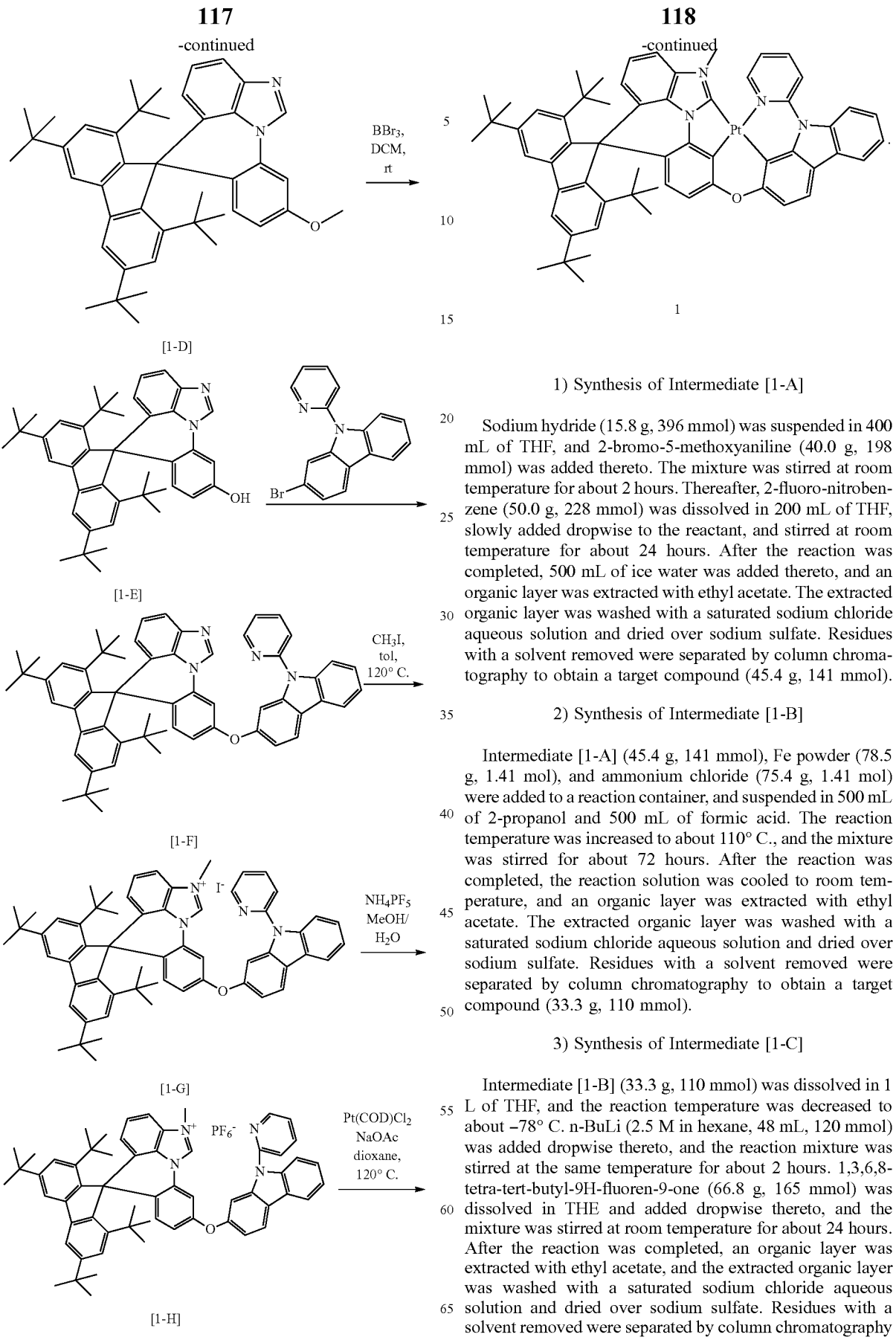

1) Synthesis of Intermediate [1-A]

Sodium hydride (15.8 g, 396 mmol) was suspended in 400 mL of THF, and 2-bromo-5-methoxyaniline (40.0 g, 198 mmol) was added thereto. The mixture was stirred at room temperature for about 2 hours. Thereafter, 2-fluoro-nitrobenzene (50.0 g, 228 mmol) was dissolved in 200 mL of THF, slowly added dropwise to the reactant, and stirred at room temperature for about 24 hours. After the reaction was completed, 500 mL of ice water was added thereto, and an organic layer was extracted with ethyl acetate. The extracted organic layer was washed with a saturated sodium chloride aqueous solution and dried over sodium sulfate. Residues with a solvent removed were separated by column chromatography to obtain a target compound (45.4 g, 141 mmol).

2) Synthesis of Intermediate [1-B]

Intermediate [1-A] (45.4 g, 141 mmol), Fe powder (78.5 g, 1.41 mol), and ammonium chloride (75.4 g, 1.41 mol) were added to a reaction container, and suspended in 500 mL of 2-propanol and 500 mL of formic acid. The reaction temperature was increased to about 110° C., and the mixture was stirred for about 72 hours. After the reaction was completed, the reaction solution was cooled to room temperature, and an organic layer was extracted with ethyl acetate. The extracted organic layer was washed with a saturated sodium chloride aqueous solution and dried over sodium sulfate. Residues with a solvent removed were separated by column chromatography to obtain a target compound (33.3 g, 110 mmol).

3) Synthesis of Intermediate [1-C]

Intermediate [1-B] (33.3 g, 110 mmol) was dissolved in 1 L of THF, and the reaction temperature was decreased to about −78° C. n-BuLi (2.5 M in hexane, 48 mL, 120 mmol) was added dropwise thereto, and the reaction mixture was stirred at the same temperature for about 2 hours. 1,3,6,8-tetra-tert-butyl-9H-fluoren-9-one (66.8 g, 165 mmol) was dissolved in THF and added dropwise thereto, and the mixture was stirred at room temperature for about 24 hours. After the reaction was completed, an organic layer was extracted with ethyl acetate, and the extracted organic layer was washed with a saturated sodium chloride aqueous solution and dried over sodium sulfate. Residues with a solvent removed were separated by column chromatography to obtain a target compound (24.1 g, 38.4 mmol).

4) Synthesis of Intermediate [1-D]

Intermediate [1-C] (24.1 g, 38.4 mmol) was added to a reaction container, and suspended in 240 mL of phosphoric acid and 10 mL of acetic acid. The reaction temperature was increased to about 50° C., and the mixture was stirred for about 24 hours. After the reaction was completed, the reaction solution was cooled to room temperature, and an organic layer was extracted with ethyl acetate. The extracted organic layer was washed with a saturated sodium chloride aqueous solution and dried over sodium sulfate. Residues with a solvent removed were separated by column chromatography to obtain a target compound (12.3 g, 20.2 mmol).

5) Synthesis of Intermediate [1-E]

Intermediate [1-D] (12.3 g, 20.2 mmol) was added to a reaction container and suspended in 200 mL of DCM, and then the reaction temperature was decreased to about −78° C. BBr$_3$ (1.0 M in DCM, 30 mL) was added dropwise thereto, and the reaction mixture was stirred at room temperature for about 12 hours. After the reaction was completed, an organic layer was extracted with ethyl acetate, and the extracted organic layer was washed with a saturated sodium chloride aqueous solution and dried over sodium sulfate. Residues with a solvent removed were separated by column chromatography to obtain a target compound (9.5 g, 16.0 mmol).

6) Synthesis of Intermediate [1-F]

Intermediate [1-E] (9.5 g, 16.0 mmol), 2-bromo-9-(pyridin-2-yl)-9H-carbazole (7.8 g, 24.0 mmol), copper iodide (300 mg, 1.6 mmol), picolinic acid (670 mg, 1.6 mmol), and tripotassium phosphate (6.8 g, 32.0 mmol) were added to a reaction container and suspended in 160 mL of dimethyl sulfoxide. The reaction mixture was heated and stirred at about 160° C. for about 12 hours. After the reaction was completed, the reaction solution was cooled to room temperature, and an organic layer was extracted with ethyl acetate. The extracted organic layer was washed with a saturated sodium chloride aqueous solution and dried over sodium sulfate. Residues with a solvent removed were separated by column chromatography to obtain a target compound (10.3 g, 12.3 mmol).

7) Synthesis of Intermediate [1-G]

Intermediate [1-F] (10.3 g, 12.3 mmol) and iodomethane (5.2 g, 36.9 mmol) were added to a reaction container and suspended in 120 mL of toluene. The reaction mixture was heated and stirred at about 110° C. for about 12 hours. After the reaction was completed, the reaction solution was cooled to room temperature, and a solvent was partially removed and then a resulting solid was filtered by adding distilled water. The filtered solid was purified by recrystallization to obtain a target compound (8.9 g, 9.1 mmol).

8) Synthesis of Intermediate [1-H]

Intermediate [1-G] (8.9 g, 9.1 mmol) and ammonium hexafluorophosphate (4.4 g, 27.3 mmol) were added to a reaction container and suspended in a solution of methanol and water (2:1). The reaction mixture was stirred at room temperature for about 12 hours. The resulting solid was filtered and purified by recrystallization to obtain a target compound (7.7 g, 7.7 mmol).

9) Synthesis of Example Compound 1

Intermediate [1-H] (7.7 g, 7.7 mmol), dichloro(1,5-cyclooctadiene)platinum (3.2 g, 8.5 mmol), and sodium acetate (1.3 g, 15.4 mmol) were suspended in 310 mL of dioxane. The reaction mixture was heated and stirred at about 110° C. for about 72 hours. After the reaction was completed, the reaction solution was cooled to room temperature, 310 mL of distilled water was added thereto, and an organic layer was extracted with ethyl acetate. The extracted organic layer was washed with a saturated sodium chloride aqueous solution and dried over sodium sulfate. Residues with a solvent removed were separated by column chromatography to obtain Compound 1 (730 mg, 0.7 mmol).

2. Synthesis of Example Compound 4

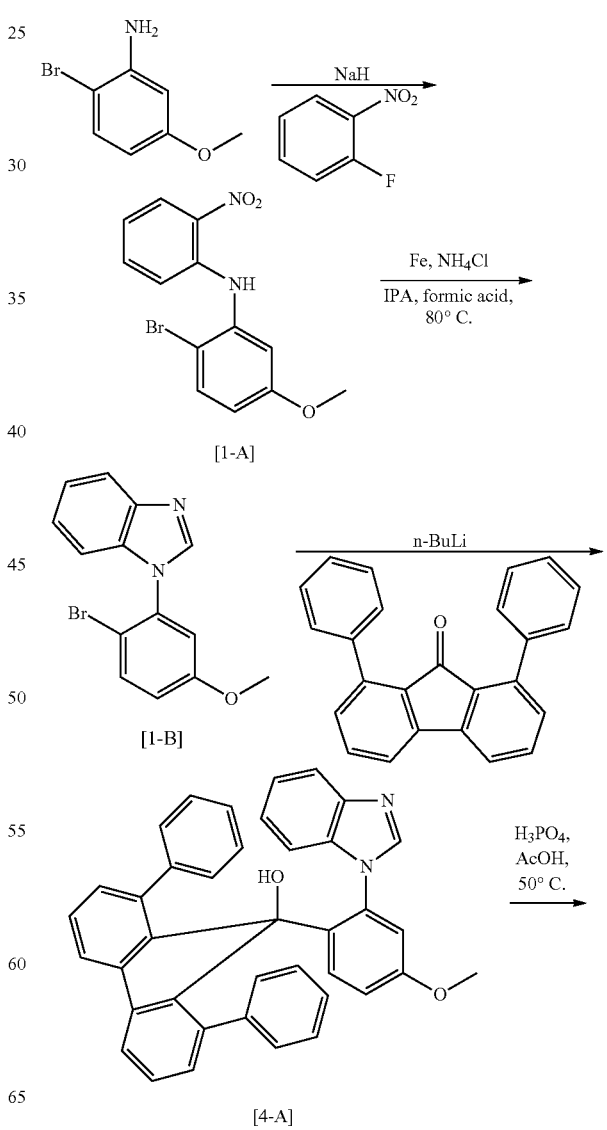

121
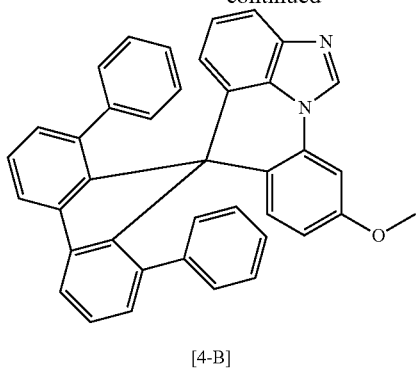
[4-B]
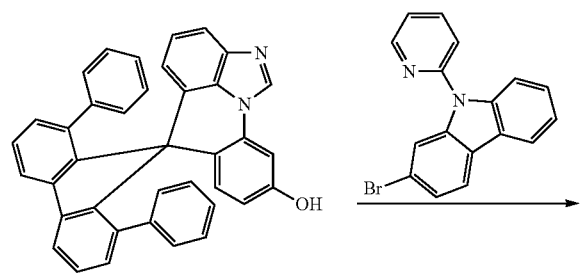
[4-C]
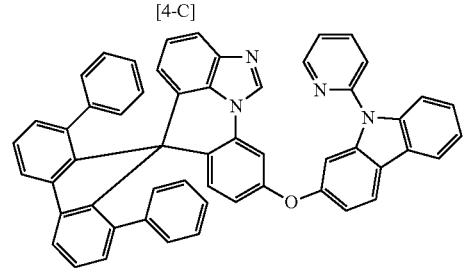
[4-D]
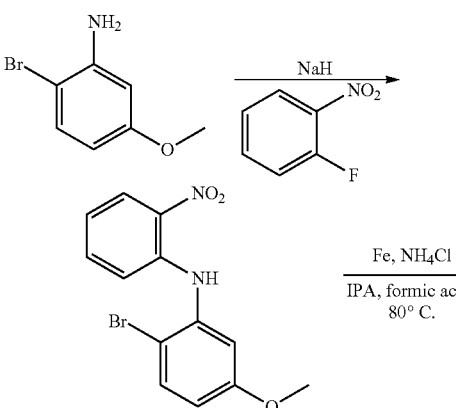
[4-E]
[4-F]
122
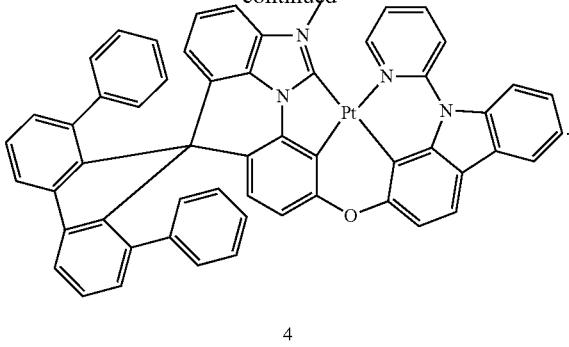
4
Compound 4 (580 mg, 0.6 mmol) was obtained in substantially the same manner as in the synthesis of Example Compound 1, except that 1,8-diphenyl-9H-fluoren-9-one was utilized instead of 1,3,6,8-tetra-tert-butyl-9H-fluoren-9-one.
3. Synthesis of Example Compound 12
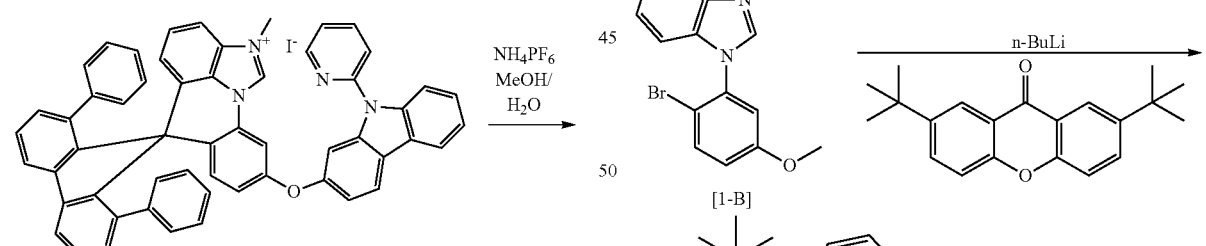
[1-A]
[1-B]
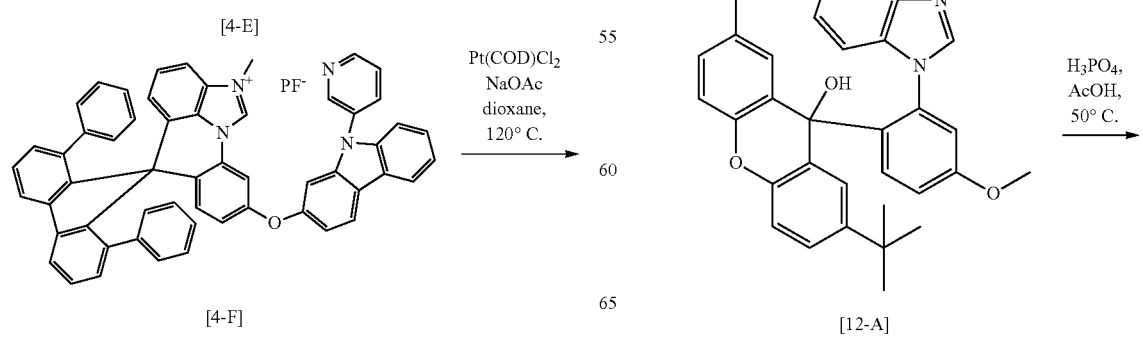
[12-A]

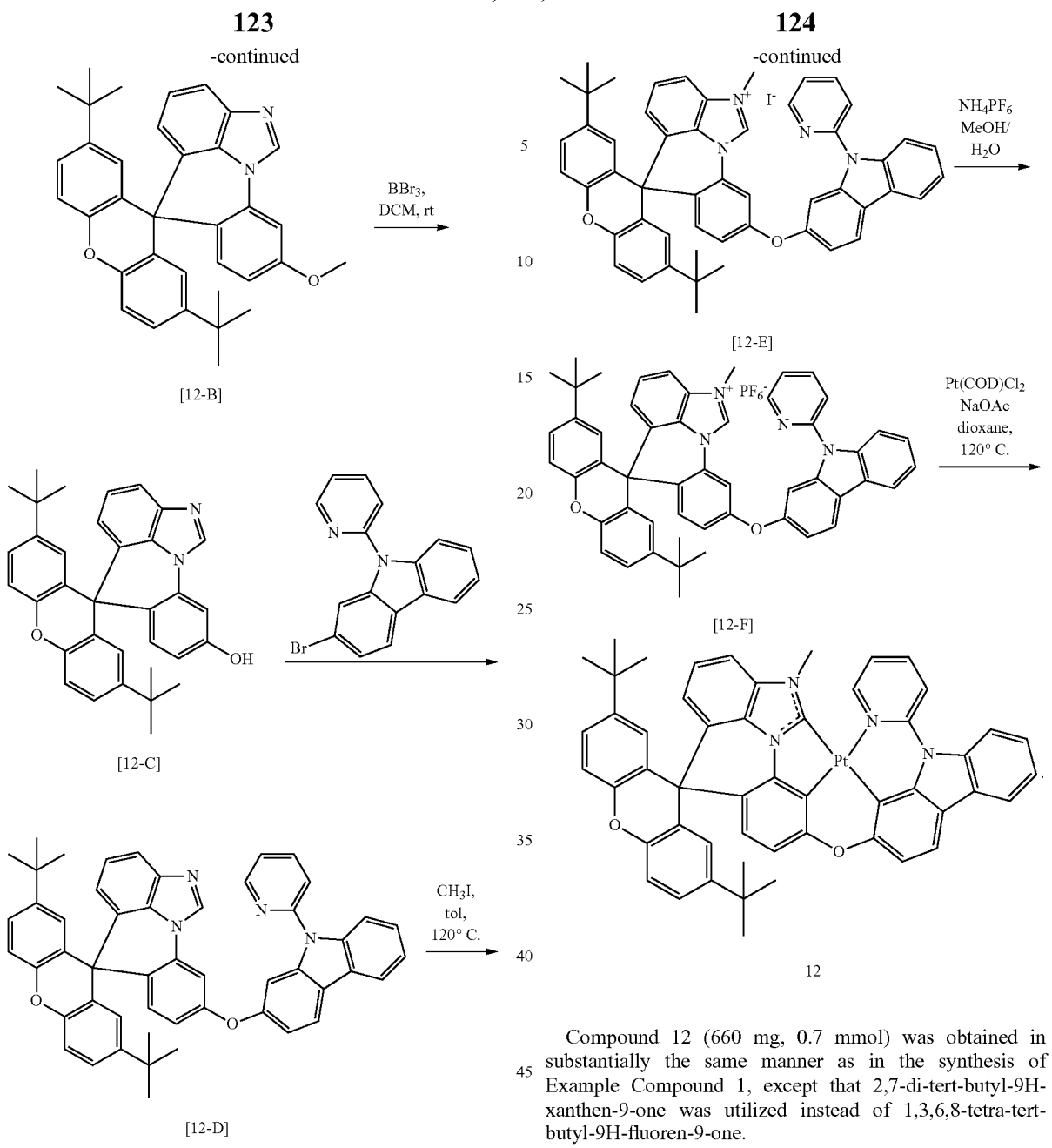
Compound 12 (660 mg, 0.7 mmol) was obtained in substantially the same manner as in the synthesis of Example Compound 1, except that 2,7-di-tert-butyl-9H-xanthen-9-one was utilized instead of 1,3,6,8-tetra-tert-butyl-9H-fluoren-9-one.
4. Synthesis of Example Compound 62
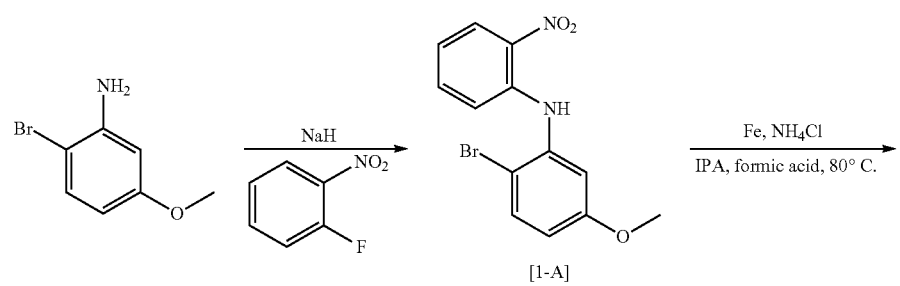

-continued
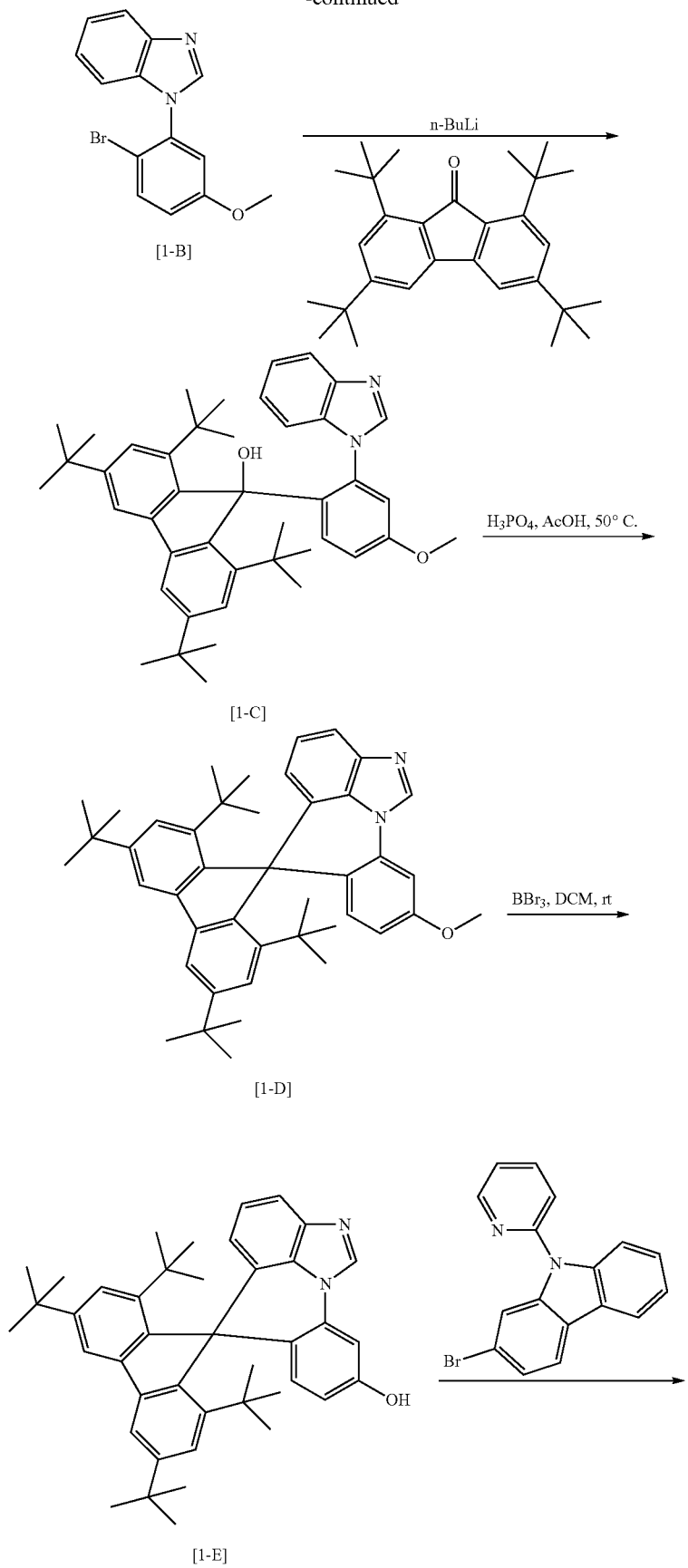

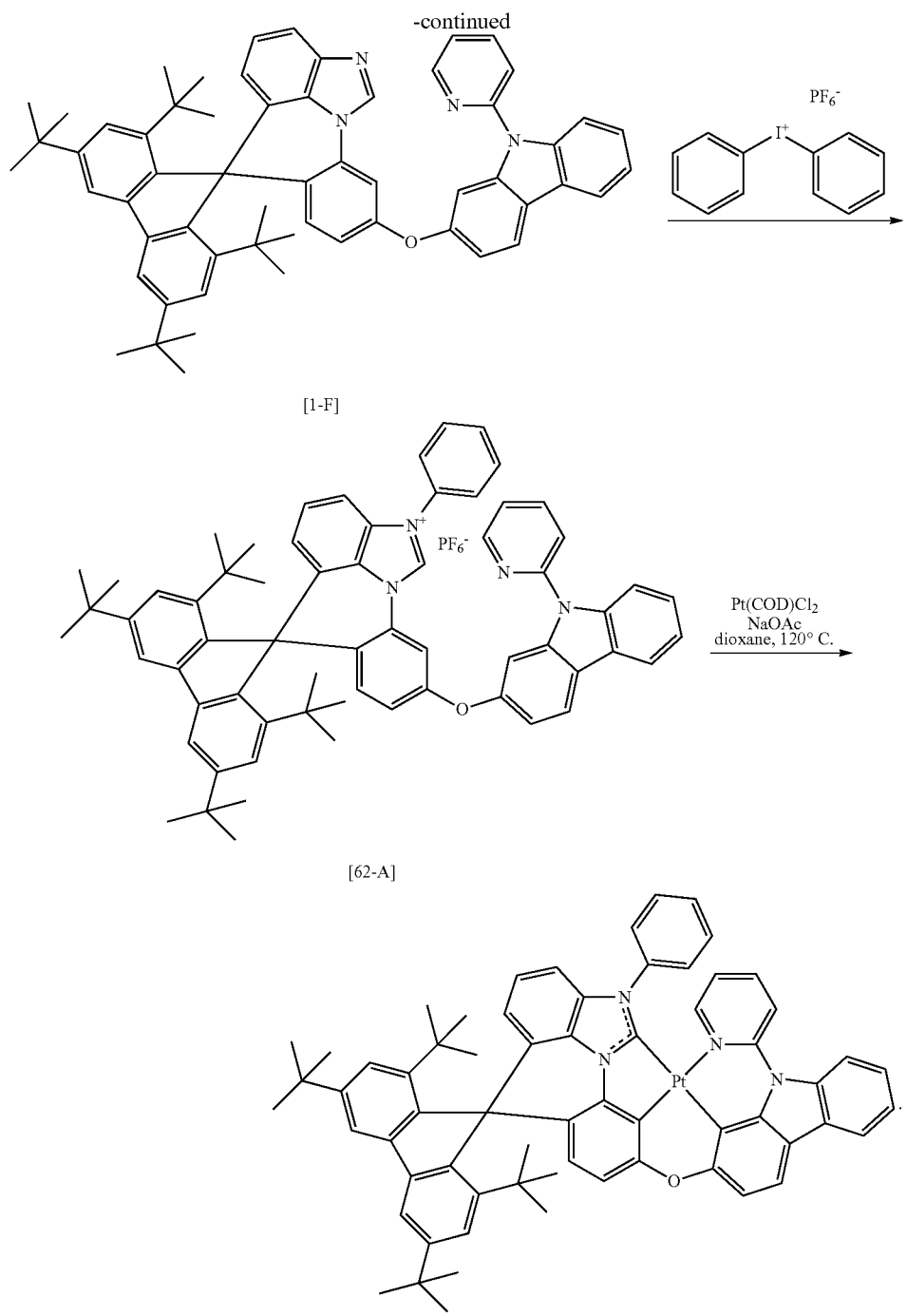

1) Synthesis of Intermediate [62-A]

Intermediate [1-F] (10.3 g, 12.3 mmol), diphenyliodonium hexafluorophosphate (7.9 g, 18.5 mmol), and copper acetate (220 mg, 1.2 mmol) were suspended in 120 mL of dimethyl sulfoxide. The reaction mixture was heated and stirred at about 110° C. for about 24 hours. After the reaction was completed, the reaction solution was cooled to room temperature, 210 mL of distilled water was added thereto, and an organic layer was extracted with ethyl acetate. The extracted organic layer was washed with a saturated sodium chloride aqueous solution and dried over sodium sulfate. Residues with a solvent removed were separated by column chromatography to obtain a target compound (8.6 g, 8.1 mmol).

2) Synthesis of Compound 62

Intermediate [62-A] (8.6 g, 8.1 mmol), dichloro(1,5-cyclooctadiene)platinum (3.4 g, 8.9 mmol), and sodium acetate (2.0 g, 24.3 mmol) were suspended in 130 mL of dioxane. The reaction mixture was heated and stirred at about 110° C. for about 72 hours. After the reaction was completed, the reaction solution was cooled to room temperature, 130 mL of distilled water was added thereto, and an organic layer was extracted with ethyl acetate. The extracted organic layer was washed with a saturated sodium chloride aqueous solution and dried over sodium sulfate. Residues with a solvent removed were separated by column chromatography to obtain Compound 62 (880 mg, 0.8 mmol).

5. Synthesis of Example Compound 83

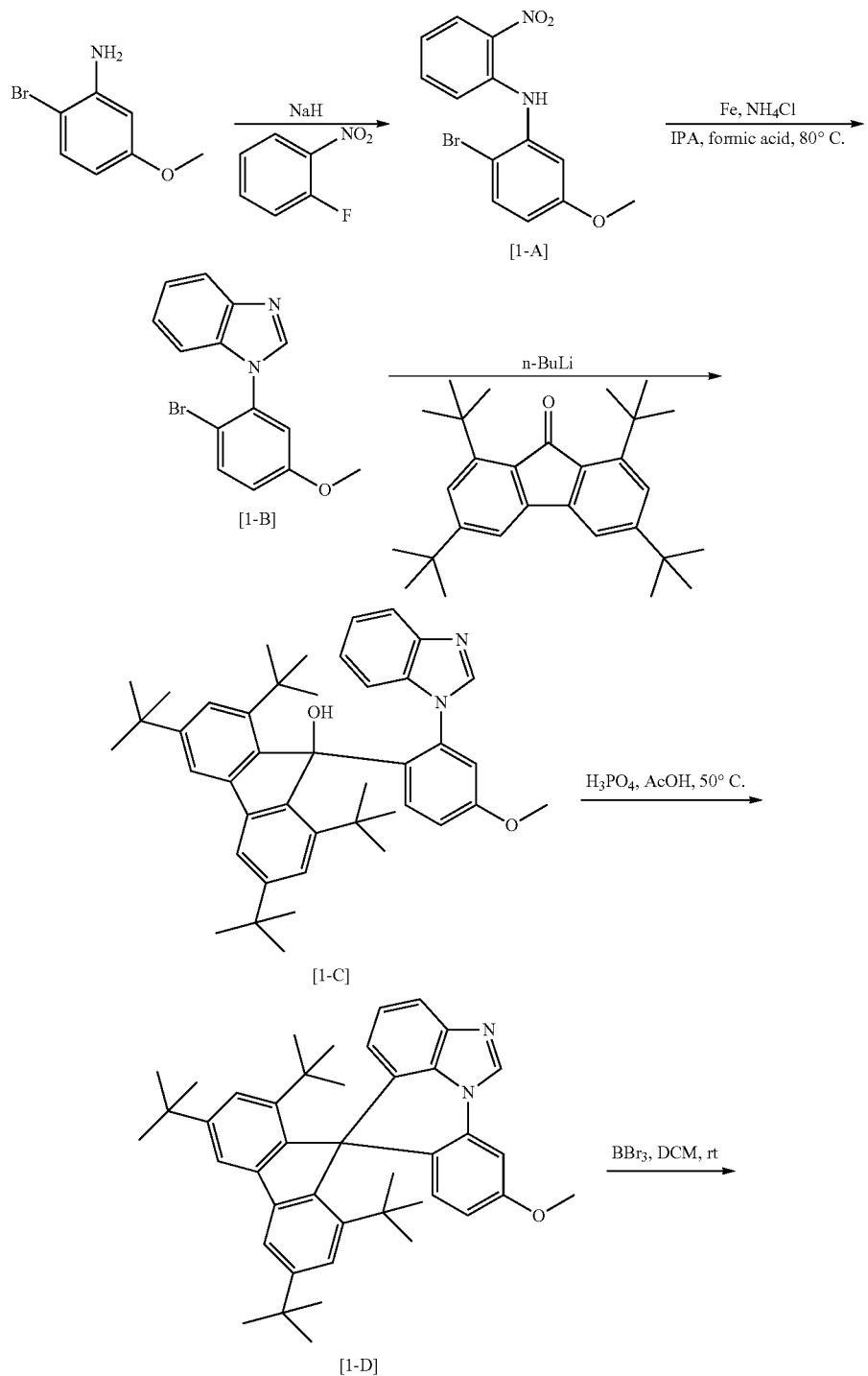

-continued
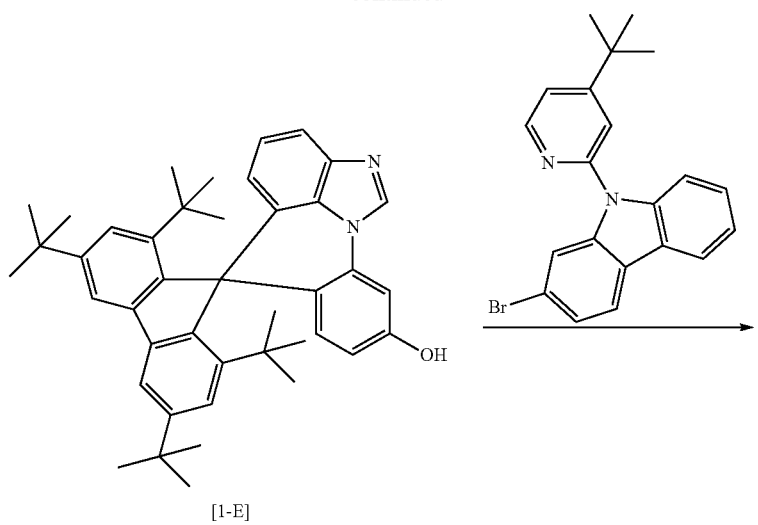
[1-E]
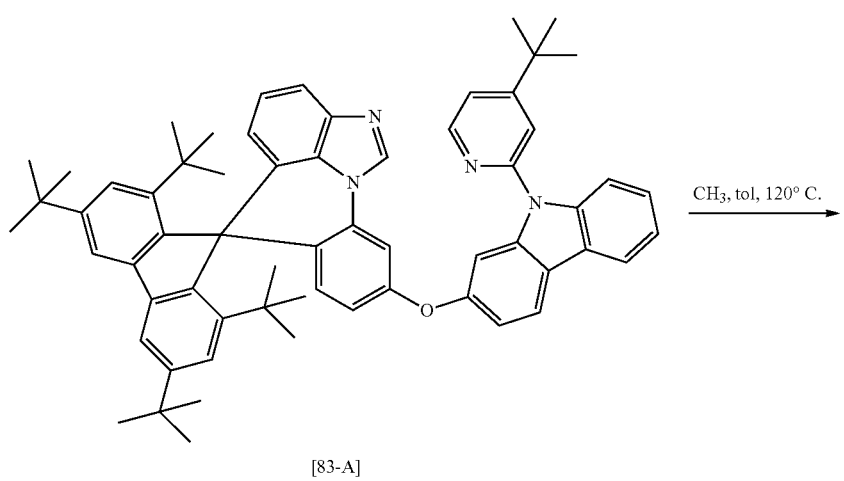
[83-A]
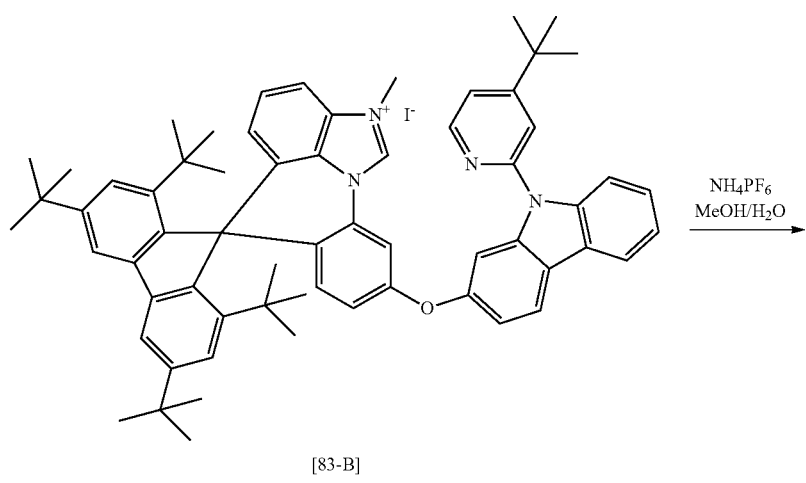
[83-B]

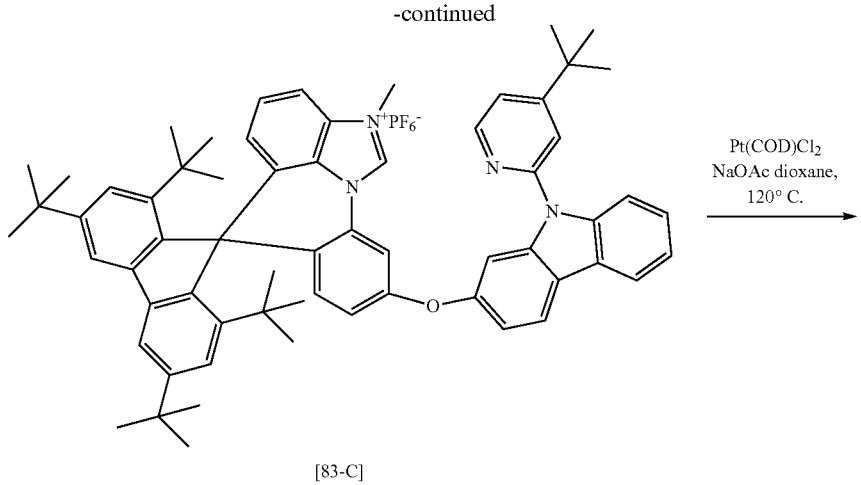
Compound 83 (550 mg, 0.5 mmol) was obtained in substantially the same manner as the synthesis of Example Compound 1 except that 2-bromo-9-(4-(tert-butyl)pyridin-2-yl)-9H-carbazole was utilized instead of 2-bromo-9-(pyridin-2-yl)-9H-carbazole.
6. Synthesis of Example Compound 129
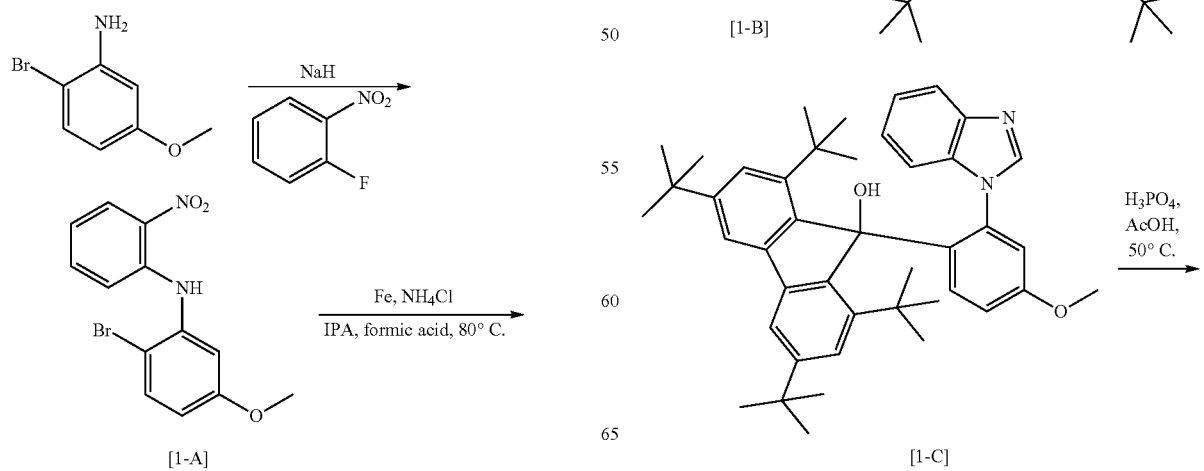

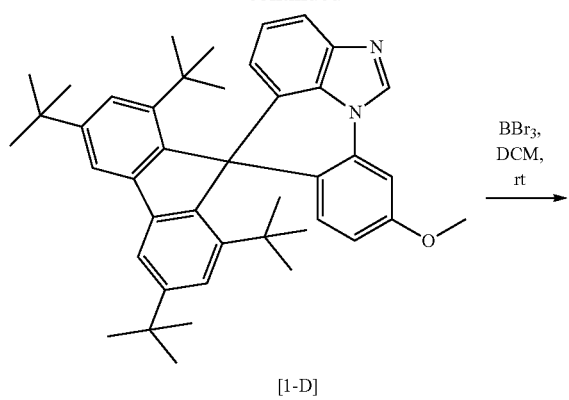
[1-D]
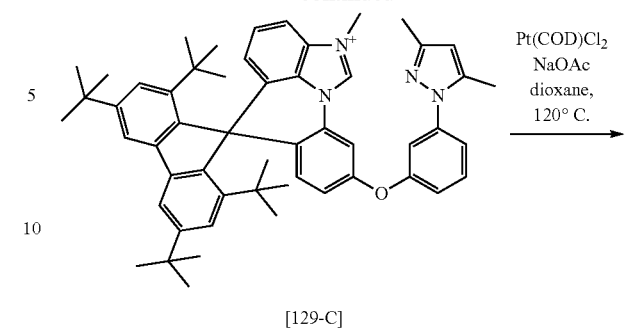
[129-C]
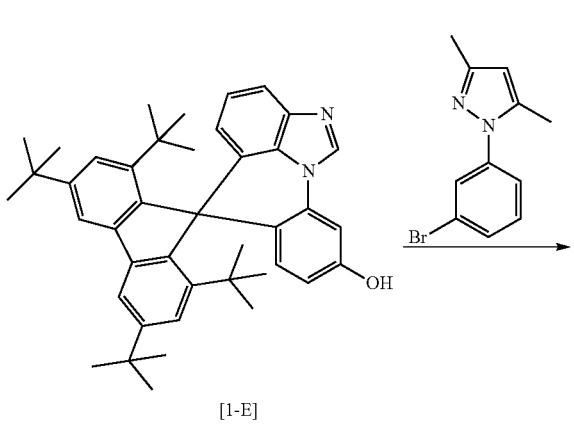
[1-E]
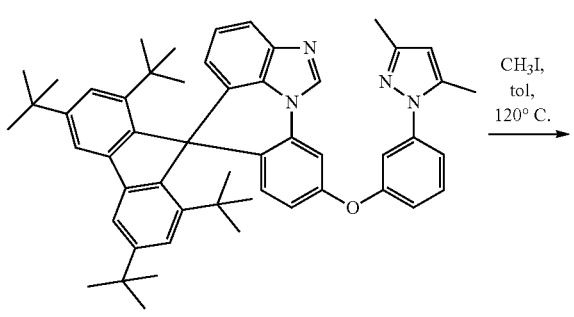
[129-A]
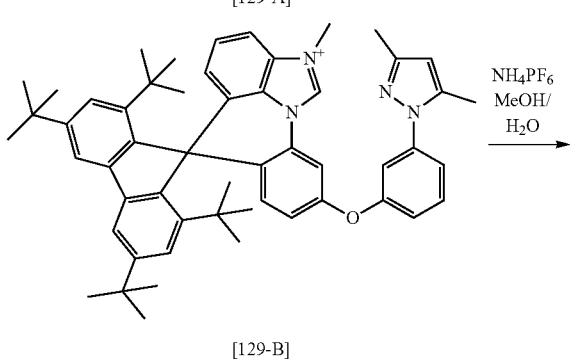
[129-B]
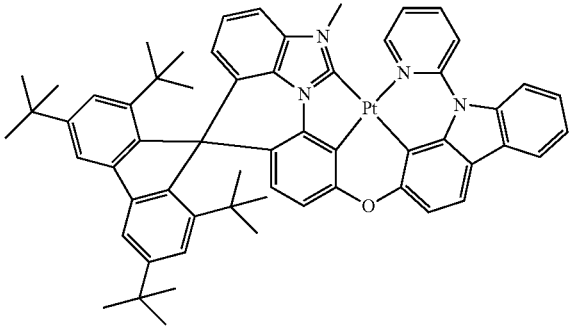
129
Compound 129 (290 mg, 0.3 mmol) was obtained in substantially the same manner as the synthesis of Example Compound 1 except that 1-(3-bromophenyl)-3,5-dimethyl-1H-pyrazole was utilized instead of 2-bromo-9-(pyridin-2-yl)-9H-carbazole.
(Characteristic Evaluation of Organometallic Compound)
The Example Compounds and Comparative Example Compounds are as follows.
Example Compounds
1

-continued
4
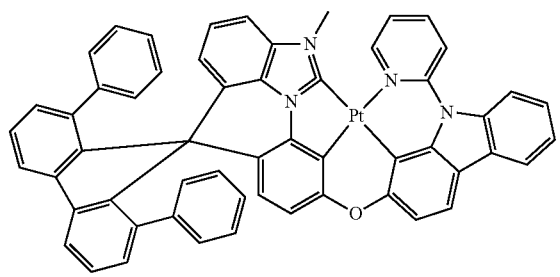
12
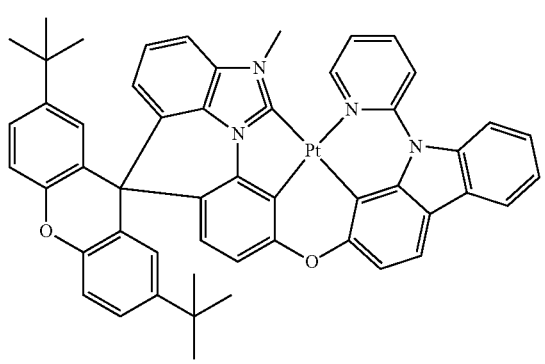
62
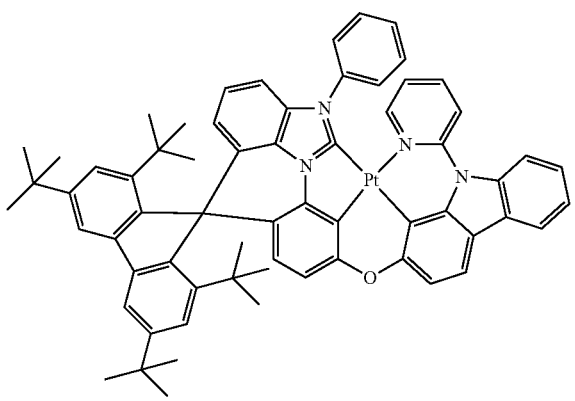
83
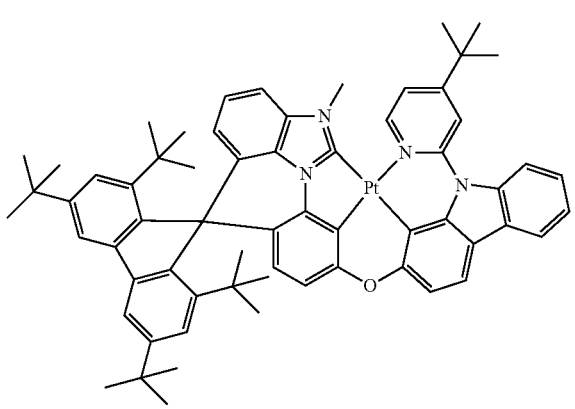
-continued
129
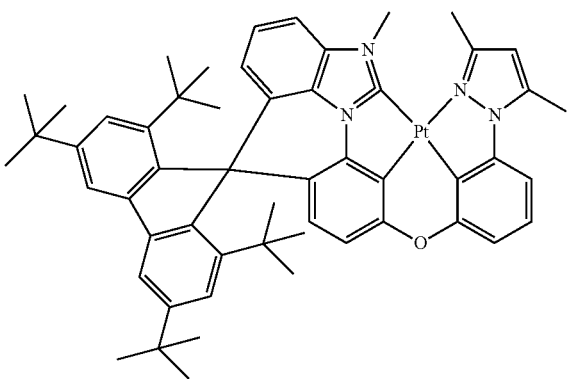
CE1
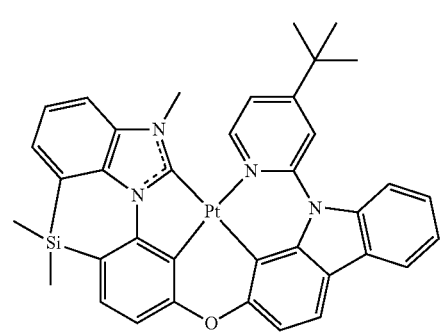
CE2
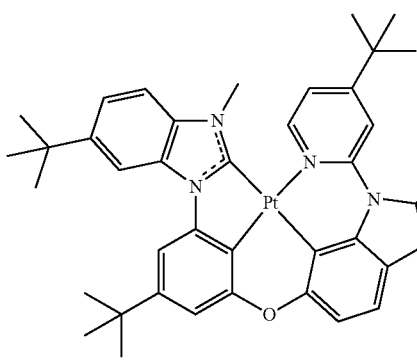
CE3
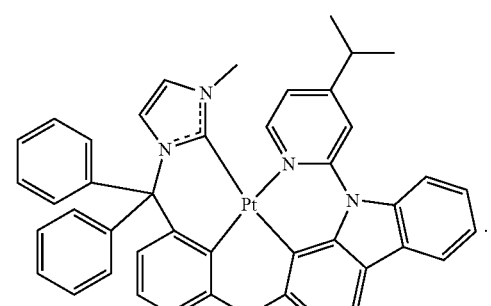
$^1$H NMR and MS/FAB of the Example Compounds are shown in Table 1.

TABLE 1

| Compound No. | $^1$H NMR (CDCl$_3$, 400 MHz) | MS/FAB found | calc. |
|---|---|---|---|
| 1 | 8.75 (m, 1H), 8.41 (m, 1H), 8.18-8.16 (m, 2H), 8.01 (m, 1H), 7.67-7.64 (m, 2H), 7.55-7.53 (m, 2H), 7.35-7.31 (m, 4H), 7.17-7.16 (m, 2H), 6.81 (m, 1H), 6.69-6.67 (m, 2H), 6.52 (m, 1H), 3.37 (s, 3H), 1.37 (s, 9H), 1.36 (s, 9H), 1.33 (s, 9H), 1.31 (s, 9H) | 1045.4256 | 1045.4258 |
| 4 | 8.77 (m, 1H), 8.40 (m, 1H), 8.19-8.18 (m, 2H), 8.01-7.99 (m, 3H), 7.69-7.67 (m, 2H), 7.59-7.55 (m, 3H), 7.49-7.45 (m, 5H), 7.40-7.36 (m, 2H), 7.15 (m, 1H), 7.07 (m, 6H), 7.33-7.32 1H), 6.81 (m, 1H), 6.68-6.66 (m, 2H), 6.55 (m, 1H), 3.34 (s, 3H) | 973.2379 | 973.2380 |
| 12 | 8.73 (m, 1H), 8.44 (m, 1H), 8.17-8.14 (m, 2H), 8.00 (m, 1H), 7.55-7.54 (m, 2H), 7.36-7.28 (m, 6H), 7.22-7.18 (m, 3H), 7.05 (m, 1H), 6.81 (m, 1H), 6.68-6.67 (m, 2H), 6.54 (m, 1H), 3.33 (s, 3H), 1.28 (s, 9H), 1.27 (s, 9H) | 949.2953 | 949.2956 |
| 62 | 8.76 (m, 1H), 8.39 (m, 1H), 8.19 (m, 1H), 8.15 (m, 1H), 8.00 (m, 1H), 7.68-7.67 (m, 2H), 7.57-7.56 (m, 2H), 7.44-7.35 (m, 6H), 7.15 (m, 1H), 7.09 (m, 1H), 7.03-7.00 (m, 3H), 6.84 (m, 1H), 6.78 (m, 1H), 6.69-6.67 (m, 2H), 1.37 (s, 9H), 1.36 (s, 9H), 1.35 (s, 9H), 1.33 (s, 9H) | 1107.4412 | 1107.4415 |
| 83 | 8.70 (m, 1H), 8.38 (m, 1H), 8.20 (m, 1H), 7.68-7.67 (m, 2H), 7.59 (m, 1H), 7.55 (m, 1H), 7.39-7.36 (m, 2H), 7.35-7.33 (m, 3H), 7.17 (m, 1H), 7.08 (m, 1H), 6.81 (m, 1H), 6.66-6.64 (m, 2H), 6.56 (m, 1H), 3.35 (s, 3H), 1.39 (s, 9H), 1.37 (s, 9H), 1.29 (s, 9H), 1.28 (s, 9H) | 1101.4880 | 1101.4884 |
| 129 | 7.67-7.66 (m, 2H), 7.35-7.31 (m, 5H), 7.05 (m, 1H), 7.01 (m, 1H), 6.81 (m, 1H), 6.66 (m, 1H), 6.55 (m, 1H), 6.41 (m, 1H), 3.37 (s, 3H), 2.91 (s, 3H), 2.76 (s, 3H), 1.36 (s, 9H), 1.35 (s, 9H), 1.32 (s, 18H) | 973.4256 | 973.4258 |

(Manufacture of Organic Electroluminescence Device)

The organic electroluminescence device of an embodiment including the organometallic compound of an embodiment in the emission layer was manufactured as follows. Additional organic electroluminescence devices were manufactured utilizing the Example Compounds and Comparative Example Compounds described above as dopant materials in the emission layer.

For a first electrode (anode), an ITO-formed glass substrate of about 15 Ω/cm$^2$ (about 1,200 Å) made by Corning Co. was cut to a size of 50 mm×50 mm×0.7 mm, cleansed by ultrasonic waves utilizing isopropyl alcohol and pure water for about 5 minutes, and then irradiated with ultraviolet rays for about 30 minutes and exposed to ozone to clean. The glass substrate was installed on a vacuum deposition apparatus.

2-TNATA was deposited under vacuum on the upper portion of the ITO anode formed on the glass substrate to form a 600 Å-thick hole injection layer, and NPB was deposited in vacuum on the upper portion of the hole injection layer to form a 300 Å-thick hole transport layer.

3,3'-bis(N-carbazolyl)-1,1'-biphenyl (mCBP) as a host and an Example Compound or Comparative Example Compound as a dopant were co-deposited on the upper portion of the hole transport layer in a weight ratio of 90:10 to form a 300 Å-thick emission layer.

TSPO1 was deposited on the upper portion of the emission layer to form a 50 Å-thick hole blocking layer, Alq$_3$ was deposited on the upper portion of the hole blocking layer to form a 300 Å-thick electron transport layer, LiF was then deposited on the upper portion of the electron transport layer to form a 10 Å-thick electron injection layer, and then Al was deposited in vacuum on the upper portion of the electron injection layer to form a 3,000 Å-thick second electrode (cathode), thereby manufacturing an organic electroluminescence device. Each layer was formed by a vacuum deposition method.

(Evaluation of Organic Electroluminescence Devices)

r The driving voltage, luminous efficiency, etc. of each organic electroluminescence device according to Examples and Comparative Examples of the present disclosure were measured and the results are shown in Table 2:

TABLE 2

| No. | Dopant | Brightness (cd/m$^2$) | Driving voltage (V) | Luminous efficiency (cd/A) | Maximum emission wavelength (nm) | CIE(y) | Device service life ($T_{90}$, h) (at 1,000 cd/m$^2$) |
|---|---|---|---|---|---|---|---|
| Example 1 | 1 | 1000 | 4.8 | 23.1 | 464 | 0.191 | 71 |
| Example 2 | 4 | 1000 | 4.7 | 25.2 | 466 | 0.205 | 87 |
| Example 3 | 12 | 1000 | 4.6 | 23.4 | 462 | 0.211 | 67 |
| Example 4 | 62 | 1000 | 4.7 | 26.1 | 462 | 0.204 | 78 |
| Example 5 | 83 | 1000 | 4.8 | 22.9 | 461 | 0.189 | 76 |
| Example 6 | 129 | 1000 | 4.5 | 21.5 | 459 | 0.185 | 59 |
| Comparative Example 1 | CE1 | 1000 | 5.1 | 20.7 | 471 | 0.267 | 61 |
| Comparative Example 2 | CE2 | 1000 | 4.8 | 21.2 | 457 | 0.229 | 54 |
| Comparative Example 3 | CE3 | 1000 | 5.2 | 17.5 | 455 | 0.201 | 12 |

Table 2 shows the results of Examples 1 to 6 and Comparative Examples 1 to 3. Referring to Table 2, it may be confirmed that Examples 1 to 6 each achieved similar or low voltage as well as high efficiency and a long service life compared to Comparative Examples 1 to 3.

An organic electroluminescence device including the organometallic compound according to an embodiment of the present disclosure may exhibit high efficiency and/or long service life characteristics due to structural characteristics in which a carbene and an aryl moiety are rigidly bonded in a spiro ring structure and the p-orbital of the carbene and the d-orbital of the central metal may be effectively shielded.

Therefore, the organometallic compound according to an embodiment of the present disclosure may be utilized as an emission layer material of the organic electroluminescence device, thereby achieving effects of reducing driving voltage and/or increasing efficiency compared to devices including related art compounds. In particular, the organometallic compound according to an embodiment of the present disclosure may be to emit deep-blue light, and may remarkably improve color purity.

The organic electroluminescence device according to an embodiment of the present disclosure may have excellent or suitable efficiency.

The organometallic compound according to embodiments of the present disclosure may be utilized as a material of the emission layer of the organic electroluminescence device, and thereby the organic electroluminescence device may have improved efficiency.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Those of ordinary skill in the art to which the present disclosure pertains will understand that the present disclosure can be carried out in other forms without changing the technical idea or essential features. Therefore, the above-described embodiments are to be understood in all aspects as being illustrative and not restrictive. Various changes in form and details may be made therein without departing from the spirit and scope of the present disclosure as set forth in the following claims and their equivalents.

What is claimed is:

1. An organic electroluminescence device comprising:
a first electrode;
a hole transport region on the first electrode;
an emission layer on the hole transport region;
an electron transport region on the emission layer; and
a second electrode on the electron transport region,
wherein the emission layer comprises an organometallic compound represented by Formula 1:

[Formula 1]

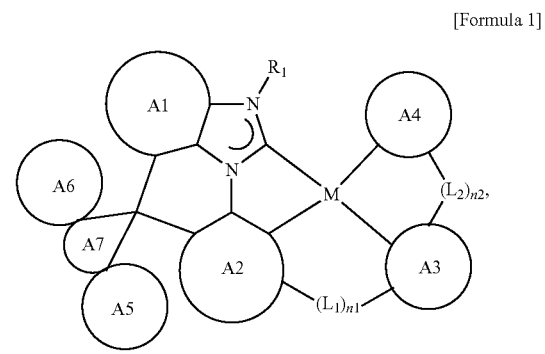

wherein, in Formula 1,

M is Pt, Pd, Cu, Ag, Au, Rh, Ir, Ru, or Os, ring A1 to ring A7 are each independently a substituted or unsubstituted hydrocarbon ring having 5 to 60 ring-forming carbon atoms, or a substituted or unsubstituted heterocycle having 1 to 60 ring-forming carbon atoms, $L_1$ and $L_2$ are each independently a direct linkage, *—O—*', *—S—*', *—C($R_{11}$)($R_{12}$)—*', *—C($R_{13}$)=*', *=C($R_{14}$)—*', *—C($R_{15}$)=C($R_{16}$)—*', *—C(=O)—*', *—C(=S)—*', *—C≡C—*', *—B($R_{17}$)—*', *—N($R_{18}$)—*', *—P($R_{19}$)*', *—Si($R_{20}$)($R_{21}$)—*', *—P($R_{22}$)($R_{23}$)—*', or *—Ge($R_{24}$)($R_{25}$)*', $R_{11}$ to $R_{25}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, $R_1$ is a hydrogen atom, a deuterium atom, a halogen atom, a substituted or unsubstituted thiol group, a substituted or unsubstituted oxy group, a substituted or unsubstituted boron group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and n1 and n2 are each independently an integer of 0 to 3, and wherein when M is Pt or Pd, $L_1$ is O, n1 is 1, A1, A2, A5 and A6 are each a benzene ring, and A7 is a 5-membered ring, then A5 and A6 are each substituted with one or more substituents selected from a tert-butyl group, a cyano group, an amine group, a substituted or unsubstituted oxy group, a substituted or unsubstituted aryl group having 6 to 30 ring-forming carbon atoms, or a substituted or unsubstituted heteroaryl group having 2 to 30 ring-forming carbon atoms.

2. The organic electroluminescence device of claim 1, wherein ring A1 to ring A7 are each independently a pentagonal ring, a hexagonal ring, or a heptagonal ring.

3. The organic electroluminescence device of claim 1, wherein the emission layer is to emit phosphorescence.

4. The organic electroluminescence device of claim 1, wherein the emission layer further comprises a host, and
   the organometallic compound represented by Formula 1 is a dopant.

5. The organic electroluminescence device of claim 1, wherein the organometallic compound represented by Formula 1 is represented by Formula 2:

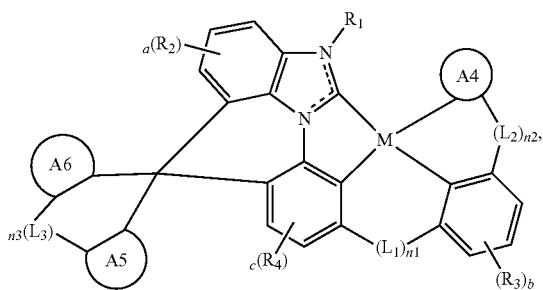

[Formula 2]

and
wherein, in Formula 2,
$R_2$ to $R_4$ are each independently a hydrogen atom, a deuterium atom, a halogen atom, a substituted or unsubstituted thiol group, a substituted or unsubstituted oxy group, a substituted or unsubstituted boron group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
a and b are each independently an integer of 0 to 3,
c is an integer of 0 to 2,
$L_3$ is a direct linkage, *—O—*, *—S—*', *—C($R_{26}$)($R_{27}$)—*', *—C($R_{28}$)=*', *=C($R_{29}$)—*', *—C($R_{30}$)=C($R_{31}$)—*', *—C(=O)—*', *—C(=S)—*', *—C≡C—*', *—B($R_{32}$)—*', *—N($R_{33}$)—*', *—P($R_{34}$)—*', *—Si($R_{35}$)($R_{36}$)—*', *—P($R_{37}$)($R_{38}$)—*', or *—Ge($R_{39}$)($R_{40}$)—*',
$R_{26}$ to $R_{40}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring,
n3 is an integer of 0 to 3, and
M, ring A4 to ring A6, $R_1$, $L_1$, $L_2$, n1 and n2 are each independently the same as defined in Formula 1.

6. The organic electroluminescence device of claim 5, wherein the organometallic compound represented by Formula 2 is represented by Formula 3:

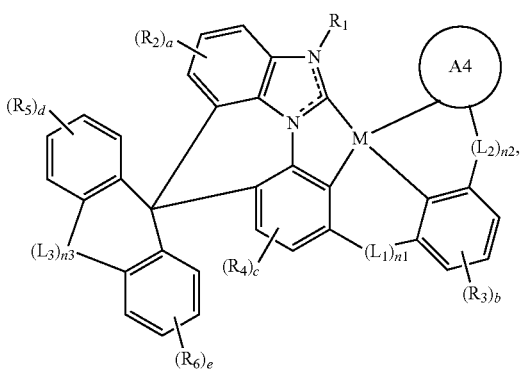

[Formula 3]

wherein, in Formula 3,
$R_5$ and $R_6$ are each independently a hydrogen atom, a deuterium atom, a halogen atom, a cyano group, a substituted or unsubstituted oxy group, an amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
d and e are each independently an integer of 0 to 4, and
M, ring A4, $R_1$ to $R_4$, a to c, $L_1$ to $L_3$, and n1 to n3 are each independently the same as defined in Formula 2, and
wherein when M is Pt or Pd, $L_1$ is O, n1 is 1, and n3 is 0, then d and e are each an integer of 1 to 4, and $R_5$ and $R_6$ are each independently a tert-butyl group, a cyano group, an amine group, a substituted or unsubstituted oxy group, a substituted or unsubstituted aryl group having 6 to 30 ring-forming carbon atoms, or a substituted or unsubstituted heteroaryl group having 2 to 30 ring-forming carbon atoms.

7. The organic electroluminescence device of claim 6, wherein the organometallic compound represented by Formula 3 is represented by any one among Formula 4-1 to Formula 4-3:

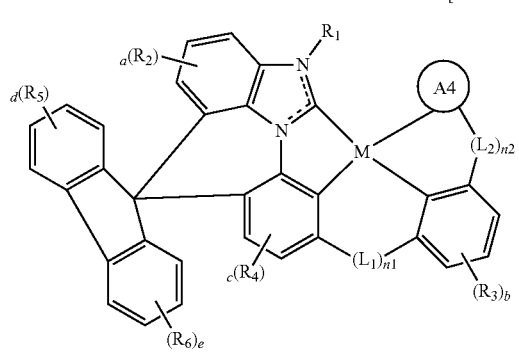

[Formula 4-1]

-continued

[Formula 4-2]

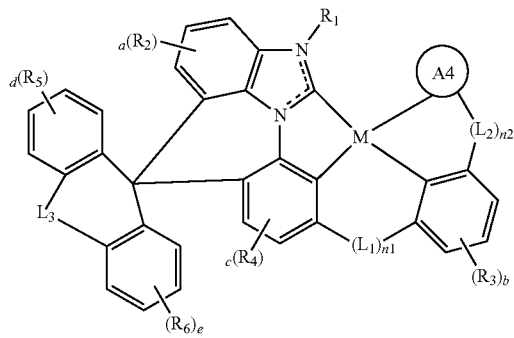

[Formula 5]

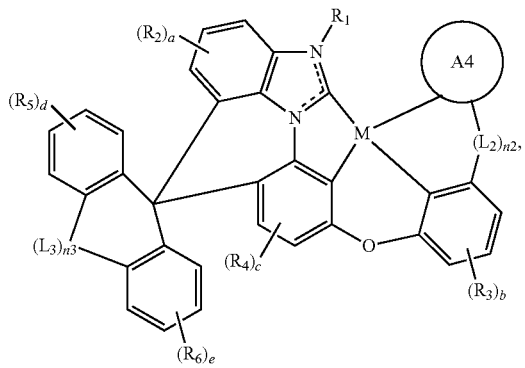

and wherein, in Formula 5,
  M, ring A4, $R_1$ to $R_6$, a to e, $L_2$, $L_3$, n2, and n3 are each independently the same as defined in Formula 3.

9. The organic electroluminescence device of claim 6, wherein the organometallic compound represented by Formula 3 is represented by Formula 6-1 or Formula 6-2:

[Formula 4-3]

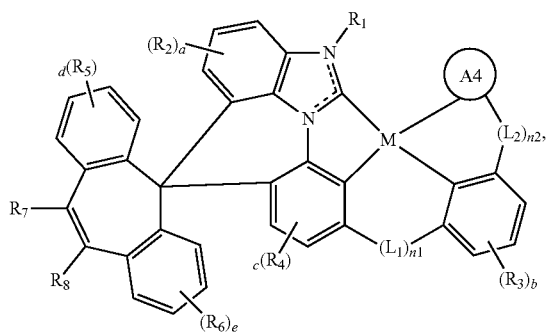

[Formula 6-1]

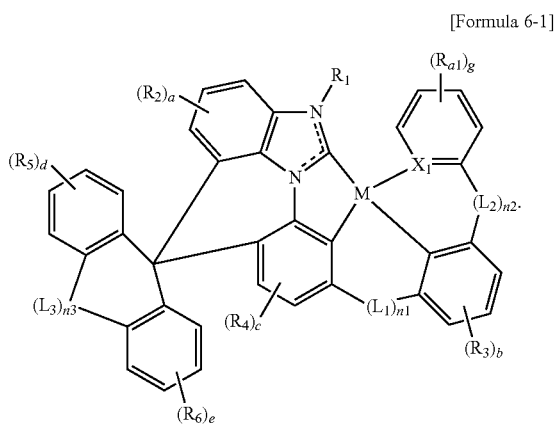

[Formula 6-2]

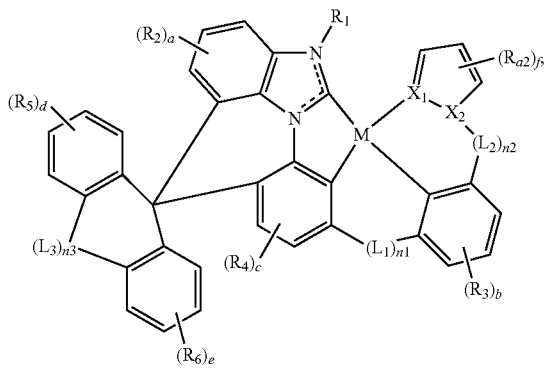

wherein, in Formula 4-1 to Formula 4-3,
  $L_3$ is *—O—*', *—S—*', *—C($R_{26}$)($R_{27}$)—*', or N($R_{33}$)—*',
  $R_{26}$, $R_{27}$, and $R_{33}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring,
  $R_7$ and $R_8$ are each independently a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and
  M, ring A4, $R_1$ to $R_6$, a to e, $L_1$ and $L_2$, n1, and n2 are each independently the same as defined in Formula 3.

8. The organic electroluminescence device of claim 6, wherein the organometallic compound represented by Formula 3 is represented by Formula 5:

and
  wherein, in Formula 6-1 and Formula 6-2,
  $X_1$ is N or C,
  $X_2$ is N or $CR_{a3}$,
  $R_{a1}$ to $R_{a3}$ are each independently a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, g is an integer of 0 to 4, f is an integer of 0 to 3, and M, $R_1$ to $R_6$, a to e, $L_1$ to $L_3$, n1, n2, and n3 are each independently the same as defined in Formula 3.

10. The organic electroluminescence device of claim 1, wherein the organometallic compound represented by Formula 1 is represented by Formula 7-1 or Formula 7-2:

[Formula 7-1]

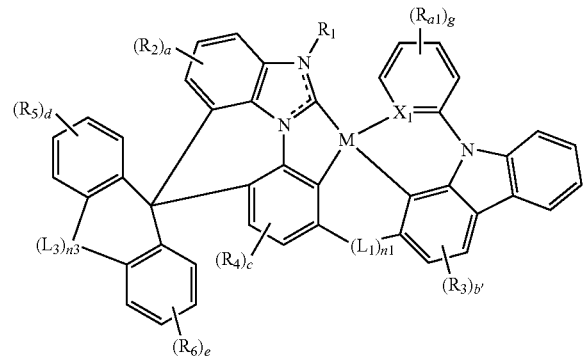

[Formula 7-2]

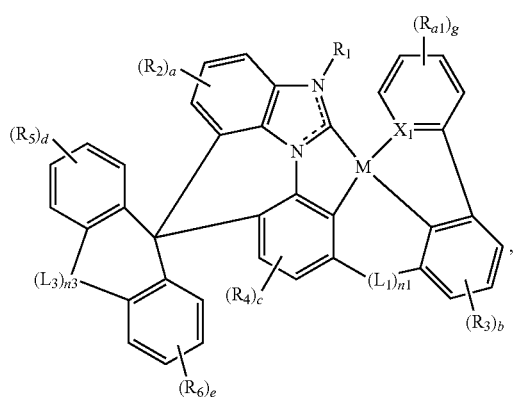

wherein, in Formula 7-1 and Formula 7-2, $R_2$ to $R_4$ are each independently a hydrogen atom, a deuterium atom, a halogen atom, a substituted or unsubstituted thiol group, a substituted or unsubstituted oxy group, a substituted or unsubstituted boron group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a is an integer of 0 to 3, c is an integer of 0 to 2, $L_3$ is a direct linkage, *—O—*', *—S—*', *—C($R_{26}$)($R_{27}$)—*', *—C($R_{28}$)=*', *=C($R_{29}$)—*', *—C($R_{30}$)=C($R_{31}$)—*', *—C(=O)—*', *—C(=S)—*', *—C≡C—*', *—B($R_{32}$)—*', *—N($R_{33}$)—*', *—P($R_{34}$)—*', *—Si($R_{35}$)($R_{36}$)—*', *—P($R_{37}$)($R_{38}$)—*', or *—Ge($R_{39}$)($R_{40}$)—*', $R_{26}$ to $R_{40}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, n3 is an integer of 0 to 3, $R_5$ and $R_6$ are each independently a hydrogen atom, a deuterium atom, a halogen atom, an amine group, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, d and e are each independently an integer of 0 to 4, $X_1$ is N or C, $X_2$ is N or $CR_{a3}$, $R_{a1}$ and $R_{a3}$ are each independently a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, g is an integer of 0 to 4, b' is an integer of 0 to 2, and M, $R_1$, b, $L_1$, and n1 are each independently the same as defined in Formula 1, and wherein when M is Pt or Pd, $L_1$ is O, n1 is 1, and n3 is 0, then d and e are each an integer of 1 to 4, and $R_5$ and $R_6$ are each independently a tert-butyl group, a cyano group, an amine group, a substituted or unsubstituted oxy group, a substituted or unsubstituted aryl group having 6 to 30 ring-forming carbon atoms, or a substituted or unsubstituted heteroaryl group having 2 to 30 ring-forming carbon atoms.

11. The organic electroluminescence device of claim 9, wherein the organometallic compound represented by Formula 1 is represented by Formula 8-1 or Formula 8-2:

[Formula 8-1]

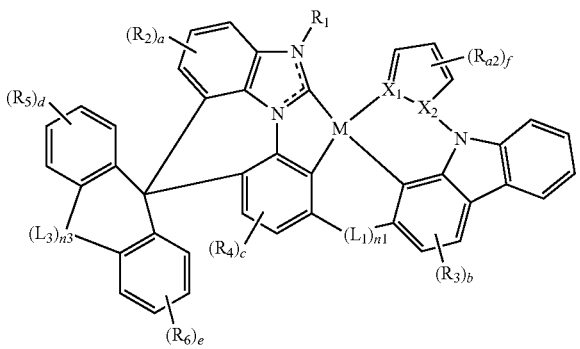

-continued

[Formula 8-2]

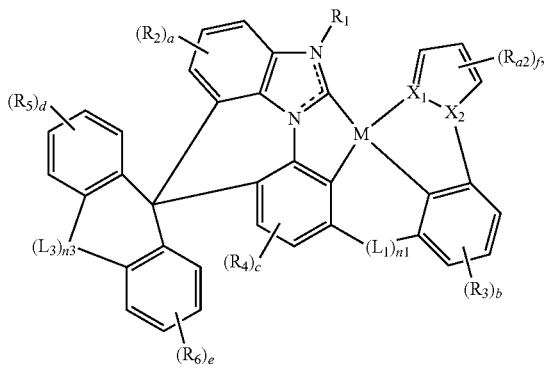

wherein, in Formula 8-1 and Formula 8-2, $R_2$ to $R_4$ are each independently a hydrogen atom, a deuterium atom, a halogen atom, a substituted or unsubstituted thiol group, a substituted or unsubstituted oxy group, a substituted or unsubstituted boron group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a is an integer of 0 to 3, c is an integer of 0 to 2, $L_3$ is a direct linkage, *—O—*, *—S—*', *—C($R_{26}$)($R_{27}$)—*', *—C($R_{28}$)=*', *=C($R_{29}$)—*', *—C($R_{30}$)=C($R_{31}$)—*', *—C(=O)—*', *—C(=S)—*', *—C≡C—*', *—B($R_{32}$)—*', *—N($R_{33}$)—*', *—P($R_{34}$)—*', *—Si($R_{35}$)($R_{36}$)—*', *—P($R_{37}$)($R_{38}$)—*', or *—Ge($R_{39}$)($R_{40}$)—*', $R_{26}$ to $R_{40}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, n3 is an integer of 0 to 3, $R_5$ and $R_6$ are each independently a hydrogen atom, a deuterium atom, a halogen atom, an amine group, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, d and e are each independently an integer of 0 to 4, $X_1$ is N or C, $X_2$ is N or $CR_{a3}$, $R_{a2}$ and $R_{a3}$ are each independently a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, f is an integer of 0 to 3, M, $R_1$, b, $L_1$, and n1 are each independently the same as defined in Formula 1, and wherein when M is Pt or Pd, $L_1$ is O, n1 is 1, and n3 is 0, then d and e are each an integer of 1 to 4, and $R_5$ and $R_6$ are each independently a tert-butyl group, a cyano group, an amine group, a substituted or unsubstituted oxy group, a substituted or unsubstituted aryl group having 6 to 30 ring-forming carbon atoms, or a substituted or unsubstituted heteroaryl group having 2 to 30 ring-forming carbon atoms.

12. The organic electroluminescence device of claim 1 wherein the organometallic compound represented by Formula 1 is at least one selected from compounds represented by Compound Group 1:

[Compound Group 1]

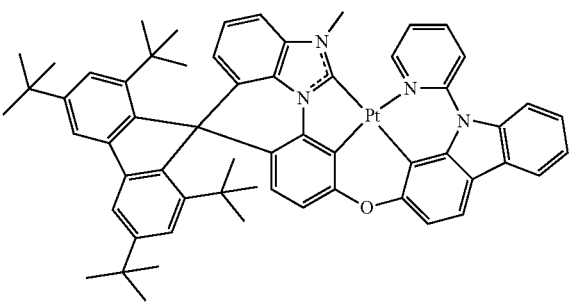

1

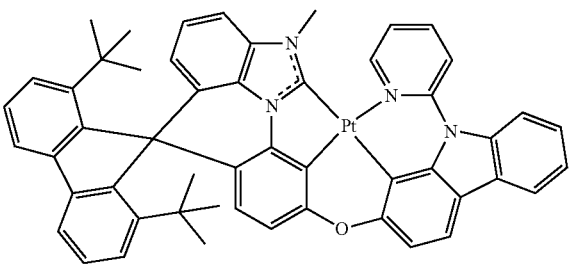

2

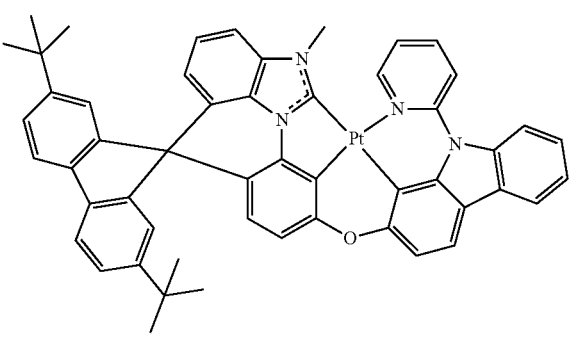

3

151
-continued
4
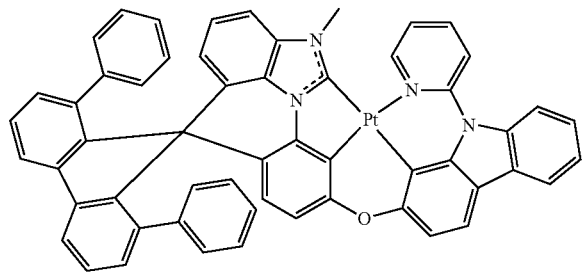
5
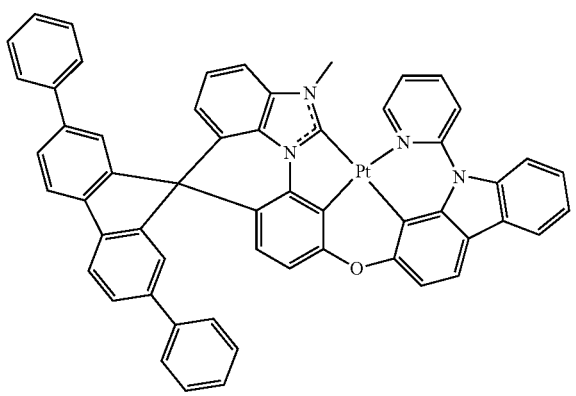
6
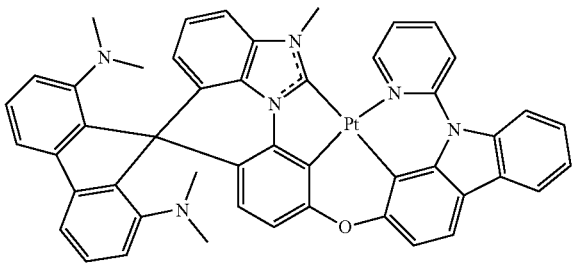
7
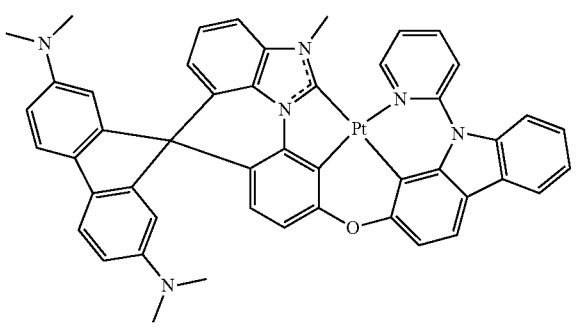
8
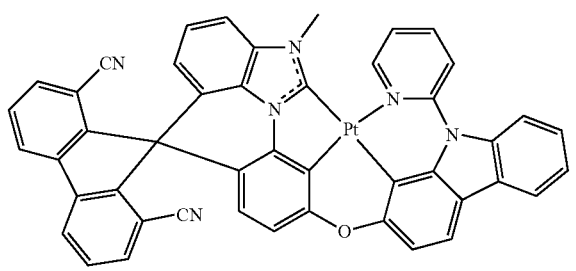
152
-continued
9
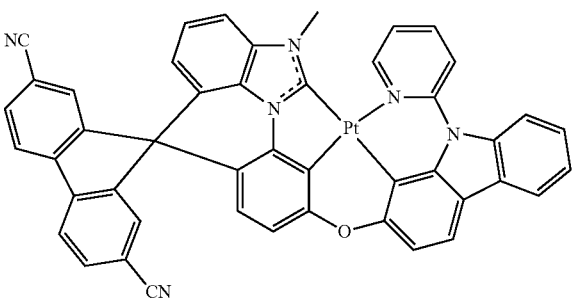
10
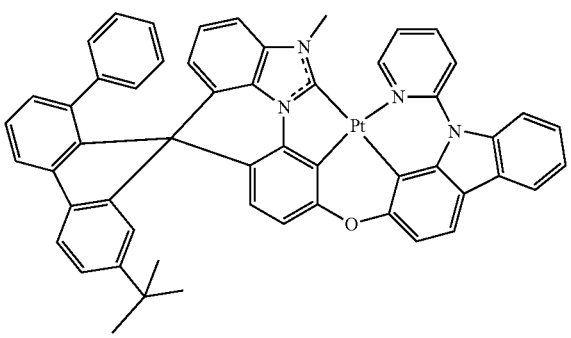
11
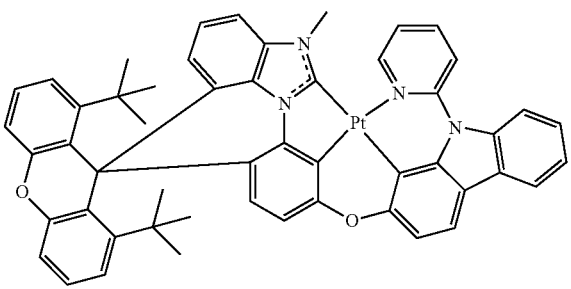
12
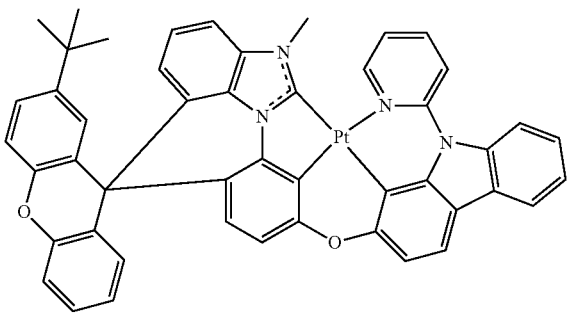
13
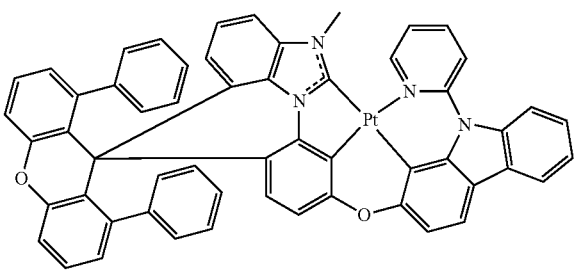

14
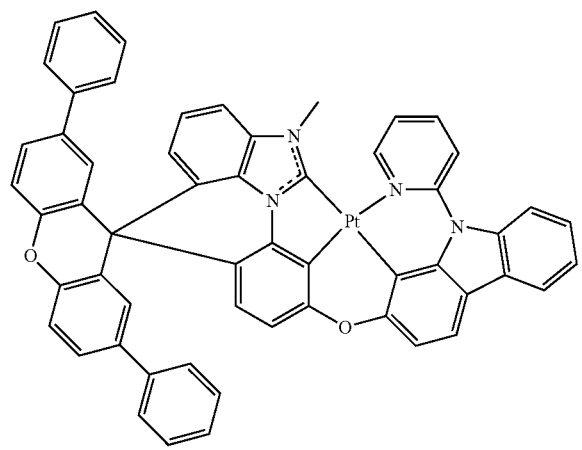
15
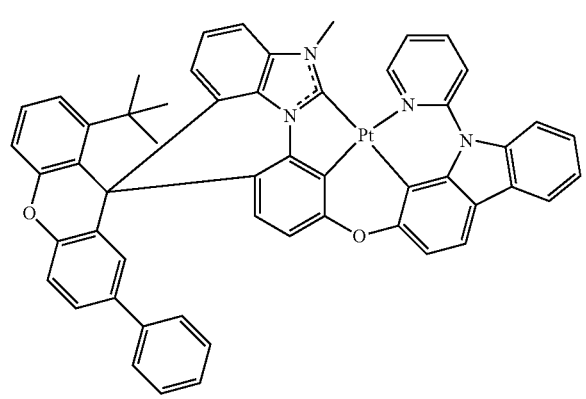
16
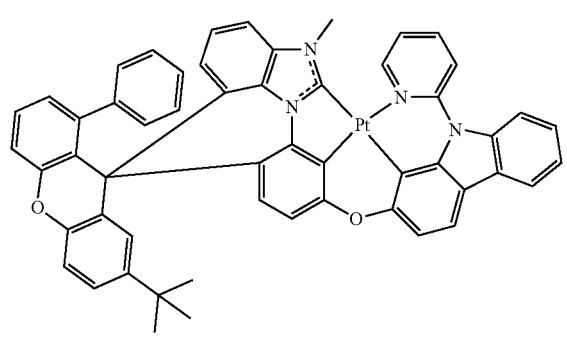
17
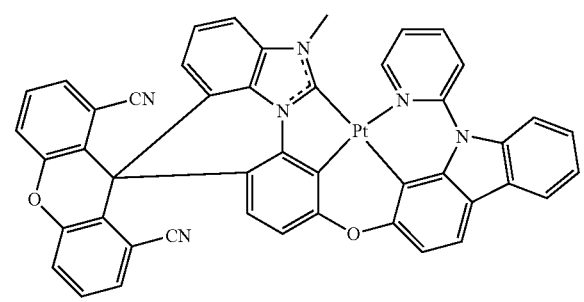
18
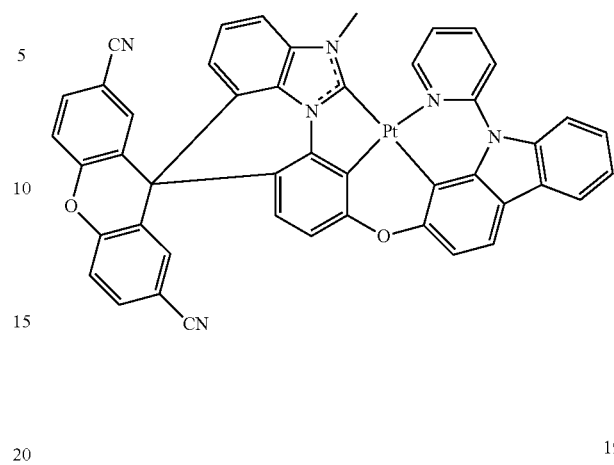
19
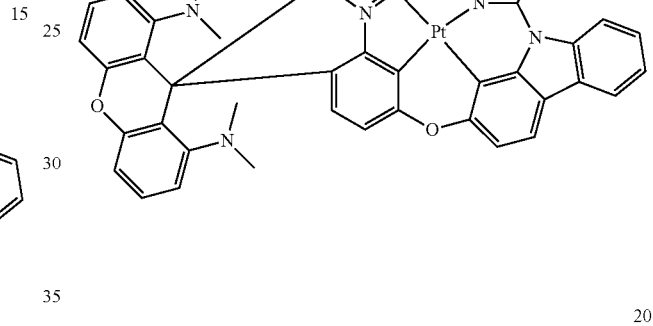
20
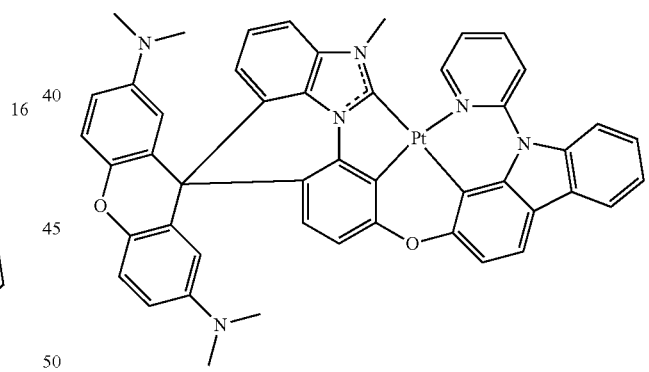
21
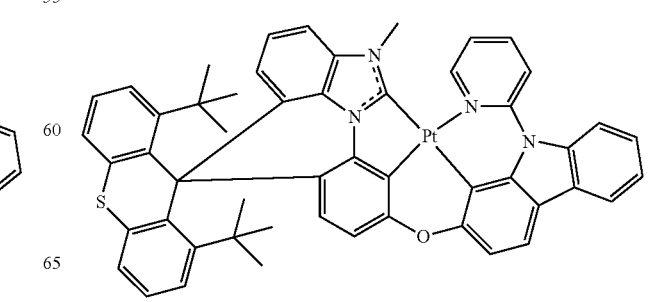

-continued
22
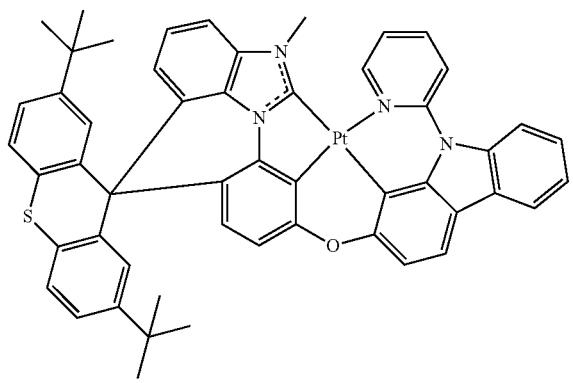
23
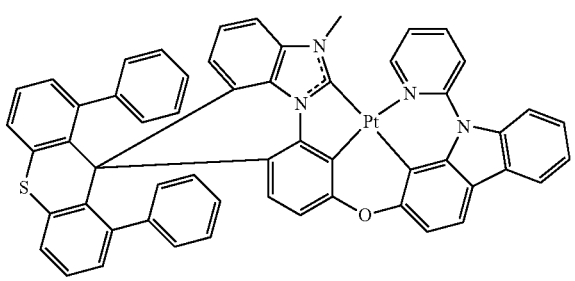
24
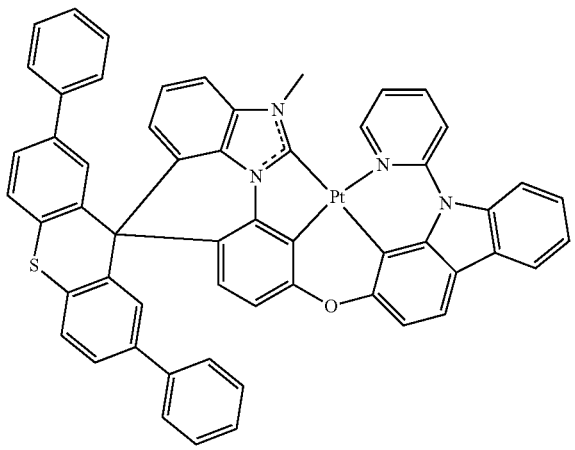
25
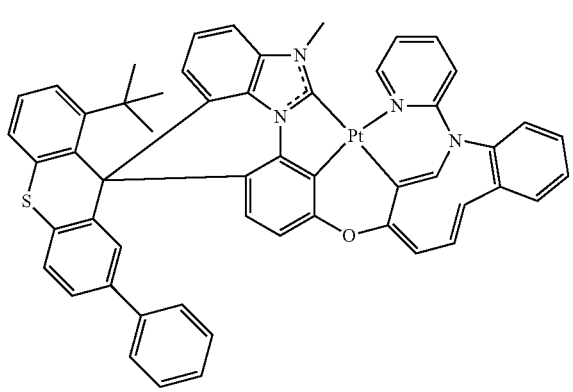
-continued
26
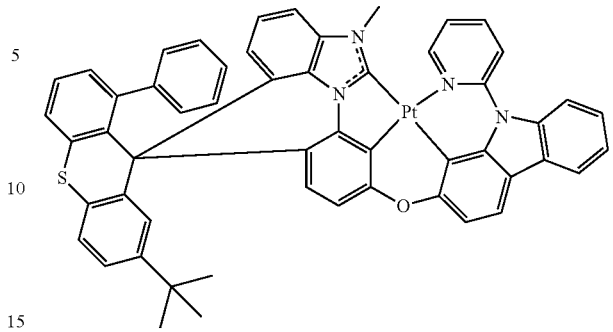
27
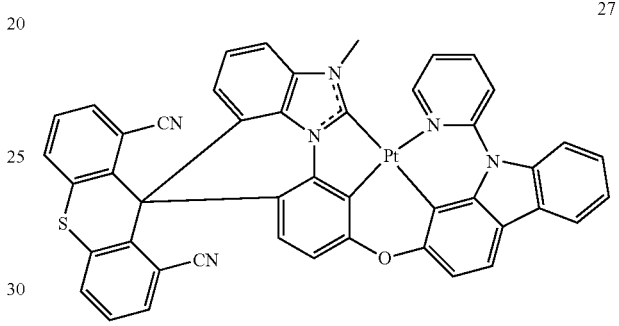
28
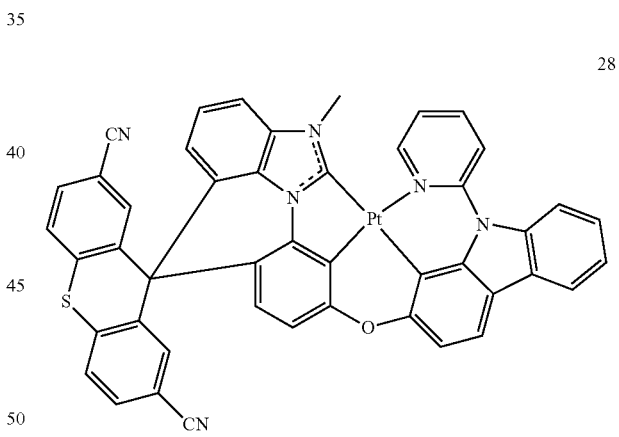
29
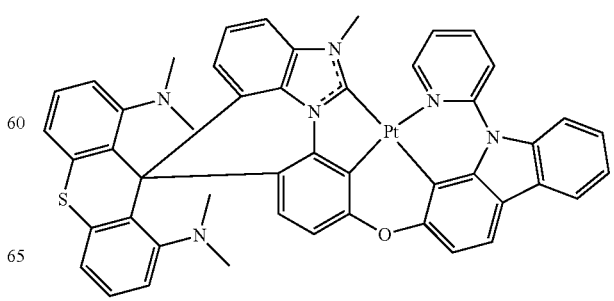

US 12,426,496 B2
157
-continued
30
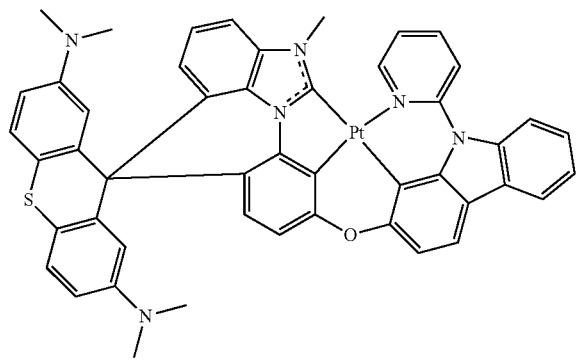
31
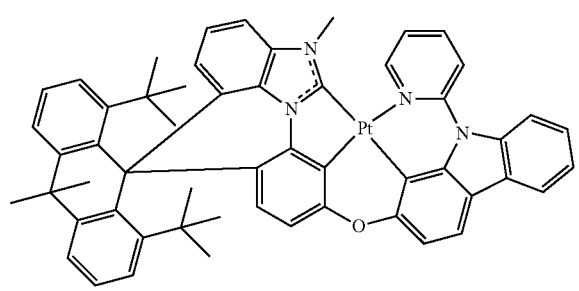
32
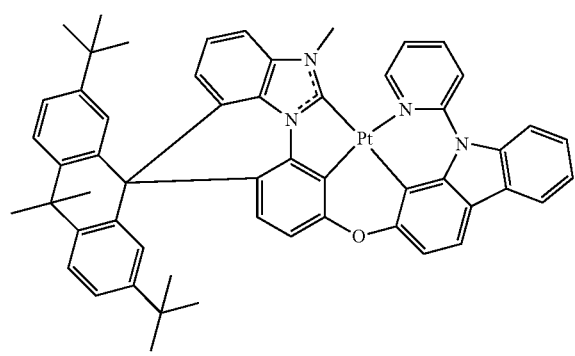
33
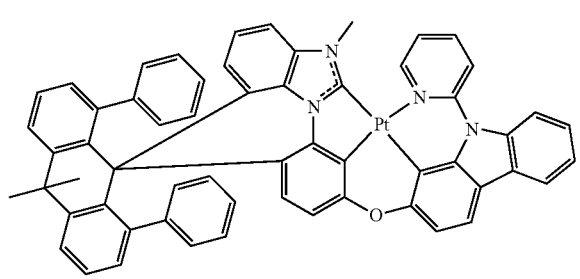
158
-continued
34
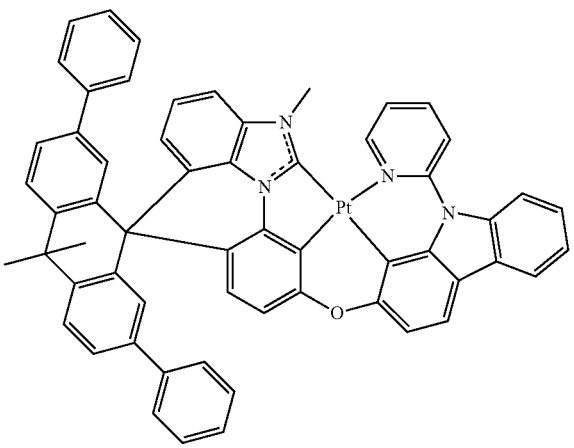
35
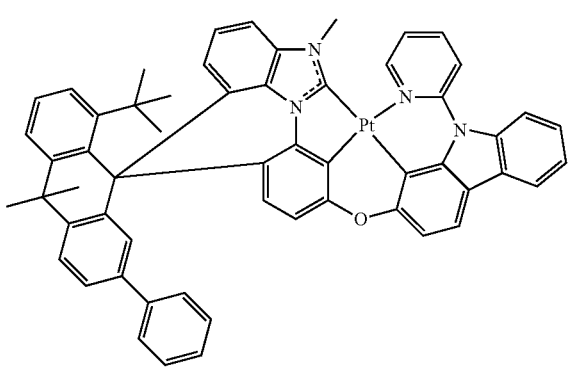
36
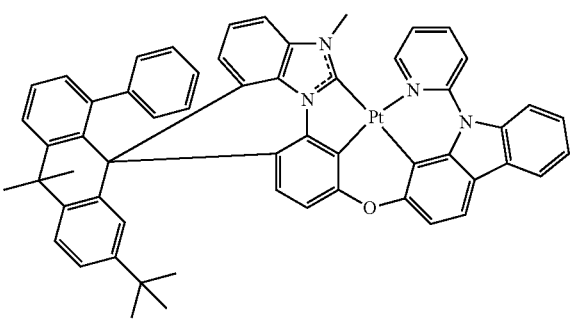
37
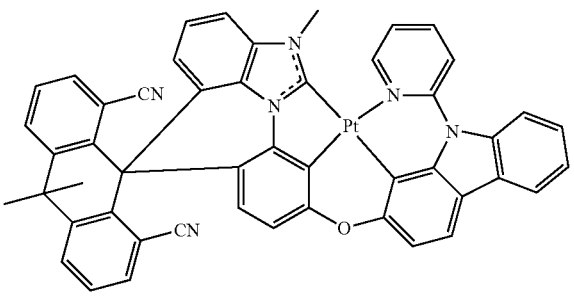

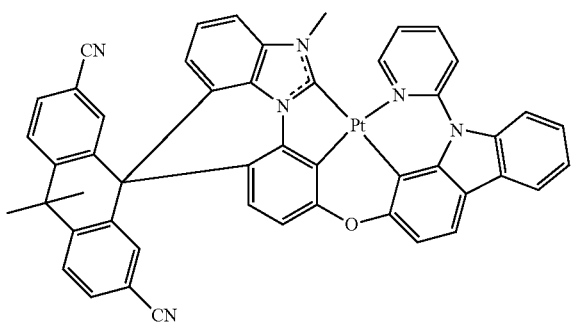
38
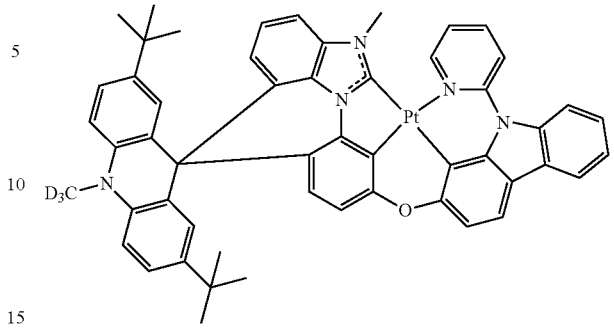
42
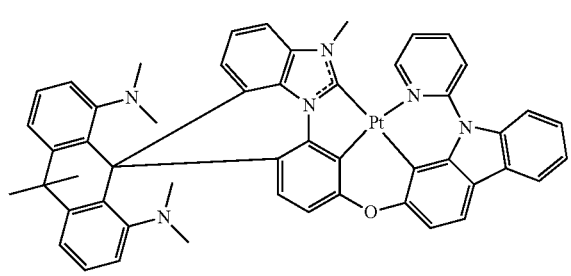
39
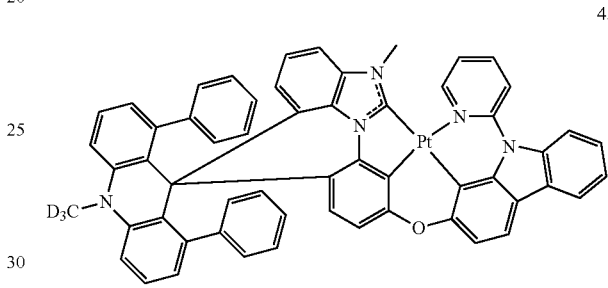
43
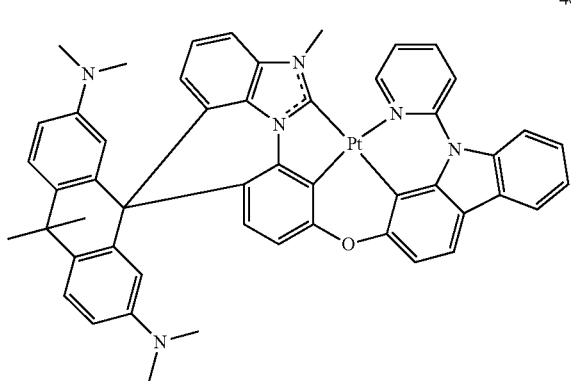
40
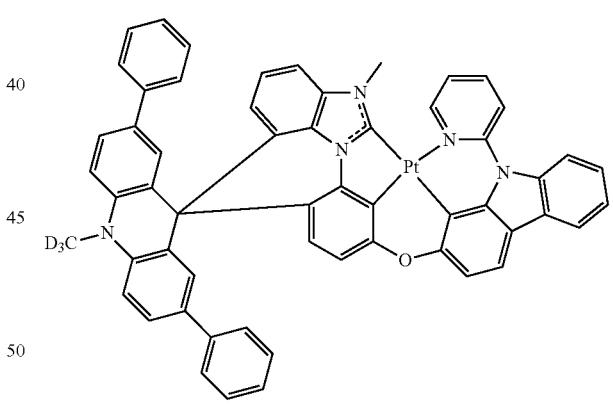
44
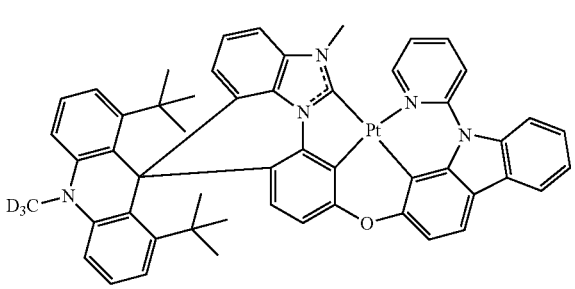
41
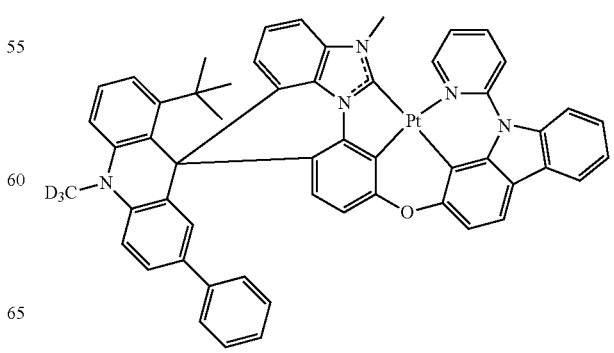
45

46
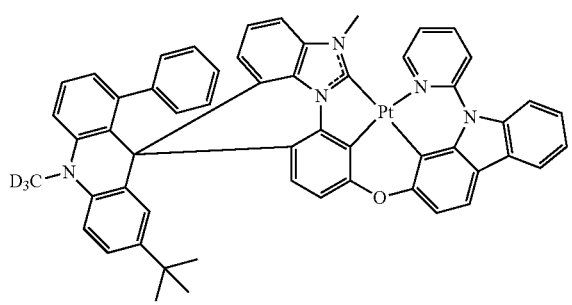
50
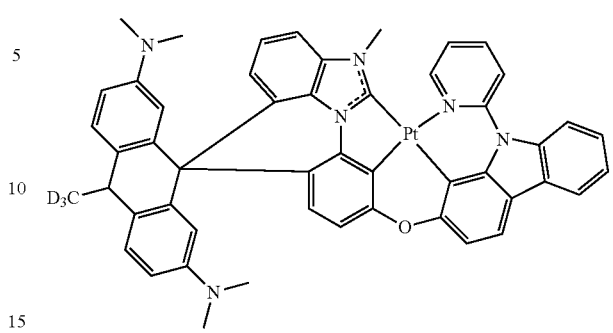
47
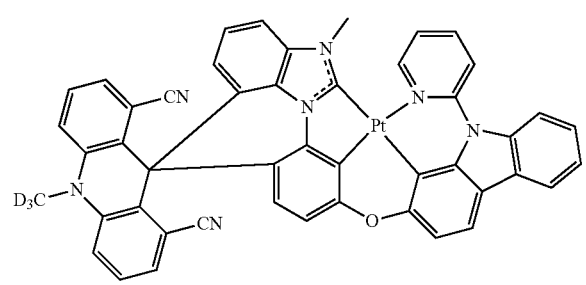
51
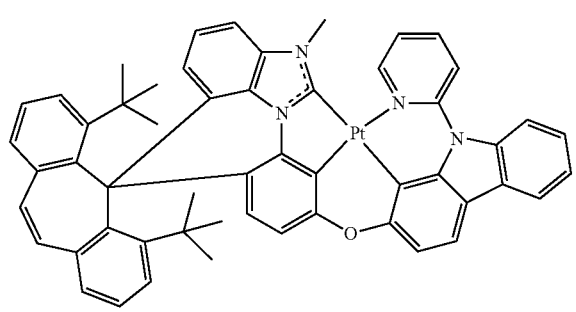
48
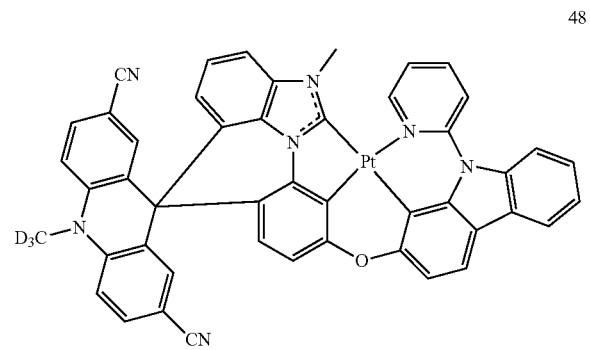
52
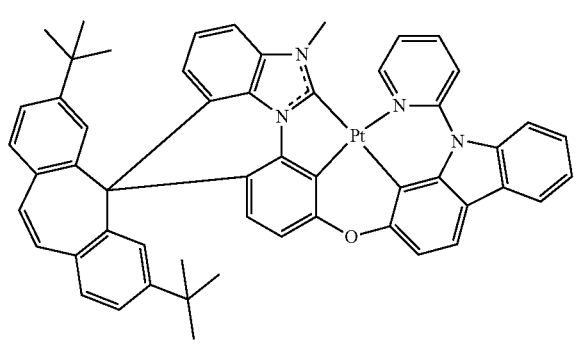
49
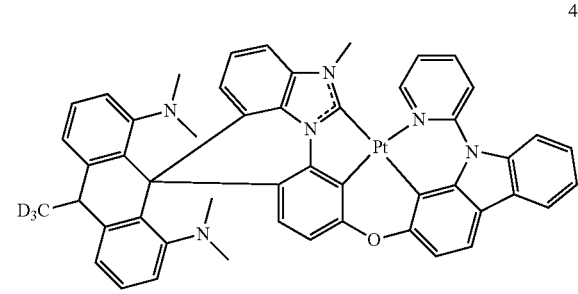
53
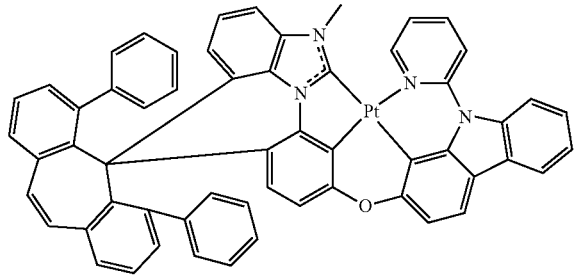

54
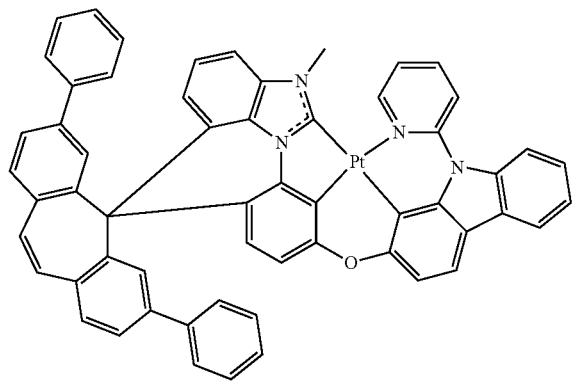
55
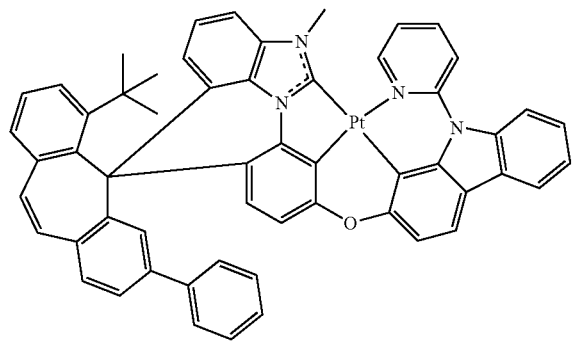
56
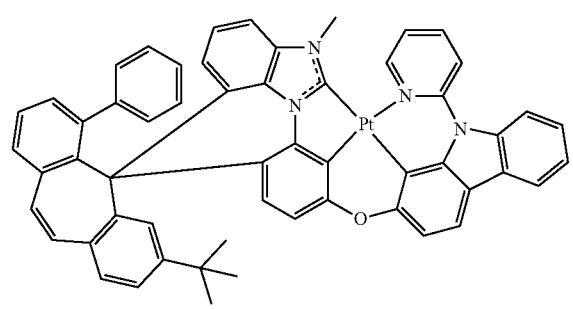
57
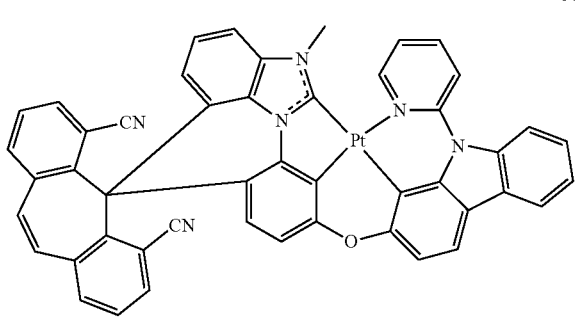
58
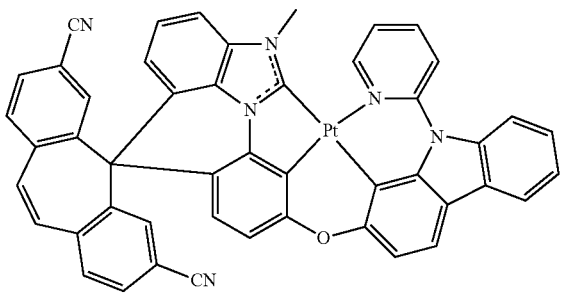
59
60
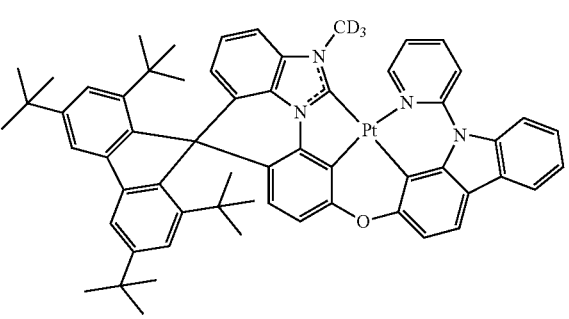
61

165
-continued
62
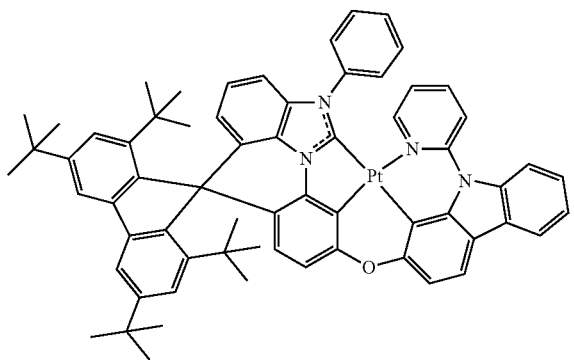
63
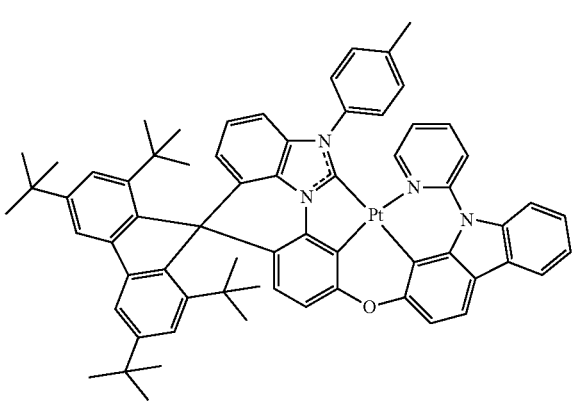
64
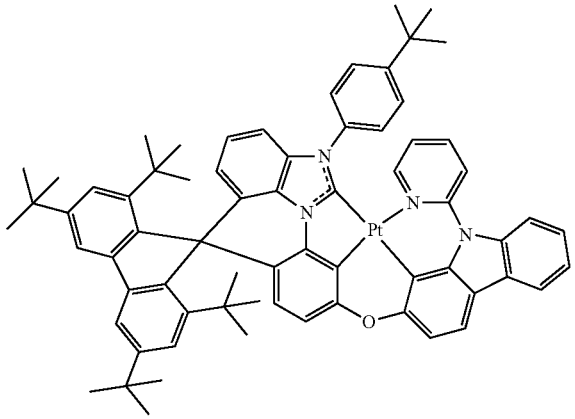
65
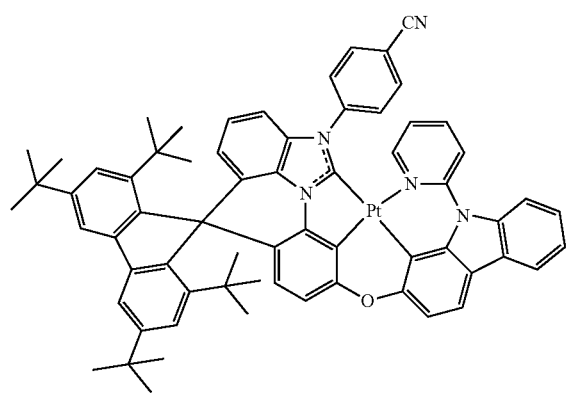
166
-continued
66
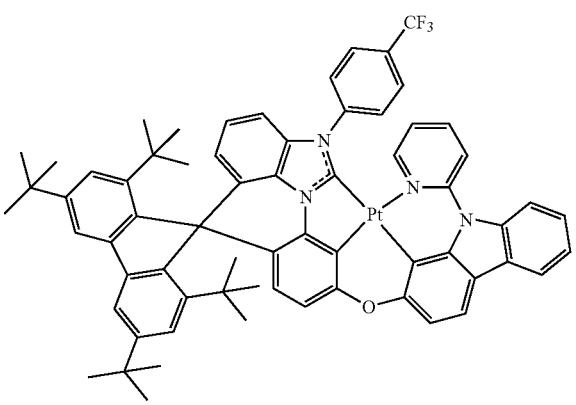
67
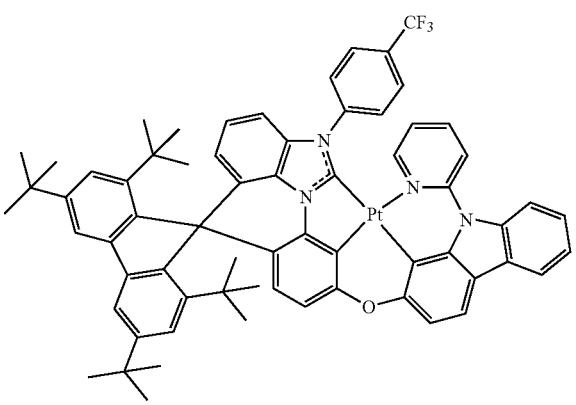
68
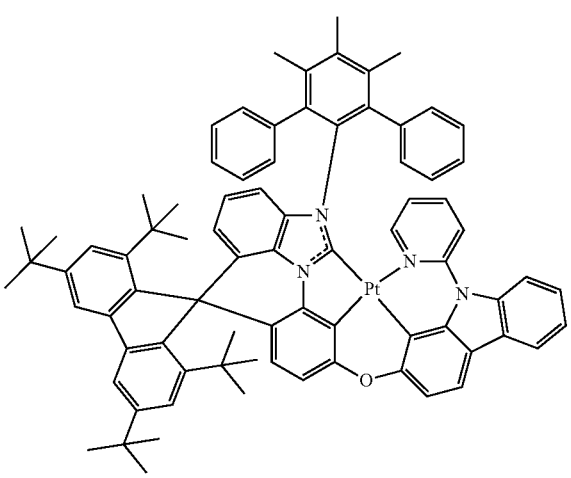

-continued
69
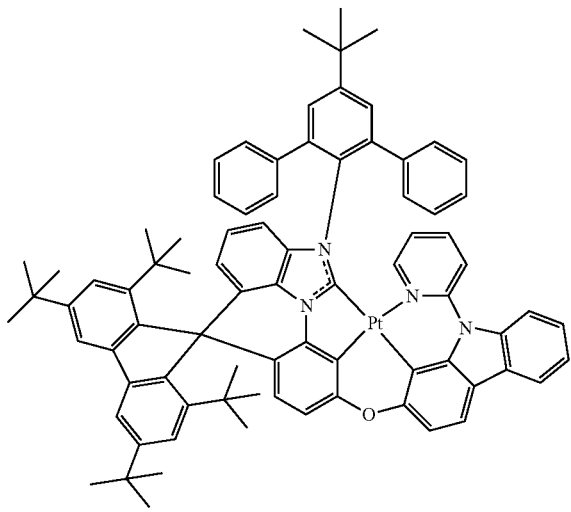
70
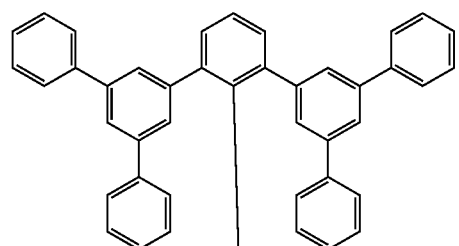
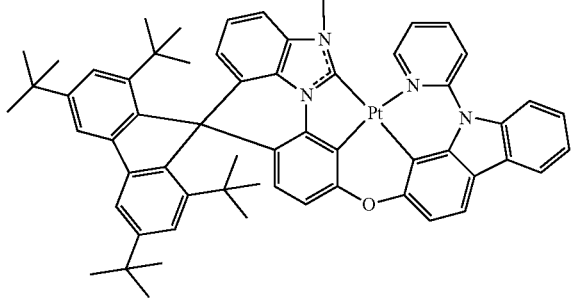
71
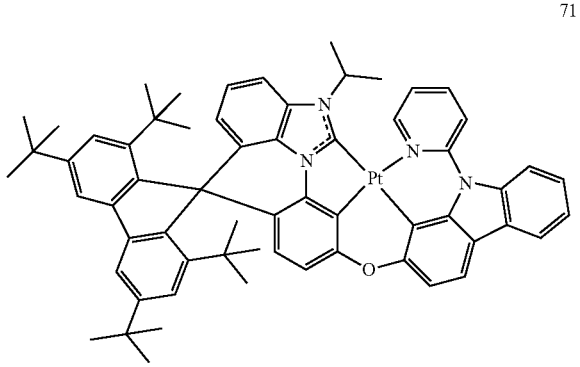
-continued
72
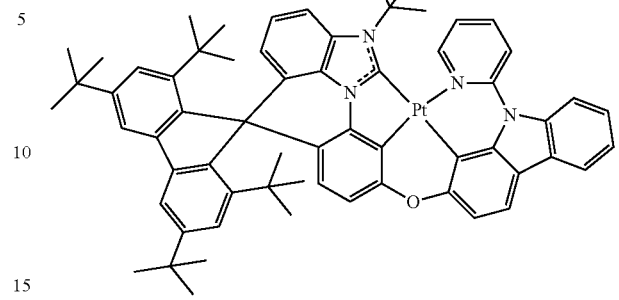
73
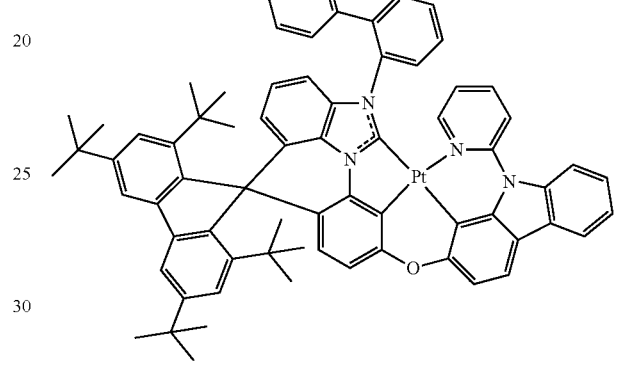
74
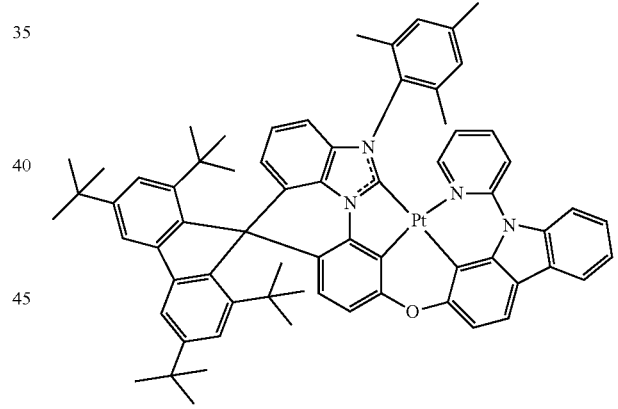
75
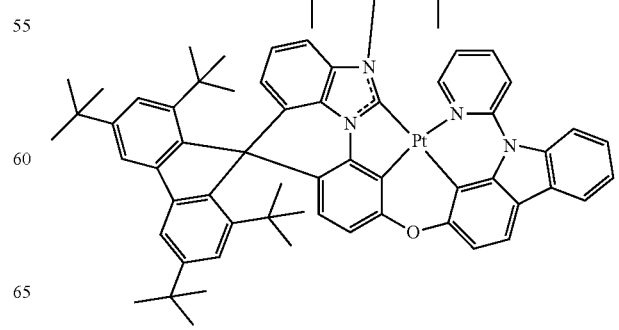

76
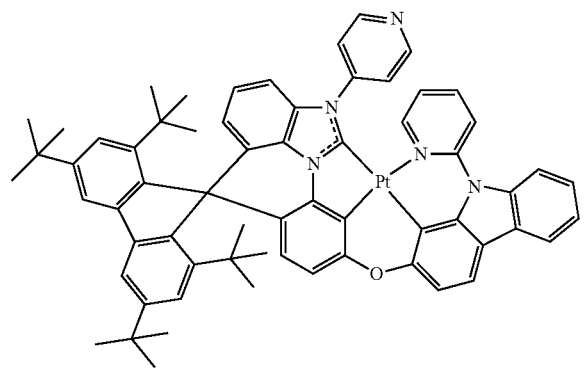
77
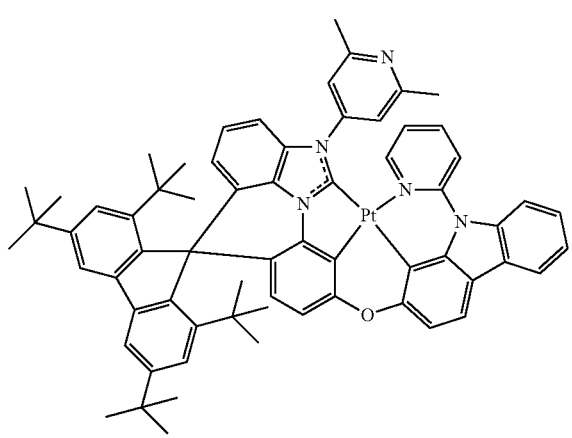
78
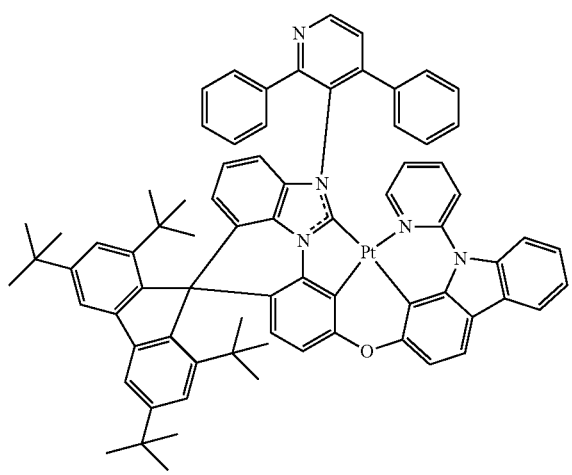
79
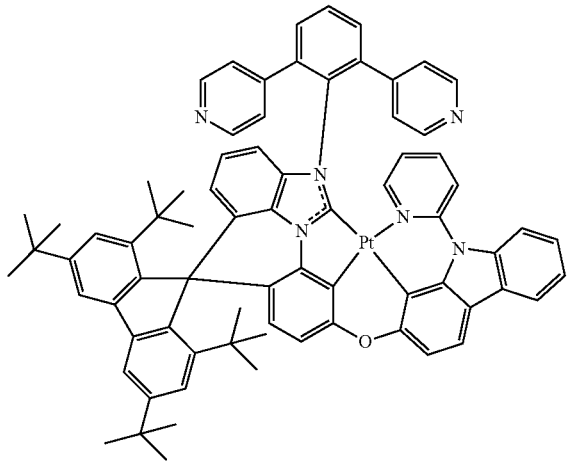
80
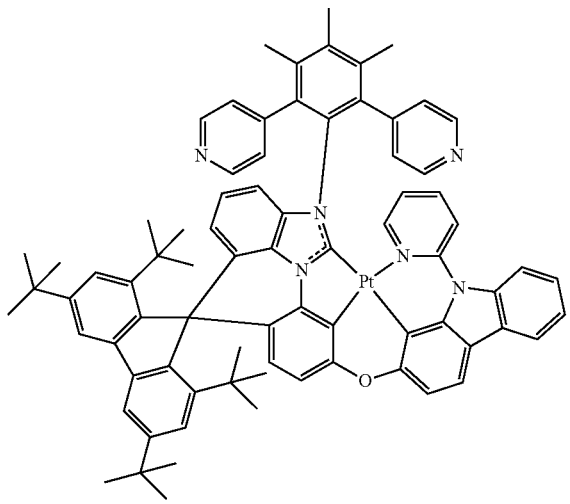
81
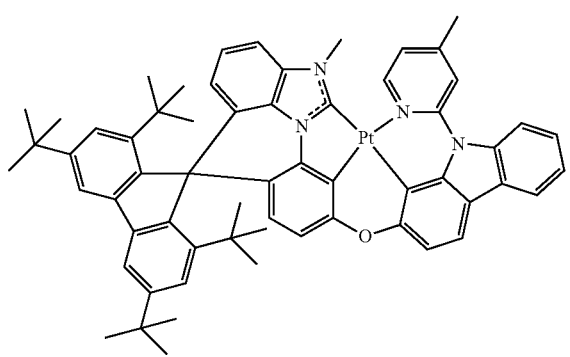

82
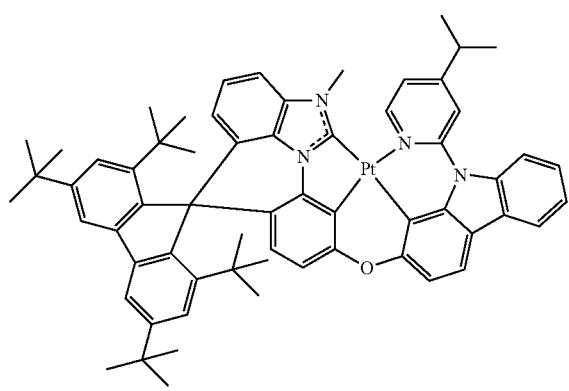
83
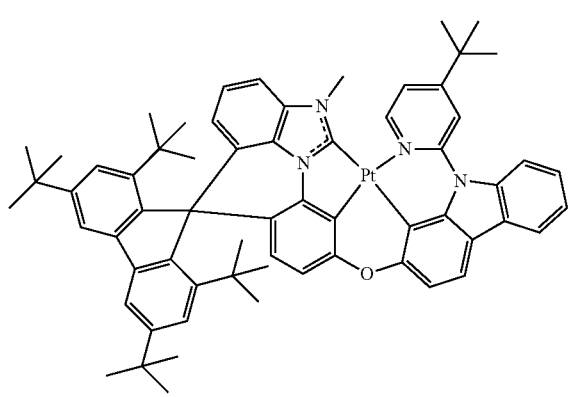
84
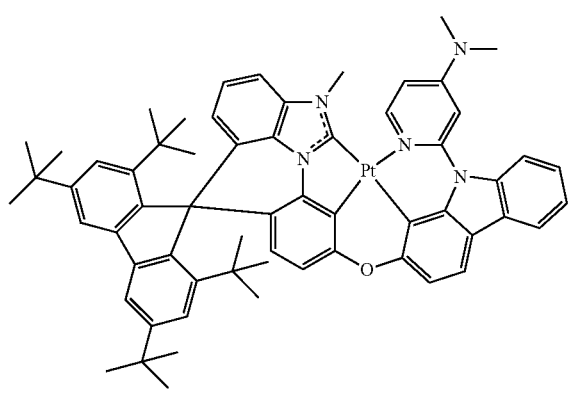
85
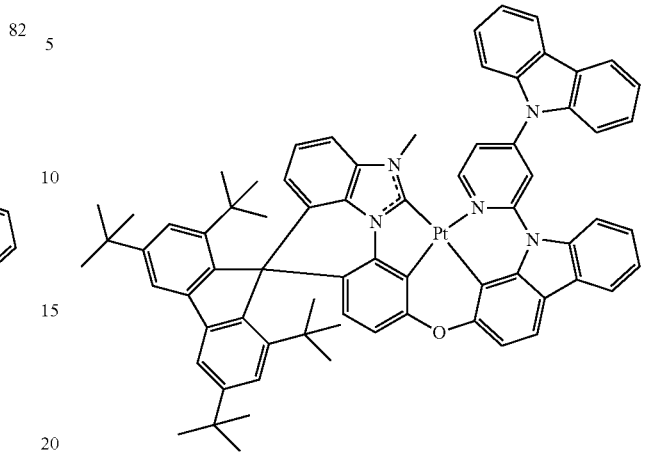
86
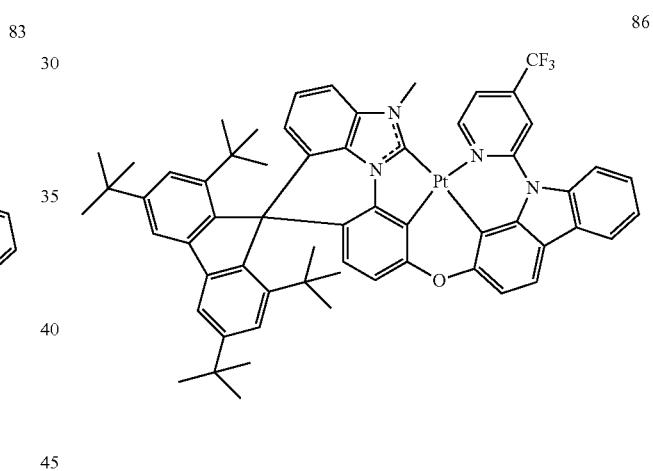
87
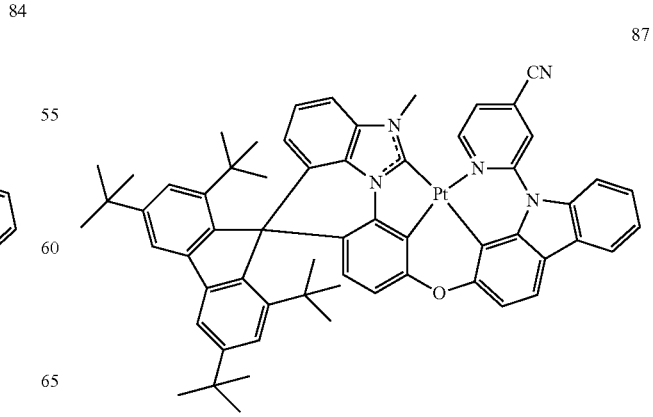

88
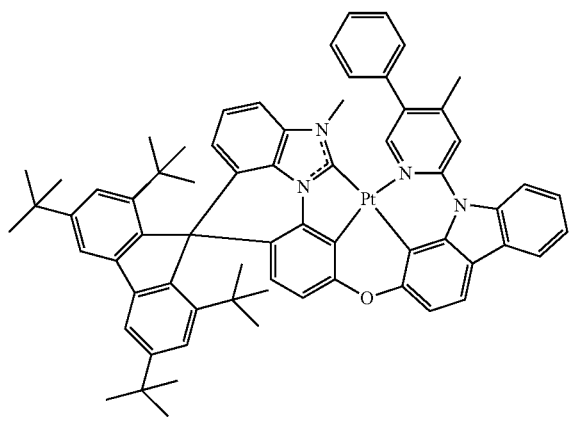
89
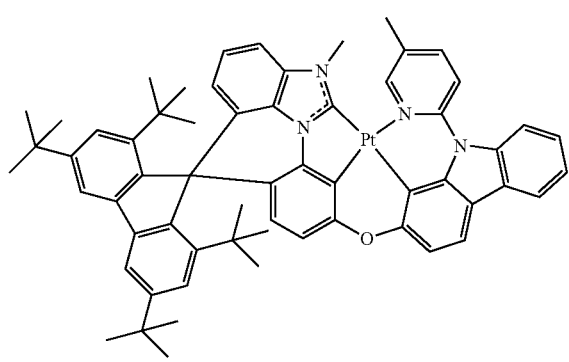
90
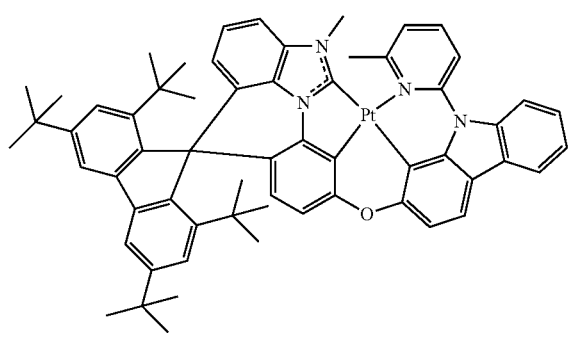
91
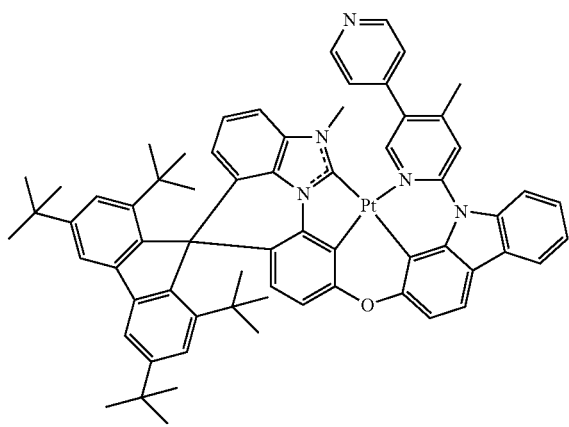
92
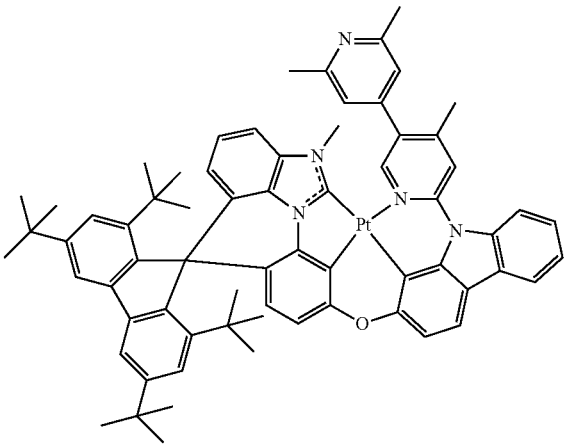
93
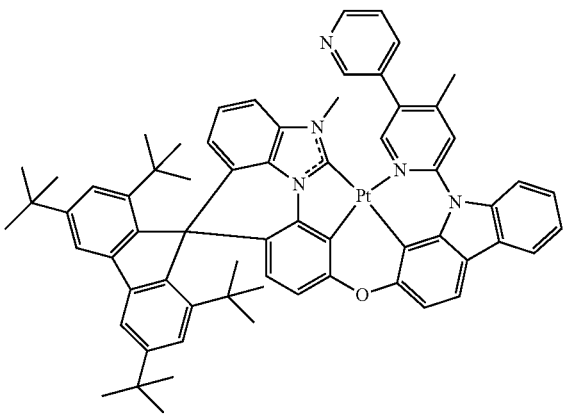
94
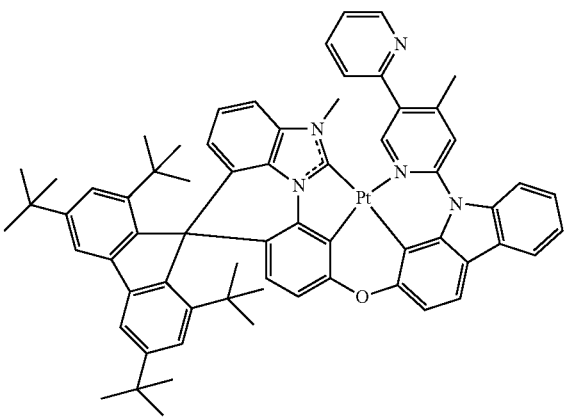

175
-continued
95
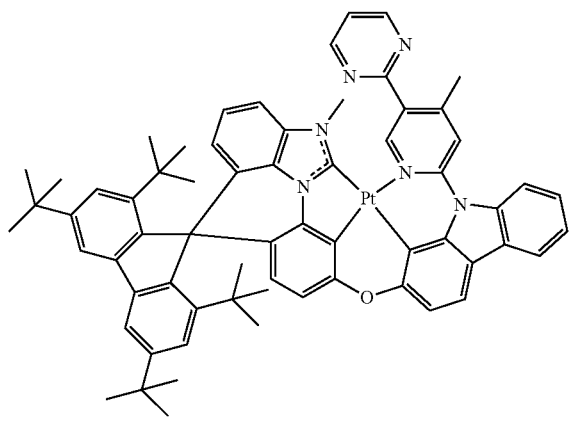
96
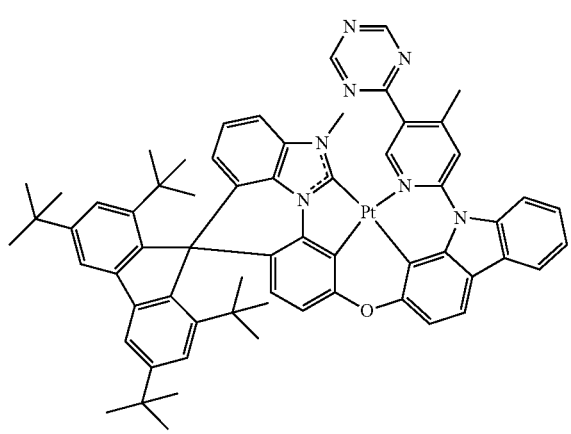
97
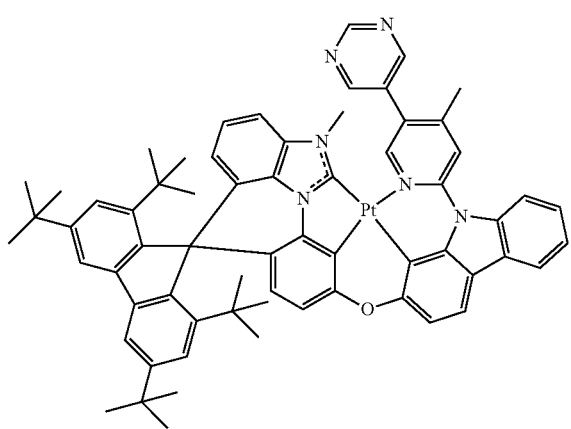
176
-continued
98
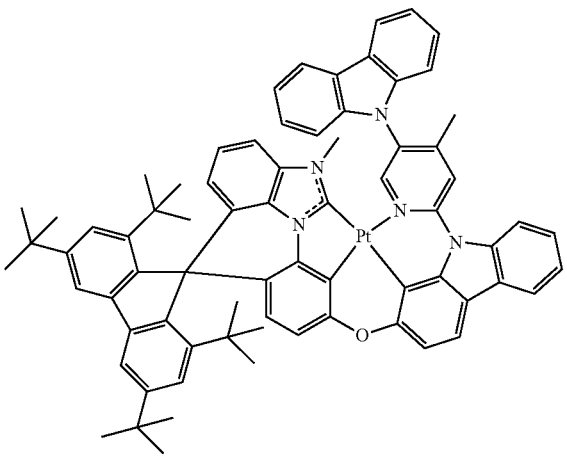
99
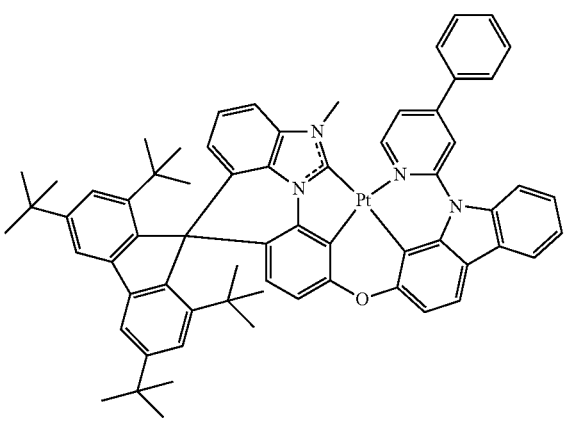
100
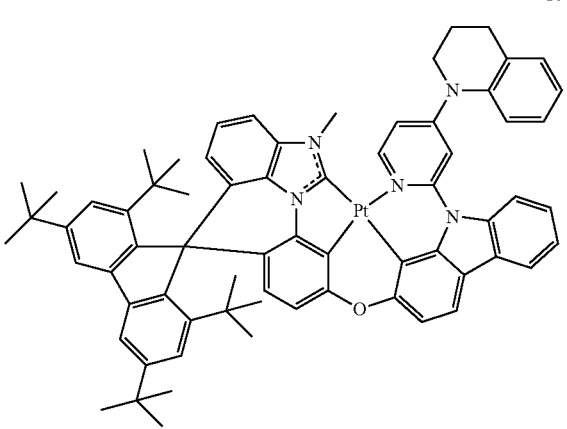

101
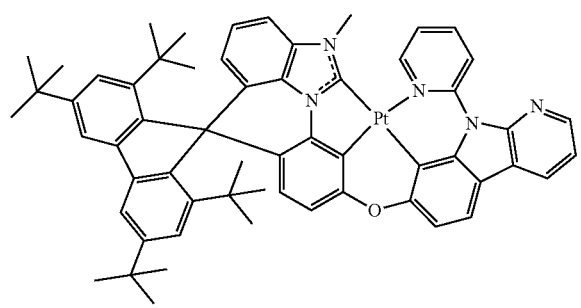
102
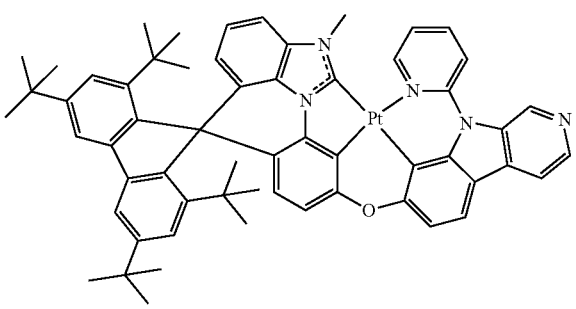
103
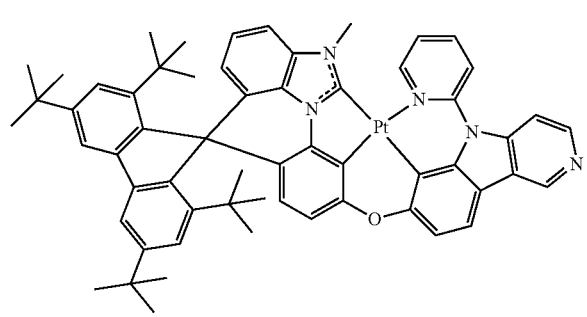
104
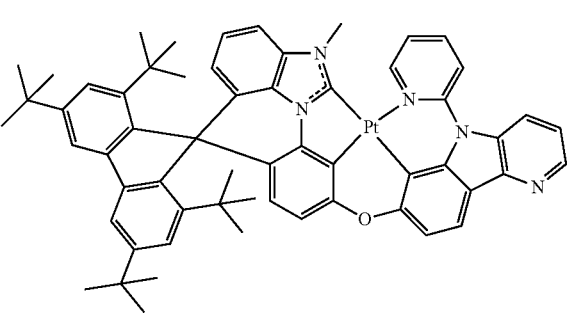
105
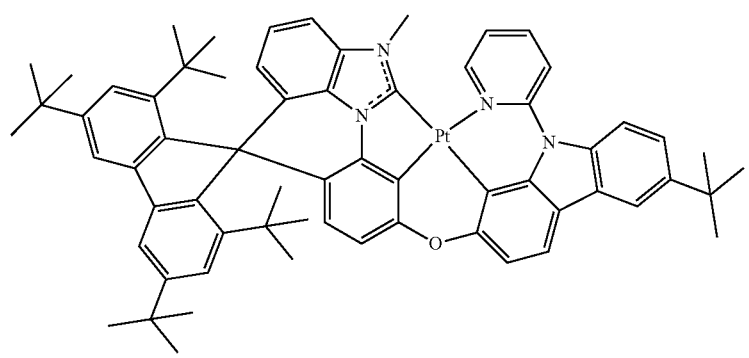
106
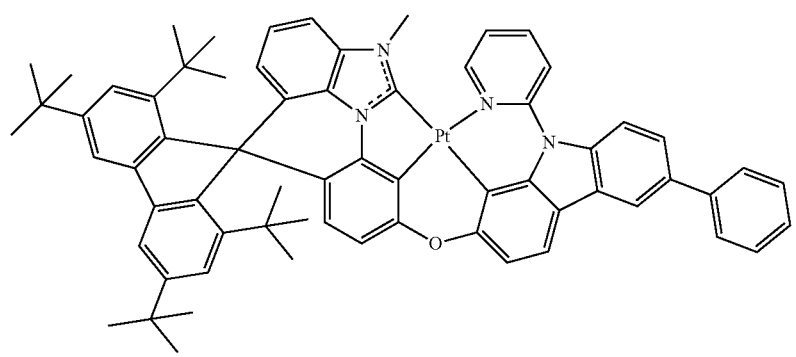
107
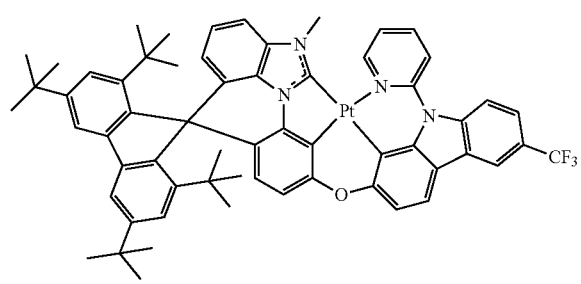
108
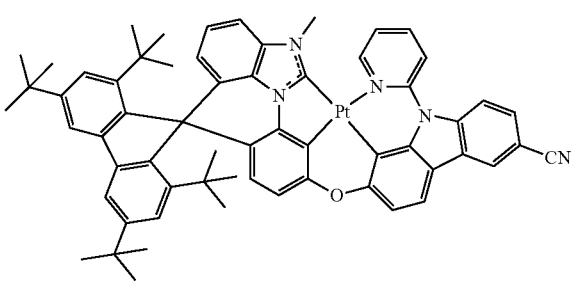

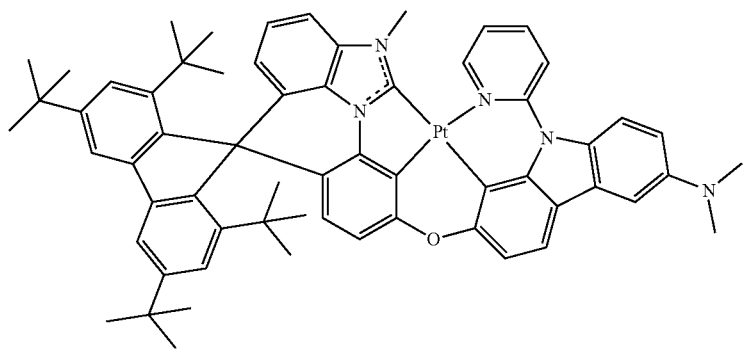
109
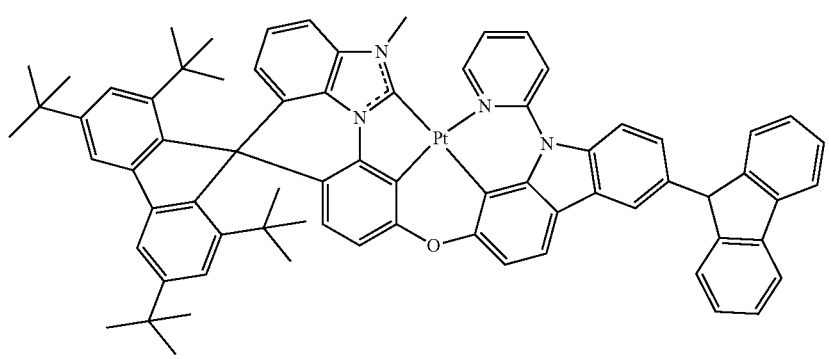
110
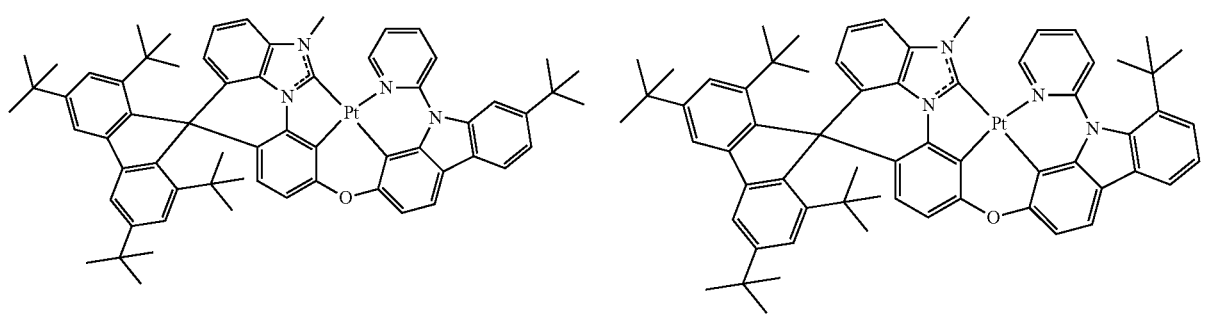
111 112
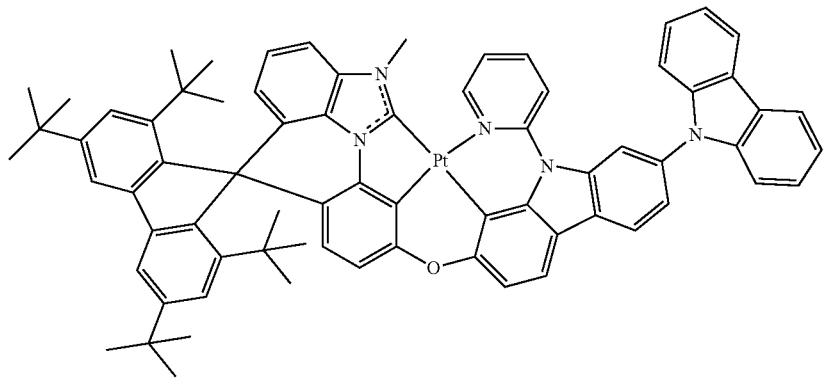
113

-continued
114
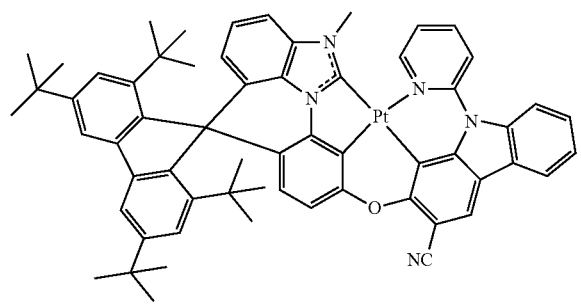
115
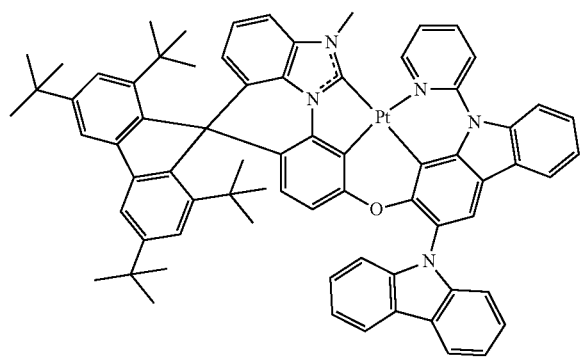
116
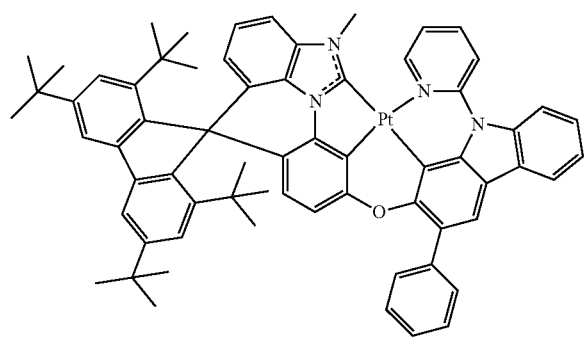
117
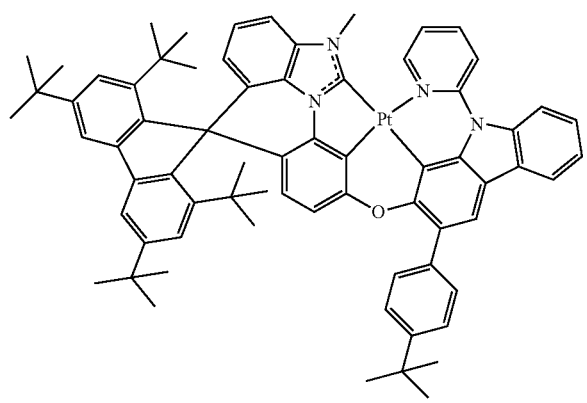
118
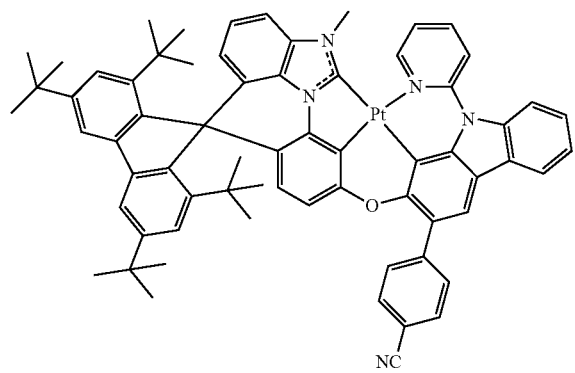
119
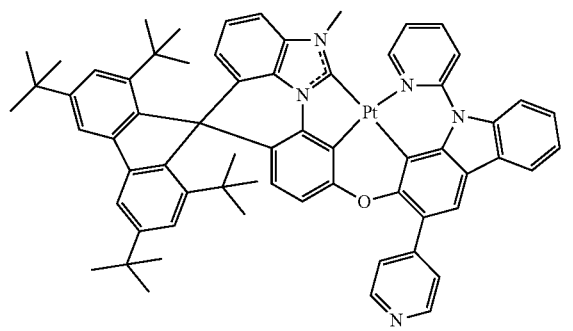

-continued
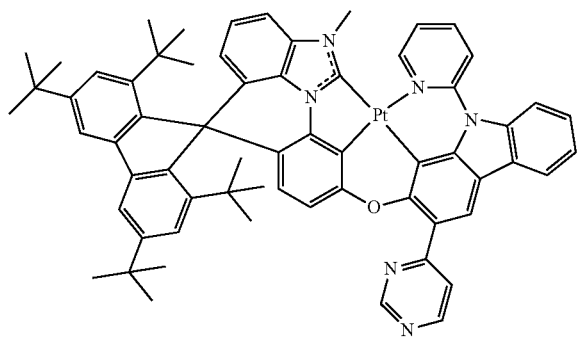
120
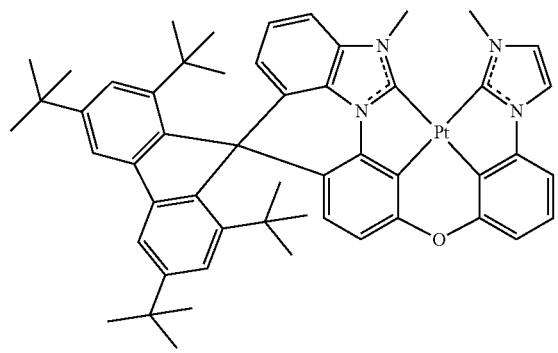
121
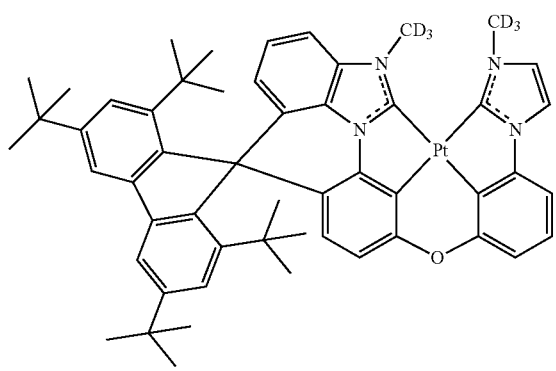
122
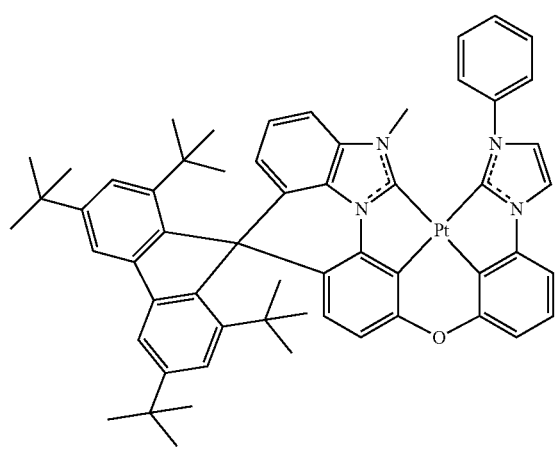
123
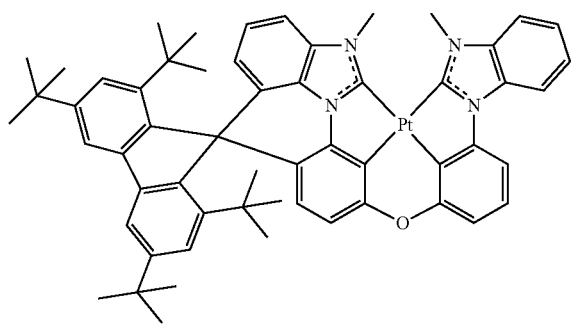
124

-continued
125
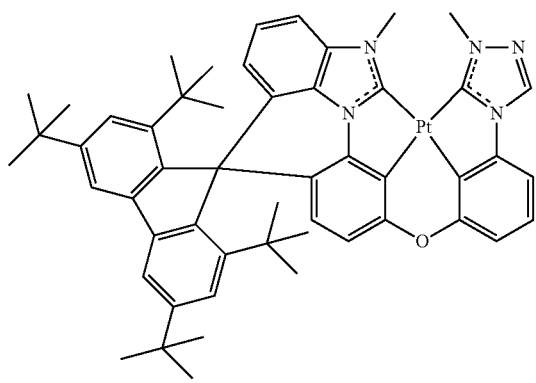
126
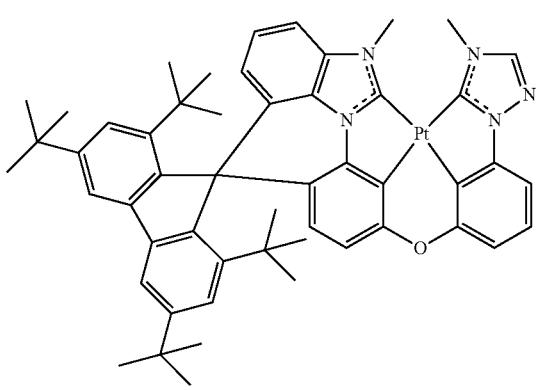
127
128
129
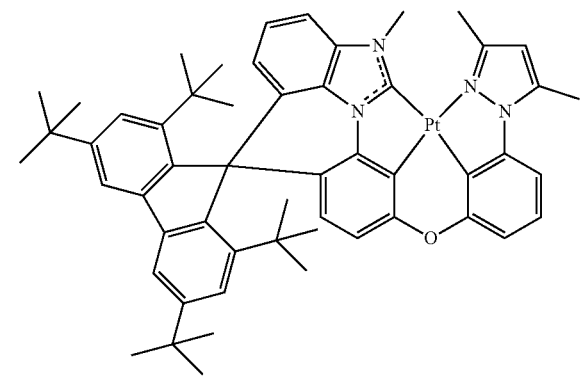
130
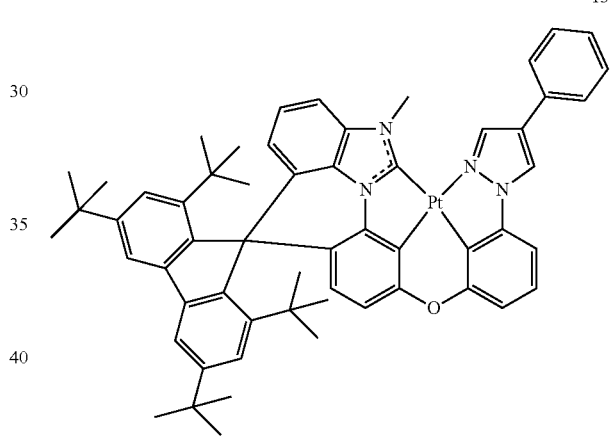
131
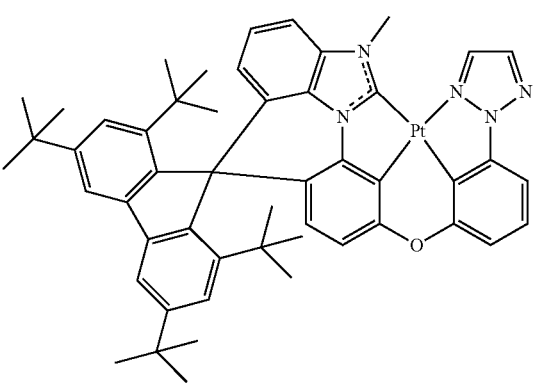

132
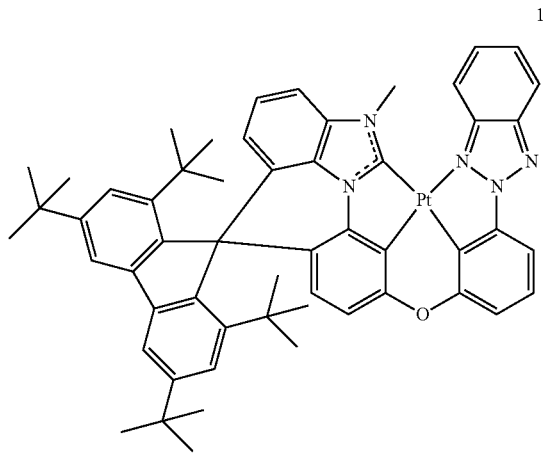
133
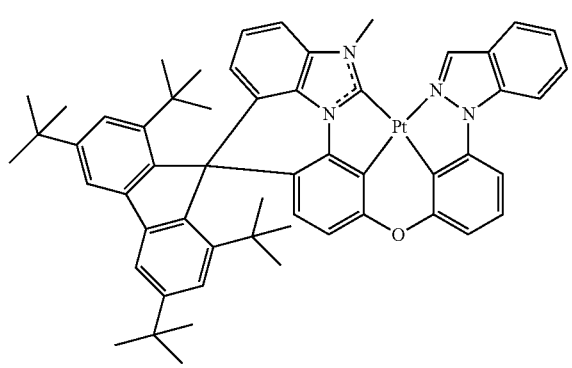
134
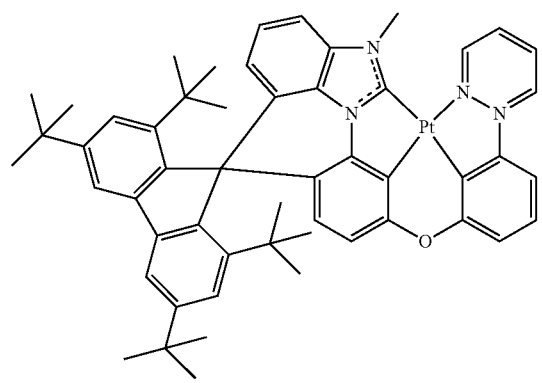
135
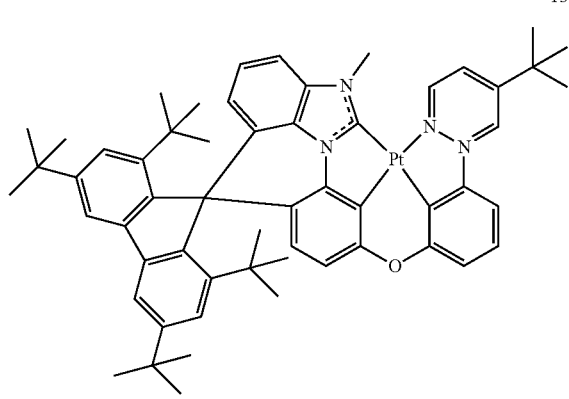
136
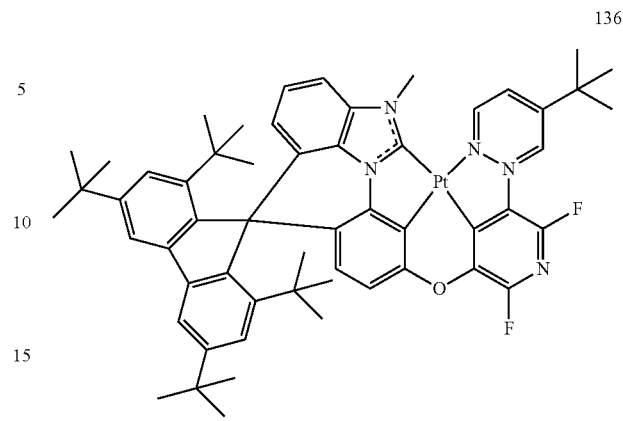
137
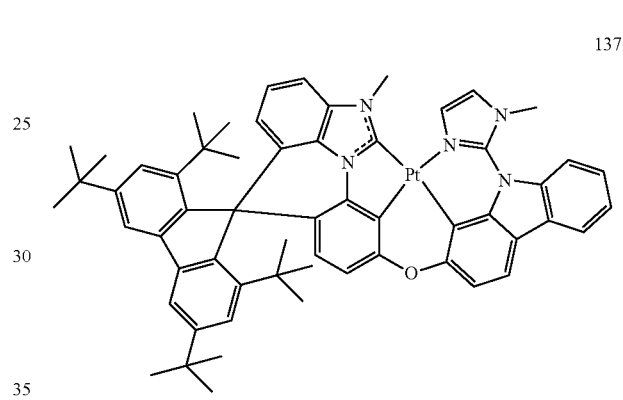
138
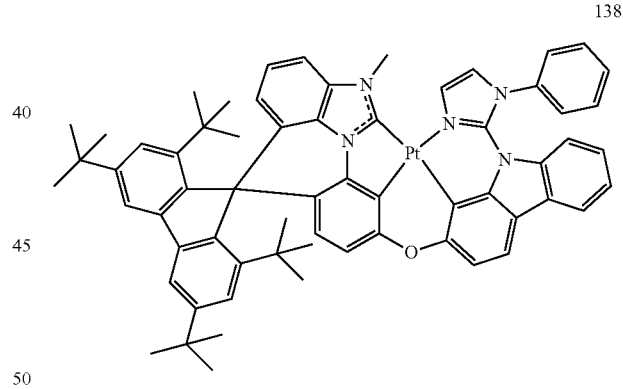
139
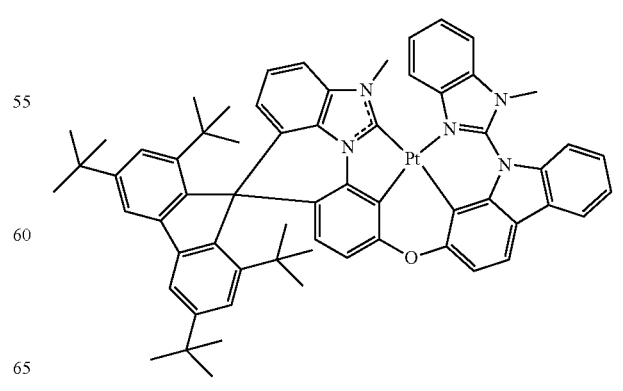

140

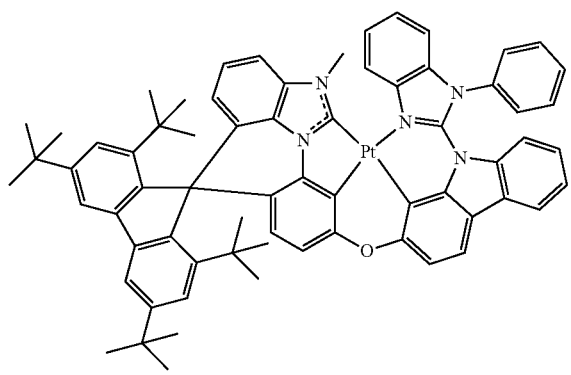

141

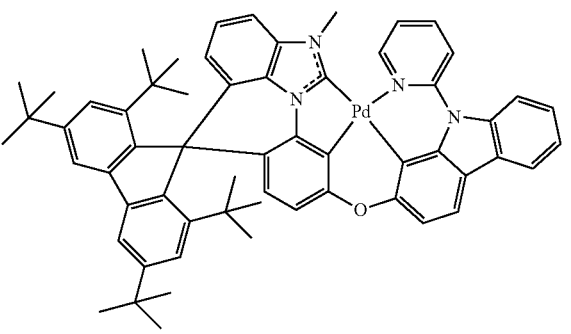

142

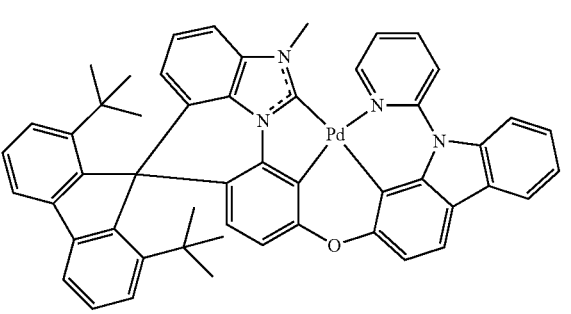

143

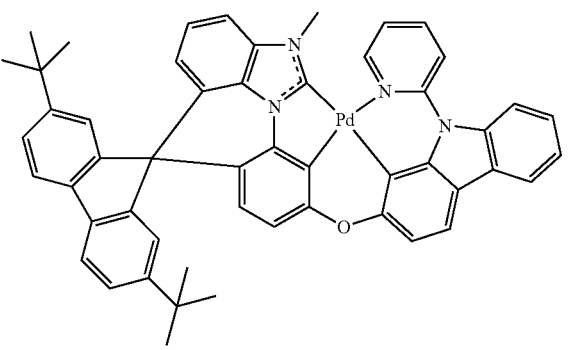

144

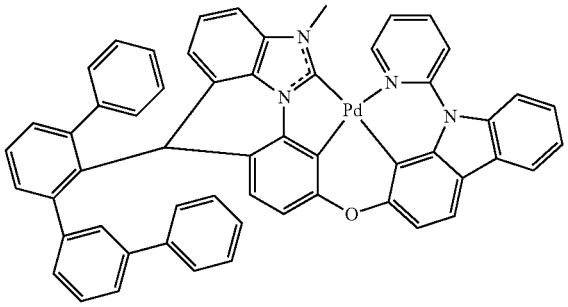

145

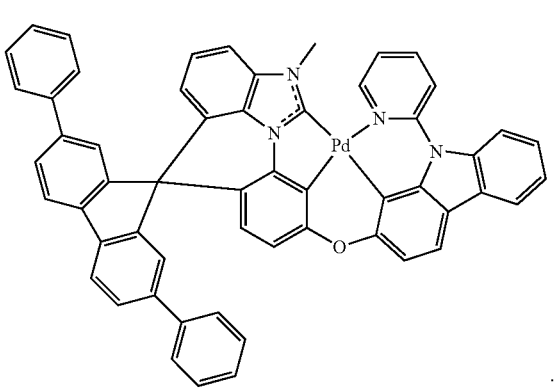

13. An organometallic compound represented by Formula 1:

[Formula 1]

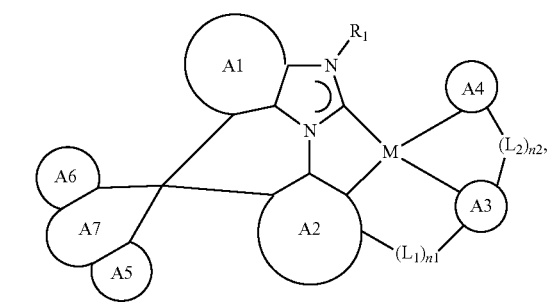

wherein, in Formula 1,

M is Pt, Pd, Cu, Ag, Au, Rh, Ir, Ru, or Os, ring A1 to ring A7 are each independently a substituted or unsubstituted hydrocarbon ring having 5 to 60 ring-forming carbon atoms, or a substituted or unsubstituted heterocycle having 1 to 60 ring-forming carbon atoms, $L_1$ and $L_2$ are each independently a direct linkage, *—O—*', *—S—*', *—C($R_{11}$)($R_{12}$)—*', *—C($R_{13}$)=*', *=C($R_{14}$)—*', *—C($R_{15}$)=C($R_{16}$)—*', *—C(=O)—*', *—C(=S)—*', *—C≡C—*', *—B($R_{17}$)—*', *—N($R_{18}$)—*', *—P($R_{19}$)*', *—Si($R_{20}$)($R_{21}$)—*', *—P($R_{22}$)($R_{23}$)—*', or *—Ge($R_{24}$)($R_{25}$)*', $R_{11}$ to $R_{25}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, $R_1$ is a hydrogen atom, a deuterium atom, a halogen atom, a substituted or unsubstituted thiol group, a substituted or unsubstituted oxy group, a substituted or unsubstituted boron group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and n1 and n2 are each independently an integer of 0 to 3, and wherein when M is Pt or Pd, $L_1$ is O, n1 is 1, A1, A2, A5 and A6 are each a benzene ring, and A7 is a 5-membered ring, then A5 and A6 are each substituted with one or more substituents selected from a tert-butyl group, a cyano group, a substituted or unsubstituted oxy group, a substituted or unsubstituted amine group, a substituted or unsubstituted aryl group having 6 to 30 ring-forming carbon atoms, or a substituted or unsubstituted heteroaryl group having 2 to 30 ring-forming carbon atoms.

14. The organometallic compound of claim 13, wherein the organometallic compound represented by Formula 1 is represented by Formula 2:

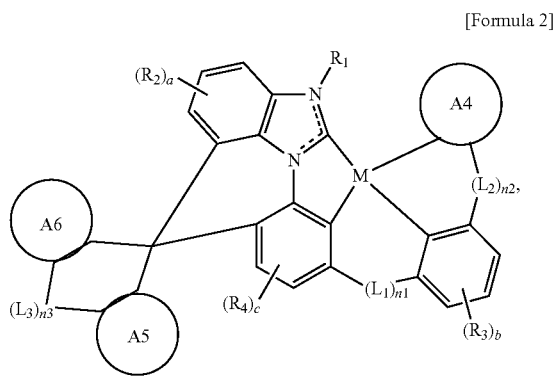

[Formula 2]

and wherein, in Formula 2, $R_2$ to $R_4$ are each independently a hydrogen atom, a deuterium atom, a halogen atom, a substituted or unsubstituted thiol group, a substituted or unsubstituted oxy group, a substituted or unsubstituted boron group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a and b are each independently an integer of 0 to 3, c is an integer of 0 to 2, $L_3$ is a direct linkage, *—O—*, *—S—*', *—C($R_{26}$)($R_{27}$)—*', *—C($R_{28}$)=*', *=C($R_{29}$)—*', *—C($R_{30}$) =C($R_{31}$)—*', *—C(=O)—*', *—C(=S)—*', *—C≡C—*', *—B($R_{32}$)—*', *—N($R_{33}$)—*', *—P($R_{34}$)—*', *—Si($R_{35}$)($R_{36}$)—*', *—P($R_{37}$)($R_{38}$)—*', or *—Ge($R_{39}$)($R_{40}$)—*', $R_{26}$ to $R_{40}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, n3 is an integer of 0 to 3, and M, ring A4 to ring A6, $R_1$, $L_1$, $L_2$, n1, and n2 are each independently the same as defined in Formula 1.

15. The organometallic compound of claim 14, wherein the organometallic compound represented by Formula 2 is represented by Formula 3:

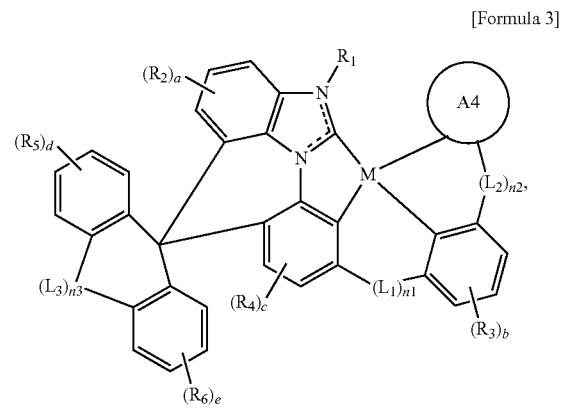

[Formula 3]

wherein, in Formula 3, $R_5$ and $R_6$ are each independently a hydrogen atom, a deuterium atom, a halogen atom, a cyano group, an amine group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, d and e are each independently an integer of 0 to 4, and M, ring A4, $R_1$ to $R_4$, a to c, $L_1$ to $L_3$, and n1 to n3 are each independently the same as defined in Formula 2, and wherein when M is Pt or Pd, $L_1$ is O, n1 is 1, and n3 is 0, then d and e are each an integer of 1 to 4, and $R_5$ and $R_6$ are each independently a tert-butyl group, a cyano group, an amine group, a substituted or unsubstituted oxy group, a substituted or unsubstituted aryl group having 6 to 30 ring-forming carbon atoms, or a substituted or unsubstituted heteroaryl group having 2 to 30 ring-forming carbon atoms.

16. The organometallic compound of claim 15, wherein the organometallic compound represented by Formula 3 is represented by any one among Formula 4-1 to Formula 4-3:

[Formula 4-1]

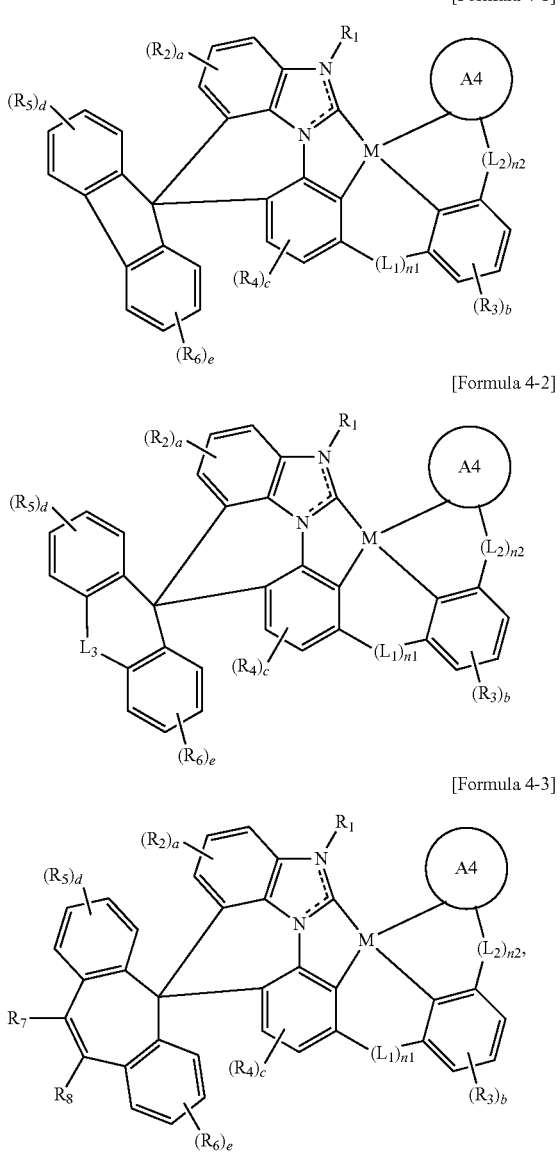

[Formula 4-2]

[Formula 4-3]

wherein, in Formula 4-1 to Formula 4-3,

L$_3$ is *—O—*', *—S—*', *—C(R$_{26}$)(R$_{27}$)—*', or N(R$_{33}$)—*',

R$_{26}$, R$_{27}$, and R$_{33}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, R$_7$ and R$_8$ are each independently a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and M, ring A4, R$_1$ to R$_6$, a to e, L$_1$ and L$_2$, n1, and n2 are each independently the same as defined in Formula 3.

17. The organometallic compound of claim 15, wherein the organometallic compound represented by Formula 3 is represented by Formula 5:

[Formula 5]

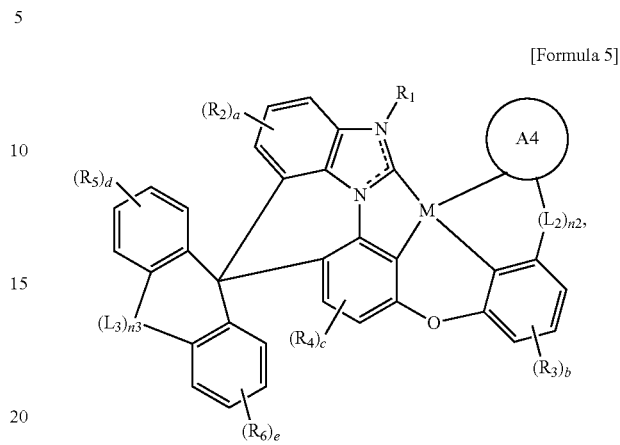

and wherein, in Formula 5,

M, ring A4, R$_1$ to R$_6$, a to e, L$_2$, L$_3$, n2, and n3 are the same as defined in Formula 3.

18. The organometallic compound of claim 15, wherein the organometallic compound represented by Formula 3 is represented by Formula 6-1 or Formula 6-2:

[Formula 6-1]

[Formula 6-2]

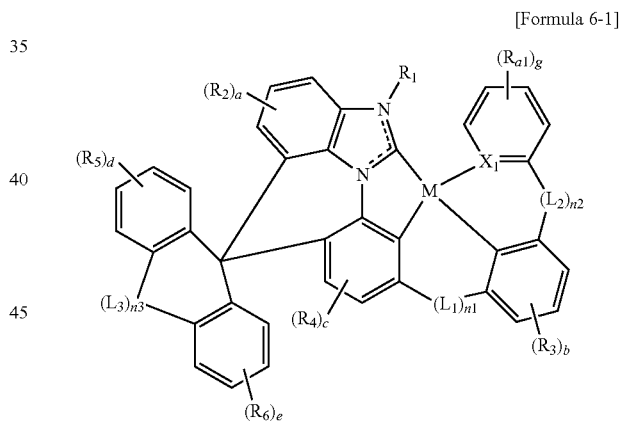

and wherein, in Formula 6-1 and Formula 6-2, $X_1$ is N or C, $X_2$ is N or $CR_{a3}$, $R_{a1}$ to $R_{a3}$ are each independently a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, g is an integer of 0 to 4, f is an integer of 0 to 3, and M, $R_1$ to $R_6$, a to e, $L_1$ to $L_3$, n1, n2, and n3 are each independently the same as defined in Formula 3.

19. The organometallic compound of claim 13, wherein the organometallic compound represented by Formula 1 is represented by Formula 7-1 or Formula 7-2:

[Formula 7-1]

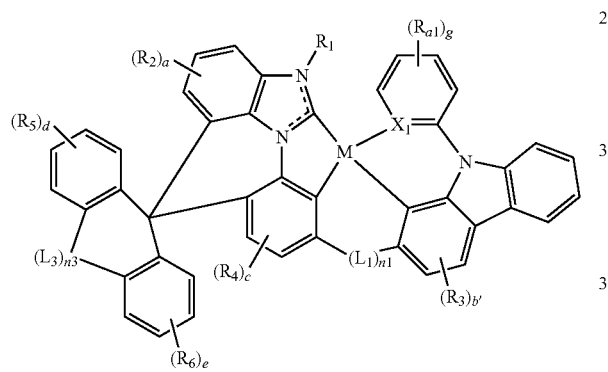

[Formula 7-2]

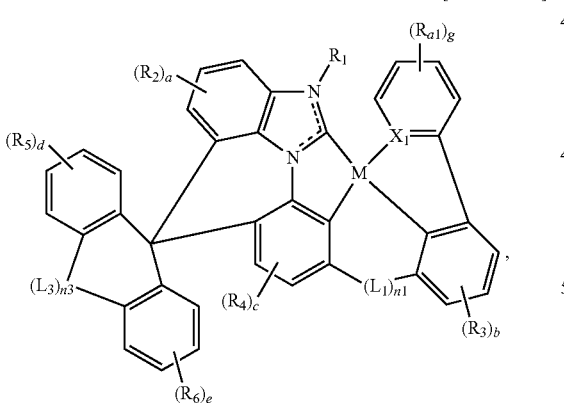

wherein, in Formula 7-1 and Formula 7-2, $R_2$ to $R_4$ are each independently a hydrogen atom, a deuterium atom, a halogen atom, a substituted or unsubstituted thiol group, a substituted or unsubstituted oxy group, a substituted or unsubstituted boron group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a is an integer of 0 to 3, c is an integer of 0 to 2, $L_3$ is a direct linkage, *—O—*, *—S—*', *—C($R_{26}$)($R_{27}$)—*', *—C($R_{28}$)=*', *=C($R_{29}$)—*', *—C($R_{30}$)=C($R_{31}$)—*', *—C(=O)—*', *—C(=S)—*', *—C≡C—*', *—B($R_{32}$)—*', *—N($R_{33}$)—*', *—P($R_{34}$)—*', *—Si($R_{35}$)($R_{36}$)—*', *—P($R_{37}$)($R_{38}$)—*', or *—Ge($R_{39}$)($R_{40}$)—*', $R_{26}$ to $R_{40}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, n3 is an integer of 0 to 3, $R_5$ and $R_6$ are each independently a hydrogen atom, a deuterium atom, a halogen atom, an amine group, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, d and e are each independently an integer of 0 to 4, $X_1$ is N or C, $X_2$ is N or $CR_{a3}$, $R_{a1}$ and $R_{a3}$ are each independently a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, g is an integer of 0 to 4, b' is an integer of 0 to 2, and M, $R_i$, b, Li, and n1 are each independently the same as defined in Formula 1, and wherein when M is Pt or Pd, $L_1$ is O, n1 is 1, and n3 is 0, then d and e are each an integer of 1 to 4, and $R_5$ and $R_6$ are each independently a tert-butyl group, a cyano group, a substituted or unsubstituted oxy group, a substituted or unsubstituted amine group, a substituted or unsubstituted aryl group having 6 to 30 ring-forming carbon atoms, or a substituted or unsubstituted heteroaryl group having 2 to 30 ring-forming carbon atoms.

20. An organometallic compound being at least one selected from compounds represented by Compound Group 1:

[Compound Group 1]

1

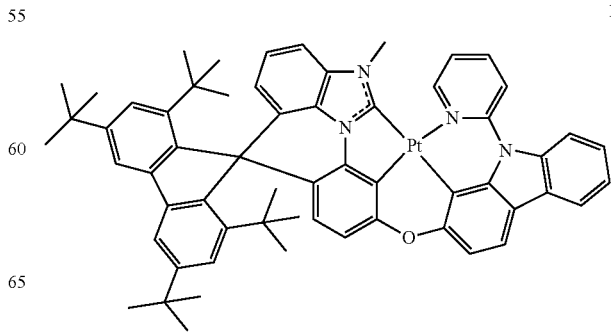

-continued
2
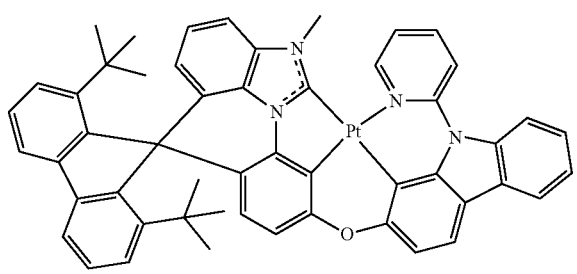
3
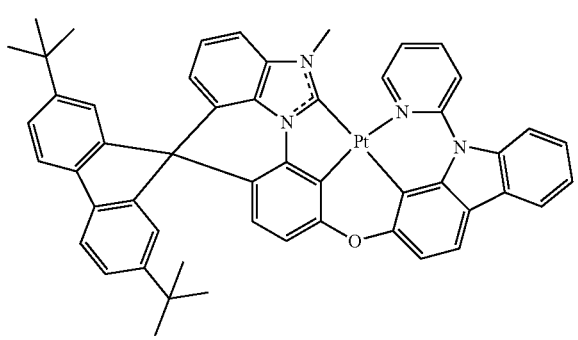
4
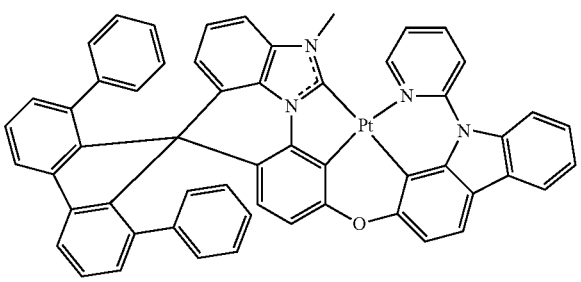
5
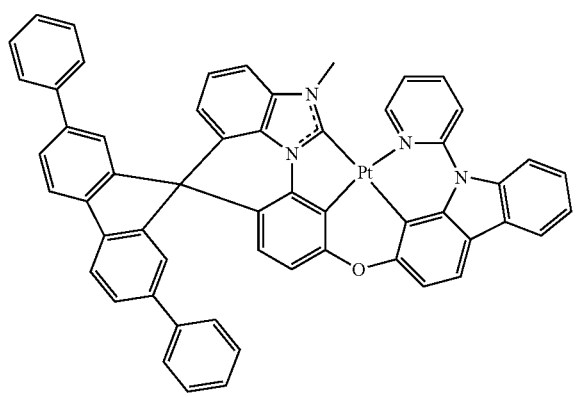
6
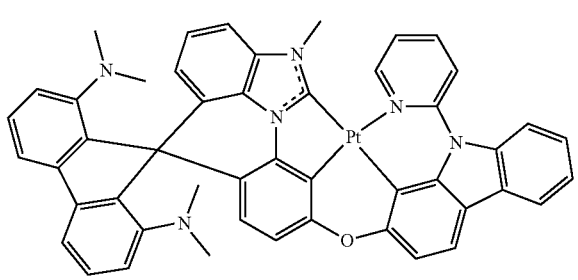
-continued
7
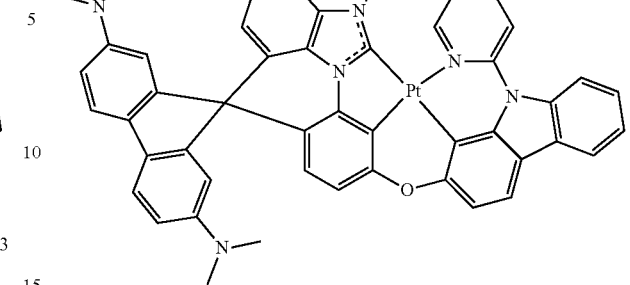
8
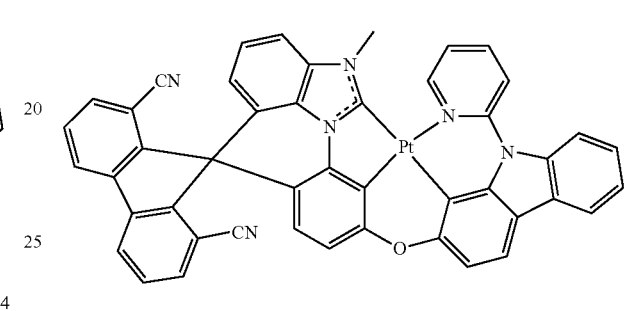
9
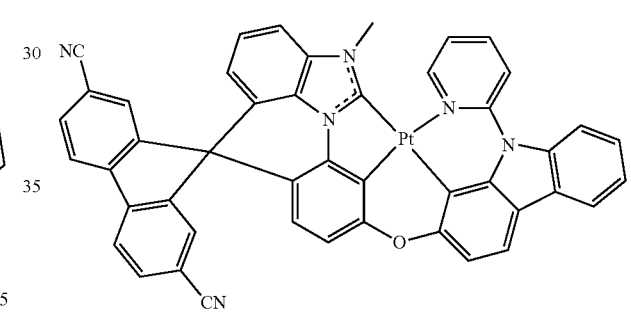
10
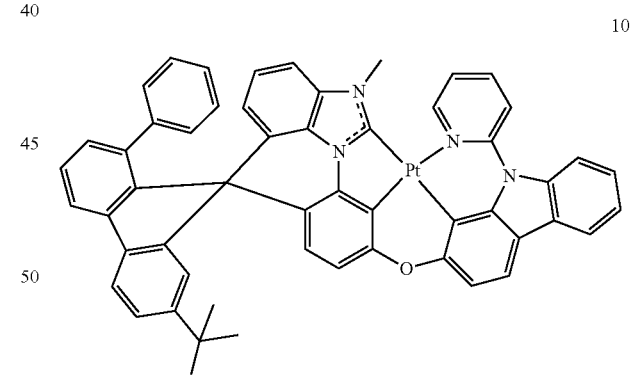
11
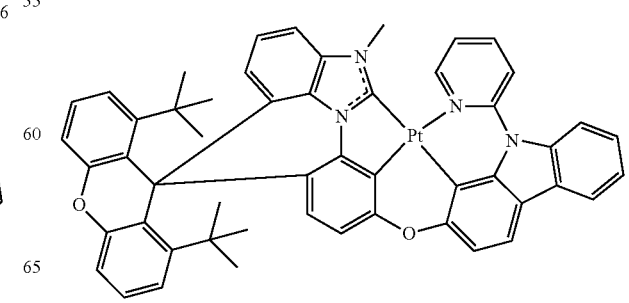

12
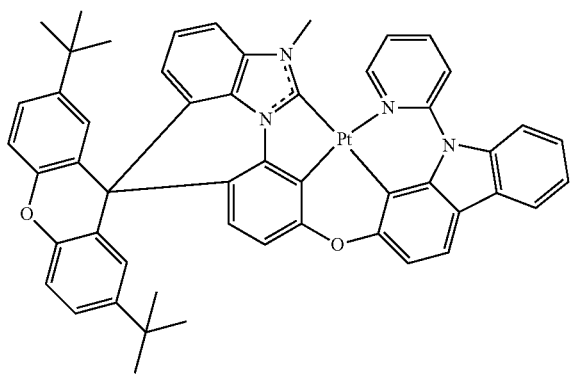
16
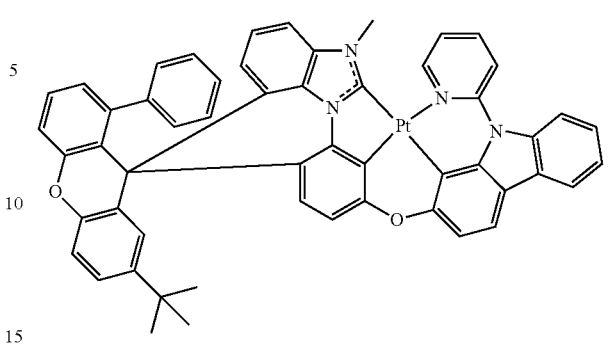
13
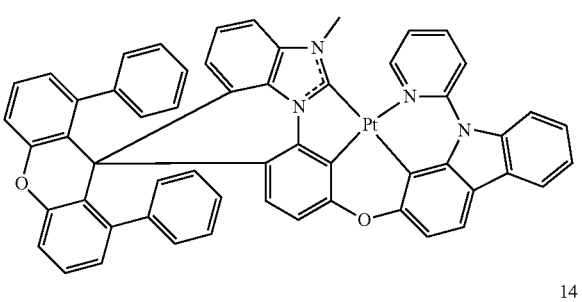
17
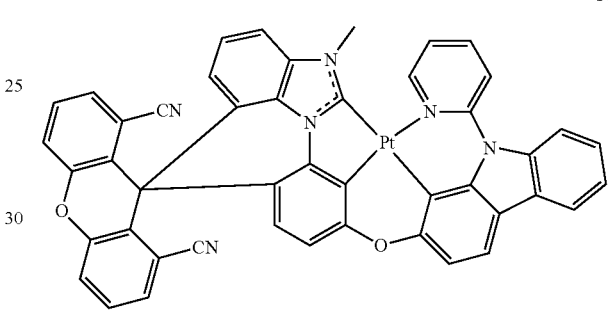
14
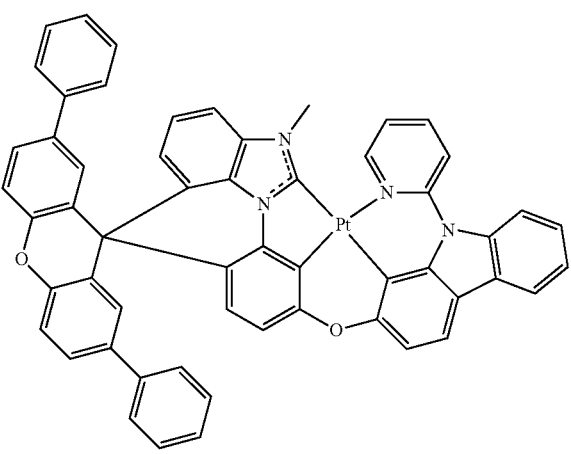
18
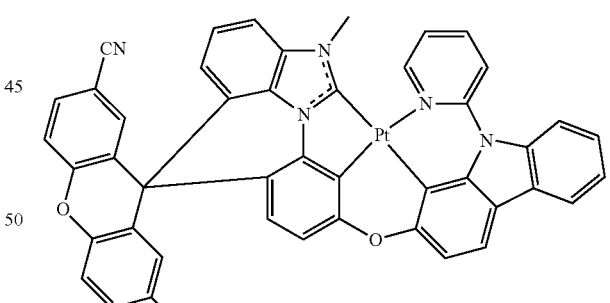
15
19
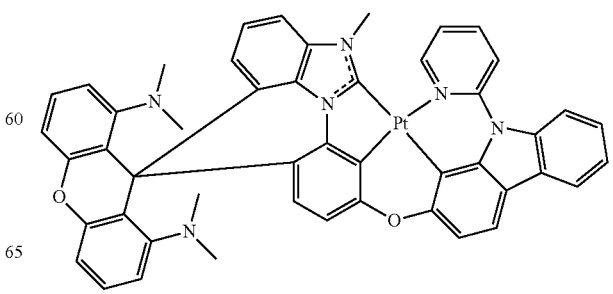
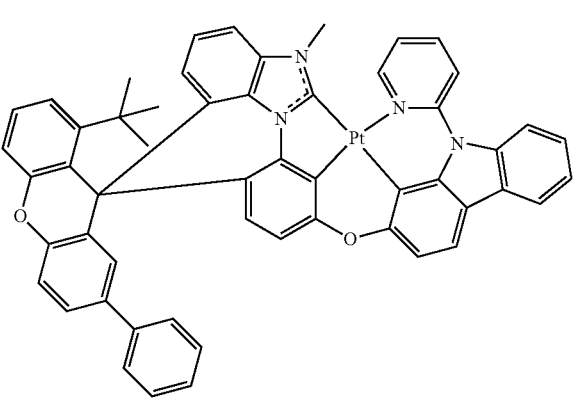

201
-continued
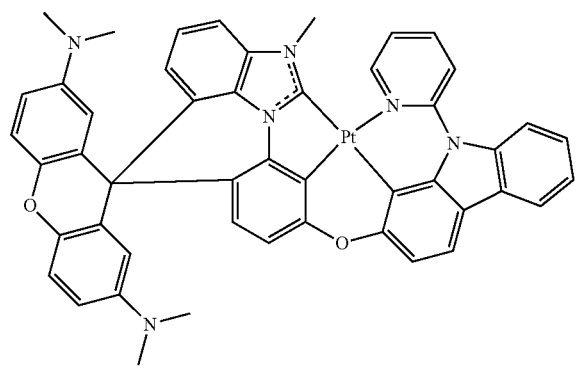
20
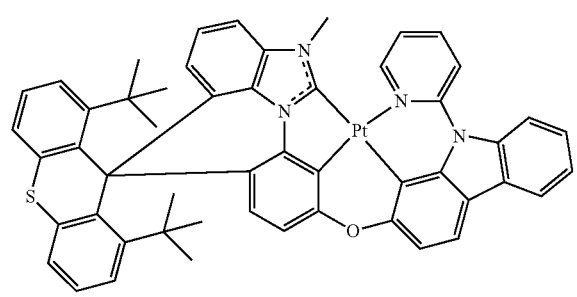
21
22
23
202
-continued
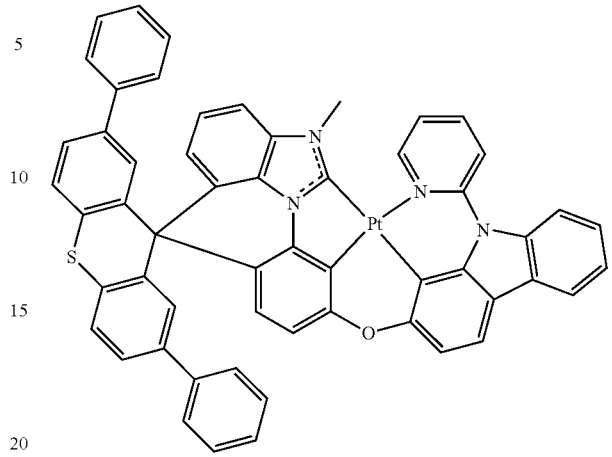
24
25
26
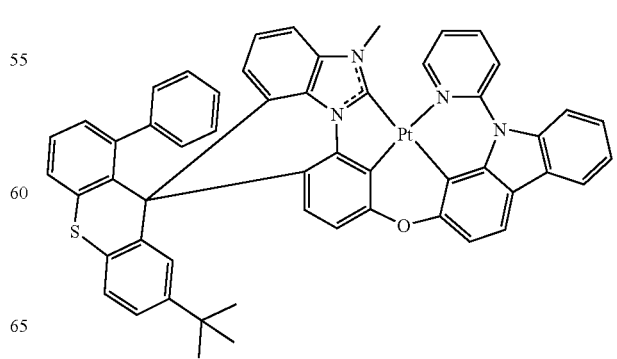

27
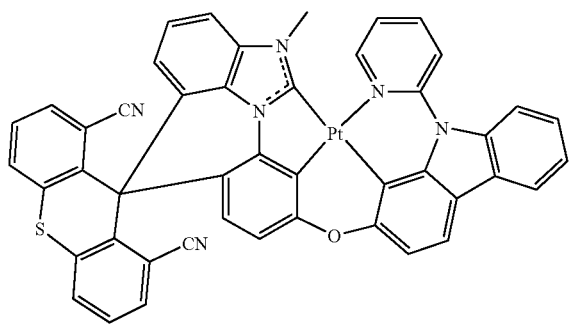
28
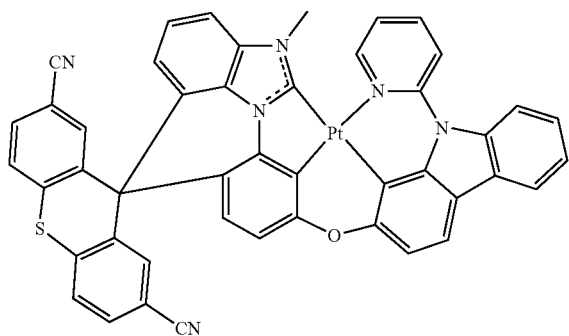
29
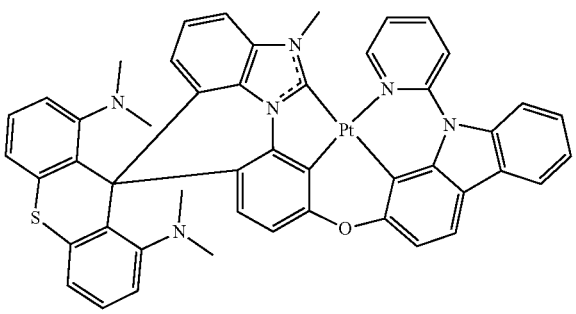
30
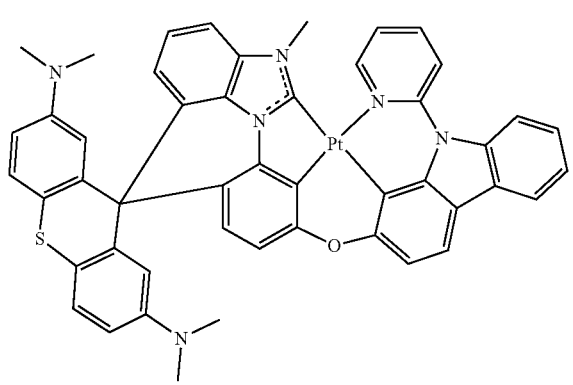
31
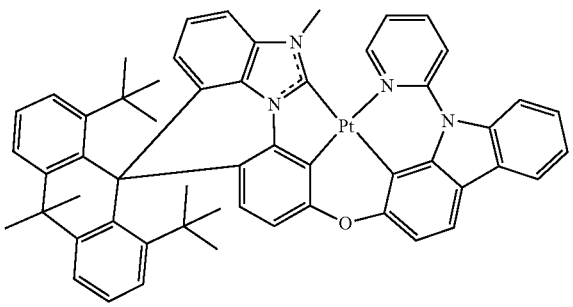
32
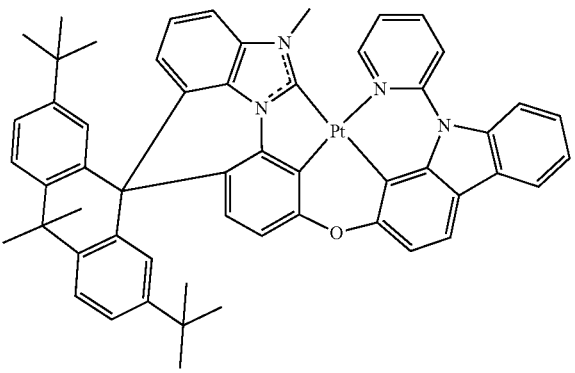
33
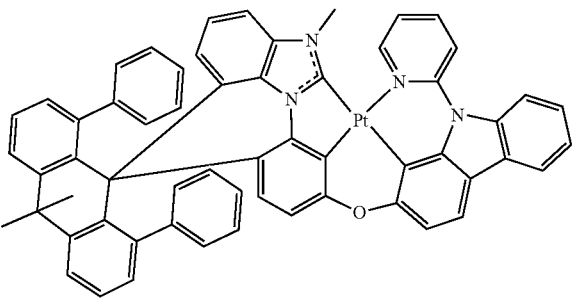
34
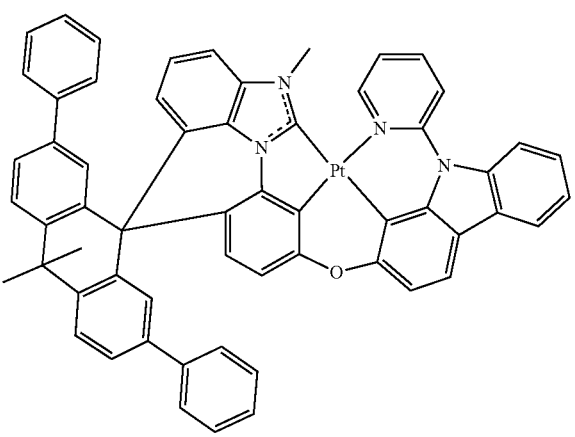

35
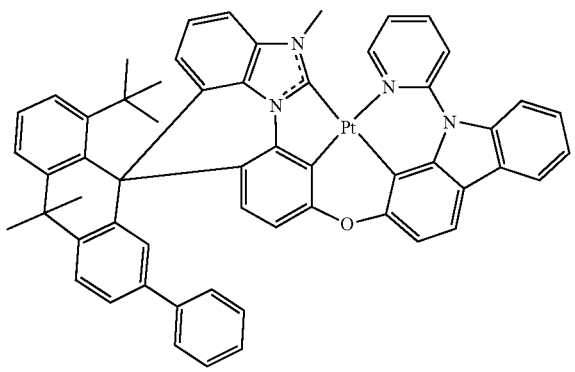
36
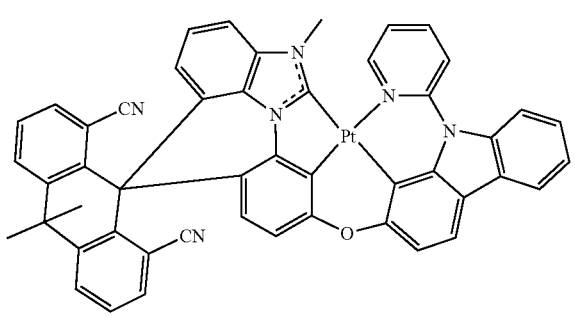
37
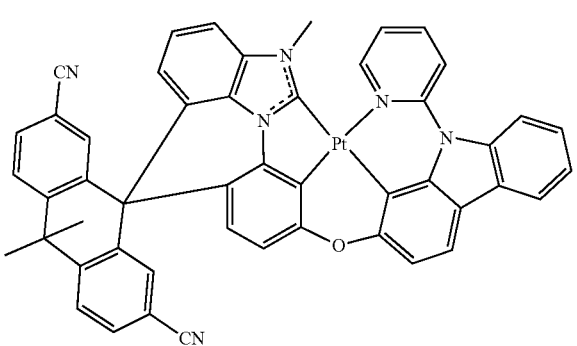
38
39
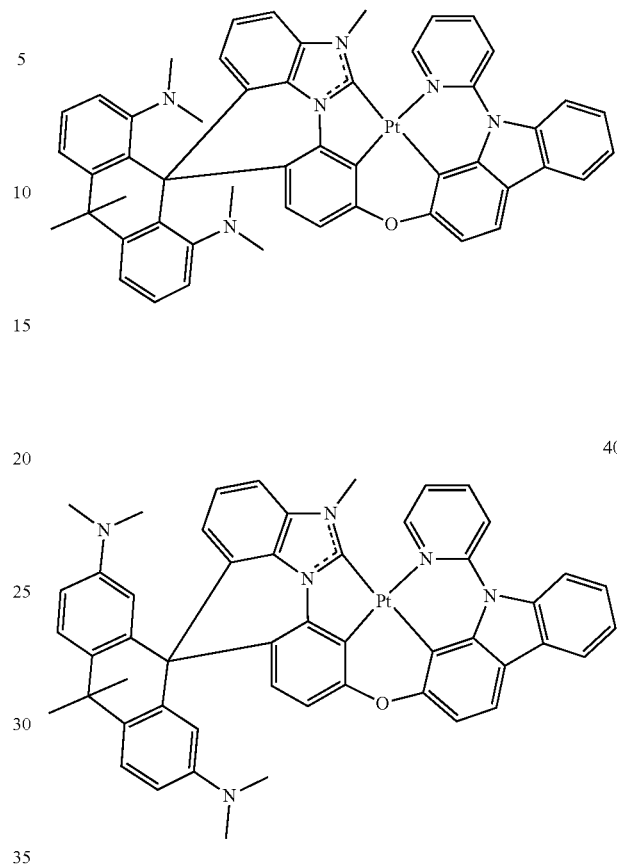
40
41
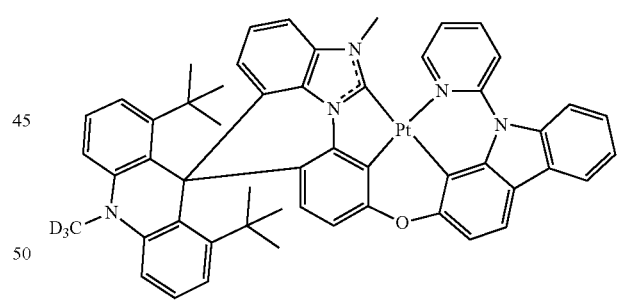
42
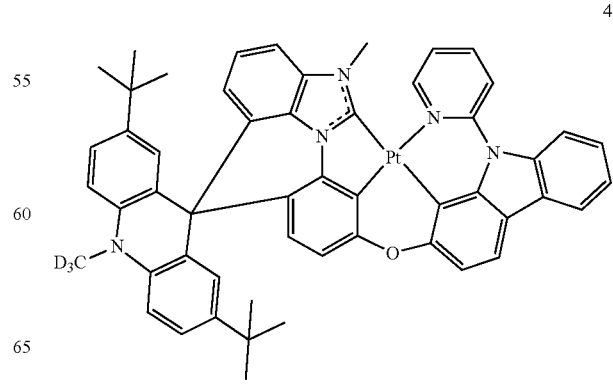

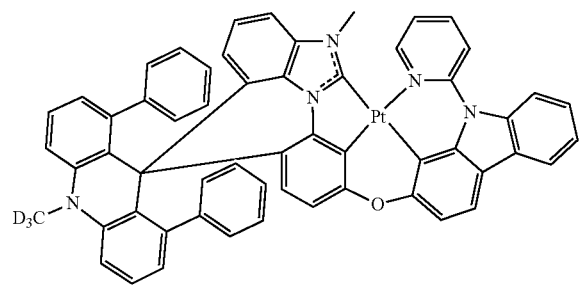
43
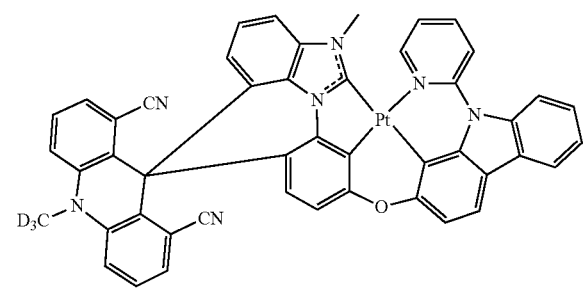
47
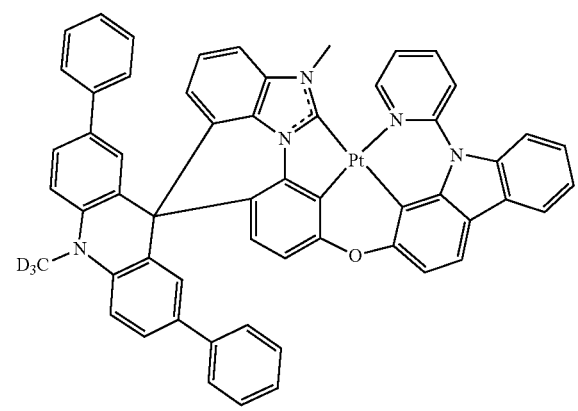
44
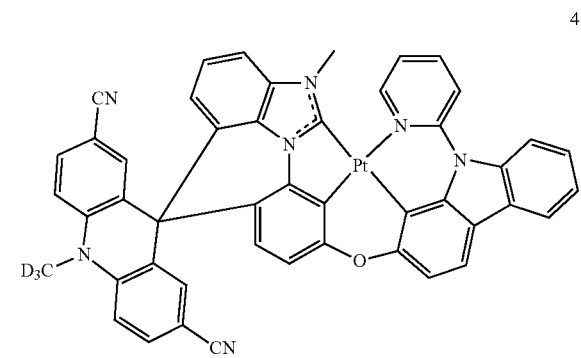
48
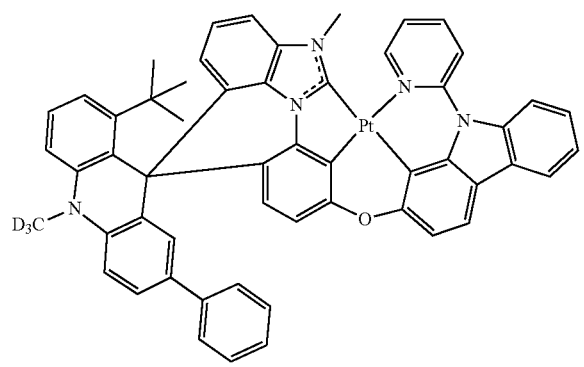
45
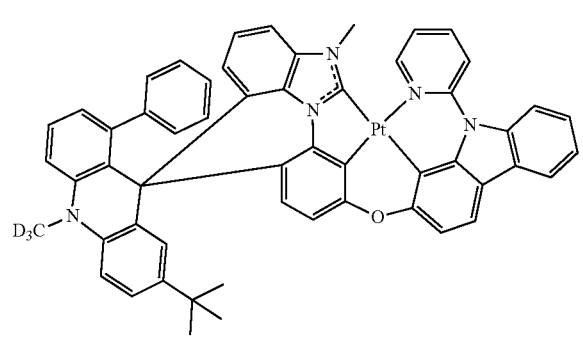
46
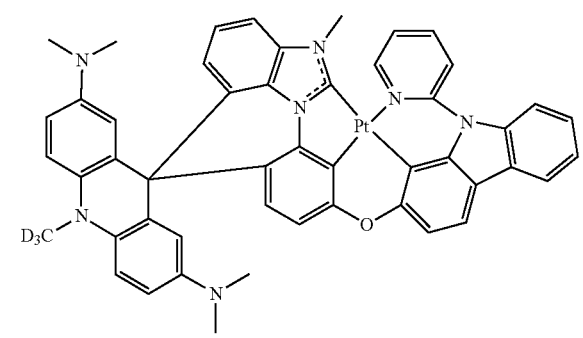
49
50

51
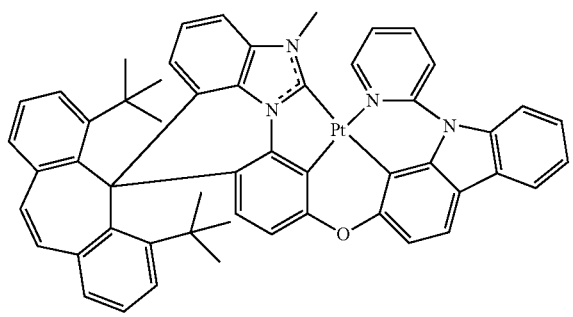
52
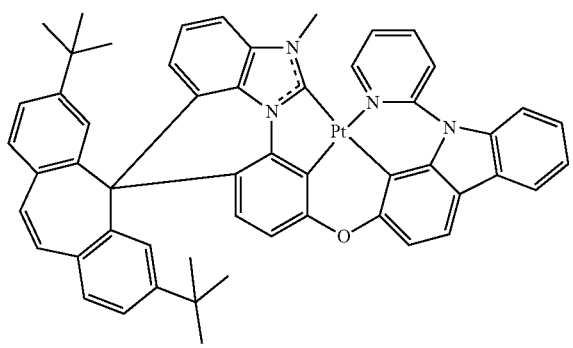
53
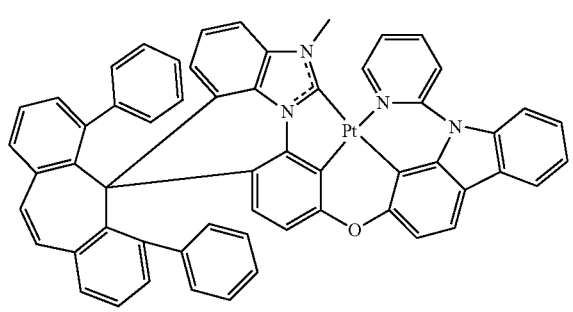
54
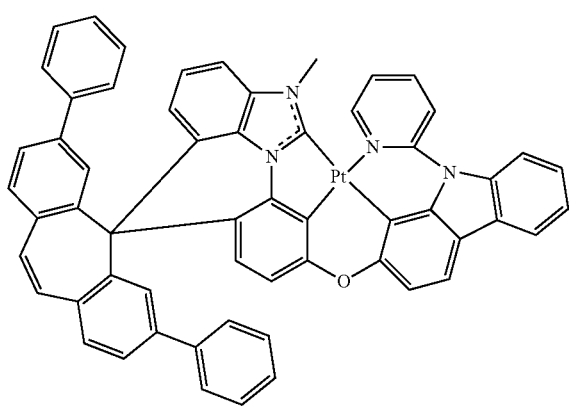
55
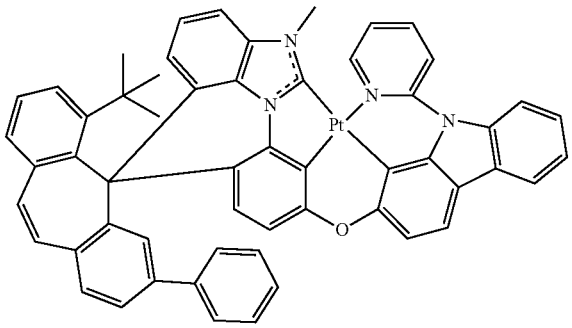
56
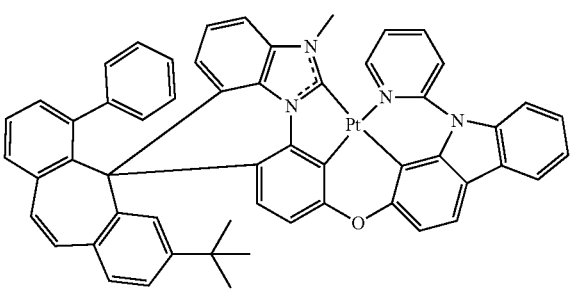
57
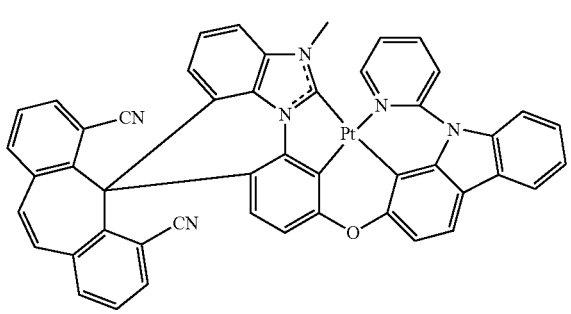
58
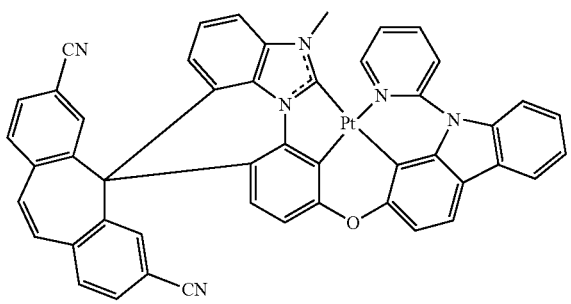
59
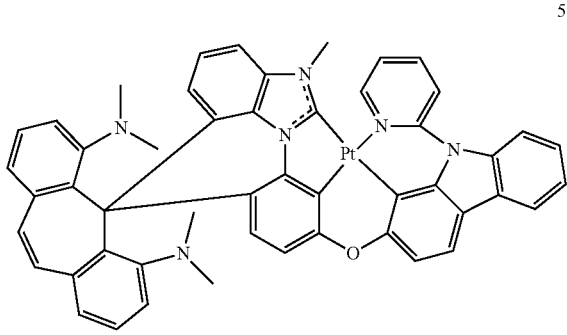

211
60
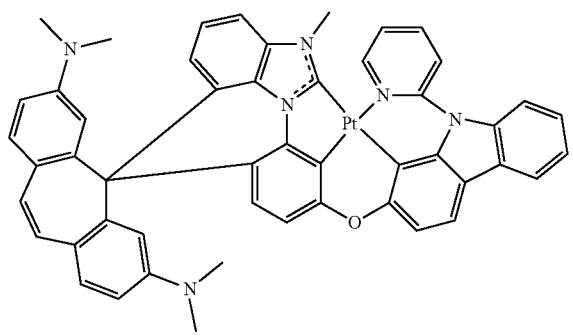
61
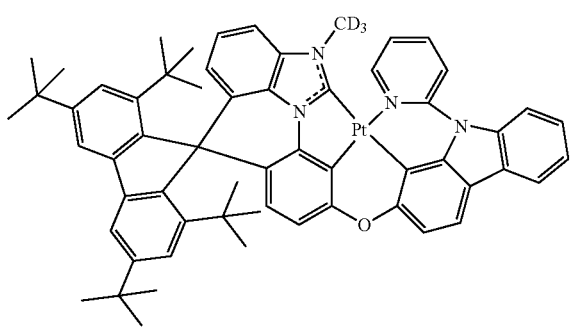
62
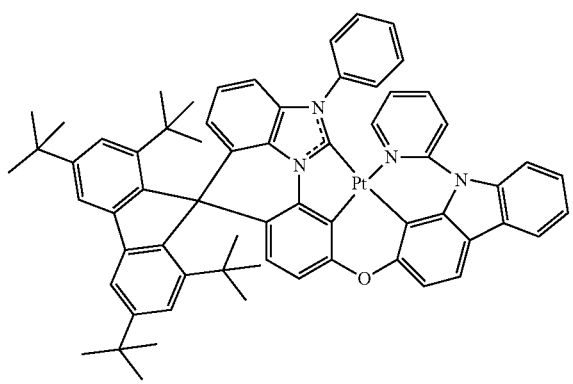
63
212
64
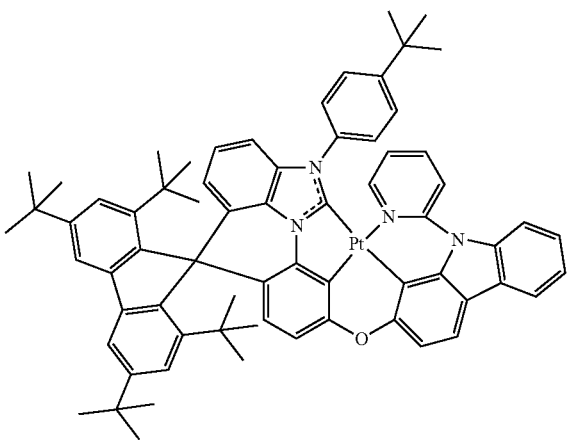
65
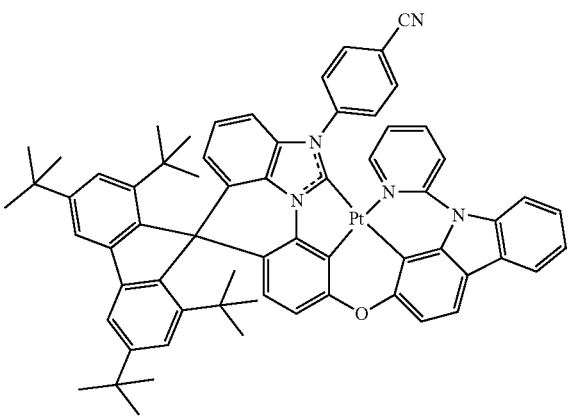
66
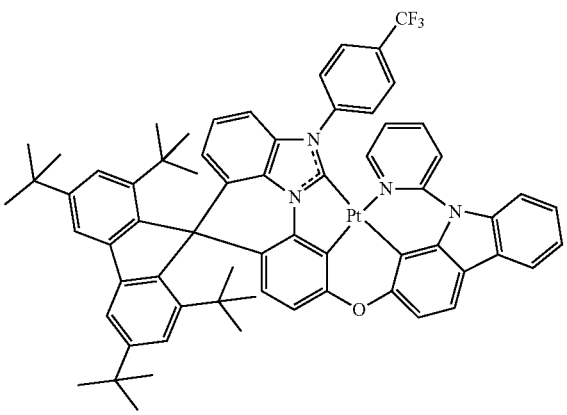

213
-continued
67
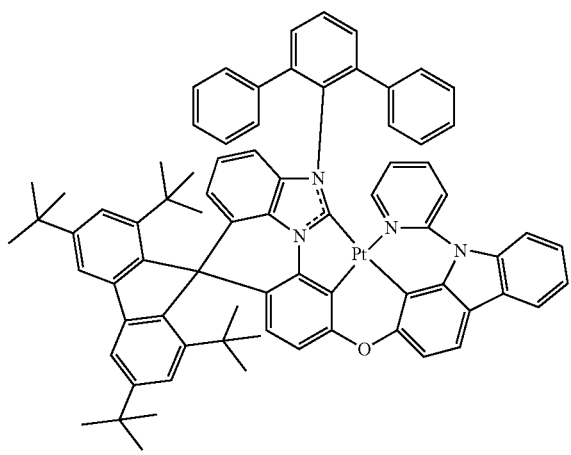
68
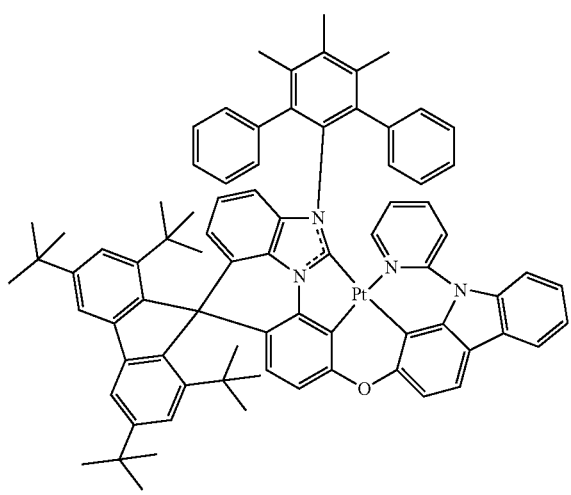
69
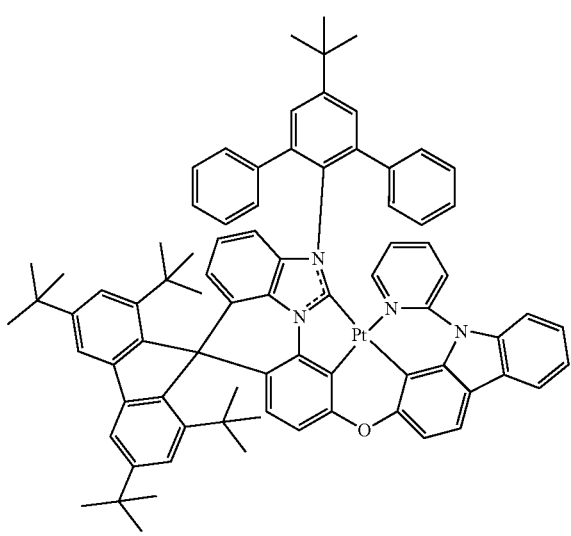
214
-continued
70
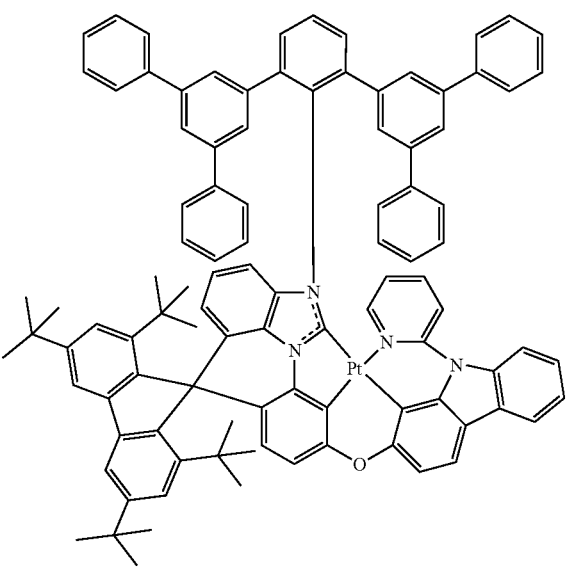
71
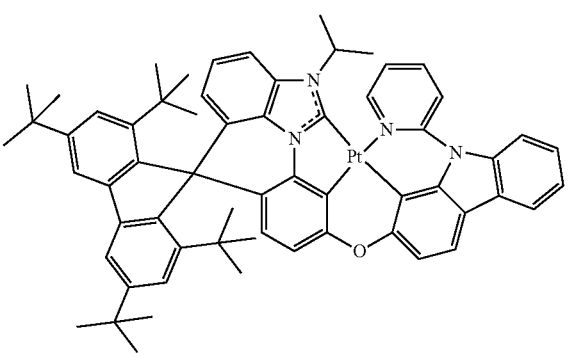
72

215
-continued
73
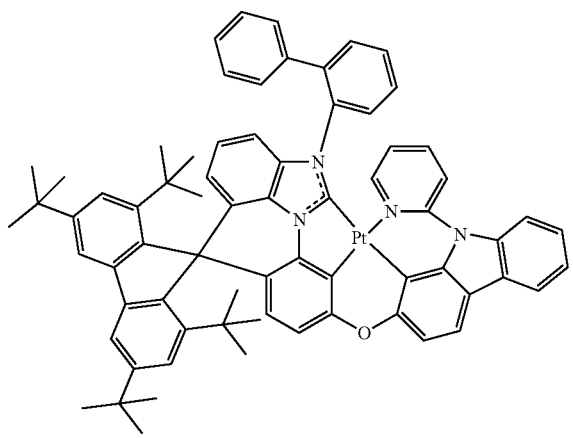
74
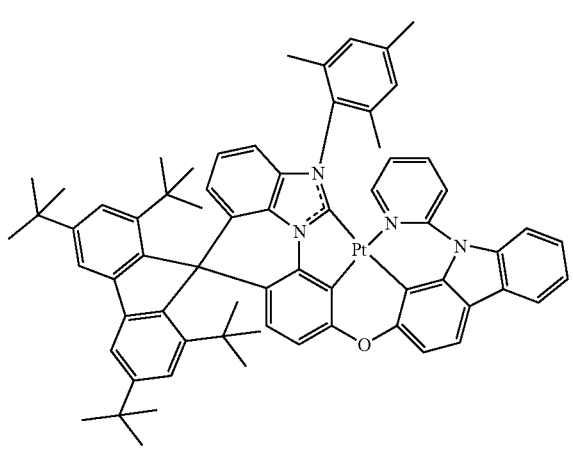
75
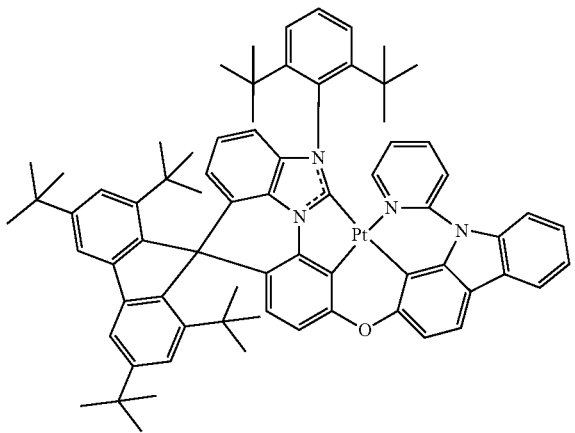
216
-continued
76
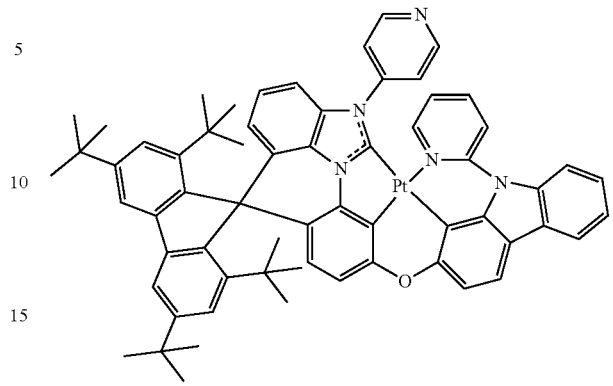
77
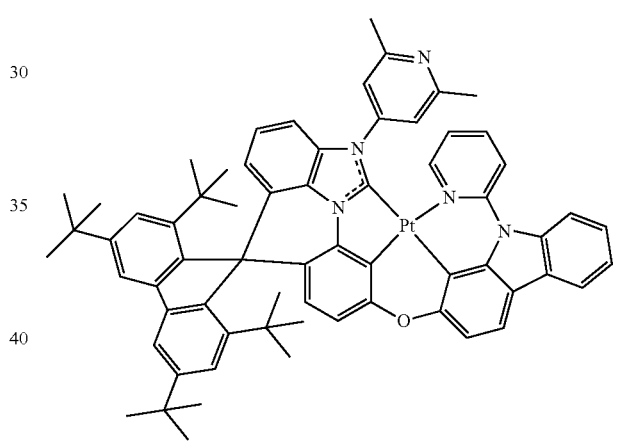
78
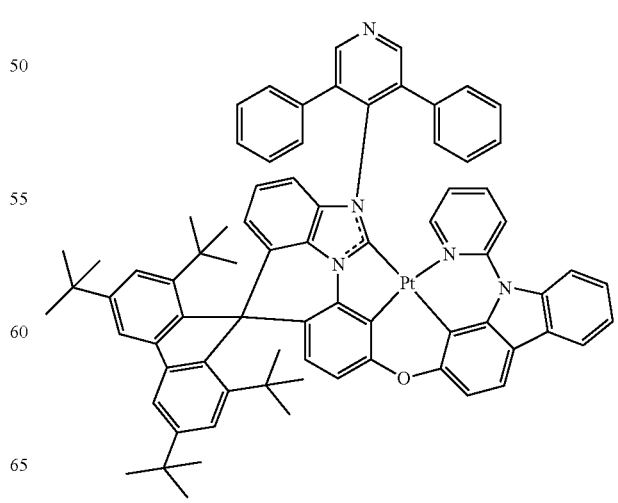

79
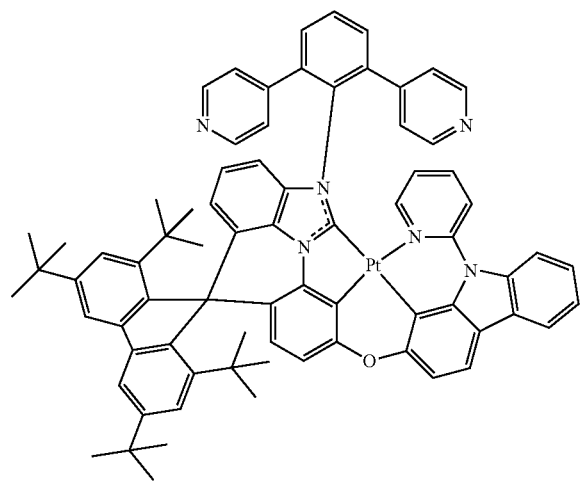
80
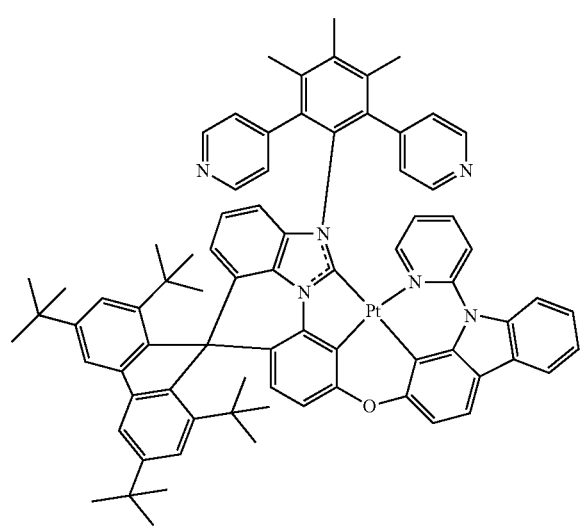
81
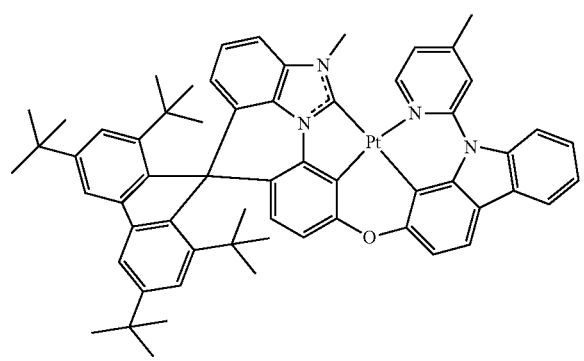
82
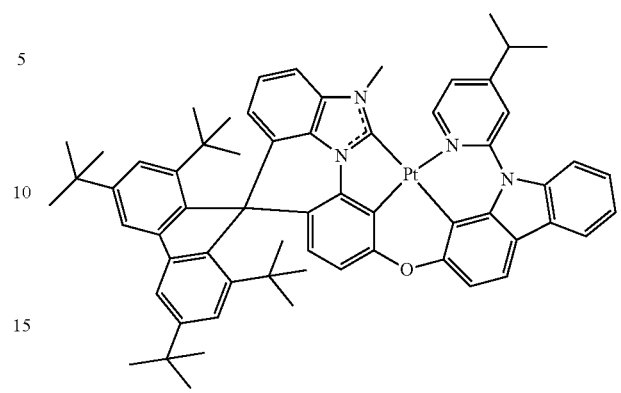
83
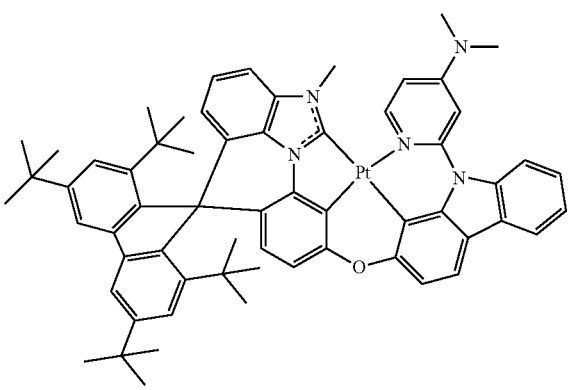
84

85
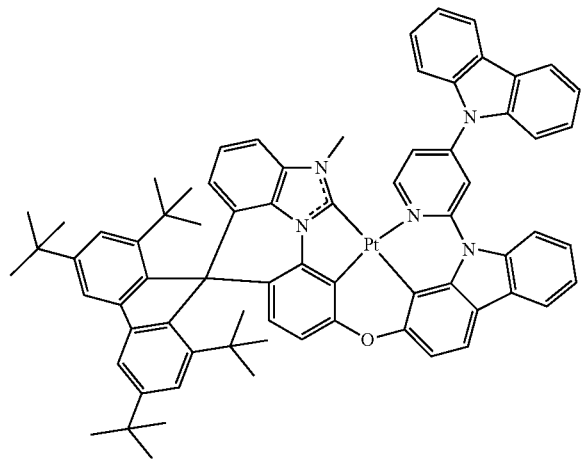
86
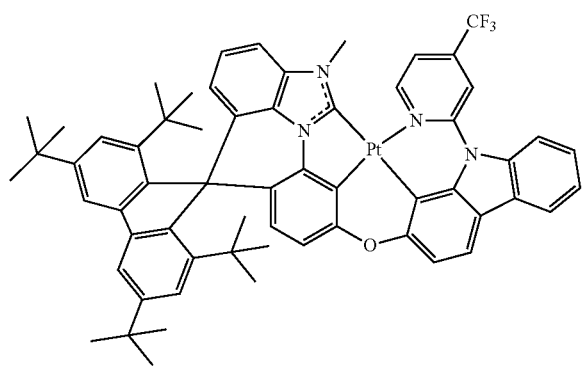
87
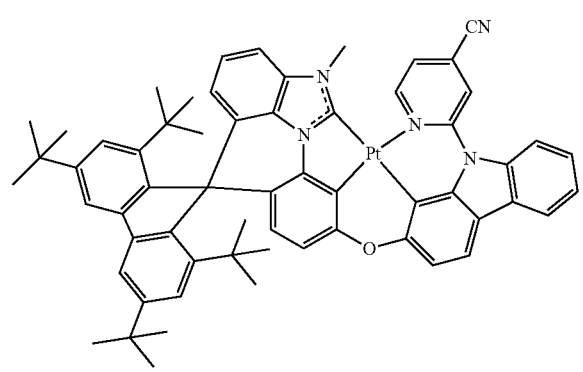
88
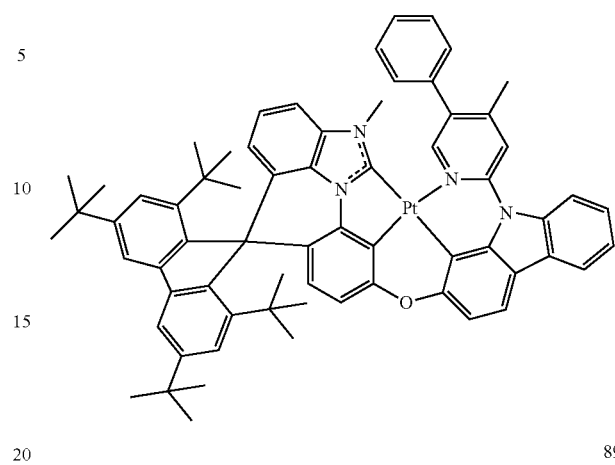
89
90
91
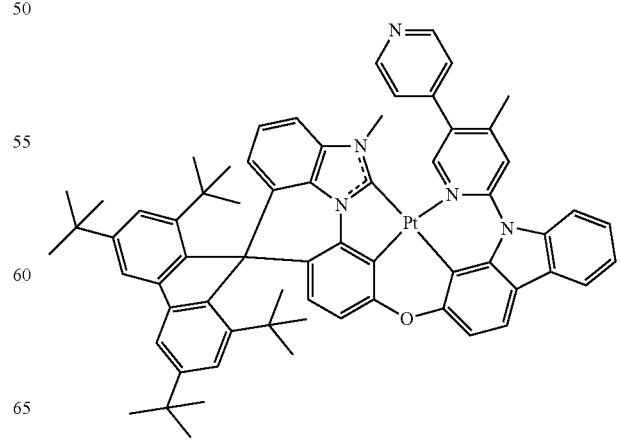

221
-continued
92
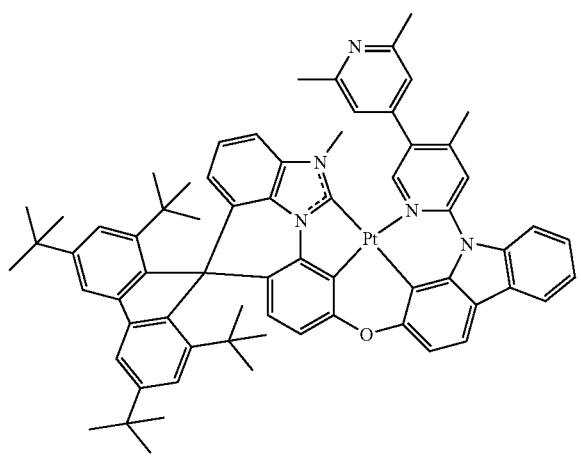
93
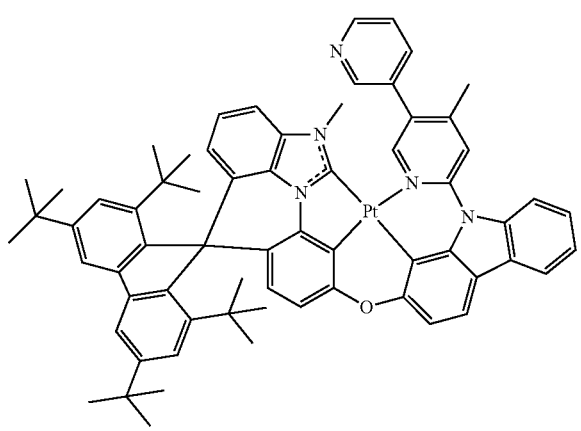
94
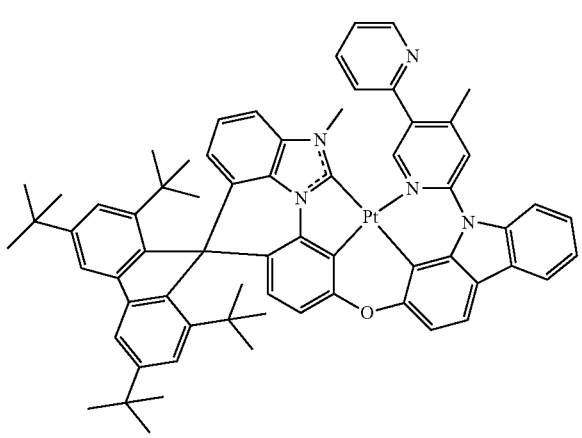
222
-continued
95
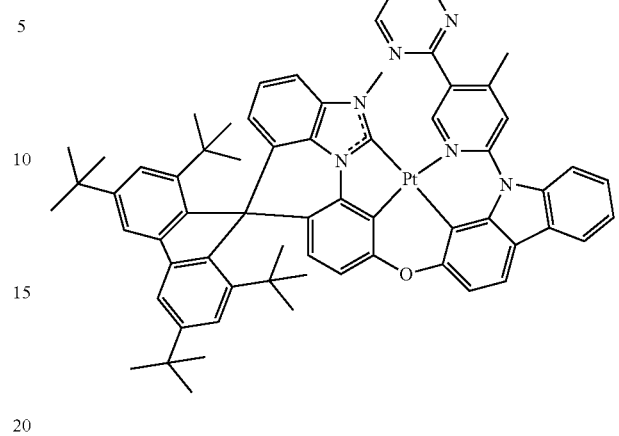
96
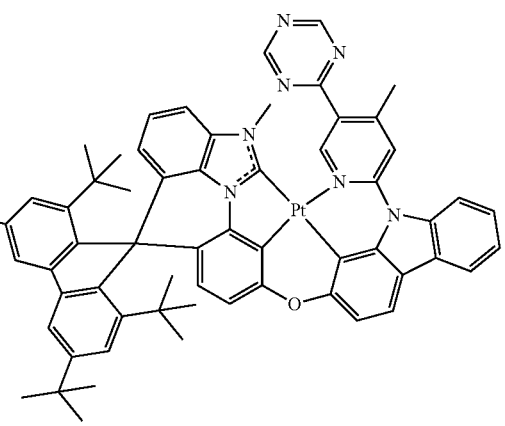
97
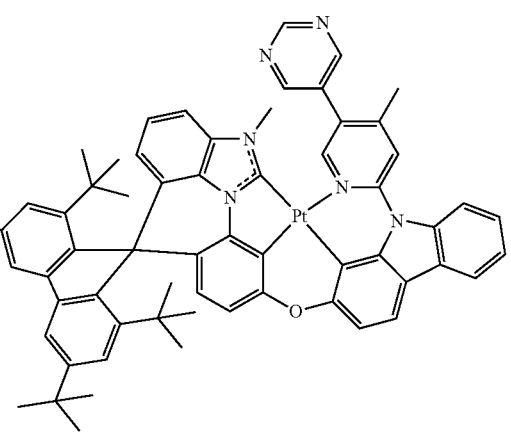

-continued
98
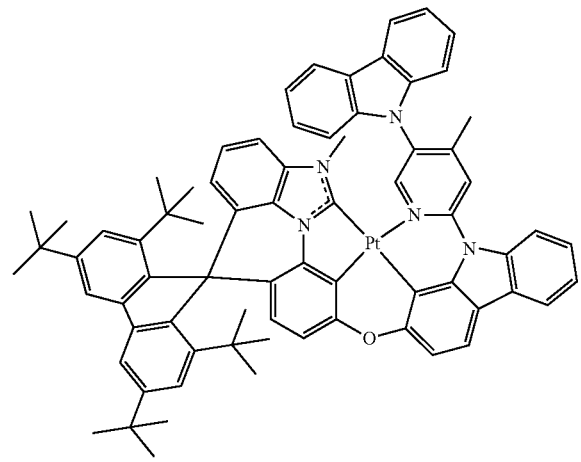
99
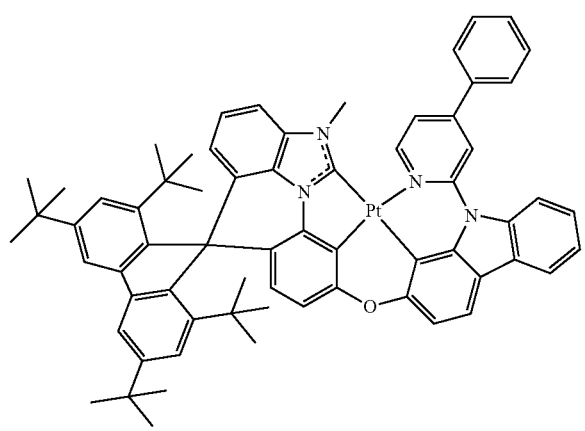
100
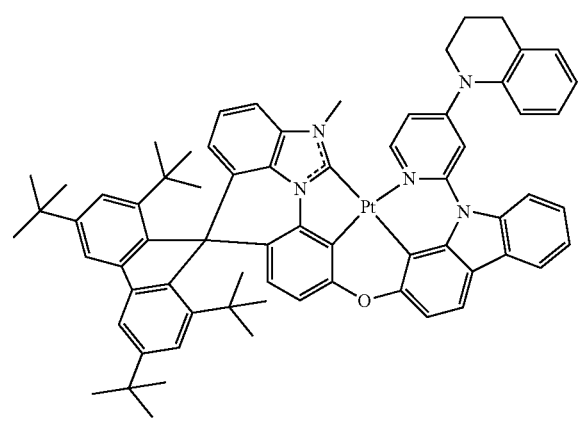
101
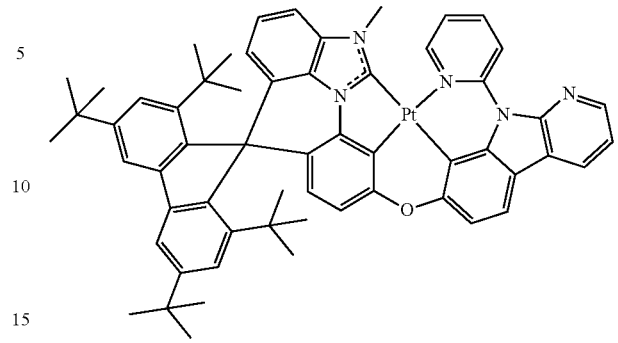
102
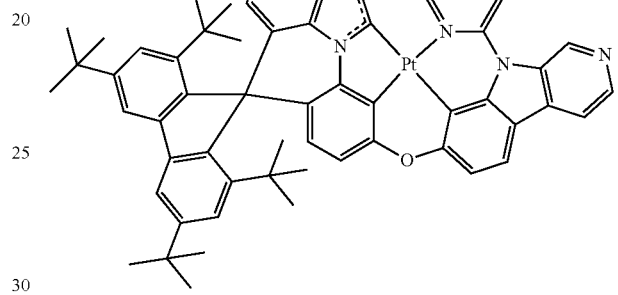
103
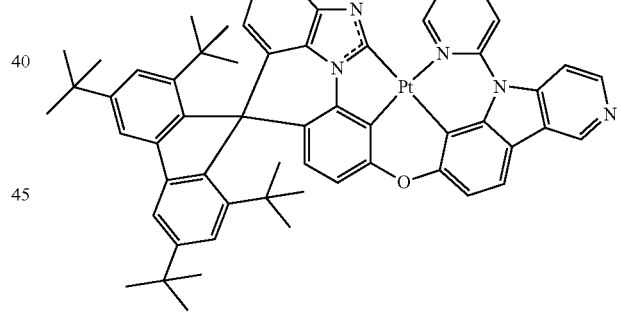
104
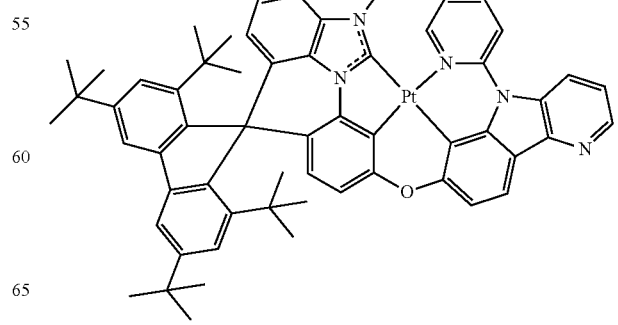

225
-continued
105
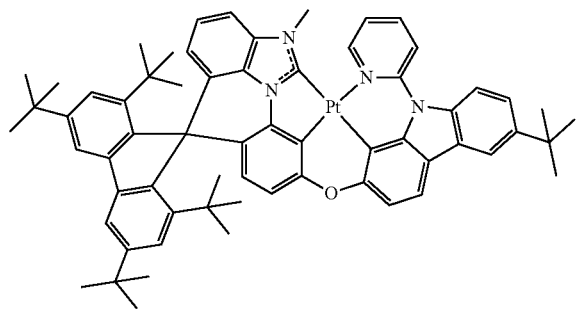
106
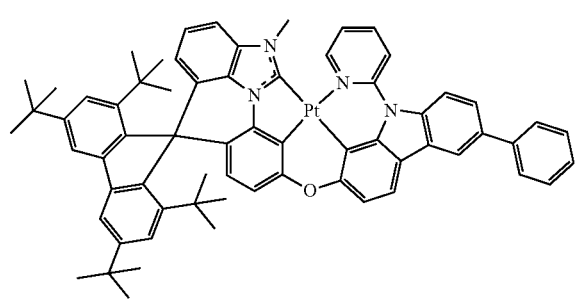
107
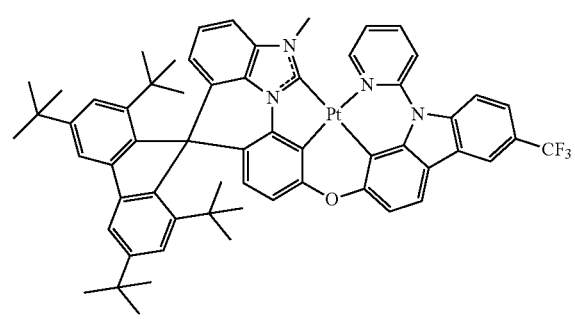
108
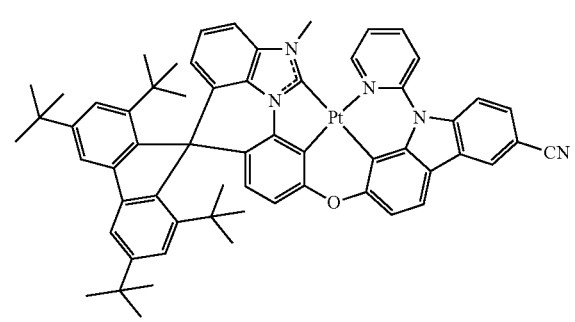
109
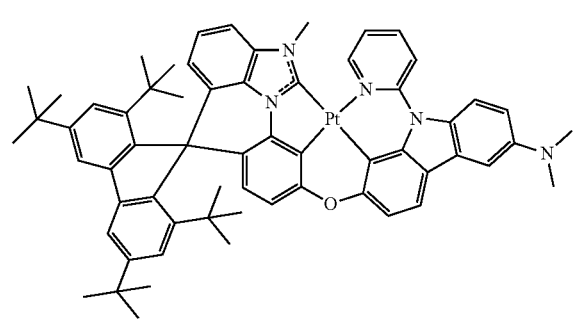
226
-continued
110
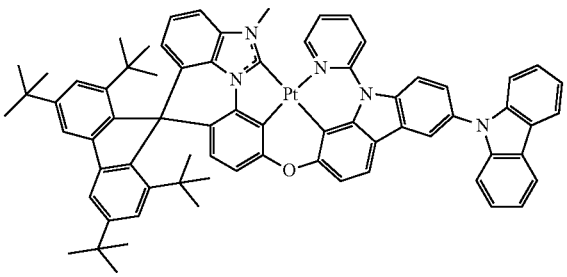
111
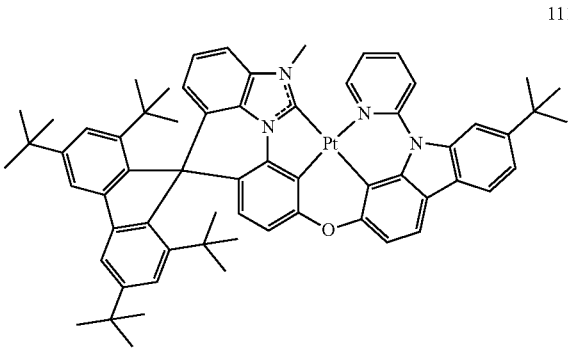
112
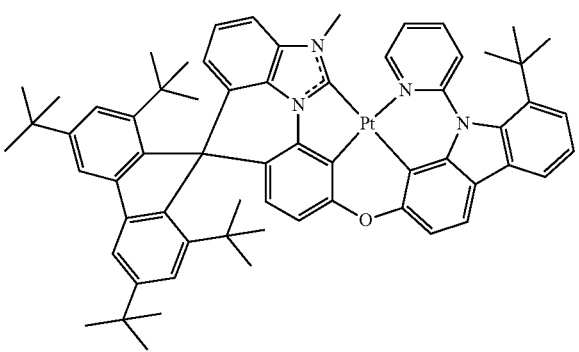
113
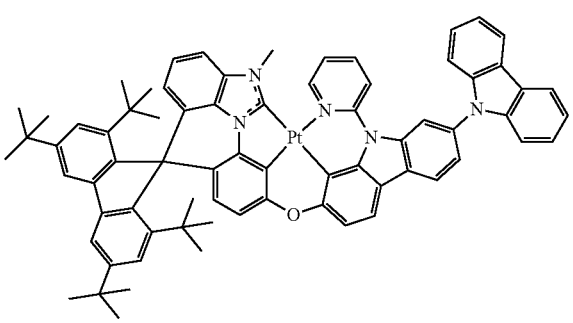

114
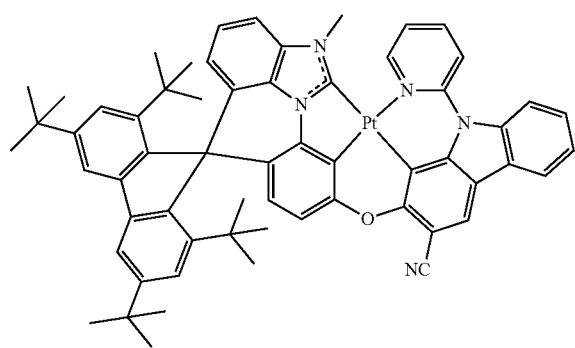
115
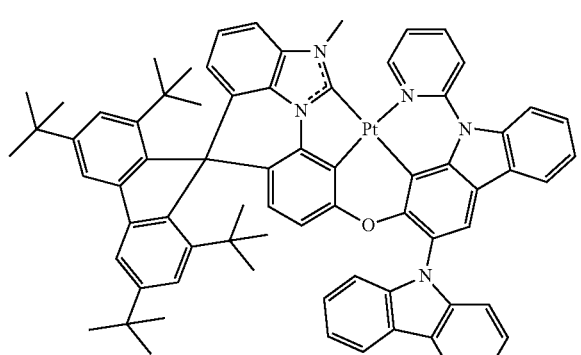
116
117
118
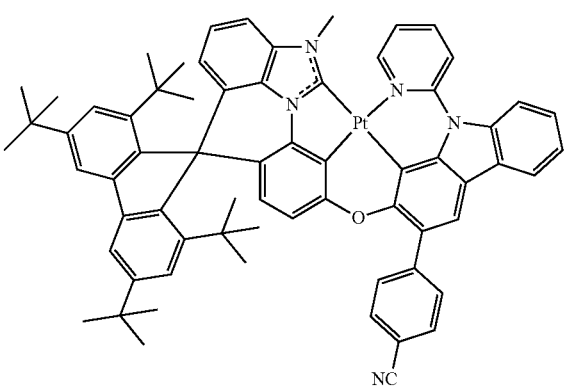
119
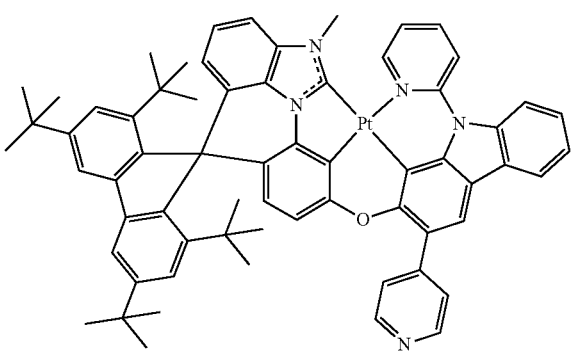
120
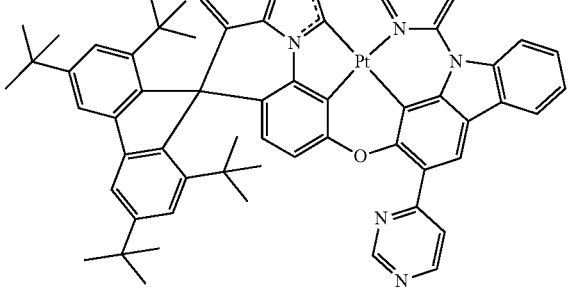
121
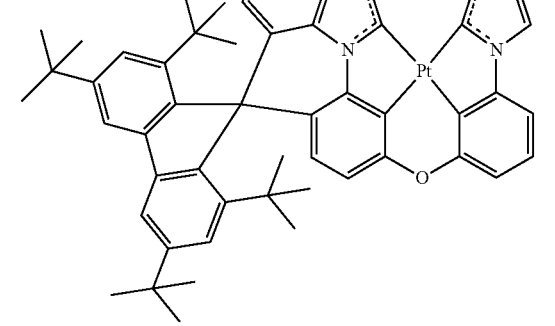

-continued
122
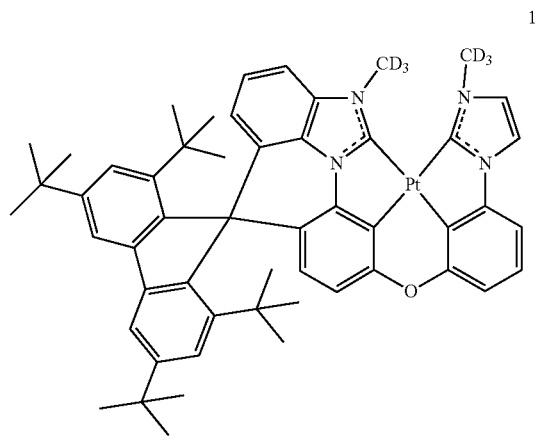
125
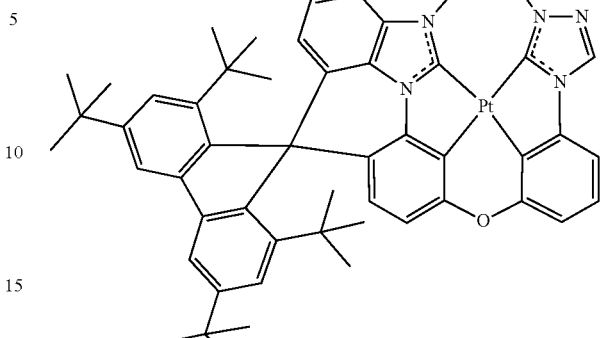
123
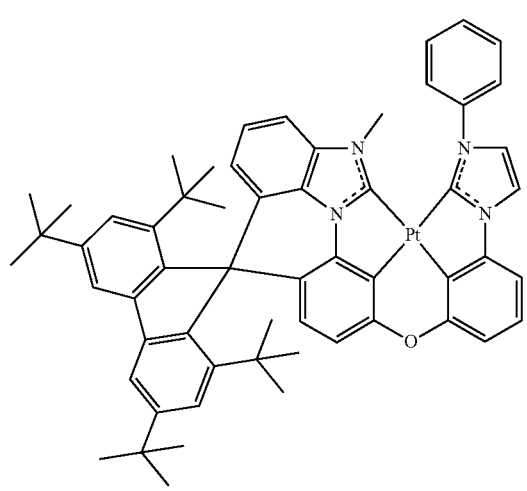
126
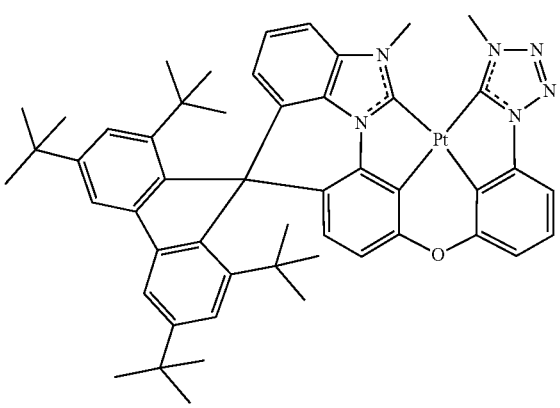
124
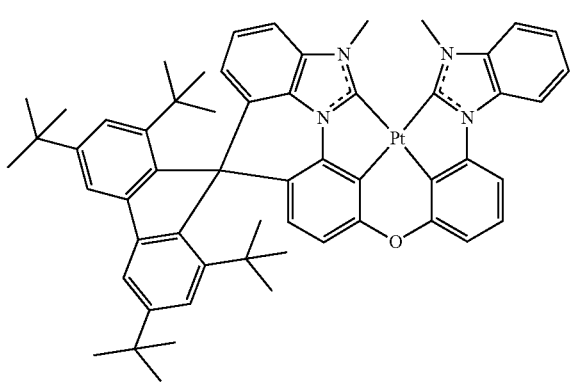
127

128
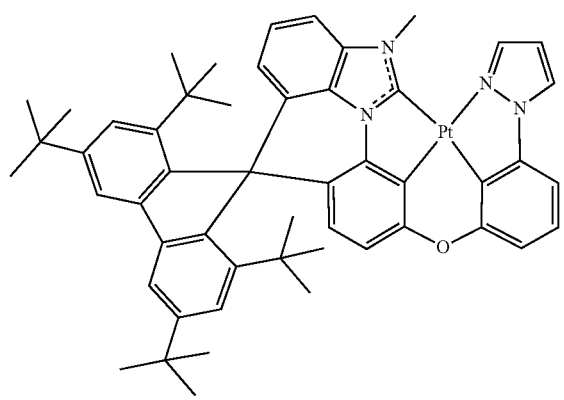
131
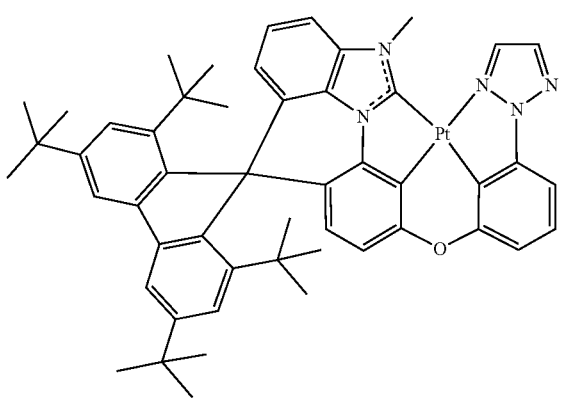
129
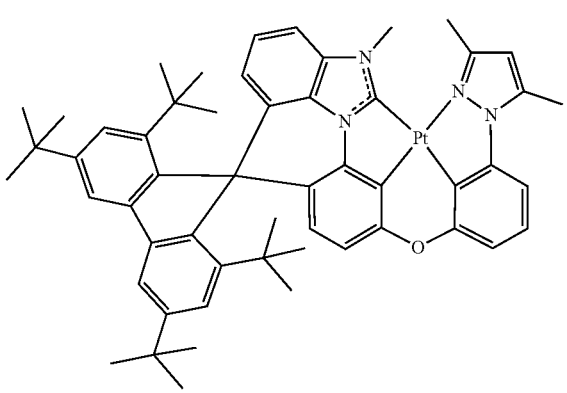
132
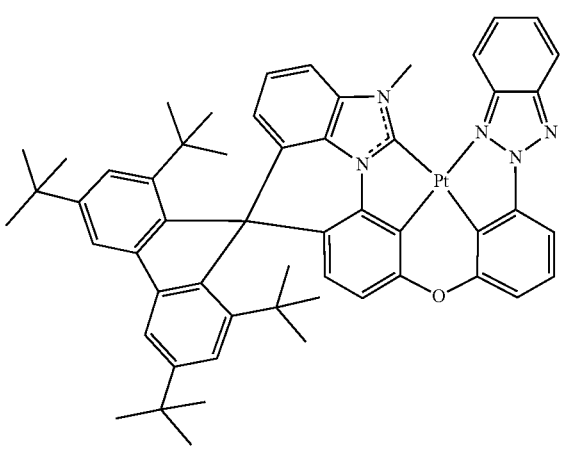
130
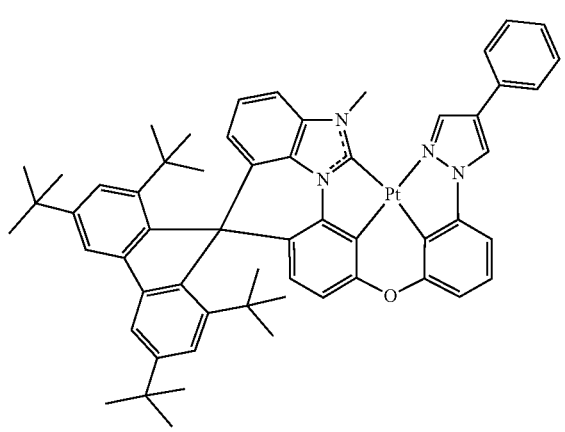
133
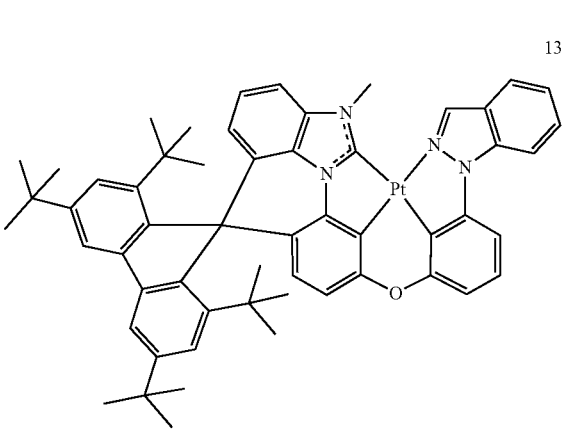

233
-continued
134
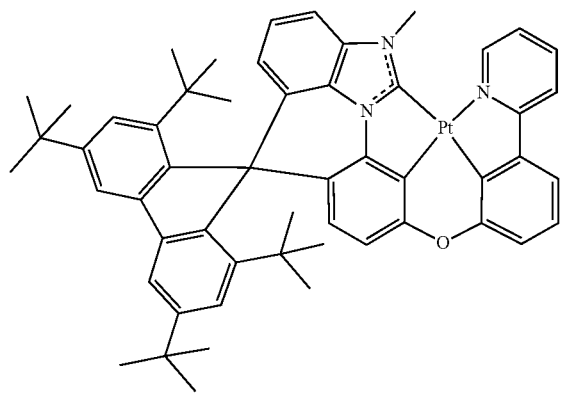
135
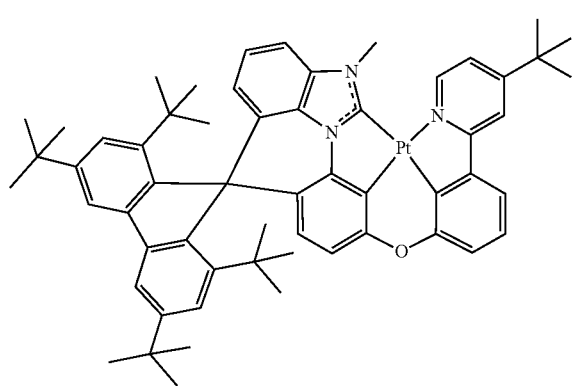
136
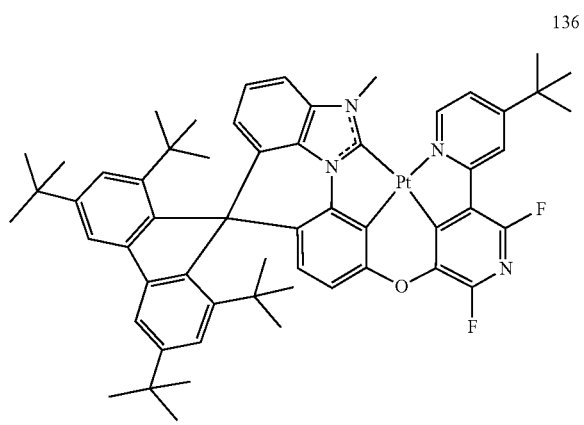
137
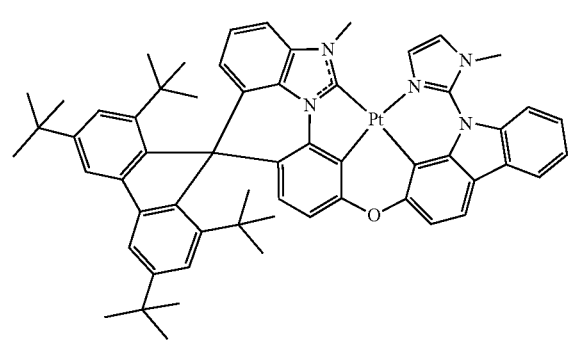
234
-continued
138
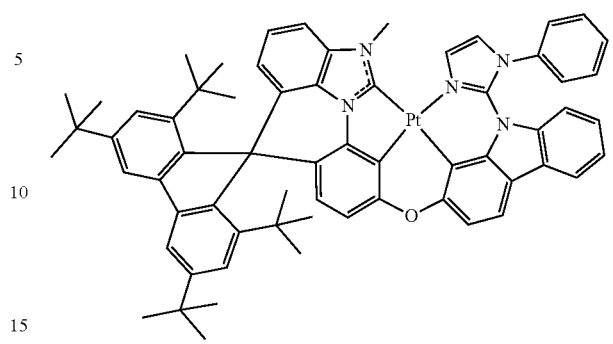
139
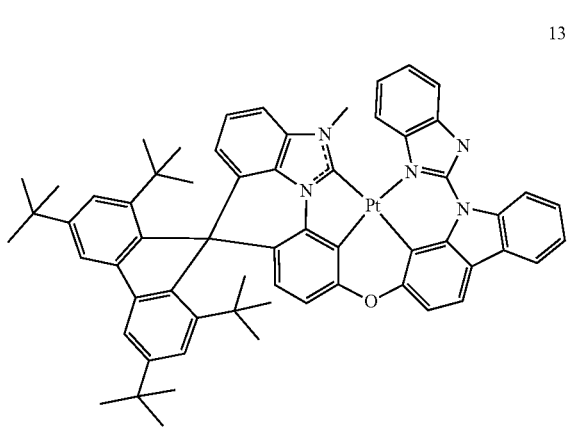
140
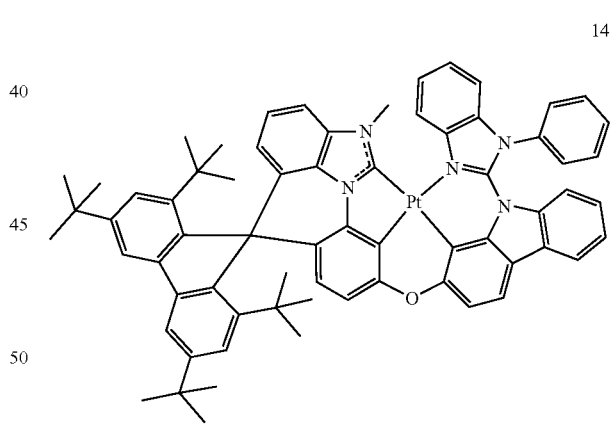
141
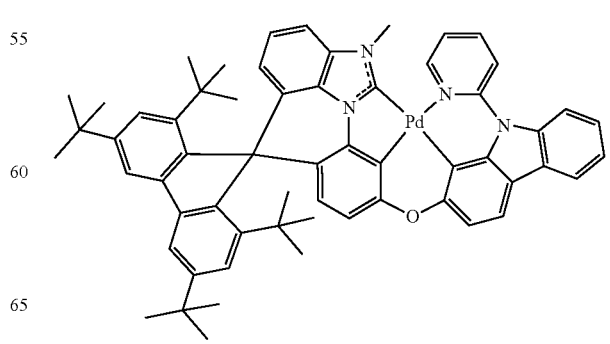

235
-continued
142
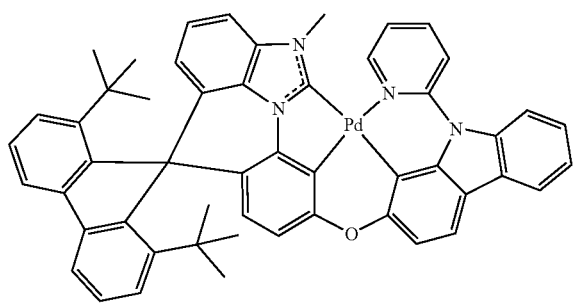
143
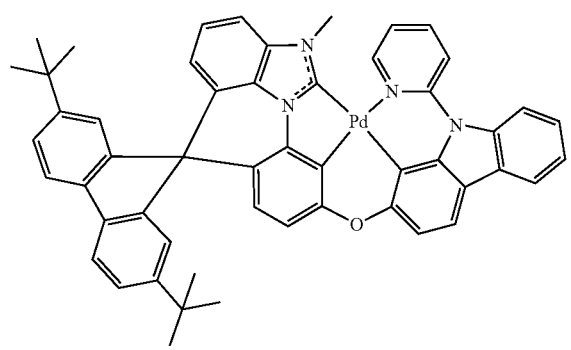
236
-continued
144
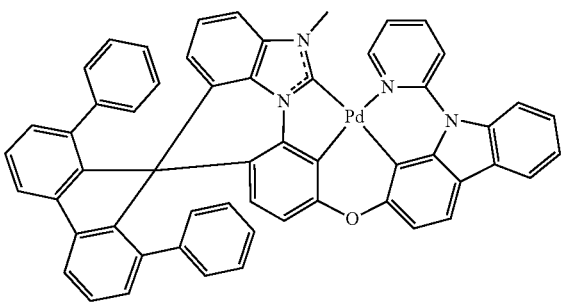
145
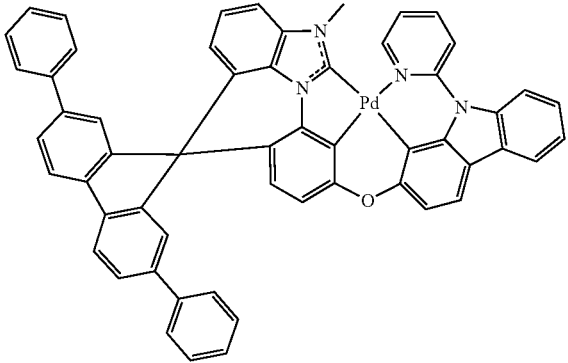
* * * * *